United States Patent
Nguyen

(10) Patent No.: US 12,474,637 B2
(45) Date of Patent: *Nov. 18, 2025

(54) RESIST COMPOSITION, METHOD OF FORMING RESIST PATTERN, COMPOUND, AND ACID DIFFUSION CONTROLLING AGENT

(71) Applicant: TOKYO OHKA KOGYO CO., LTD., Kawasaki (JP)

(72) Inventor: KhanhTin Nguyen, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 689 days.

This patent is subject to a terminal disclaimer.

(21) Appl. No.: 17/660,576

(22) Filed: Apr. 25, 2022

(65) Prior Publication Data
US 2022/0397825 A1 Dec. 15, 2022

(30) Foreign Application Priority Data
May 24, 2021 (JP) .............................. 2021-087105

(51) Int. Cl.
| | |
|---|---|
| G03F 7/38 | (2006.01) |
| G03F 7/004 | (2006.01) |
| G03F 7/039 | (2006.01) |
| G03F 7/32 | (2006.01) |
| G03F 7/40 | (2006.01) |

(52) U.S. Cl.
CPC .......... *G03F 7/0392* (2013.01); *G03F 7/0045* (2013.01); *G03F 7/322* (2013.01); *G03F 7/38* (2013.01); *G03F 7/40* (2013.01)

(58) Field of Classification Search
CPC ...... G03F 7/0392; G03F 7/0045; G03F 7/322; G03F 7/38; G03F 7/40
See application file for complete search history.

(56) References Cited

U.S. PATENT DOCUMENTS

| | | | |
|---|---|---|---|
| 2016/0246175 A1* | 8/2016 | Kotake | C08F 220/26 |
| 2016/0299428 A1* | 10/2016 | Masunaga | G03F 7/0045 |
| 2018/0149773 A1 | 5/2018 | Koga | |
| 2018/0149973 A1* | 5/2018 | Arai | C09D 125/18 |
| 2019/0113842 A1 | 4/2019 | Hatakeyama et al. | |
| 2019/0361345 A1* | 11/2019 | Ikeda | G03F 7/0045 |
| 2021/0157234 A1 | 5/2021 | Odashima et al. | |
| 2021/0179554 A1 | 6/2021 | Fujiwara et al. | |
| 2021/0188770 A1 | 6/2021 | Fujiwara et al. | |
| 2024/0377734 A1* | 11/2024 | Uehara | C07D 333/76 |

FOREIGN PATENT DOCUMENTS

| | | |
|---|---|---|
| JP | 2018-092159 A | 6/2010 |
| JP | 2016-157105 A | 9/2016 |
| JP | 2019-074592 A | 5/2019 |
| JP | 2021-081678 A | 5/2021 |
| JP | 2021-091645 A | 6/2021 |
| JP | 2021-091666 A | 6/2021 |
| TW | 202004339 A | 1/2020 |
| WO | WO 2017/179727 A1 | 10/2017 |

* cited by examiner

*Primary Examiner* — Mark F. Huff
*Assistant Examiner* — Christine Curiac
(74) *Attorney, Agent, or Firm* — Knobbe, Martens, Olson & Bear, LLP

(57) ABSTRACT

A resist composition containing a base material component and a compound represented by General Formula (d0), in which in the formula, $Rd^0$ represents a condensed cyclic group containing a condensed ring containing at least one aromatic rings, the condensed cyclic group having, as a substituent, an acid decomposable group which is decomposed under action of acid to form a polar group, $Yd^0$ represents a divalent linking group or a single bond, $M^{m+}$ represents an m-valent organic cation, and m represents an integer of 1 or more

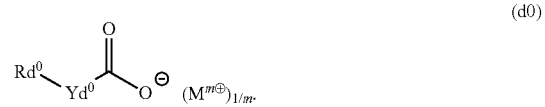

(d0)

5 Claims, No Drawings

RESIST COMPOSITION, METHOD OF FORMING RESIST PATTERN, COMPOUND, AND ACID DIFFUSION CONTROLLING AGENT

BACKGROUND OF THE INVENTION

Field of the Invention

The present invention relates to a resist composition, a method of forming a resist pattern, a compound, and an acid diffusion controlling agent.

Priority is claimed on Japanese Patent Application No. 2021-087105, filed on May 24, 2021, the content of which is incorporated herein by reference.

Description of Related Art

In recent years, in the production of semiconductor elements and liquid crystal display elements, advances in lithography techniques have led to a rapid progress in the field of pattern fining. Typically, these pattern fining techniques involve shortening the wavelength (increasing the energy) of the light source for exposure.

Resist materials for use with these types of light sources for exposure require lithography characteristics such as a high resolution capable of reproducing a fine-sized pattern, and a high level of sensitivity to these types of light sources for exposure.

As a resist material that satisfies these requirements, a chemical amplification-type resist composition that contains a base material component that exhibits changed solubility in a developing solution under action of acid, and an acid generator component that generates acid upon exposure has been used in the related art.

In the resist pattern formation, the behavior of acid generated from an acid generator component upon exposure is considered as one factor that has a great influence on lithography characteristics.

On the other hand, a chemical amplification-type resist composition having both an acid generator component and an acid diffusion controlling agent that controls the diffusion of the acid generated from the acid generator component upon exposure has been proposed.

For example, Patent Document 1 discloses an acid generator and an acid diffusion controlling agent, which have a specific bulky structure (a bicyclooctane skeleton) of which an anion moiety mainly consists of a hydrocarbon and have a relatively enhanced hydrophobicity. The invention described in Patent Document 1 mainly adopts, as a means, employing a compound having an anion moiety having a relatively enhanced hydrophobicity as an acid generator, and it discloses that according to a resist composition containing the compound, it is possible to achieve high sensitivity in the resist pattern formation and form a resist pattern having a good shape with high resolution and reduced roughness.

CITATION LIST

Patent Document

[Patent Document 1] Japanese Unexamined Patent Application, First Publication No. 2018-92159

SUMMARY OF THE INVENTION

With the further progress of lithography technology and resist pattern fining, for example, it is aimed to form a fine pattern of several tens of nanometers in lithography by EUV and EB. As the resist pattern size becomes smaller as described above, a resist composition with which a resist pattern having good critical dimension uniformity (CDU) of pattern size and good resolution can be formed is required.

However, in the resist composition containing such an acid diffusion controlling agent having a bulky structure as that described in Patent Document 1 as described above, although the uniformity of the acid diffusion controlling agent in the resist film can be enhanced due to the improvement of the hydrophobicity, the compatibility with the developing solution is decreased, and there is room for improvement in achieving both CDU and resolution.

The present invention has been made in consideration of the above circumstances, and an object of the present invention is to provide a resist composition with which a resist pattern having good CDU and good resolution can be formed, a method of forming a resist pattern using the resist composition, a novel compound useful as an acid generator of the resist composition, and an acid generator using the compound.

In order to achieve the above-described object, the present invention employs the following configurations.

That is, a first aspect of the present invention is a resist composition that generates acid upon exposure and exhibits changed solubility in a developing solution under action of acid, the resist composition containing a base material component (A) that exhibits changed solubility in a developing solution under action of acid, an acid generator component (B) that generates acid upon exposure, and an acid diffusion controlling agent component (D) that controls a diffusion of the acid generated from the acid generator component (B) upon exposure, in which the acid diffusion controlling agent component (D) contains a compound (D0) represented by General Formula (d0).

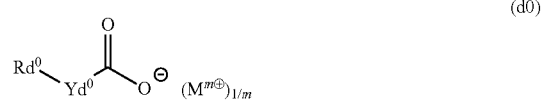

(d0)

[In the formula, $Rd^0$ represents a condensed cyclic group containing a condensed ring containing at least one aromatic rings. The condensed cyclic group has, as a substituent, an acid decomposable group that is decomposed under action of acid to form a polar group. $Yd^0$ represents a divalent linking group or a single bond, $M^{m+}$ represents an m-valent organic cation. m represents an integer of 1 or more.]

The second aspect according to the present invention is a method of forming a resist pattern, including a step of forming a resist film on a support using the resist composition according to the first aspect, a step of exposing the resist film, and a step of developing the exposed resist film to form a resist pattern.

A third aspect of the present invention is a compound represented by General Formula (d0).

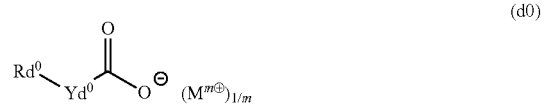

(d0)

[In the formula, $Rd^0$ represents a condensed cyclic group containing a condensed ring containing at least one aromatic rings. The condensed cyclic group has, as a substituent, an acid decomposable group that is decomposed under action of acid to form a polar group. $Yd^0$ represents a divalent linking group or a single bond, $M^{m+}$ represents an m-valent organic cation. m represents an integer of 1 or more.]

A fourth aspect of the present invention is an acid diffusion controlling agent containing the compound according to the third aspect described above.

According to the present invention, it is possible to provide a resist composition with which a resist pattern having good CDU and good resolution can be formed, a method of forming a resist pattern using the resist composition, a novel compound useful as an acid generator of the resist composition, and an acid generator using the compound.

DETAILED DESCRIPTION OF THE INVENTION

In the present specification and the scope of the present claims, the "aliphatic" is a relative concept used with respect to the "aromatic" and defines a group or compound that has no aromaticity.

The "alkyl group" includes a monovalent saturated hydrocarbon group that is linear, branched, or cyclic unless otherwise specified. The same applies to the alkyl group of an alkoxy group.

The "alkylene group" includes a divalent saturated hydrocarbon group that is linear, branched, or cyclic unless otherwise specified.

Examples of the "halogen atom" include a fluorine atom, a chlorine atom, a bromine atom, and an iodine atom.

The "constitutional unit" means a monomer unit (a monomeric unit) that contributes to the formation of a polymeric compound (a resin, a polymer, or a copolymer).

In a case where "may have a substituent" is described, both of a case where a hydrogen atom (—H) is substituted with a monovalent group and a case where a methylene group (—CH$_2$—) is substituted with a divalent group are included.

The "exposure" is used as a general concept that includes irradiation with any form of radiation.

The "acid decomposable group" indicates a group having acid decomposability, in which at least part of bonds in the structure of the acid decomposable group can be cleaved under action of acid.

Examples of the acid decomposable group having a polarity that is increased under action of acid include groups that are decomposed under action of acid to generate a polar group.

Examples of the polar group include a carboxy group, a hydroxyl group, an amino group, and a sulfo group (—SO$_3$H).

More specific examples of the acid decomposable group include a group (for example, a group obtained by protecting a hydrogen atom of the OH-containing polar group with an acid dissociable group) obtained by protecting the above-described polar group with an acid dissociable group.

The "acid dissociable group" indicates any one of (i) a group having acid decomposability, in which a bond between the acid dissociable group and an atom adjacent to the acid dissociable group can be cleaved under action of acid; and (ii) a group in which part of bonds are cleaved under action of acid, and then a decarboxylation reaction occurs, thereby cleaving the bond between the acid dissociable group and the atom adjacent to the acid dissociable group."

It is necessary that the acid dissociable group that constitutes the acid decomposable group be a group that exhibits a lower polarity than the polar group generated by the dissociation of the acid dissociable group. Thus, in a case where the acid dissociable group is dissociated under action of acid, a polar group that exhibits a higher polarity than the acid dissociable group is generated, thereby increasing the polarity. As a result of the above, the polarity of the total component (A1) is increased. By the increase in the polarity, the solubility in a developing solution relatively changes. The solubility in a developing solution is increased in a case where the developing solution is an alkali developing solution, whereas the solubility in a developing solution is decreased in a case where the developing solution is an organic developing solution.

The "base material component" is an organic compound having a film-forming ability. The organic compounds used as the base material component are roughly classified into a non-polymer and a polymer. As the non-polymer, those having a molecular weight of 500 or more and less than 4,000 are usually used. Hereinafter, the "low molecular weight compound" refers to a non-polymer having a molecular weight of 500 or more and less than 4,000. As the polymer, those having a molecular weight of 1,000 or more are usually used. Hereinafter, the "resin", the "polymeric compound", or the "polymer" refers to a polymer having a molecular weight of 1,000 or more. As the molecular weight of the polymer, a weight average molecular weight in terms of polystyrene-equivalent value determined by gel permeation chromatography (GPC) is used.

The "constitutional unit derived from" means a constitutional unit that is formed by the cleavage of a multiple bond between carbon atoms, for example, an ethylenic double bond.

In the "acrylic acid ester", the hydrogen atom bonded to the carbon atom at the α-position may be substituted with a substituent. The substituent ($R^{\alpha x}$) that is substituted for the hydrogen atom bonded to the carbon atom at the α-position is an atom other than a hydrogen atom or a group. Further, the acrylic acid ester includes an itaconic acid diester in which the substituent (R') is substituted with a substituent having an ester bond or an α-hydroxyacryl ester in which the substituent (R') is substituted with a hydroxyalkyl group or a group in which a hydroxyl group thereof is modified. The carbon atom at the α-position of acrylic acid ester indicates a carbon atom bonded to the carbonyl group of acrylic acid unless otherwise specified.

Hereinafter, the acrylic acid ester obtained by substituting a hydrogen atom bonded to the carbon atom at the α-position with a substituent is also referred to as an α-substituted acrylic acid ester.

The "derivative" includes a compound obtained by substituting a hydrogen atom at the α-position of an object compound with another substituent such as an alkyl group or a halogenated alkyl group; and a derivative thereof. Examples of the derivatives thereof include a derivative in which the hydrogen atom of the hydroxyl group of the object compound in which the hydrogen atom at the α-position may be substituted with a substituent is substituted with an organic group; and a derivative in which a substituent other than a hydroxyl group is bonded to the object compound in which the hydrogen atom at the α-position may be substituted with a substituent. The α-position refers to the first carbon atom adjacent to the functional group unless otherwise specified.

Examples of the substituent that is substituted for the hydrogen atom at the α-position of hydroxystyrene include the same one as $R^{\alpha x}$.

In the present specification and the scope of the present claims, asymmetric carbon atoms may be present, and thus enantiomers or diastereomers may be present depending on the structures represented by the chemical formula. In that case, these isomers are represented by one chemical formula. These isomers may be used alone or in the form of a mixture.

(Resist Composition)

The resist composition according to the present embodiment is a resist composition that generates acid upon exposure and exhibits changed solubility in a developing solution under action of acid.

Such a resist composition contains a base material component (A) (hereinafter, also referred to as a "component (A)") that exhibits changed solubility in a developing solution under action of acid, an acid generator component (B) (hereinafter, also referred to as a "component (B)" that generates acid upon exposure, and an acid diffusion controlling agent component (D) (hereinafter, also referred to as a "component (D)") that controls the diffusion of the acid generated from the component (B) upon exposure.

In a case where a resist film is formed using the resist composition according to the present embodiment and the formed resist film is subjected to selective exposure, acid is generated from the component (B) at exposed portions of the resist film, and the generated acid acts on the component (A) to change the solubility of the component (A) in a developing solution, whereas the solubility of the component (A) in a developing solution is not changed at unexposed portions, thereby that generates the difference in solubility in the developing solution between exposed portions and unexposed portions of the resist film. Therefore, by subjecting the resist film to development, exposed portions of the resist film are dissolved and removed to form a positive-tone resist pattern in a case where the resist composition is a positive-tone type, whereas unexposed portions of the resist film are dissolved and removed to form a negative-tone resist pattern in a case where the resist composition is a negative-tone type.

In the present specification, a resist composition which forms a positive-tone resist pattern by dissolving and removing exposed portions of the resist film is called a positive-tone resist composition, and a resist composition which forms a negative-tone resist pattern by dissolving and removing unexposed portions of the resist film is called a negative-tone resist composition. The resist composition according to the present embodiment may be a positive-tone resist composition or a negative-tone resist composition. Further, in the resist pattern formation, the resist composition according to the present embodiment may be applied to an alkali developing process using an alkali developing solution in the developing treatment, or a solvent developing process using a developing solution (an organic developing solution) containing an organic solvent in the developing treatment.

<Component (A)>

In the resist composition according to the present embodiment, the component (A) preferably contains a resin component (A1) (hereinafter, also referred to as a "component (A1)") that exhibits changed solubility in a developing solution under action of acid. In the alkali developing process and the solvent developing process, since the polarity of the base material component before and after the exposure is changed by using the component (A1), an excellent development contrast can be obtained.

As the component (A), another polymeric compound and/or a low molecular weight compound may be used in combination with the component (A1).

In a case of applying an alkali developing process, a base material component containing the component (A1) is insoluble in an alkali developing solution prior to exposure; however, it has a polarity that is increased under action of acid and then exhibits increased solubility in an alkali developing solution, for example, in a case where acid is generated from the component (B) upon exposure. Therefore, in the resist pattern formation, in a case where a resist film formed by applying the resist composition onto a support is subjected to the selective exposure, exposed portions of the resist film change from an insoluble state to a soluble state in an alkali developing solution, whereas unexposed portions of the resist film remain insoluble in an alkali developing solution, and thus, a positive-tone resist pattern is formed by alkali developing.

On the other hand, in a case of applying a solvent developing process, a base material component containing the component (A1) has a high solubility in an organic developing solution prior to exposure; however, it has an increased polarity under action of acid and then exhibits decreased solubility in an organic developing solution, for example, in a case where acid is generated from the component (B) upon exposure. As a result, in the resist pattern formation, in a case where a resist film obtained by applying the resist composition onto a support is subjected to the selective exposure, exposed portions of the resist film change from a soluble state to an insoluble state with respect to an organic developing solution, whereas unexposed portions of the resist film remain soluble and unchanged, whereby a contrast between exposed portions and unexposed portions can be obtained, and thus a negative-tone resist pattern is formed by developing in the organic developing solution.

In the resist composition according to the present embodiment, the component (A) may be used alone or in a combination of two or more kinds thereof.

In regard to component (A1) The component (A1) is a resin component that exhibits changed solubility in a developing solution under action of acid.

The component (A1) preferably has a constitutional unit (a1) that includes an acid decomposable group having a polarity that is increased under action of acid.

The component (A1) may have other constitutional units as necessary in addition to the constitutional unit (a1).

<<Constitutional Unit (a1)>>

The constitutional unit (a1) is a constitutional unit that contains an acid decomposable group having a polarity that is increased under action of acid.

Examples of the acid dissociable group are the same as those which have been proposed so far as acid dissociable groups for the base resin for a chemical amplification-type resist composition.

Specific examples of acid dissociable groups of the base resin proposed for a chemical amplification-type resist composition contains an "acetal-type acid dissociable group", a "tertiary alkyl ester-type acid dissociable group", and a "tertiary alkyloxycarbonyl acid dissociable group" described below.

Acetal-Type Acid Dissociable Group:

Examples of the acid dissociable group for protecting a carboxy group or a hydroxyl group as a polar group include the acid dissociable group represented by General Formula (a1-r-1) shown below (hereinafter, also referred to as an "acetal-type acid dissociable group").

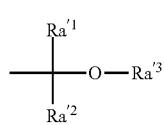

(a1-r-1)

[In the formula, $Ra'^1$ to $Ra'^2$ represent hydrogen atoms or alkyl groups. $Ra'^3$ represents a hydrocarbon group, and $Ra'^3$ may be bonded to any one of $Ra'^1$ or $Ra'^2$ to form a ring.]

In General Formula (a1-r-1), it is preferable that at least one of $Ra'^1$ and $Ra'^2$ represents a hydrogen atom and more preferable that both $Ra'^1$ and $Ra'^2$ represent a hydrogen atom.

In a case where $Ra'^1$ or $Ra'^2$ represents an alkyl group, examples of the alkyl group include the same one as the alkyl group mentioned as the substituent which may be bonded to the carbon atom at the α-position in the description on the α-substituted acrylic acid ester, and the alkyl group preferably has 1 to 5 carbon atoms. Specific examples thereof preferably include a linear or branched alkyl group. More specific examples thereof include a methyl group, an ethyl group, a propyl group, an isopropyl group, an n-butyl group, an isobutyl group, a tert-butyl group, a pentyl group, an isopentyl group, and a neopentyl group. Among these, a methyl group or an ethyl group is preferable, and a methyl group is particularly preferable.

In General Formula (a1-r-1), examples of the hydrocarbon group as $Ra'^3$ include a linear or branched alkyl group and a cyclic hydrocarbon group.

The linear alkyl group has preferably 1 to 5 carbon atoms, more preferably 1 to 4 carbon atoms, and still more preferably 1 or 2 carbon atoms. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched alkyl group has preferably 3 to 10 carbon atoms and more preferably 3 to 5 carbon atoms. Specific examples thereof include an isopropyl group, an isobutyl group, a tert-butyl group, an isopentyl group, a neopentyl group a 1,1-diethylpropyl group, and a 2,2-dimethylbutyl group, where an isopropyl group is preferable.

In a case where $Ra'^3$ represents a cyclic hydrocarbon group, the hydrocarbon group may be an aliphatic hydrocarbon group or an aromatic hydrocarbon group and may be a polycyclic group or a monocyclic group.

The aliphatic hydrocarbon group which is a monocyclic group is preferably a group obtained by removing one hydrogen atom from a monocycloalkane. The monocycloalkane preferably has 3 to 6 carbon atoms, and specific examples thereof include cyclopentane and cyclohexane.

The aliphatic hydrocarbon group which is a polycyclic group is preferably a group obtained by removing one hydrogen atom from a polycycloalkane, where the polycycloalkane preferably has 7 to 12 carbon atoms. Specific examples thereof include adamantane, norbornane, isobornane, tricyclodecane, and tetracyclododecane.

In a case where the cyclic hydrocarbon group as $Ra'^3$ is an aromatic hydrocarbon group, the aromatic hydrocarbon group is a hydrocarbon group having at least one aromatic ring.

The aromatic ring is not particularly limited as long as it is a cyclic conjugated system having (4n+2) π electrons, and may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms.

Specific examples of the aromatic ring include aromatic hydrocarbon rings such as benzene, naphthalene, anthracene, and phenanthrene; and an aromatic heterocyclic ring obtained by substituting a part of carbon atoms constituting the above-described aromatic hydrocarbon ring with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

Specific examples of the aromatic hydrocarbon group as $Ra'^3$ include a group obtained by removing one hydrogen atom from the above-described aromatic hydrocarbon ring or aromatic heterocyclic ring (an aryl group or a heteroaryl group); a group obtained by removing one hydrogen atom from an aromatic compound having two or more aromatic rings (for example, biphenyl or fluorene); and a group in which one hydrogen atom of the above-described aromatic hydrocarbon ring or aromatic heterocyclic ring has been substituted with an alkylene group (for example, an arylalkyl group such as a benzyl group, a phenethyl group, a 1-naphthylmethyl group, a 2-naphthylmethyl group, a 1-naphthylethyl group, or a 2-naphthylethyl group). The alkylene group bonded to the aromatic hydrocarbon ring or aromatic heterocyclic ring preferably has 1 to 4 carbon atoms, more preferably 1 or 2 carbon atoms, and particularly preferably 1 carbon atom.

The cyclic hydrocarbon group as $Ra'^3$ may have a substituent. Examples of the substituent include, $-R^{P1}$, $-R^{P2}-O-R^{P1}$, $-R^{P2}-CO-R^{P1}$, $-R^{P2}-CO-OR^{P1}$, $-R^{P2}-O-CO-R^{P1}$, $-R^{P2}-OH$, $-R^{P2}-CN$, and $-R^{P2}-COOH$ (hereinafter, these substituents are also collectively referred to as "$Ra^{x5}$").

Here, $R^{P1}$ represents a monovalent chain-like saturated hydrocarbon group having 1 to 10 carbon atoms, a monovalent aliphatic cyclic saturated hydrocarbon group having 3 to 20 carbon atoms, or a monovalent aromatic hydrocarbon group having 6 to 30 carbon atoms. In addition, $R^{P2}$ represents a single bond, a divalent chain-like saturated hydrocarbon group having 1 to 10 carbon atoms, a divalent aliphatic cyclic saturated hydrocarbon group having 3 to 20 carbon atoms, or a divalent aromatic hydrocarbon group having 6 to 30 carbon atoms. However, part or all of hydrogen atoms contained in the chain-like saturated hydrocarbon group, the aliphatic cyclic saturated hydrocarbon group, and the aromatic hydrocarbon group of $R^{P1}$ and $R^{P2}$ may be substituted with a fluorine atom. In the aliphatic cyclic hydrocarbon group, one or more of the above-described substituents may be included as a single kind, or one or more of the above-described substituents may be included as a plurality of kinds.

Examples of the monovalent chain-like saturated hydrocarbon group having 1 to 10 carbon atoms include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms include monocyclic aliphatic saturated hydrocarbon groups such as a cyclopropyl group, a cyclobutyl group, a cyclopentyl group, a cyclohexyl group, a cycloheptyl group, a cyclooctyl group, a cyclodecyl group, and cyclododecyl group; and polycyclic aliphatic saturated hydrocarbon groups such as a bicyclo[2.2.2]octanyl group, a tricyclo[5.2.1.02,6]decanyl group, a tricyclo[3.3.1.13,7]decanyl group, a tetracyclo [6.2.1.13,6.02,7] dodecanyl group, and an adamantyl group.

Examples of the monovalent aromatic hydrocarbon group having 6 to 30 carbon atoms include a group obtained by removing one hydrogen atom from an aromatic hydrocarbon ring such as benzene, biphenyl, fluorene, naphthalene, anthracene, or phenanthrene.

In a case where $Ra'^3$ is bonded to any one of $Ra'^1$ or $Ra'^2$ to form a ring, the cyclic group is preferably a 4-membered to 7-membered ring, and more preferably a 4-membered to 6-membered ring. Specific examples of the cyclic group include a tetrahydropyranyl group and a tetrahydrofuranyl group.

Tertiary Alkyl Ester-Type Acid Dissociable Group:

Among the above polar groups, examples of the acid dissociable group for protecting the carboxy group include the acid dissociable group represented by General Formula (a1-r-2) shown below.

Among the acid dissociable groups represented by General Formula (a1-r-2), for convenience, a group which is constituted of alkyl groups is referred to as a "tertiary alkyl ester-type acid dissociable group".

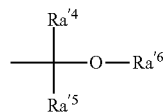

(a1-r-2)

[In the formula, $Ra'^4$ to $Ra'^6$ each represents a hydrocarbon group, and $Ra'^5$ and $Ra'^6$ may be bonded to each other to form a ring.]

Examples of the hydrocarbon group as $Ra'^4$ include a linear or branched alkyl group, a chain-like or cyclic alkenyl group, and a cyclic hydrocarbon group.

Examples of the linear or branched alkyl group and the cyclic hydrocarbon group (the aliphatic hydrocarbon group which is a monocyclic group, the aliphatic hydrocarbon group which is a polycyclic group, or the aromatic hydrocarbon group) as $Ra'^4$ include the same ones as $Ra'^3$ described above.

The chain-like or cyclic alkenyl group as $Ra'^4$ is preferably an alkenyl group having 2 to 10 carbon atoms.

Examples of the hydrocarbon group as $Ra'^5$ and $Ra'^6$ include the same ones as those mentioned above as $Ra'^3$.

In a case where $Ra'^5$ to $Ra'^6$ are bonded to each other to form a ring, suitable examples thereof include groups represented by General Formula (a1-r2-1), General Formula (a1-r2-2), and General Formula (a1-r2-3).

On the other hand, in a case where $Ra'^4$ to $Ra'^6$ are not bonded to each other and represent an independent hydrocarbon group, suitable examples thereof include a group represented by General Formula (a1-r2-4).

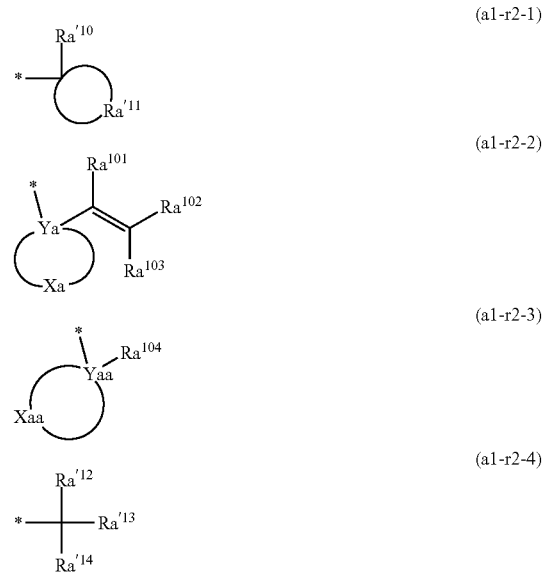

[In General Formula (a1-r2-1), $Ra'^{10}$ represents a linear or branched alkyl group having 1 to 12 carbon atoms, a part of which may be substituted with a halogen atom or a hetero atom-containing group. $Ra'^{11}$ represents a group that forms an aliphatic cyclic group together with a carbon atom to which $Ra'^{10}$ is bonded. In General Formula (a1-r2-2), Ya represents a carbon atom. Xa is a group that forms a cyclic hydrocarbon group together with Ya. Part or all of hydrogen atoms contained in the cyclic hydrocarbon group may be substituted. $Ra^{101}$ to $Ra^{103}$ each independently represent a hydrogen atom, a monovalent chain-like saturated hydrocarbon group having 1 to 10 carbon atoms, or a monovalent aliphatic cyclic saturated hydrocarbon group having 3 to 20 carbon atoms. Part or all of hydrogen atoms contained in the chain-like saturated hydrocarbon group and the aliphatic cyclic saturated hydrocarbon group may be substituted. Two or more of $Ra^{101}$ to $Ra^{103}$ may be bonded to each other to form a ring structure. In General Formula (a1-r2-3), Yaa represents a carbon atom. Xaa is a group that forms an aliphatic cyclic group together with Yaa. $Ra^{104}$ represents an aromatic hydrocarbon group which may have a substituent. In General Formula (a1-r2-4), $Ra'^{12}$ and $Ra'^{13}$ each independently represent a monovalent chain-like saturated hydrocarbon group having 1 to 10 carbon atoms. Part or all of hydrogen atoms contained in the chain-like saturated hydrocarbon group may be substituted. $Ra'^{14}$ represents a hydrocarbon group which may have a substituent. * represents a bonding site].

In General Formula (a1-r2-1), $Ra'^{10}$ represents a linear or branched alkyl group having 1 to 12 carbon atoms, a part of which may be substituted with a halogen atom or a hetero atom-containing group.

The linear alkyl group as $Ra'^{10}$ has 1 to 12 carbon atoms, and preferably has 1 to 10 carbon atoms and particularly preferably 1 to 5 carbon atoms.

Examples of the branched alkyl group as $Ra'^{10}$ include the same one as $Ra'^3$.

A part of the alkyl group as $Ra'^{10}$ may be substituted with a halogen atom or a hetero atom-containing group. For example, a part of hydrogen atoms constituting the alkyl group may be substituted with a halogen atom or a hetero atom-containing group. Further, a part of carbon atoms (such as a methylene group) constituting the alkyl group may be substituted with a hetero atom-containing group.

Examples of the hetero atom mentioned here include an oxygen atom, a sulfur atom, and a nitrogen atom. Examples of the hetero atom-containing group include (—O—), —C(=O)—O—, —O—C(=O)—, —C(=O)—, —O—C(=O)—O—, —C(=O)—NH—, —NH—, —S—, —S(=O)$_2$—, and —S(=O)$_2$—O—.

In General Formula (a1-r2-1), $Ra'^{11}$ (a group that forms an aliphatic cyclic group together with a carbon atom to which $Ra'^{10}$ is bonded) is preferably the group mentioned as the aliphatic hydrocarbon group (the alicyclic hydrocarbon group) which is a monocyclic group or a polycyclic group as $Ra'^3$ in General Formula (a1-r-1). Among them, it is more preferably a monocyclic alicyclic hydrocarbon group is preferable, specifically, a cyclopentyl group or a cyclohexyl group is more preferable.

In General Formula (a1-r2-2), examples of the cyclic hydrocarbon group formed by Xa together with Ya include a group in which one or more hydrogen atoms are further removed from a cyclic monovalent hydrocarbon group (an aliphatic hydrocarbon group) as $Ra'^3$ in General Formula (a1-r-1).

The cyclic hydrocarbon group that is formed by Xa together with Ya may have a substituent. Examples of this substituent include the same one as the substituent which may be contained in the cyclic hydrocarbon group as $Ra'^3$.

In General Formula (a1-r2-2), as $Ra'^{101}$ to $Ra'^{103}$, examples of the monovalent chain-like saturated hydrocarbon group having 1 to 10 carbon atoms include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms, as $Ra'^{101}$ to $Ra'^{103}$, include monocyclic aliphatic saturated hydrocarbon groups such as a cyclopropyl group, a cyclobutyl group, a cyclopentyl group, a cyclohexyl group, a cycloheptyl group, a cyclooctyl group, a cyclodecyl group, and cyclododecyl group; and polycyclic aliphatic saturated hydrocarbon groups such as a bicyclo[2.2.2]octanyl group, a tricyclo[5.2.1.0$^{2,6}$]decanyl group, a tricyclo[3.3.1.1$^{3,7}$]decanyl group, a tetracyclo[6.2.1.1$^{3,6}$.0$^{2,7}$] dodecanyl group, and an adamantyl group.

Among the above, $Ra'^{101}$ to $Ra'^{103}$ are preferably a hydrogen atom or a monovalent chain-like saturated hydrocarbon group having 1 to 10 carbon atoms, and among them, a hydrogen atom, a methyl group, and an ethyl group are more preferable, and a hydrogen atom is particularly preferable from the viewpoint of easy synthesis.

Examples of the substituent contained in the chain-like saturated hydrocarbon group represented by $Ra'^{101}$ to $Ra'^{103}$ or the aliphatic cyclic saturated hydrocarbon group include the same group as $Ra^{x5}$ described above.

Examples of the group containing a carbon-carbon double bond generated by forming a ring structure, which is obtained by bonding two or more of $Ra'^{101}$ to $Ra'^{103}$ to each other, include a cyclopentenyl group, a cyclohexenyl group, a methylcyclopentenyl group, a methylcyclohexenyl group, a cyclopentylideneethenyl group, and a cyclohexylideneethenyl group. Among these, a cyclopentenyl group, a cyclohexenyl group, and a cyclopentylideneethenyl group are preferable from the viewpoint of easy synthesis.

In General Formula (a1-r2-3), an aliphatic cyclic group that is formed by Xaa together with Yaa is preferably the group mentioned as the aliphatic hydrocarbon group which is a monocyclic group or a polycyclic group as $Ra'^3$ in General Formula (a1-r-1).

In General Formula (a1-r2-3), Examples of the aromatic hydrocarbon group as $Ra^{104}$ include a group obtained by removing one or more hydrogen atoms from an aromatic hydrocarbon ring having 5 to 30 carbon atoms. Among them, $Ra^{104}$ is preferably a group obtained by removing one or more hydrogen atoms from an aromatic hydrocarbon ring having 6 to 15 carbon atoms, more preferably a group obtained by removing one or more hydrogen atoms from benzene, naphthalene, anthracene, or phenanthrene, still more preferably a group obtained by removing one or more hydrogen atoms from benzene, naphthalene, or anthracene, particularly preferably a group obtained by removing one or more hydrogen atoms from benzene or naphthalene, and most preferably a group obtained by removing one or more hydrogen atoms from benzene.

Examples of the substituent which may be contained in $Ra^{104}$ in General Formula (a1-r2-3) include a methyl group, an ethyl group, propyl group, a hydroxy group, a carboxy group, a halogen atom, an alkoxy group (a methoxy group, an ethoxy group, a propoxy group, a butoxy group, and the like), and an alkyloxycarbonyl group.

In General Formula (a1-r2-4), $Ra'^{12}$ and $Ra'^{13}$ each independently represent a monovalent chain-like saturated hydrocarbon group having 1 to 10 carbon atoms. Examples of the monovalent chain-like saturated hydrocarbon group having 1 to 10 carbon atoms as $Ra'^{12}$ and $Ra'^{13}$ include the same one as the monovalent chain-like saturated hydrocarbon group having 1 to 10 carbon atoms as $Ra^{101}$ to $Ra^{103}$ as described above. Part or all of hydrogen atoms contained in the chain-like saturated hydrocarbon group may be substituted.

Among them, $Ra'^{12}$ and $Ra'^{13}$ are preferably a hydrogen atom or an alkyl group having 1 to 5 carbon atoms, more preferably an alkyl group having 1 to 5 carbon atoms, still more preferably a methyl group or an ethyl group, and particularly preferably a methyl group.

In a case where the chain-like saturated hydrocarbon groups represented by $Ra'^{12}$ and $Ra'^{13}$ are substituted, examples of the substituent include the same group as $Ra^{x5}$ described above.

In General Formula (a1-r2-4), $Ra'^{14}$ represents a hydrocarbon group which may have a substituent. Examples of the hydrocarbon group as $Ra'^{14}$ include a linear or branched alkyl group and a cyclic hydrocarbon group.

The linear alkyl group as $Ra'^{14}$ has preferably 1 to 5 carbon atoms, more preferably 1 to 4 carbon atoms, and still more preferably 1 or 2 carbon atoms. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched alkyl group as $Ra'^{14}$ has preferably 3 to 10 carbon atoms and more preferably 3 to 5 carbon atoms. Specific examples thereof include an isopropyl group, an isobutyl group, a tert-butyl group, an isopentyl group, a neopentyl group a 1,1-diethylpropyl group, and a 2,2-dimethylbutyl group, where an isopropyl group is preferable.

In a case where $Ra'^{14}$ represents a cyclic hydrocarbon group, the hydrocarbon group may be an aliphatic hydrocarbon group or an aromatic hydrocarbon group and may be a polycyclic group or a monocyclic group.

The aliphatic hydrocarbon group which is a monocyclic group is preferably a group obtained by removing one hydrogen atom from a monocycloalkane. The monocycloalkane preferably has 3 to 6 carbon atoms, and specific examples thereof include cyclopentane and cyclohexane.

The aliphatic hydrocarbon group which is a polycyclic group is preferably a group obtained by removing one hydrogen atom from a polycycloalkane, where the polycycloalkane preferably has 7 to 12 carbon atoms. Specific examples thereof include adamantane, norbornane, isobornane, tricyclodecane, and tetracyclododecane.

Examples of the aromatic hydrocarbon group as $Ra'^{14}$ include the same one as the aromatic hydrocarbon group as $Ra^{104}$. Among them, $Ra'^{14}$ is preferably a group obtained by removing one or more hydrogen atoms from an aromatic hydrocarbon ring having 6 to 15 carbon atoms, more preferably a group obtained by removing one or more hydrogen atoms from benzene, naphthalene, anthracene, or phenanthrene, still more preferably a group obtained by removing one or more hydrogen atoms from benzene, naphthalene, or anthracene, particularly preferably a group obtained by removing one or more hydrogen atoms from naphthalene or anthracene, and most preferably a group obtained by removing one or more hydrogen atoms from naphthalene.

Examples of the substituent which may be contained in $Ra'^{14}$ include the same one as the substituent which may be contained in $Ra^{104}$.

In a case where $Ra'^{14}$ in General Formula (a1-r2-4) is a naphthyl group, the position at which the tertiary carbon atom in General Formula (a1-r2-4) is bonded may be any of the 1-position and the 2-position of the naphthyl group.

In a case where $Ra'^{14}$ in General Formula (a1-r2-4) is an anthryl group, the position at which the tertiary carbon atom in General Formula (a1-r2-4) is bonded may be any of the 1-position, the 2-position, and 9-position of the anthryl group.

Specific examples of the group represented by General Formula (a1-r2-1) are shown below.

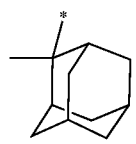

(r-pr-m1)

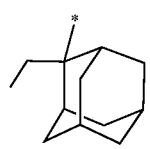

(r-pr-m2)

(r-pr-m3)

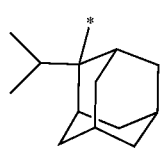

(r-pr-m4)

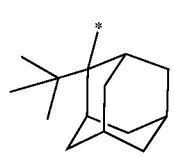

(r-pr-m5)

-continued

(r-pr-m6)

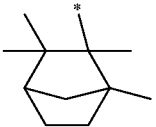

(r-pr-m7)

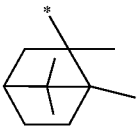

(r-pr-m8)

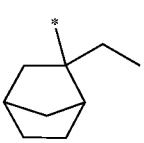

(r-pr-m9)

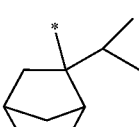

(r-pr-m10)

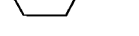

(r-pr-m11)

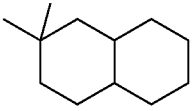

(r-pr-m12)

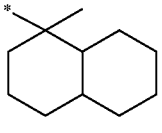

(r-pr-m13)

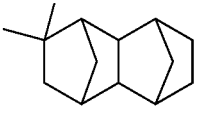

(r-pr-m14)

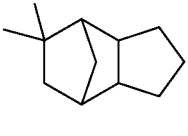

(r-pr-m15)

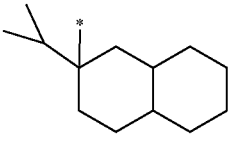

(r-pr-m16)

(r-pr-m17)
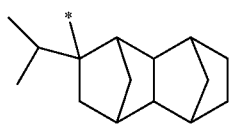
(r-pr-s1)
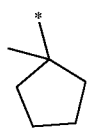
(r-pr-s2)
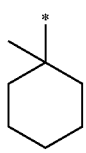
(r-pr-s3)
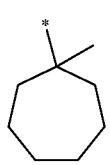
(r-pr-s4)
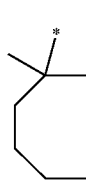
(r-pr-s5)
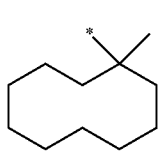
(r-pr-s6)
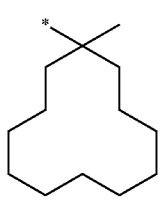
(r-pr-s7)
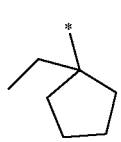
(r-pr-s8)
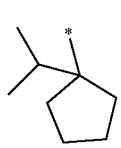
(r-pr-s9)
(r-pr-s10)
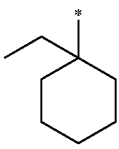
(r-pr-s11)
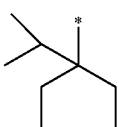
(r-pr-s12)
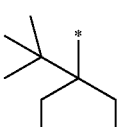
(r-pr-s13)
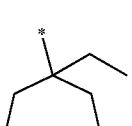
(r-pr-s14)
(r-pr-s15)
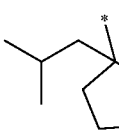
(r-pr-s16)
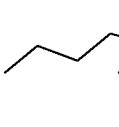
(r-pr-s17)
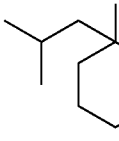
(r-pr-s18)
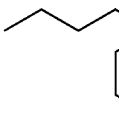
(r-pr-s19)
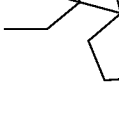

-continued
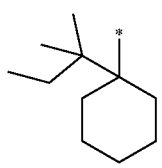 (r-pr-s20)
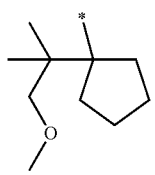 (r-pr-sp1)
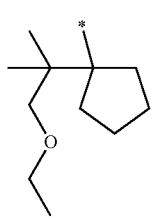 (r-pr-sp2)
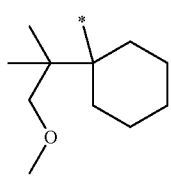 (r-pr-sp3)
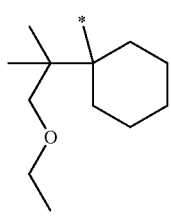 (r-pr-sp4)
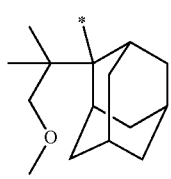 (r-pr-sp5)
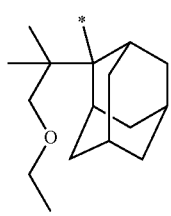 (r-pr-sp6)
Specific examples of the group represented by General Formula (a1-r2-2) are shown below.
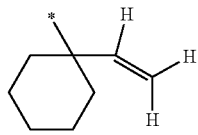 (r-pr-sv1)
-continued
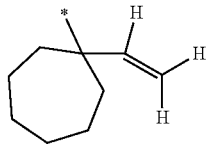 (r-pr-sv2)
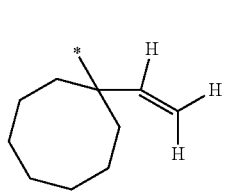 (r-pr-sv3)
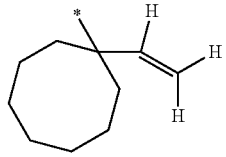 (r-pr-sv4)
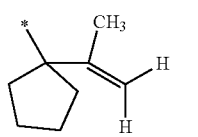 (r-pr-sv5)
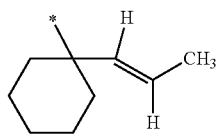 (r-pr-sv6)
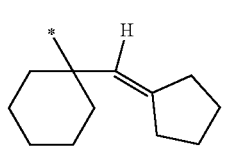 (r-pr-sv7)
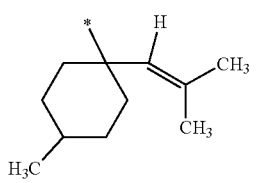 (r-pr-sv8)
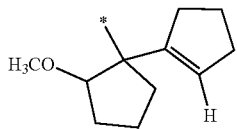 (r-pr-sv9)
 (r-pr-sv10)
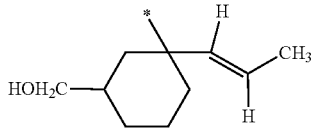 (r-pr-sv11)

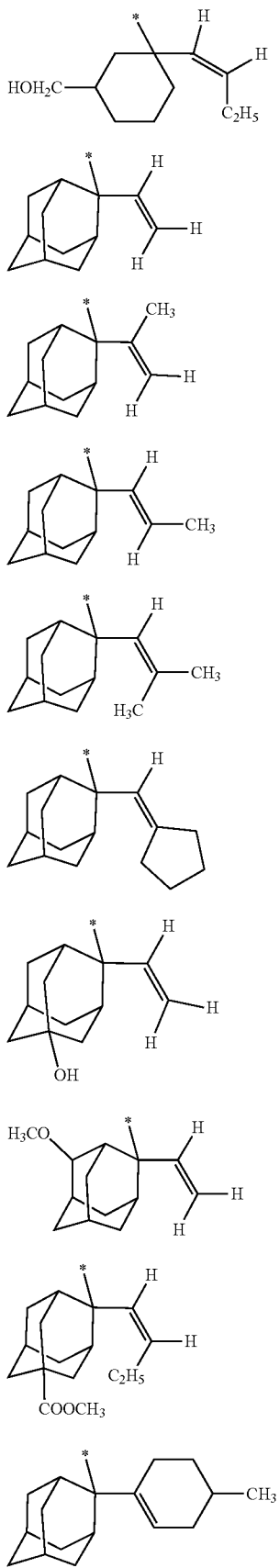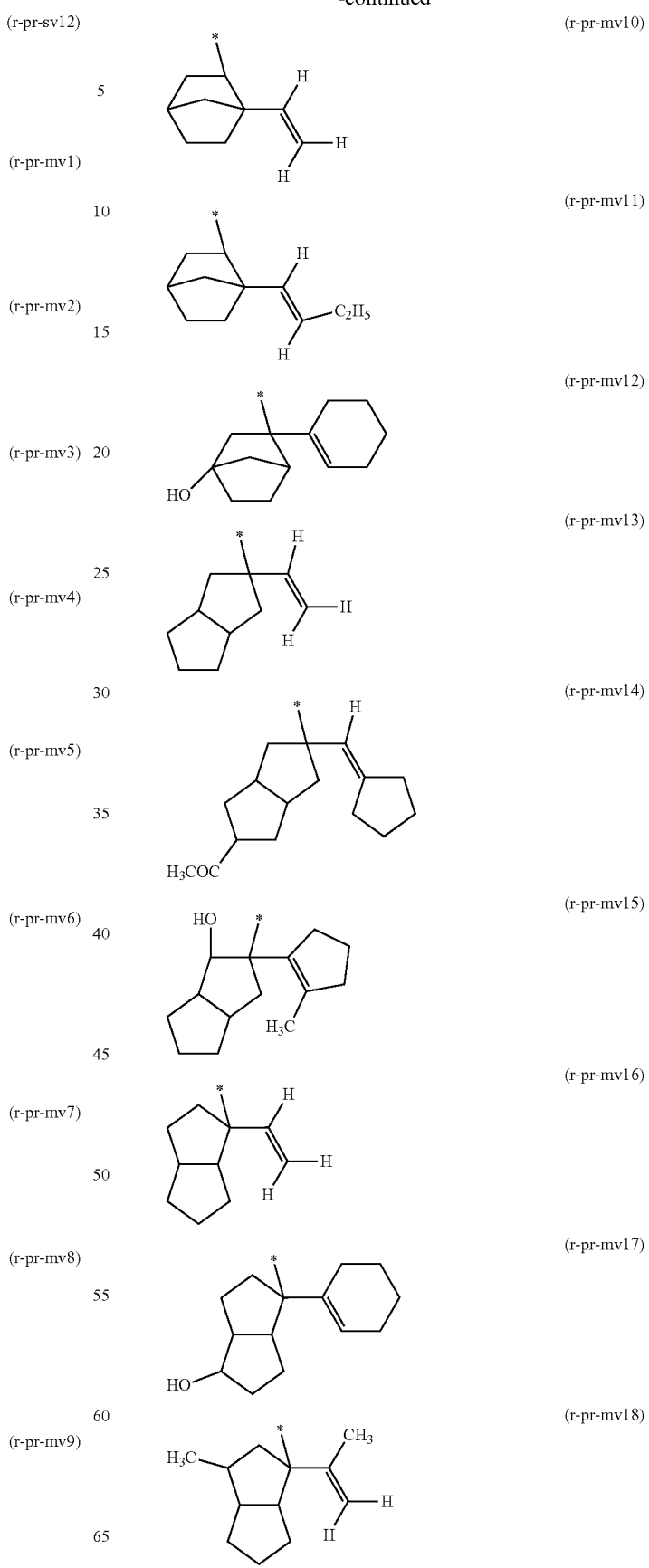

(r-pr-mv19)
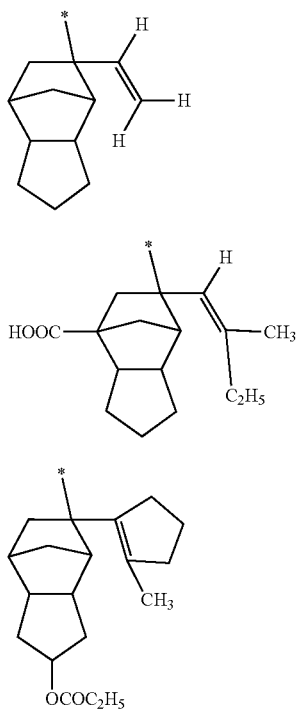
(r-pr-mv20)
(r-pr-mv21)
(r-pr-sa5)
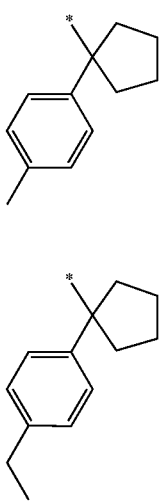
(r-pr-sa6)
Specific examples of the group represented by General Formula (a1-r2-3) are shown below.
(r-pr-sa1)
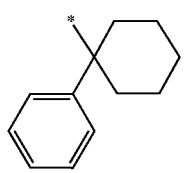
(r-pr-sa7)
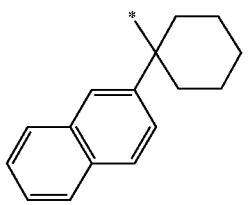
(r-pr-sa2)
(r-pr-sa8)
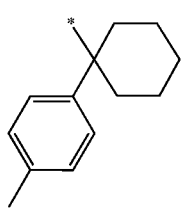
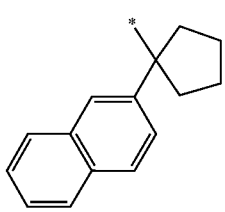
(r-pr-sa3)
(r-pr-sa9)
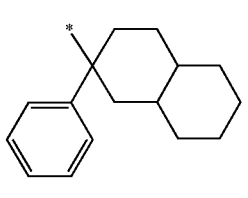
(r-pr-ma1)
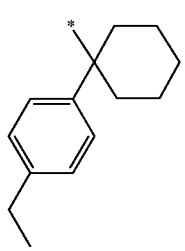
(r-pr-sa4)
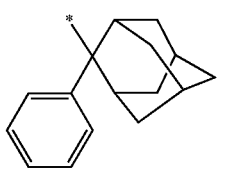
(r-pr-ma2)
Specific examples of the group represented by General Formula (a1-r2-4) are shown below.

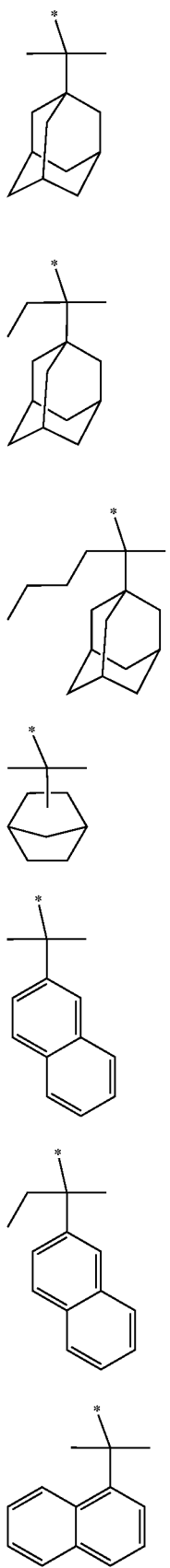
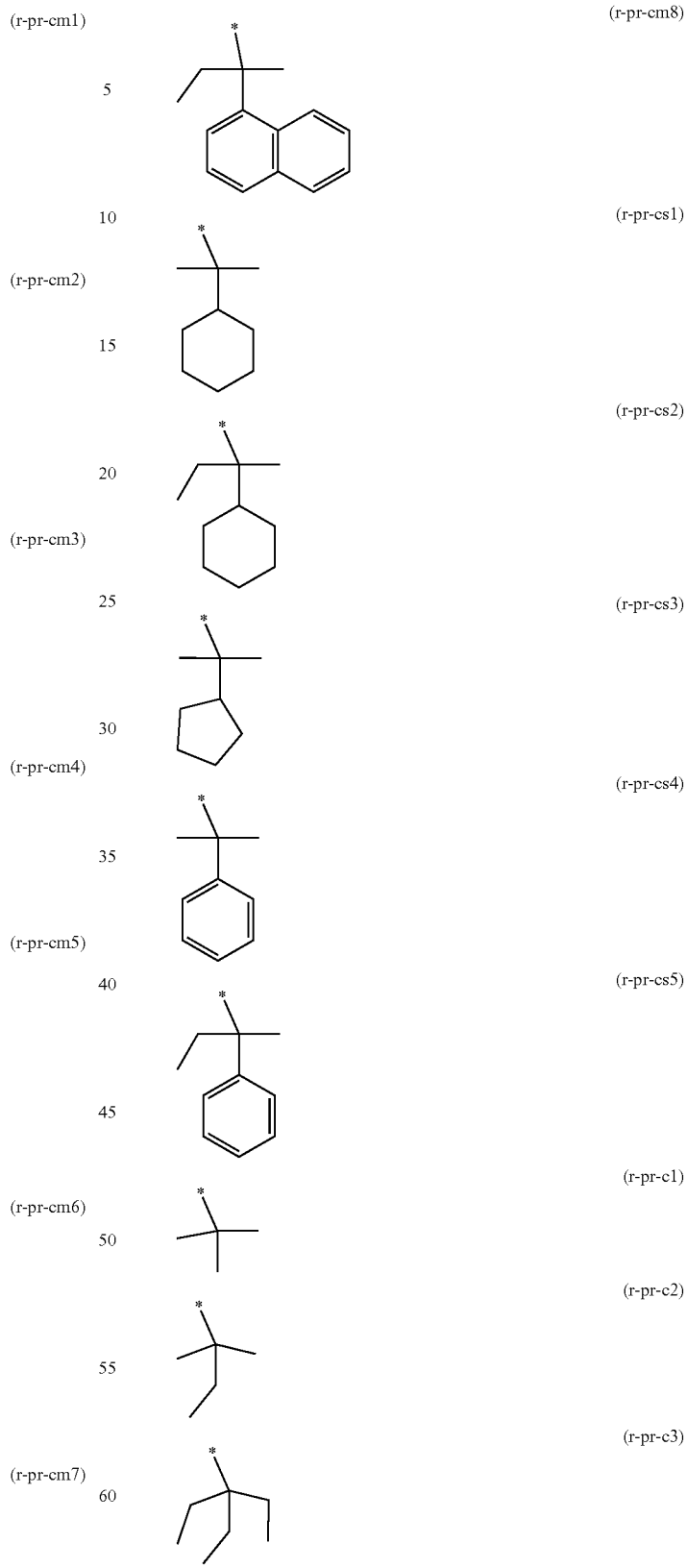
Tertiary Alkyloxycarbonyl Acid Dissociable Group:
Among the polar groups, examples of the acid dissociable group for protecting a hydroxyl group include an acid dissociable group (hereinafter, for convenience, also referred to as a "tertiary alkyloxycarbonyl acid dissociable group") represented by General Formula (a1-r-3) shown below.

(a1-r-3)

[In the formula, $Ra'^7$ to $Ra'^9$ each represents an alkyl group.]

In General Formula (a1-r-3), $Ra'^7$ to $Ra'^9$ are each preferably an alkyl group having 1 to 5 carbon atoms and more preferably an alkyl group having 1 to 3 carbon atoms.

Further, the total number of carbon atoms in each of the alkyl groups is preferably in a range of 3 to 7, more preferably in a range of 3 to 5, and most preferably 3 or 4.

Examples of the constitutional unit (a1) include a constitutional unit derived from acrylic acid ester in which the hydrogen atom bonded to the carbon atom at the α-position may be substituted with a substituent; a constitutional unit derived from acrylamide; a constitutional unit in which at least part of hydrogen atoms in a hydroxyl group of a constitutional unit derived from hydroxystyrene or a hydroxystyrene derivative are protected by a substituent including an acid decomposable group; and a constitutional unit in which at least part of hydrogen atoms in —C(=O)—OH of a constitutional unit derived from vinylbenzoic acid or a vinylbenzoic acid derivative are protected by the substituent including an acid decomposable group.

Among the above, the constitutional unit (a1) is preferably a constitutional unit derived from acrylic acid ester in which the hydrogen atom bonded to the carbon atom at the α-position may be substituted with a substituent.

Preferred specific examples of such a constitutional unit (a1) include constitutional units represented by General Formula (a1-1) or (a1-2).

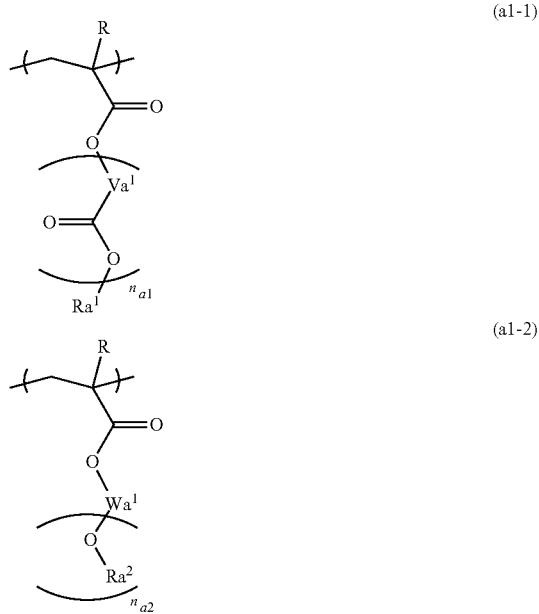

(a1-1)

(a1-2)

[In the formula, R represents a hydrogen atom, an alkyl group having 1 to 5 carbon atoms, or a halogenated alkyl group having 1 to 5 carbon atoms. $Va^1$ represents a divalent hydrocarbon group which may have an ether bond. $n_{a1}$ represents an integer in a range of 0 to 2. $Ra^1$ is an acid dissociable group represented by General Formula (a1-r-1) or (a1-r-2). $Wa^1$ represents an $(n_{a2}+1)$-valent hydrocarbon group, $n_{a2}$ represents an integer in a range of 1 to 3, and $Ra^2$ represents an acid dissociable group represented by General Formula (a1-r-1) or (a1-r-3).]

In General Formula (a1-1), the alkyl group having 1 to 5 carbon atoms as R is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which part or all of hydrogen atoms in the alkyl group having 1 to 5 carbon atoms have been substituted with a halogen atom. The halogen atom is particularly preferably a fluorine atom.

R is preferably a hydrogen atom, an alkyl group having 1 to 5 carbon atoms, or a fluorinated alkyl group having 1 to 5 carbon atoms, and most preferably a hydrogen atom or a methyl group in terms of industrial availability.

In General Formula (a1-1), the divalent hydrocarbon group as $Va^1$ may be an aliphatic hydrocarbon group or an aromatic hydrocarbon group.

The aliphatic hydrocarbon group as the divalent hydrocarbon group represented by $Va^1$ may be saturated or unsaturated. In general, it is preferable that the aliphatic hydrocarbon group is saturated.

Specific examples of the aliphatic hydrocarbon group include a linear or branched aliphatic hydrocarbon group, and an aliphatic hydrocarbon group containing a ring in the structure thereof.

The linear aliphatic hydrocarbon group described above preferably has 1 to 10 carbon atoms, more preferably 1 to 6 carbon atoms, still more preferably 1 to 4 carbon atoms, and most preferably 1 to 3 carbon atoms.

The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group described above preferably has 2 to 10 carbon atoms, more preferably 3 to 6 carbon atoms, still more preferably 3 or 4 carbon atoms, and most preferably 3 carbon atoms.

The branched aliphatic hydrocarbon group is preferably a branched alkylene group, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. The alkyl group in the alkylalkylene group is preferably a linear alkyl group having 1 to 5 carbon atoms.

Examples of the aliphatic hydrocarbon group containing a ring in the structure thereof include an alicyclic hydrocarbon group (a group obtained by removing two hydrogen atoms from an aliphatic hydrocarbon ring), a group obtained by bonding the alicyclic hydrocarbon group to the terminal of a linear or branched aliphatic hydrocarbon group, and a group obtained by interposing the alicyclic hydrocarbon group is in a linear or branched aliphatic hydrocarbon group. Examples of the linear or branched aliphatic hydrocarbon group include the same one as the above-described linear aliphatic hydrocarbon group or the above-described branched aliphatic hydrocarbon group.

The alicyclic hydrocarbon group preferably has 3 to 20 carbon atoms and more preferably 3 to 12 carbon atoms.

The alicyclic hydrocarbon group may be a polycyclic group or a monocyclic group. The monocyclic alicyclic hydrocarbon group is preferably a group obtained by removing two hydrogen atoms from a monocycloalkane. The monocycloalkane preferably has 3 to 6 carbon atoms, and specific examples thereof include cyclopentane and cyclohexane. The polycyclic alicyclic hydrocarbon group is preferably a group obtained by removing two hydrogen atoms from a polycycloalkane, and the polycycloalkane is preferably a group having 7 to 12 carbon atoms. Specific examples of the polycyclic alicyclic hydrocarbon group include adamantane, norbornane, isobornane, tricyclodecane, and tetracyclododecane.

The aromatic hydrocarbon group as the divalent hydrocarbon group represented by $Va^1$ is a hydrocarbon group having an aromatic ring.

The aromatic hydrocarbon group preferably has 3 to 30 carbon atoms, more preferably 5 to 30 carbon atoms, still more preferably 5 to 20 carbon atoms, particularly preferably 6 to 15 carbon atoms, and most preferably 6 to 12 carbon atoms. Here, the number of carbon atoms in a substituent is not included in the number of carbon atoms.

Specific examples of the aromatic ring contained in the aromatic hydrocarbon group include aromatic hydrocarbon rings such as benzene, biphenyl, fluorene, naphthalene, anthracene, and phenanthrene; and an aromatic heterocyclic ring obtained by substituting a part of carbon atoms constituting the above-described aromatic hydrocarbon ring with a hetero atom. Examples of the hetero atom in the aromatic heterocyclic rings include an oxygen atom, a sulfur atom, and a nitrogen atom.

Specific examples of the aromatic hydrocarbon group include a group obtained by removing two hydrogen atoms from the above-described aromatic hydrocarbon ring (an arylene group); and a group in which one hydrogen atom of a group (an aryl group) formed by removing one hydrogen atom from the aromatic hydrocarbon ring has been substituted with an alkylene group (for example, a group obtained by further removing one hydrogen atom from an aryl group in arylalkyl groups such as a benzyl group, a phenethyl group, a 1-naphthylmethyl group, a 2-naphthylmethyl group, a 1-naphthylethyl group, or a 2-naphthylethyl group). The alkylene group (an alkyl chain in the arylalkyl group) preferably has 1 to 4 carbon atoms, more preferably 1 or 2 carbon atoms, and particularly preferably 1 carbon atom.

In General Formula (a1-1), $Ra^1$ is an acid dissociable group represented by General Formula (a1-r-1) or (a1-r-2).

In General Formula (a1-2), the $(n_{a2}+1)$-valent hydrocarbon group as $Wa^1$ may be an aliphatic hydrocarbon group or an aromatic hydrocarbon group. The aliphatic hydrocarbon group indicates a hydrocarbon group that has no aromaticity and may be saturated or unsaturated. In general, it is preferable that the aliphatic hydrocarbon group is saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof.

The valency of $(n_{a2}+1)$ is preferably divalent, trivalent, or tetravalent, and more preferably divalent or trivalent.

In General Formula (a1-2), $Ra^2$ is an acid dissociable group represented by General Formula (a1-r-1) or (a1-r-3).

Specific examples of the constitutional unit represented by General Formula (a1-1) are shown below. In each of the formulae shown below, Ra represents a hydrogen atom, a methyl group, or a trifluoromethyl group.

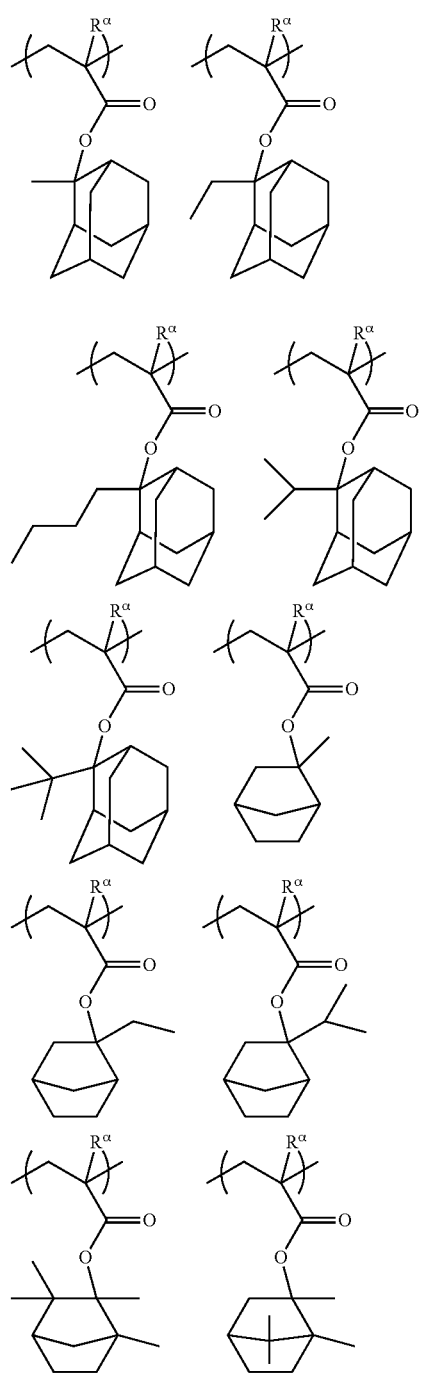

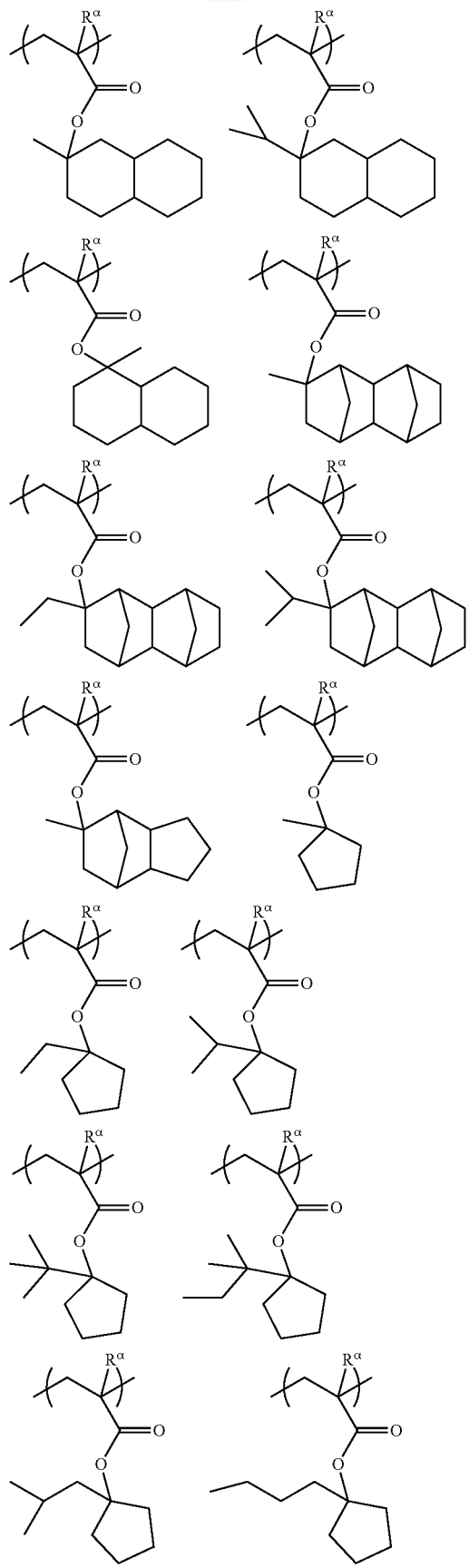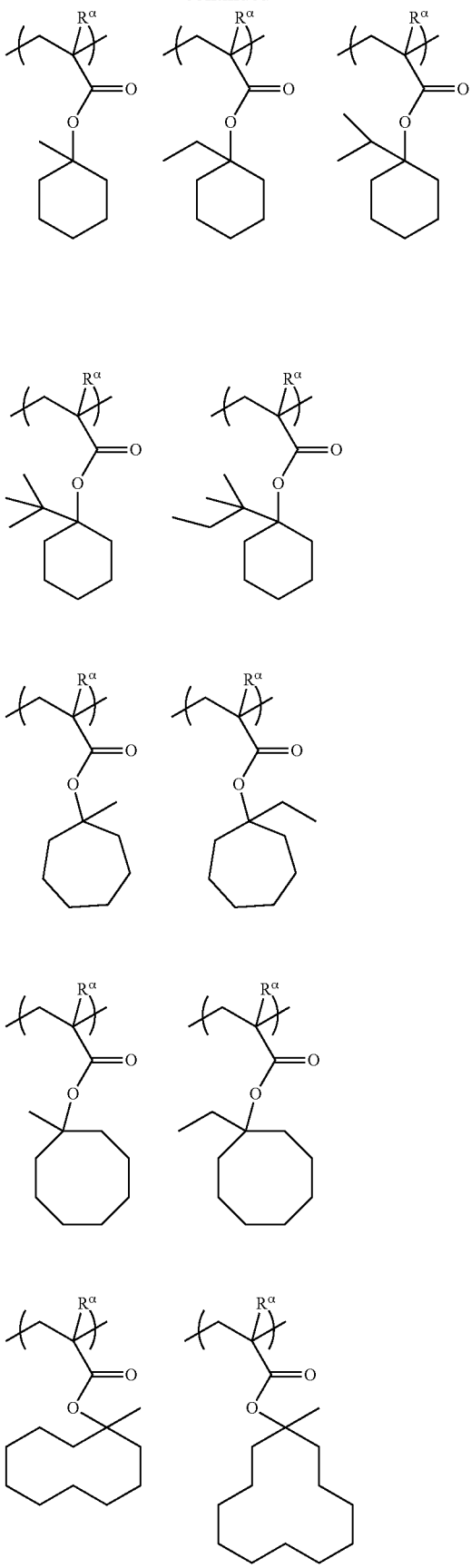

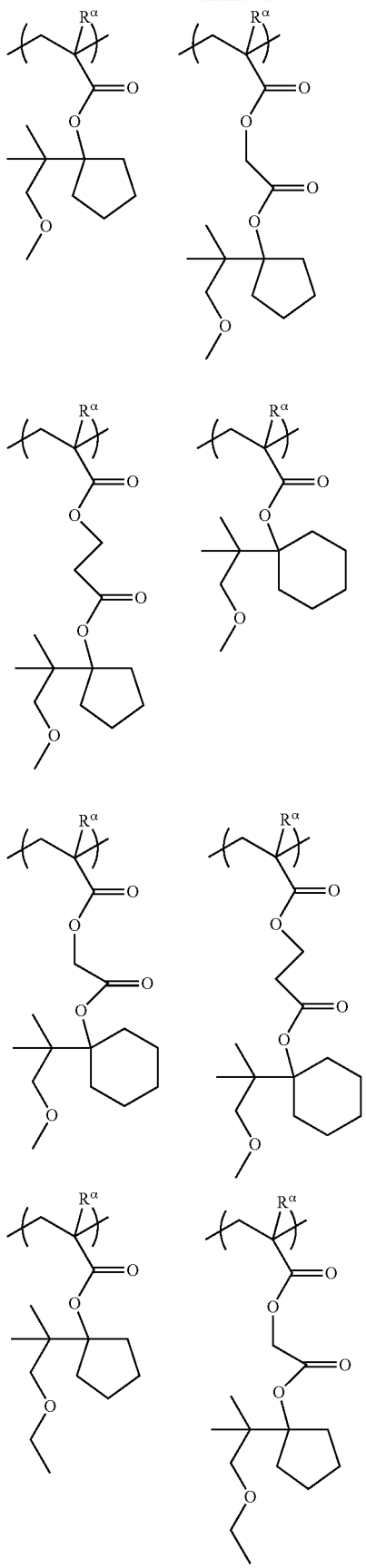
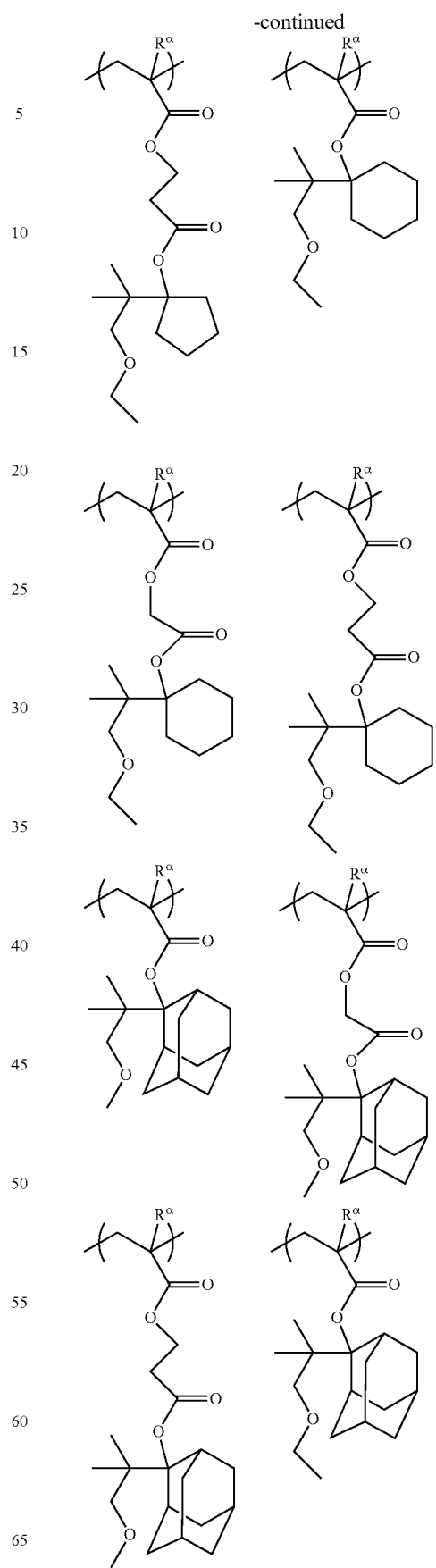

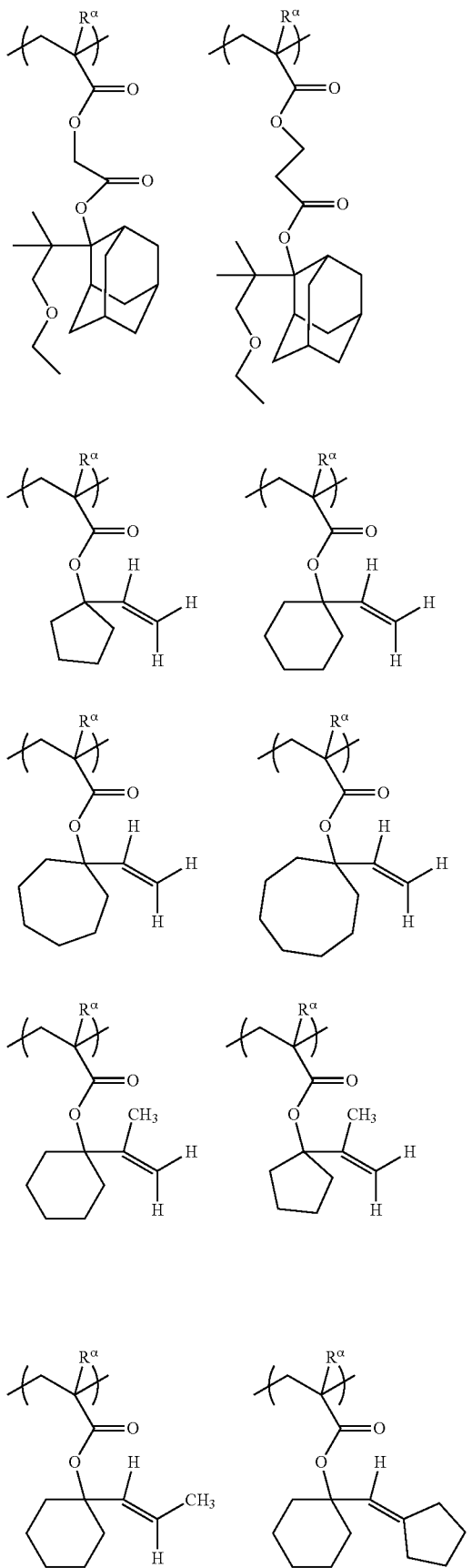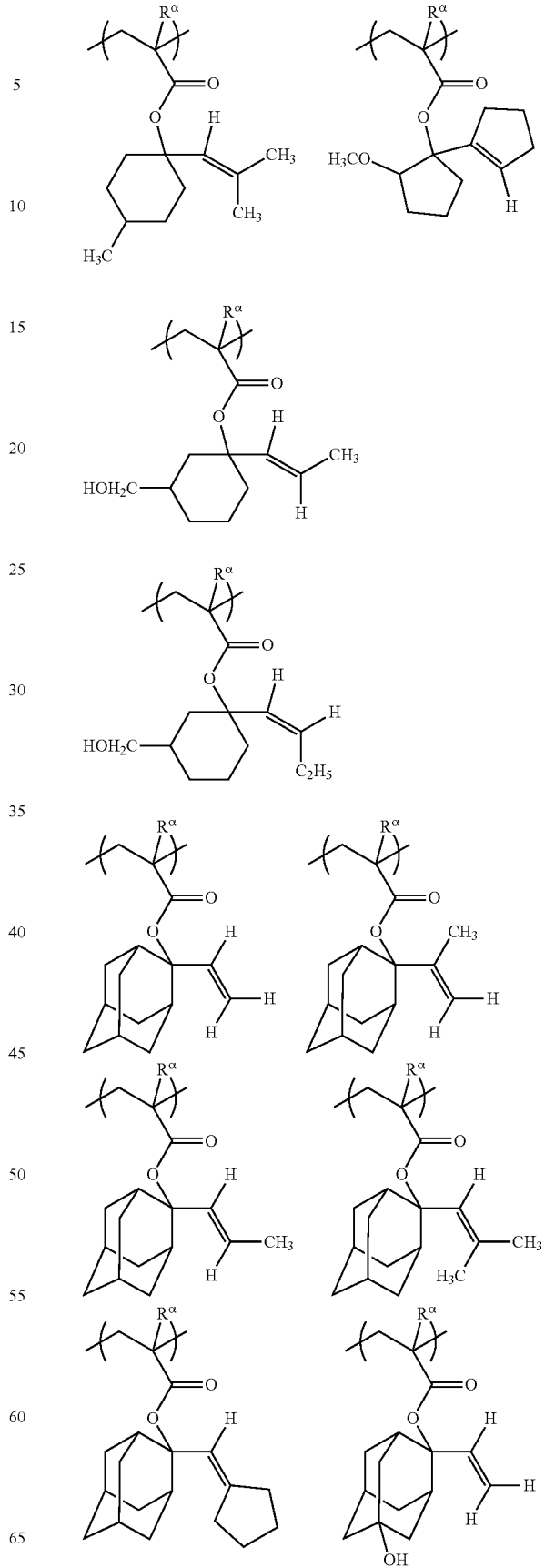

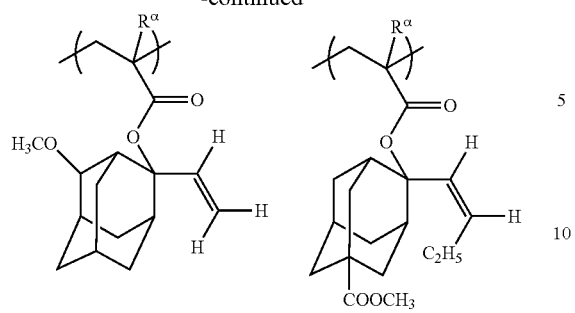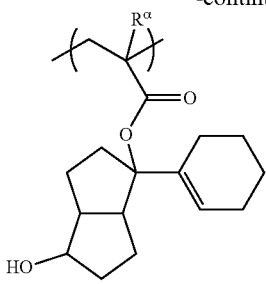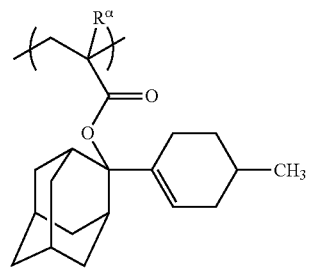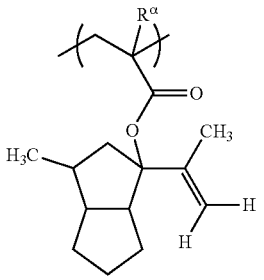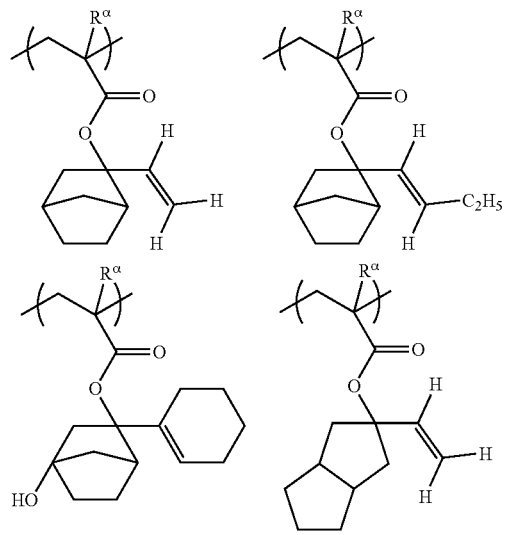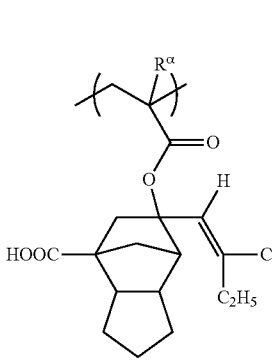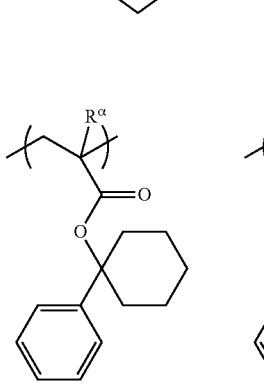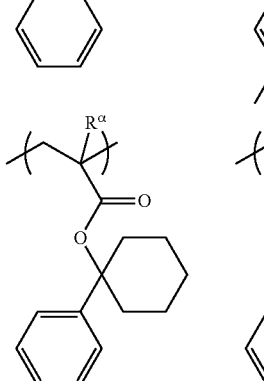

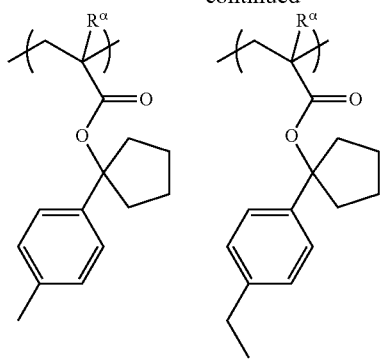
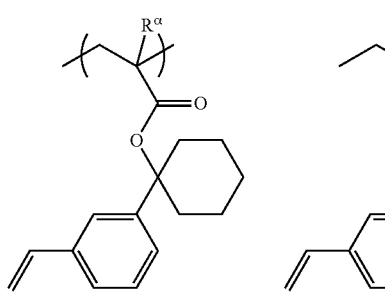
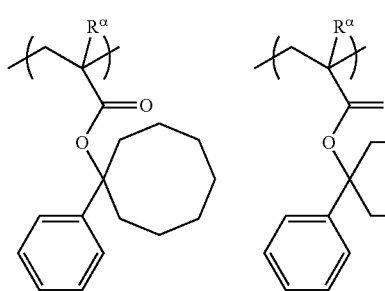
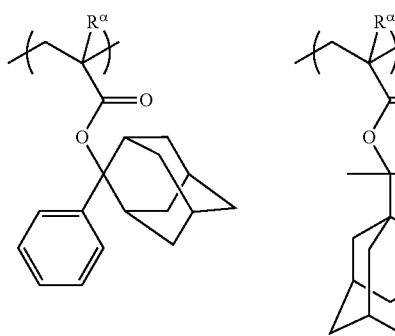
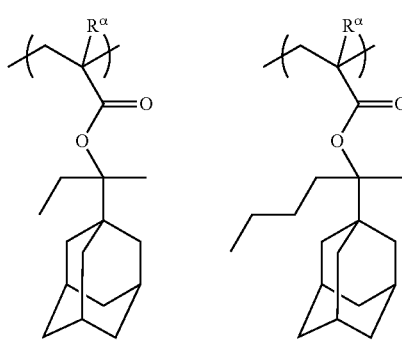
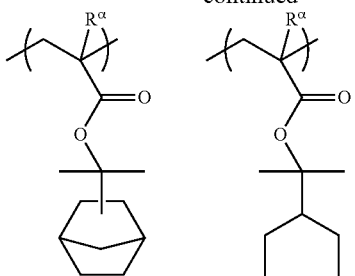
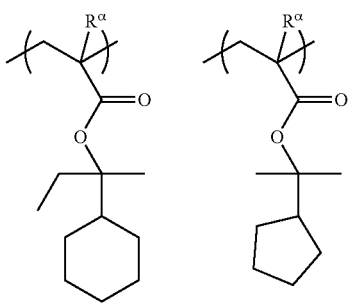
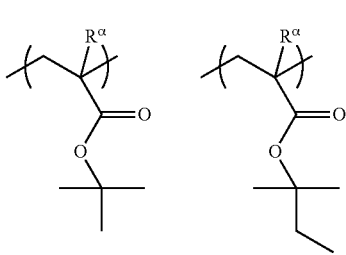
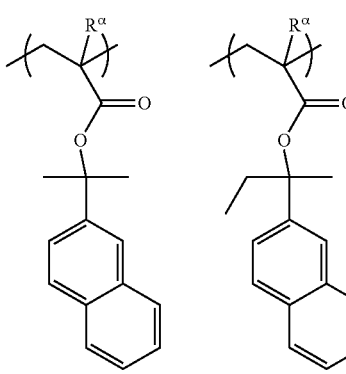
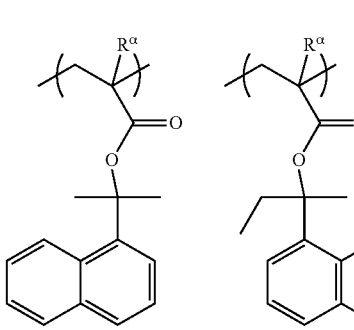

-continued

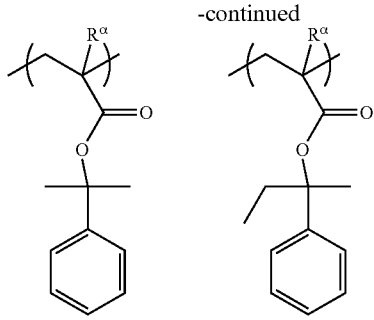

The constitutional unit (a1) contained in the component (A1) may be one kind or may be two or more kinds.

The constitutional unit (a1) is more preferably a constitutional unit represented by General Formula (a1-1) since lithography characteristics (sensitivity, shape, and the like) in lithography depending on an electron beam or EUV can be more easily increased.

Among these, the constitutional unit (a1) particularly preferably includes a constitutional unit represented by General Formula (a1-1-1) shown below.

(a1-1-1)

[In the formula, $Ra^{1\prime\prime\prime}$ is an acid dissociable group represented by General Formula (a1-r2-1), (a1-r2-3), or (a1-r2-4).]

In General Formula (a1-1-1), R, $Va^1$, and $n_{a1}$ are each the same as R, $Va^1$, and $n_{a1}$ in General Formula (a1-1).

The description for the acid dissociable group represented by General Formula (a1-r2-1), (a1-r2-3), or (a1-r2-4) is as described above. Among them, it is preferable to select a group in which the acid dissociable group is a cyclic group due to the fact that the reactivity can be increased, which is suitable for EB or EUV.

In General Formula (a1-1-1), $Ra^{1\prime\prime\prime}$ is preferably, among the above, an acid dissociable group represented by General Formula (a1-r2-1).

The proportion of the constitutional unit (a1) in the component (A1) is preferably in a range of 5% to 95% by mole, more preferably in a range of 10% to 90% by mole, still more preferably in a range of 30% to 70% by mole, and particularly preferably in a range of 40% to 60% by mole, with respect to the total (100% by mole) of all constitutional units constituting the component (A1).

In a case where the proportion of the constitutional unit (a1) is equal to or larger than the lower limit value of the above-described preferred range, lithography characteristics such as sensitivity, resolution, and roughness amelioration are improved. On the other hand, in a case where it is equal to or smaller than the upper limit value of the above-described preferred range, balance with other constitutional units can be obtained, and various lithography characteristics are improved.

<<Other Constitutional Units>>

The component (A1) may have other constitutional units as necessary in addition to the constitutional unit (a1) described above.

Examples of other constitutional units include a constitutional unit (a10) represented by General Formula (a10-1) described later; a constitutional unit (a2) containing a lactone-containing cyclic group, a —$SO_2$—-containing cyclic group, or a carbonate-containing cyclic group; a constitutional unit (a3) containing a polar group-containing aliphatic hydrocarbon group; a constitutional unit (a4) containing an acid non-dissociable aliphatic cyclic group; and a constitutional unit (st) derived from styrene or a styrene derivative.

In regard to constitutional unit (a10):
The constitutional unit (a10) is a constitutional unit represented by General Formula (a10-1).

(a10-1)

[In the formula, R represents a hydrogen atom, an alkyl group having 1 to 5 carbon atoms, or a halogenated alkyl group having 1 to 5 carbon atoms. $Ya^{x1}$ represents a single bond or a divalent linking group. $Wa^{x1}$ represents an aromatic hydrocarbon group which may have a substituent. $n_{ax1}$ represents an integer of 1 or more.]

In General Formula (a10-1), R represents a hydrogen atom, an alkyl group having 1 to 5 carbon atoms, or a halogenated alkyl group having 1 to 5 carbon atoms.

The alkyl group having 1 to 5 carbon atoms as R is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group.

The halogenated alkyl group having 1 to 5 carbon atoms as R is a group obtained by substituting part or all of hydrogen atoms of the above-described alkyl group having 1 to 5 carbon atoms with a halogen atom. The halogen atom is particularly preferably a fluorine atom.

R is preferably a hydrogen atom, an alkyl group having 1 to 5 carbon atoms, or a fluorinated alkyl group having 1 to 5 carbon atoms, and in terms of industrial availability, R is more preferably a hydrogen atom, a methyl group, or trifluoromethyl group, still more preferably a hydrogen atom or a methyl group, and particularly preferably a methyl group.

In General Formula (a10-1), $Ya^{x1}$ represents a single bond or a divalent linking group.

In the chemical formulae described above, the divalent linking group as $Ya^{x1}$ is not particularly limited, and suitable examples thereof include a divalent hydrocarbon group which may have a substituent and a divalent linking group having hetero atoms.

Divalent Hydrocarbon Group which May have Substituent:

In a case where $Ya^{x1}$ represents a divalent hydrocarbon group which may have a substituent, the hydrocarbon group may be an aliphatic hydrocarbon group or an aromatic hydrocarbon group.

Aliphatic Hydrocarbon Group as $Ya^{x1}$

The aliphatic hydrocarbon group indicates a hydrocarbon group that has no aromaticity. The aliphatic hydrocarbon group may be saturated or unsaturated. In general, it is preferable that the aliphatic hydrocarbon group is saturated.

Examples of the aliphatic hydrocarbon group include a linear or branched aliphatic hydrocarbon group, and an aliphatic hydrocarbon group containing a ring in the structure thereof.

Linear or Branched Aliphatic Hydrocarbon Group

The linear aliphatic hydrocarbon group described above preferably has 1 to 10 carbon atoms, more preferably 1 to 6 carbon atoms, still more preferably 1 to 4 carbon atoms, and most preferably 1 to 3 carbon atoms.

The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group described above preferably has 2 to 10 carbon atoms, more preferably 3 to 6 carbon atoms, still more preferably 3 or 4 carbon atoms, and most preferably 3 carbon atoms.

The branched aliphatic hydrocarbon group is preferably a branched alkylene group, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. The alkyl group in the alkylalkylene group is preferably a linear alkyl group having 1 to 5 carbon atoms.

The linear or branched aliphatic hydrocarbon group may have a substituent or may not have a substituent. Examples of the substituent include a fluorine atom, a fluorinated alkyl group having 1 to 5 carbon atoms, which has been substituted with a fluorine atom, and a carbonyl group.

Aliphatic Hydrocarbon Group Containing Ring in Structure Thereof

Examples of the aliphatic hydrocarbon group containing a ring in the structure thereof include a cyclic aliphatic hydrocarbon group which may have a substituent containing a hetero atom in the ring structure thereof (a group obtained by removing two hydrogen atoms from an aliphatic hydrocarbon ring), a group in which the cyclic aliphatic hydrocarbon group is bonded to the terminal of a linear or branched aliphatic hydrocarbon group, and a group in which the cyclic aliphatic hydrocarbon group is interposed in a linear or branched aliphatic hydrocarbon group. Examples of the linear or branched aliphatic hydrocarbon group include the same ones as those described above.

The cyclic aliphatic hydrocarbon group preferably has 3 to 20 carbon atoms and more preferably 3 to 12 carbon atoms.

The cyclic aliphatic hydrocarbon group may be a polycyclic group or a monocyclic group. The monocyclic alicyclic hydrocarbon group is preferably a group obtained by removing two hydrogen atoms from a monocycloalkane. The monocycloalkane preferably has 3 to 6 carbon atoms, and specific examples thereof include cyclopentane and cyclohexane. The polycyclic alicyclic hydrocarbon group is preferably a group obtained by removing two hydrogen atoms from a polycycloalkane, and the polycycloalkane is preferably a group having 7 to 12 carbon atoms. Specific examples of the polycyclic alicyclic hydrocarbon group include adamantane, norbornane, isobornane, tricyclodecane, and tetracyclododecane.

The cyclic aliphatic hydrocarbon group may have or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and still more preferably a methoxy group or an ethoxy group.

The halogen atom as the substituent is preferably a fluorine atom.

Examples of the halogenated alkyl group as the substituent include groups in which part or all of hydrogen atoms in the above-described alkyl groups have been substituted with the above-described halogen atoms.

In the cyclic aliphatic hydrocarbon group, a part of carbon atoms constituting the ring structure thereof may be substituted with a substituent containing a hetero atom. The substituent containing a hetero atom is preferably —O—, —C(=O)—O—, —S—, —S(=O)$_2$—, or —S(=O)$_2$—O—.

Aromatic Hydrocarbon Group as $Ya^{x1}$

The aromatic hydrocarbon group is a hydrocarbon group having at least one aromatic ring.

The aromatic ring is not particularly limited as long as it is a cyclic conjugated system having (4n+2) π electrons, and may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms. Here, the number of carbon atoms in a substituent is not included in the number of carbon atoms.

Specific examples of the aromatic ring include aromatic hydrocarbon rings such as benzene, naphthalene, anthracene, and phenanthrene; and an aromatic heterocyclic ring obtained by substituting a part of carbon atoms constituting the above-described aromatic hydrocarbon ring with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

Specific examples of the aromatic hydrocarbon group include a group obtained by removing two hydrogen atoms from the above-described aromatic hydrocarbon ring or aromatic heterocyclic ring (an arylene group or a heteroarylene group); a group obtained by removing two hydrogen atoms from an aromatic compound having two or more aromatic rings (for example, biphenyl or fluorene); and a group in which one hydrogen atom of a group (an aryl group or a heteroaryl group) obtained by removing one hydrogen atom from the above-described aromatic hydrocarbon ring or aromatic heterocyclic ring has been substituted with an alkylene group (for example, a group in which one hydrogen atom further has been removed from an aryl group in arylalkyl groups such as a benzyl group, a phenethyl group, a 1-naphthylmethyl group, a 2-naphthylmethyl group, a 1-naphthylethyl group, or a 2-naphthylethyl group). The alkylene group bonded to the aryl group or the heteroaryl group preferably has 1 to 4 carbon atoms, more preferably 1 or 2 carbon atoms, and particularly preferably 1 carbon atom.

With respect to the aromatic hydrocarbon group, the hydrogen atom contained in the aromatic hydrocarbon group may be substituted with a substituent. For example, the hydrogen atom bonded to the aromatic ring in the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group having 1 to 5 carbon atoms, and a methyl group, an ethyl group, a propyl group, an n-butyl group, or a tert-butyl group is most preferable.

Examples of the alkoxy group, the halogen atom, and the halogenated alkyl group, as the substituent, include those exemplified as the substituent that is substituted for a hydrogen atom contained in the cyclic aliphatic hydrocarbon group.

Divalent Linking Group Containing Hetero Atom:

In a case where $Ya^{x1}$ represents a divalent linking group containing a hetero atom, preferred examples of the linking group include —O—, —C(=O)—O—, —O—C(=O)—, —C(=O)—, —O—C(=O)—O—, —C(=O)—NH—, —NH—, —NH—C(=NH)— (H may be substituted with a substituent such as an alkyl group, an acyl group, or the like), —S—, —S(=O)$_2$—, —S(=O)$_2$—O—, and a group represented by General Formula —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_m$—, —Y$^{22}$—, —Y$^{21}$—O—C(=O)—Y$^{22}$— or —Y$^{21}$—S(=O)$_2$—O—Y$^{22}$— [in the formulae, Y$^{21}$ and Y$^{22}$ each independently represent a divalent hydrocarbon group which may have a substituent, 0 represents an oxygen atom, and m" represents an integer in a range of 0 to 3].

In a case where the divalent linking group containing a hetero atom is —C(=O)—NH—, —C(=O)—NH—C(=O)—, —NH—, or —NH—C(=NH)—, H may be substituted with a substituent such as an alkyl group, an acyl group, or the like. The substituent (an alkyl group, an acyl group, or the like) preferably has 1 to 10 carbon atoms, more preferably 1 to 8 carbon atoms, and particularly preferably 1 to 5 carbon atoms.

In General Formulae —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_m$—Y$^{22}$—, —Y$^{21}$—O—C(=O)—Y$^{22}$—, and —Y$^{21}$—S(=O)$_2$—O—Y$^{22}$—, Y$^{21}$, and Y$^{22}$ each independently represent a divalent hydrocarbon group which may have a substituent. Examples of the divalent hydrocarbon group include the same ones as those (the divalent hydrocarbon groups which may have a substituent) described in the description of the above divalent linking group as $Ya^{x1}$.

Y$^{21}$ is preferably a linear aliphatic hydrocarbon group, more preferably a linear alkylene group, still more preferably a linear alkylene group having 1 to 5 carbon atoms, and particularly preferably a methylene group or an ethylene group.

Y$^{22}$ is preferably a linear or branched aliphatic hydrocarbon group and more preferably a methylene group, an ethylene group, or an alkylmethylene group. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —[Y$^{21}$—C(=O)—O]$_m$—Y$^{22}$—. m" represents an integer in a range of 0 to 3, preferably an integer in a range of 0 to 2, more preferably 0 or 1, and particularly preferably 1. In other words, it is particularly preferable that the group represented by Formula —[Y$^{21}$—C(=O)—O]$_m$ —Y$^{22}$— represents a group represented by Formula —Y$^{21}$—C(=O)—O—Y$^{22}$—. Among these, a group represented by Formula —(CH$_2$)$_{a'}$—C(=O)—O—(CH$_2$)$_{b'}$— is preferable. In the formula, a' represents an integer in a range of 1 to 10, preferably an integer in a range of 1 to 8, more preferably an integer in a range of 1 to 5, still more preferably 1 or 2, and most preferably 1. b' represents an integer in a range of 1 to 10, preferably an integer in a range of 1 to 8, more preferably an integer in a range of 1 to 5, still more preferably 1 or 2, and most preferably 1.

Among the above, $Ya^{x1}$ is preferably a single bond, an ester bond [—C(=O)—O—, —O—C(=O)—], an ether bond (—O—), a linear or branched alkylene group, or a combination thereof, and more preferably a single bond or an ester bond [—C(=O)—O—, —O—C(=O)—].

In General Formula (a10-1), $Wa^{x1}$ represents an aromatic hydrocarbon group which may have a substituent.

Examples of the aromatic hydrocarbon group as $Wa^{x1}$ include a group obtained by removing ($n_{ax1}$+1) hydrogen atoms from an aromatic ring which may have a substituent. The aromatic ring is not particularly limited as long as it is a cyclic conjugated system having (4n+2) π electrons, and may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms. Specific examples of the aromatic ring include aromatic hydrocarbon rings such as benzene, naphthalene, anthracene, and phenanthrene; and an aromatic heterocyclic ring obtained by substituting a part of carbon atoms constituting the above-described aromatic hydrocarbon ring with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

Examples of the aromatic hydrocarbon group as $Wa^{x1}$ also include a group obtained by removing ($n_{ax1}$+1) hydrogen atoms from an aromatic compound including an aromatic ring (for example, biphenyl or fluorene) which may have two or more substituents.

Among the above, $Wa^{x1}$ is preferably a group obtained by removing ($n_{ax1}$+1) hydrogen atoms from benzene, naphthalene, anthracene, or biphenyl, more preferably a group obtained by removing ($n_{ax1}$+1) hydrogen atoms from benzene or naphthalene, and still more preferably a group obtained by removing ($n_{ax1}$+1) hydrogen atoms from benzene.

The aromatic hydrocarbon group as $Wa^{x1}$ may have a substituent or may not have a substituent. Examples of the substituent include an alkyl group, an alkoxy group, a halogen atom, and a halogenated alkyl group. Examples of the alkyl group, the alkoxy group, the halogen atom, and the halogenated alkyl group, as the substituent, include the same ones as those described as the above-described substituent of the cyclic aliphatic hydrocarbon group as $Ya^{x1}$. The substituent is preferably a linear or branched alkyl group having 1 to 5 carbon atoms, more preferably a linear or branched alkyl group having 1 to 3 carbon atoms, still more preferably an ethyl group or a methyl group, and particularly preferably a methyl group. The aromatic hydrocarbon group as $Wa^{x1}$ preferably has no substituent.

In General Formula (a10-1), $n_{ax1}$ represents an integer of 1 or more, preferably an integer in a range of 1 to 10, more preferably an integer in a range of 1 to 5, still more preferably 1, 2, or 3, and particularly preferably 1 or 2.

Specific examples of the constitutional unit (a10) represented by General Formula (a10-1) are shown below.

In each of the formulae shown below, Ra represents a hydrogen atom, a methyl group, or a trifluoromethyl group.

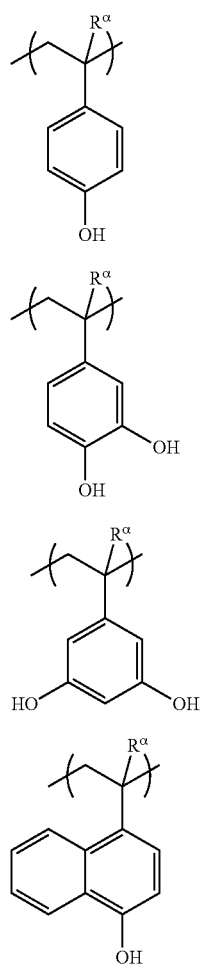

(a10-1-1)

(a10-1-2)

(a10-1-3)

(a10-1-4)

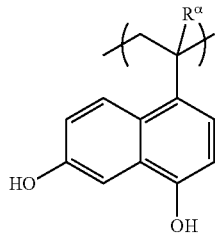

(a10-1-5)

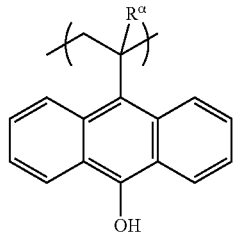

(a10-1-6)

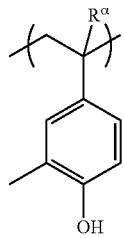

(a10-1-7)

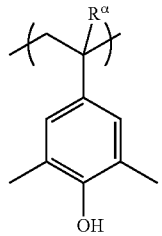

(a10-1-8)

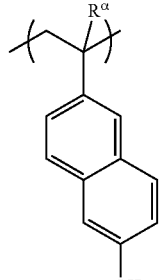

(a10-1-9)

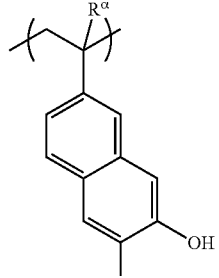

(a10-1-10)

(a10-1-11)
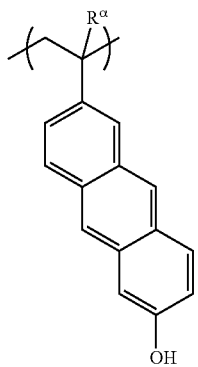
(a10-1-12)
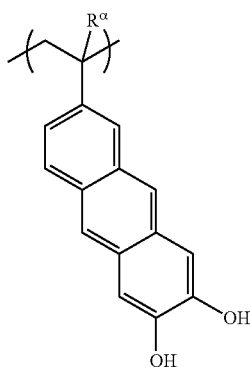
(a10-1-13)
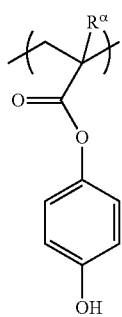
(a10-1-14)
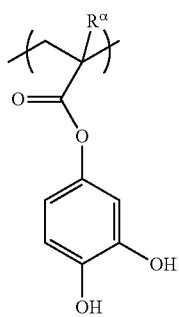
(a10-1-15)
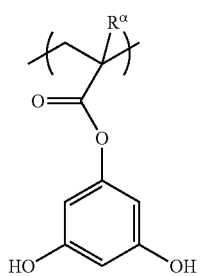
(a10-1-16)
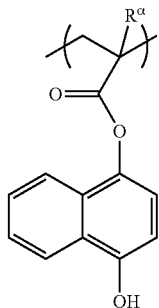
(a10-1-17)
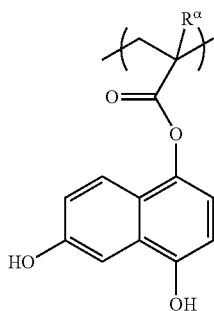
(a10-1-18)
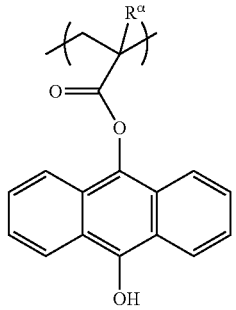
(a10-1-19)
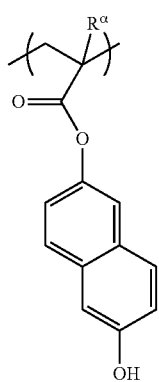

-continued (a10-1-20)
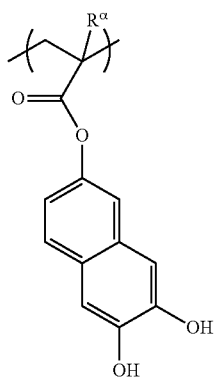

(a10-1-21)
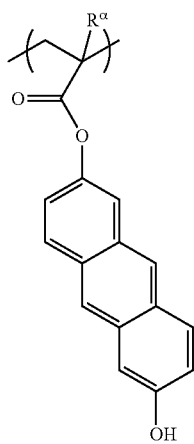

(a10-1-22)
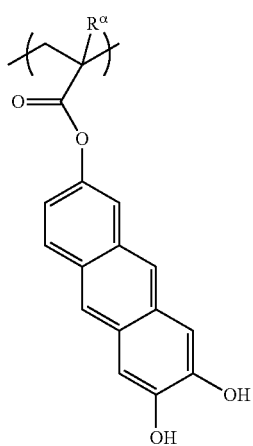

(a10-1-23)
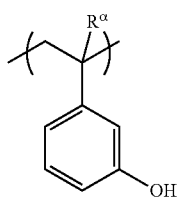

The constitutional unit (a10) contained in the component (A1) may be one kind or may be two or more kinds.

In a case where the component (A1) has the constitutional unit (a10), the proportion of the constitutional unit (a10) in the component (A1) is preferably in a range of 5% to 95% by mole, more preferably in a range of 10% to 90% by mole, still more preferably in a range of 30% to 70% by mole, and particularly preferably in a range of 40% to 60% by mole, with respect to the total (100% by mole) of all constitutional units constituting the component (A1).

In a case where the proportion of the constitutional unit (a10) is equal to or larger than the lower limit value, the sensitivity can be more easily increased. On the other hand, in a case where the proportion of the constitutional unit (a10) is equal to or smaller than the upper limit value, balance with other constitutional units is obtained easily.

In Regard to Constitutional Unit (a2):

The component (A1) may further have, as necessary, a constitutional unit (a2) (provided that a group having the constitutional unit (a1) is excluded) containing a lactone-containing cyclic group, a —$SO_2$—-containing cyclic group, or a carbonate-containing cyclic group, in addition to the constitutional unit (a1).

In a case where the component (A1) is used for forming a resist film, the lactone-containing cyclic group, the —$SO_2$—-containing cyclic group, or the carbonate-containing cyclic group in the constitutional unit (a2) is effective for improving the adhesiveness of the resist film to the substrate. Further, due to having the constitutional unit (a2), lithography characteristics can be improved, for example, by the effects obtained by appropriately adjusting the acid diffusion length, increasing the adhesiveness of the resist film to the substrate, and appropriately adjusting the solubility during development.

The "lactone-containing cyclic group" indicates a cyclic group that contains a ring (lactone ring) containing a —O—C(=O)— in the ring skeleton. In a case where the lactone ring is counted as the first ring and the group contains only the lactone ring, the group is referred to as a monocyclic group. Further, in a case where the group has other ring structures, the group is referred to as a polycyclic group regardless of the structures. The lactone-containing cyclic group may be a monocyclic group or a polycyclic group.

The lactone-containing cyclic group for the constitutional unit (a2) is not particularly limited, and any lactone-containing cyclic group may be used. Specific examples thereof include groups each represented by General Formulae (a2-r-1) to (a2-r-7) shown below.

(a2-r-1)
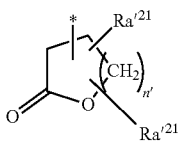

(a2-r-2)
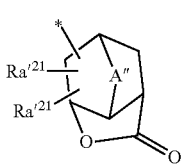

(a2-r-3)
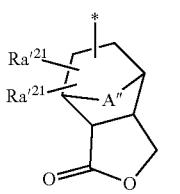

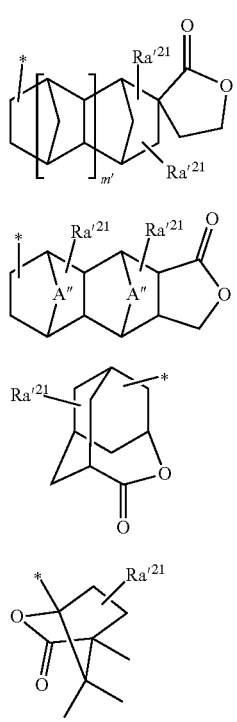

[In the formulae, each $Ra'^{21}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or a —$SO_2$—-containing cyclic group; A" represents an oxygen atom, a sulfur atom, or an alkylene group having 1 to 5 carbon atoms, which may contain an oxygen atom (—O—) or a sulfur atom (—S—); and n' represents an integer in a range of 0 to 2, and m' is 0 or 1.]

In General Formulae (a2-r-1) to (a2-r-7), the alkyl group as $Ra'^{21}$ is preferably an alkyl group having 1 to 6 carbon atoms. The alkyl group is preferably a linear alkyl group or a branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Among these, a methyl group or ethyl group is preferable, and a methyl group is particularly preferable.

The alkoxy group as $Ra'^{21}$ is preferably an alkoxy group having 1 to 6 carbon atoms. Further, the alkoxy group is preferably a linear or branched alkoxy group. Specific examples of the alkoxy groups include a group that is formed by linking the above-described alkyl group mentioned as the alkyl group represented by $Ra'^{21}$ to an oxygen atom (—O—).

The halogen atom as $Ra'^{21}$ is preferably a fluorine atom.

Examples of the halogenated alkyl group as $Ra'^{21}$ include groups in which part or all of hydrogen atoms in the above-described alkyl group as $Ra'^{21}$ have been substituted with the above-described halogen atoms. The halogenated alkyl group is preferably a fluorinated alkyl group and particularly preferably a perfluoroalkyl group.

In —COOR" and —OC(=O)R" as $Ra'^{21}$, R" represents a hydrogen atom, an alkyl group, a lactone-containing cyclic group, a carbonate-containing cyclic group, or a —$SO_2$—-containing cyclic group.

The alkyl group as R" may be linear, branched, or cyclic, and preferably has 1 to 15 carbon atoms.

In a case where R" represents a linear or branched alkyl group, it is preferably an alkyl group having 1 to 10 carbon atoms, more preferably an alkyl group having 1 to 5 carbon atoms, and particularly preferably a methyl group or an ethyl group.

In a case where R" represents a cyclic alkyl group, the cyclic alkyl group preferably has 3 to 15 carbon atoms, more preferably 4 to 12 carbon atoms, and particularly preferably 5 to 10 carbon atoms. Specific examples thereof include a group obtained by removing one or more hydrogen atoms from a monocycloalkane, which may or may not be substituted with a fluorine atom or a fluorinated alkyl group; and a group obtained by removing one or more hydrogen atoms from a polycycloalkane such as bicycloalkane, tricycloalkane, or tetracycloalkane. More specific examples thereof include a group obtained by removing one or more hydrogen atoms from a monocycloalkane such as cyclopentane or cyclohexane; and a group obtained by removing one or more hydrogen atoms from a polycycloalkane such as adamantane, norbornane, isobornane, tricyclodecane, or tetracyclododecane.

Examples of the lactone-containing cyclic group as R" include the same ones as the groups each represented by General Formulae (a2-r-1) to (a2-r-7).

The carbonate-containing cyclic group as R" has the same definition as that for the carbonate-containing cyclic group described below. Specific examples of the carbonate-containing cyclic group include groups each represented by General Formulae (ax3-r-1) to (ax3-r-3).

The —$SO_2$—-containing cyclic group as R" has the same definition as that for the —$SO_2$—-containing cyclic group described below. Specific examples thereof include groups each represented by General Formulae (a5-r-1) to (a5-r-4).

The hydroxyalkyl group as $Ra'^{21}$ preferably has 1 to 6 carbon atoms, and specific examples thereof include a group in which at least one hydrogen atom in the alkyl group as $Ra'^{21}$ has been substituted with a hydroxyl group.

Among the above, each $Ra'^{21}$ is independently preferably a hydrogen atom or a cyano group.

In General Formulae (a2-r-2), (a2-r-3) and (a2-r-5), as the alkylene group having 1 to 5 carbon atoms as A", a linear or branched alkylene group is preferable, and examples thereof include a methylene group, an ethylene group, an n-propylene group, and an isopropylene group. Specific examples of the alkylene groups that contain an oxygen atom or a sulfur atom include a group obtained by interposing —O— or —S— in the terminal of the alkylene group or between the carbon atoms of the alkylene group, and examples thereof include —O—$CH_2$—, —$CH_2$—O—$CH_2$—, —S—$CH_2$—, and —$CH_2$—S—$CH_2$—. A" is preferably an alkylene group having 1 to 5 carbon atoms or —O—, more preferably an alkylene group having 1 to 5 carbon atoms, and most preferably a methylene group.

Specific examples of the groups each represented by General Formulae (a2-r-1) to (a2-r-7) are shown below.

(r-lc-1-1)

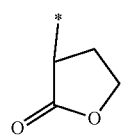

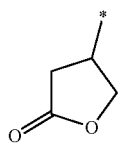 (r-lc-1-2)
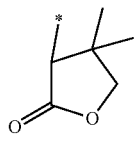 (r-lc-1-3)
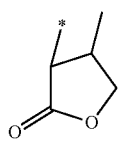 (r-lc-1-4)
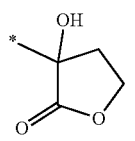 (r-lc-1-5)
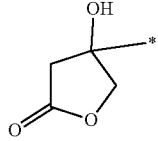 (r-lc-1-6)
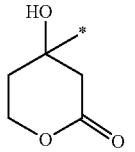 (r-lc-1-7)
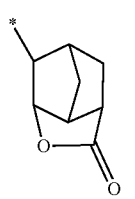 (r-lc-2-1)
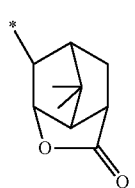 (r-lc-2-2)
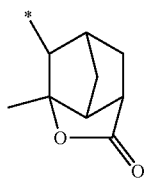 (r-lc-2-3)
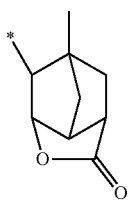 (r-lc-2-4)
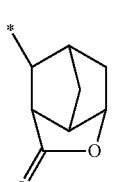 (r-lc-2-5)
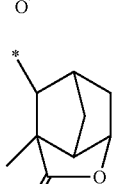 (r-lc-2-6)
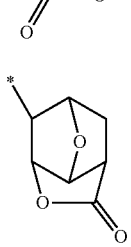 (r-lc-2-7)
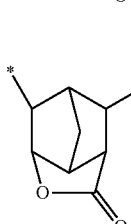 (r-lc-2-8)
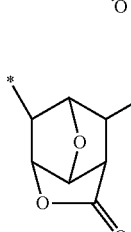 (r-lc-2-9)
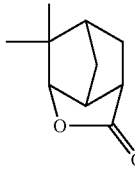 (r-lc-2-10)
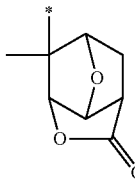 (r-lc-2-11)

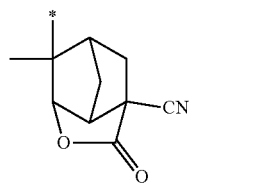 (r-lc-2-12)
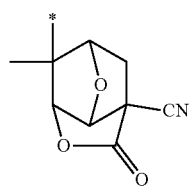 (r-lc-2-13)
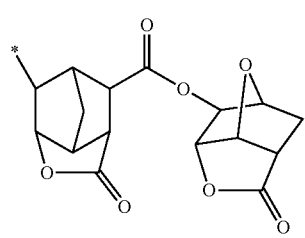 (r-lc-2-14)
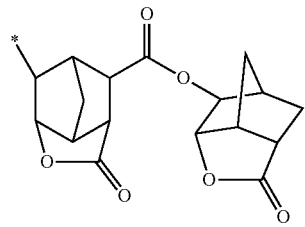 (r-lc-2-15)
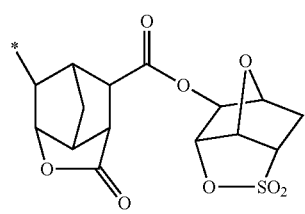 (r-lc-2-16)
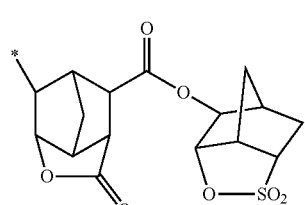 (r-lc-2-17)
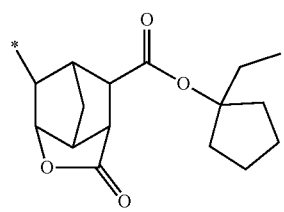 (r-lc-2-18)
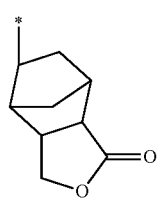 (r-lc-3-1)
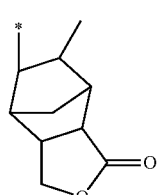 (r-lc-3-2)
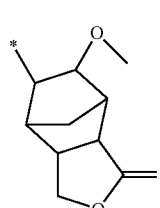 (r-lc-3-3)
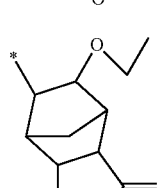 (r-lc-3-4)
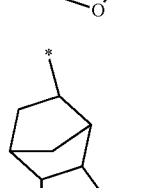 (r-lc-3-5)
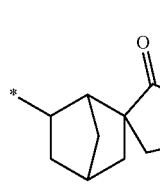 (r-lc-4-1)
(r-lc-4-2)
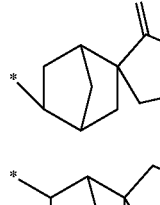 (r-lc-4-3)
(r-lc-4-4)

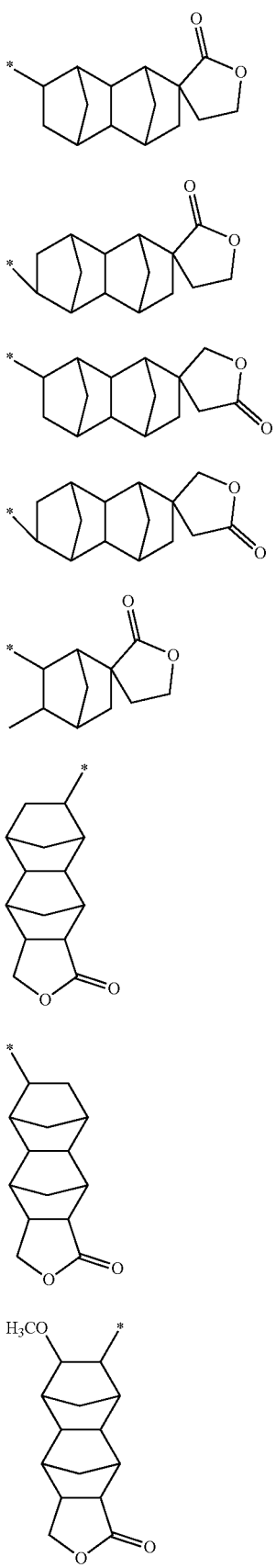
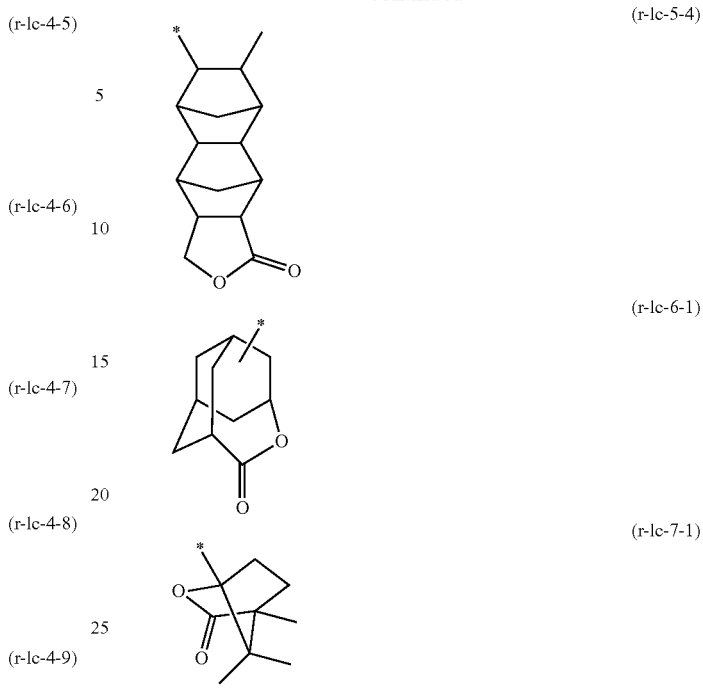

The "—SO$_2$—-containing cyclic group" indicates a cyclic group having a ring containing —SO$_2$— in the ring skeleton thereof. Specifically, it is a cyclic group in which the sulfur atom (S) in —SO$_2$— forms a part of the ring skeleton of the cyclic group. In a case where the ring containing —SO$_2$— in the ring skeleton thereof is counted as the first ring and the group contains only the ring, the group is referred to as a monocyclic group. Further, in a case where the group has other ring structures, the group is referred to as a polycyclic group regardless of the structures. The —SO$_2$—-containing cyclic group may be a monocyclic group or a polycyclic group.

The —SO$_2$—-containing cyclic group is preferably a cyclic group containing —O—SO$_2$— in the ring skeleton thereof, in other words, a cyclic group containing a sultone ring in which —O—S— in the —O—SO$_2$— group forms a part of the ring skeleton thereof.

More specific examples of the —SO$_2$—-containing cyclic group include groups each represented by General Formulae (a5-r-1) to (a5-r-4) shown below.

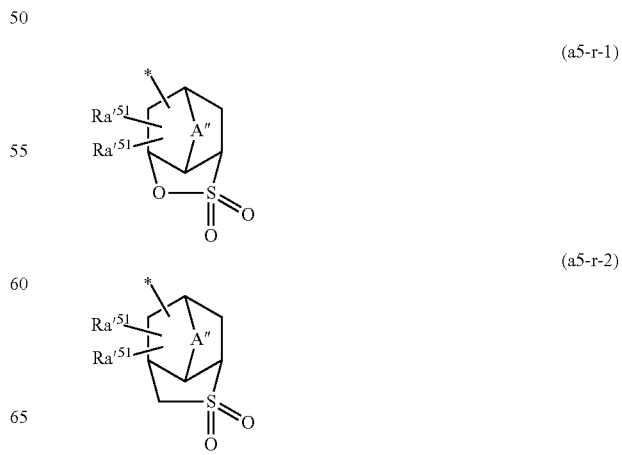

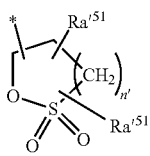
(a5-r-3)

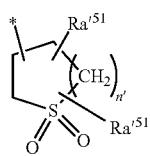
(a5-r-4)

[In the formulae, Ra'⁵¹s each independently represent a hydrogen atom, an alkyl group, an alkoxy group, a halogen atom, a halogenated alkyl group, a hydroxyl group, —COOR″, —OC(=O)R″, a hydroxyalkyl group, or a cyano group; R″ represents a hydrogen atom, an alkyl group, a lactone-containing cyclic group, a carbonate-containing cyclic group, or a —SO$_2$—-containing cyclic group; A″ represents an oxygen atom, a sulfur atom, or an alkylene group having 1 to 5 carbon atoms, which may contain an oxygen atom or a sulfur atom; and n' represents an integer in a range of 0 to 2.]

In General Formulae (a5-r-1) and (a5-r-2), A″ has the same definition as that for A″ in General Formulae (a2-r-2), (a2-r-3) and (a2-r-5).

Examples of the alkyl group, the alkoxy group, the halogen atom, the halogenated alkyl group, —COOR″, —OC(=O)R″, and the hydroxyalkyl group, as Ra'51 include the same ones as those described in the explanation of Ra'²¹ in General Formulae (a2-r-1) to (a2-r-7).

Specific examples of the groups each represented by General Formulae (a5-r-1) to (a5-r-4) are shown below. In the formulae shown below, "Ac" represents an acetyl group.

(r-sl-1-1)

(r-sl-1-2)

(r-sl-1-3)

(r-sl-1-4)

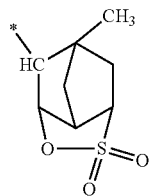

(r-sl-1-5)

(r-sl-1-6)

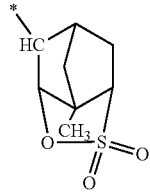

(r-sl-1-7)

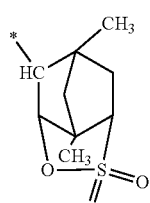

(r-sl-1-8)

(r-sl-1-9)

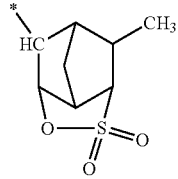

(r-sl-1-10)

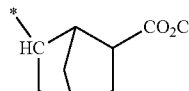

(r-sl-1-11)

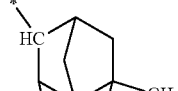

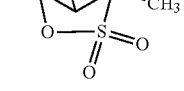

-continued
(r-sl-1-12)
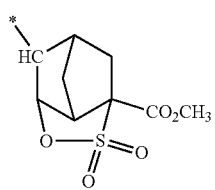
(r-sl-1-13)
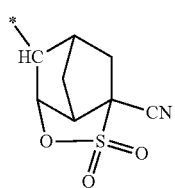
(r-sl-1-14)
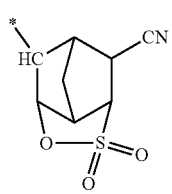
(r-sl-1-15)
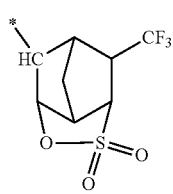
(r-sl-1-16)
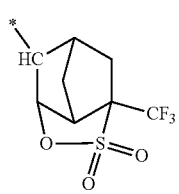
(r-sl-1-17)
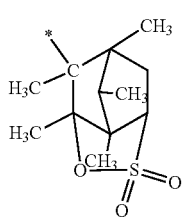
(r-sl-1-18)
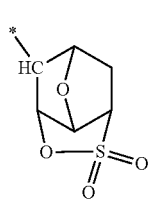
(r-sl-1-19)
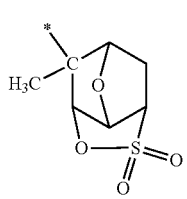
-continued
(r-sl-1-20)
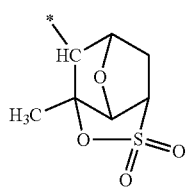
(r-sl-1-21)
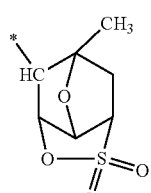
(r-sl-1-22)
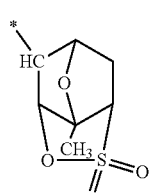
(r-sl-1-23)
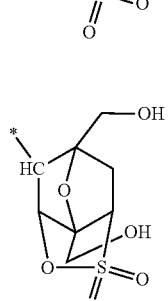
(r-sl-1-24)
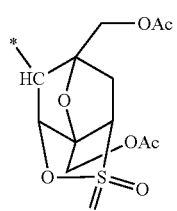
(r-sl-1-25)
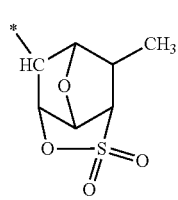
(r-sl-1-26)

(r-sl-1-27)
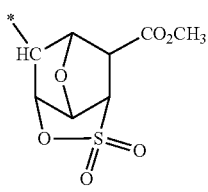

(r-sl-1-28)
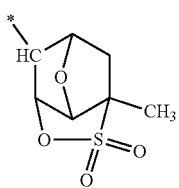

(r-sl-1-29)

(r-sl-1-30)
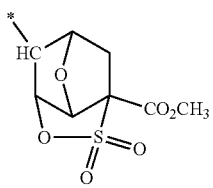

(r-sl-1-31)

(r-sl-1-32)
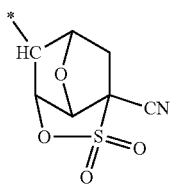

(r-sl-1-33)
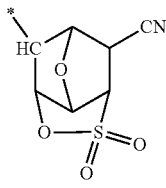

(r-sl-2-1)
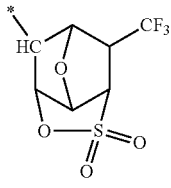

(r-sl-2-2)
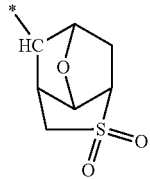

(r-sl-2-3)
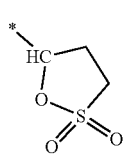

(r-sl-2-4)
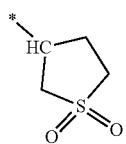

The "carbonate-containing cyclic group" indicates a cyclic group having a ring (a carbonate ring) containing —O—C(=O)—O— in the ring skeleton thereof. In a case where the carbonate ring is counted as the first ring and the group contains only the carbonate ring, the group is referred to as a monocyclic group. Further, in a case where the group has other ring structures, the group is referred to as a polycyclic group regardless of the structures. The carbonate-containing cyclic group may be a monocyclic group or a polycyclic group.

The carbonate ring-containing cyclic group is not particularly limited, and any carbonate ring-containing cyclic group may be used. Specific examples thereof include groups each represented by General Formulae (ax3-r-1) to (ax3-r-3) shown below.

(ax3-r-1)
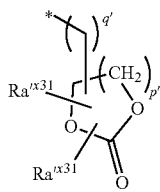

(ax3-r-2)
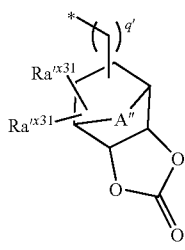

(ax3-r-3)

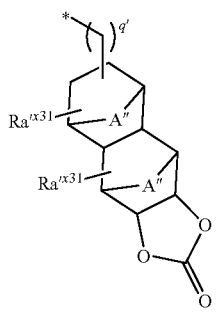

[In the formulae, Ra'ˣ³¹s each independently represent a hydrogen atom, an alkyl group, an alkoxy group, a halogen atom, a halogenated alkyl group, a hydroxyl group, —COOR″, —OC(═O)R″, a hydroxyalkyl group, or a cyano group; R″ represents a hydrogen atom, an alkyl group, a lactone-containing cyclic group, a carbonate-containing cyclic group, or a —$SO_2$—-containing cyclic group; A″ represents an oxygen atom, a sulfur atom, or an alkylene group having 1 to 5 carbon atoms, which may contain an oxygen atom or a sulfur atom; and p′ represents an integer in a range of 0 to 3, and q′ is 0 or 1.]

In General Formulae (ax3-r-2) and (ax3-r-3), A″ has the same definition as that for A″ in General Formulae (a2-r-2), (a2-r-3) and (a2-r-5).

Examples of the alkyl group, the alkoxy group, the halogen atom, the halogenated alkyl group, —COOR″, —OC(═O)R″, and the hydroxyalkyl group, as Ra′31 include the same ones as those described in the explanation Ra′²¹ in General Formulae (a2-r-1) to (a2-r-7).

Specific examples of the groups each represented by General Formulae (ax3-r-1) to (ax3-r-3) are shown below.

(r-cr-1-1)

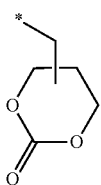

(r-cr-1-2)

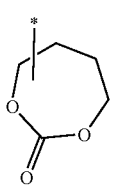

(r-cr-1-3)

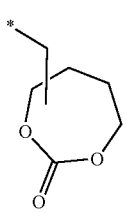

(r-cr-1-4)

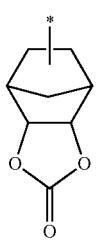

(r-cr-1-5)

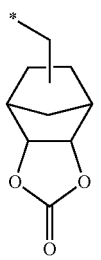

(r-cr-1-6)

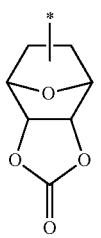

(r-cr-1-7)

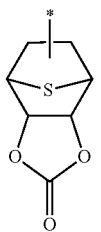

(r-cr-2-1)

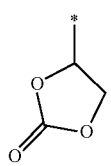

(r-cr-2-2)

(r-cr-2-3)

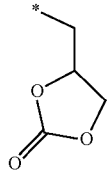

(r-cr-2-4)

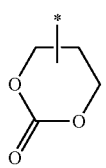

-continued (r-cr-3-1)
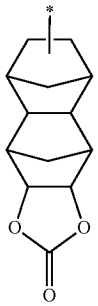

(r-cr-3-2)
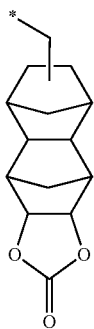

(r-cr-3-3)

(r-cr-3-4)
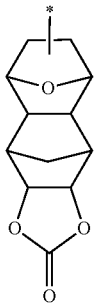

(r-cr-3-5)
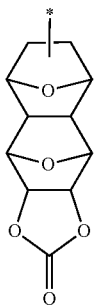

Among them, the constitutional unit (a2) is preferably a constitutional unit derived from acrylic acid ester in which the hydrogen atom bonded to the carbon atom at the α-position may be substituted with a substituent.

The constitutional unit (a2) is preferably a constitutional unit represented by General Formula (a2-1).

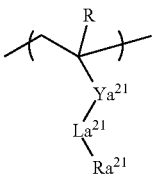

(a2-1)

[In the formula, R represents a hydrogen atom, an alkyl group having 1 to 5 carbon atoms, or a halogenated alkyl group having 1 to 5 carbon atoms. $Ya^{21}$ represents a single bond or a divalent linking group. $La^{21}$ represents —O—, —COO—, —CON(R')—, —OCO—, —CONHCO— or —CONHCS—, and R' represents a hydrogen atom or a methyl group. However, in a case where $La^{21}$ represents —O—, $Ya^{21}$ does not represent —CO—. $Ra^{21}$ represents a lactone-containing cyclic group, a carbonate-containing cyclic group, or a —$SO_2$—-containing cyclic group.]

In General Formula (a2-1), R has the same definition as described above. R is preferably a hydrogen atom, an alkyl group having 1 to 5 carbon atoms, or a fluorinated alkyl group having 1 to 5 carbon atoms, and particularly preferably a hydrogen atom or a methyl group in terms of industrial availability.

In General Formula (a2-1), the divalent linking group as $Ya^{21}$ is not particularly limited, and suitable examples thereof include a divalent hydrocarbon group which may have a substituent and a divalent linking group having a hetero atom.

Divalent Hydrocarbon Group which May have Substituent:

In a case where $Ya^{21}$ represents a divalent hydrocarbon group which may have a substituent, the hydrocarbon group may be an aliphatic hydrocarbon group or an aromatic hydrocarbon group.

Aliphatic Hydrocarbon Group as $Ya^{21}$

The aliphatic hydrocarbon group indicates a hydrocarbon group that has no aromaticity. The aliphatic hydrocarbon group may be saturated or unsaturated. In general, it is preferable that the aliphatic hydrocarbon group is saturated.

Examples of the aliphatic hydrocarbon group include a linear or branched aliphatic hydrocarbon group, and an aliphatic hydrocarbon group containing a ring in the structure thereof.

Linear or Branched Aliphatic Hydrocarbon Group

The linear aliphatic hydrocarbon group described above preferably has 1 to 10 carbon atoms, more preferably 1 to 6 carbon atoms, still more preferably 1 to 4 carbon atoms, and most preferably 1 to 3 carbon atoms.

The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group described above preferably has 2 to 10 carbon atoms, more preferably 3 to 6 carbon atoms, still more preferably 3 or 4 carbon atoms, and most preferably 3 carbon atoms.

The branched aliphatic hydrocarbon group is preferably a branched alkylene group, and specific examples thereof include alkylalkylene groups, for example, alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)$_2$—CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. The alkyl group in the alkylalkylene group is preferably a linear alkyl group having 1 to 5 carbon atoms.

The linear or branched aliphatic hydrocarbon group may have a substituent or may not have a substituent. Examples of the substituent include a fluorine atom, a fluorinated alkyl group having 1 to 5 carbon atoms, which has been substituted with a fluorine atom, and a carbonyl group.

Aliphatic Hydrocarbon Group Containing Ring in Structure Thereof

Examples of the aliphatic hydrocarbon group containing a ring in the structure thereof include a cyclic aliphatic hydrocarbon group which may have a substituent containing a hetero atom in the ring structure thereof (a group obtained by removing two hydrogen atoms from an aliphatic hydrocarbon ring), a group in which the cyclic aliphatic hydrocarbon group is bonded to the terminal of a linear or branched aliphatic hydrocarbon group, and a group in which the cyclic aliphatic hydrocarbon group is interposed in a linear or branched aliphatic hydrocarbon group. Examples of the linear or branched aliphatic hydrocarbon group include the same ones as those described above.

The cyclic aliphatic hydrocarbon group preferably has 3 to 20 carbon atoms and more preferably 3 to 12 carbon atoms.

The cyclic aliphatic hydrocarbon group may be a polycyclic group or a monocyclic group. The monocyclic alicyclic hydrocarbon group is preferably a group obtained by removing two hydrogen atoms from a monocycloalkane. The monocycloalkane preferably has 3 to 6 carbon atoms, and specific examples thereof include cyclopentane and cyclohexane. The polycyclic alicyclic hydrocarbon group is preferably a group obtained by removing two hydrogen atoms from a polycycloalkane, and the polycycloalkane is preferably a group having 7 to 12 carbon atoms. Specific examples of the polycyclic alicyclic hydrocarbon group include adamantane, norbornane, isobornane, tricyclodecane, and tetracyclododecane.

The cyclic aliphatic hydrocarbon group may have or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and still more preferably a methoxy group or an ethoxy group.

The halogen atom as the substituent is preferably a fluorine atom.

Examples of the halogenated alkyl group as the substituent include groups in which part or all of hydrogen atoms in the above-described alkyl groups have been substituted with the above-described halogen atoms.

In the cyclic aliphatic hydrocarbon group, a part of carbon atoms constituting the ring structure thereof may be substituted with a substituent containing a hetero atom. The substituent containing a hetero atom is preferably —O—, —C(=O)—O—, —S—, —S(=O)$_2$—, or —S(=O)$_2$—O—.

Aromatic Hydrocarbon Group as Ya[21]

The aromatic hydrocarbon group is a hydrocarbon group having at least one aromatic ring.

The aromatic ring is not particularly limited as long as it is a cyclic conjugated system having (4n+2) π electrons, and may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms. Here, the number of carbon atoms in a substituent is not included in the number of carbon atoms.

Specific examples of the aromatic ring include aromatic hydrocarbon rings such as benzene, naphthalene, anthracene, and phenanthrene; and an aromatic heterocyclic ring obtained by substituting a part of carbon atoms constituting the above-described aromatic hydrocarbon ring with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

Specific examples of the aromatic hydrocarbon group include a group obtained by removing two hydrogen atoms from the above-described aromatic hydrocarbon ring or aromatic heterocyclic ring (an arylene group or a heteroarylene group); a group obtained by removing two hydrogen atoms from an aromatic compound having two or more aromatic rings (for example, biphenyl or fluorene); and a group in which one hydrogen atom of a group (an aryl group or a heteroaryl group) obtained by removing one hydrogen atom from the above-described aromatic hydrocarbon ring or aromatic heterocyclic ring has been substituted with an alkylene group (for example, a group in which one hydrogen atom further has been removed from an aryl group in arylalkyl groups such as a benzyl group, a phenethyl group, a 1-naphthylmethyl group, a 2-naphthylmethyl group, a 1-naphthylethyl group, or a 2-naphthylethyl group). The alkylene group bonded to the aryl group or the heteroaryl group preferably has 1 to 4 carbon atoms, more preferably 1 or 2 carbon atoms, and particularly preferably 1 carbon atom.

With respect to the aromatic hydrocarbon group, the hydrogen atom contained in the aromatic hydrocarbon group may be substituted with a substituent. For example, the hydrogen atom bonded to the aromatic ring in the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group having 1 to 5 carbon atoms, and a methyl group, an ethyl group, a propyl group, an n-butyl group, or a tert-butyl group is most preferable.

Examples of the alkoxy group, the halogen atom, and the halogenated alkyl group, as the substituent, include those exemplified as the substituent that is substituted for a hydrogen atom contained in the cyclic aliphatic hydrocarbon group.

Divalent Linking Group Containing Hetero Atom:

In a case where Ya[21] represents a divalent linking group containing a hetero atom, preferred examples of the linking group include —O—, —C(=O)—O—, —O—C(=O)—, —C(=O)—, —O—C(=O)—O—, —C(=O)—NH—, —NH—, —NH—C(=NH)— (H may be substituted with a substituent such as an alkyl group, an acyl group, or the like), —S—, —S(=O)$_2$—, —S(=O)$_2$—O—, and a group represented by General Formula —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, —Y$^{21}$—O—C(=O)—Y$^{22}$— or —Y$^{21}$—S(=O)$_2$—O—Y$^{22}$— [in the formulae, Y$^{21}$ and Y$^{22}$ each independently represent a divalent hydrocarbon group which may have a substituent, 0 represents an oxygen atom, and m" represents an integer in a range of 0 to 3].

In a case where the divalent linking group containing a hetero atom is —C(=O)—NH—, —C(=O)—NH—C(=O)—, —NH—, or —NH—C(=NH)—, H may be substituted with a substituent such as an alkyl group, an acyl group, or the like. The substituent (an alkyl group, an acyl group, or the like) preferably has 1 to 10 carbon atoms, more preferably 1 to 8 carbon atoms, and particularly preferably 1 to 5 carbon atoms.

In General Formulae —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, —Y$^{21}$—O—C(=O)—Y$^{22}$—, and —Y$^{21}$—S(=O)$_2$—O—Y$^{22}$—, Y$^{21}$, and Y$^{22}$ each independently represent a divalent hydrocarbon group which may have a substituent. Examples of the divalent hydrocarbon group include the same ones as those (described as the divalent hydrocarbon group which may have a substituent) described in the explanation of the above-described divalent linking group as Ya$^{21}$.

Y$^{21}$ is preferably a linear aliphatic hydrocarbon group, more preferably a linear alkylene group, still more preferably a linear alkylene group having 1 to 5 carbon atoms, and particularly preferably a methylene group or an ethylene group.

Y$^{22}$ is preferably a linear or branched aliphatic hydrocarbon group and more preferably a methylene group, an ethylene group, or an alkylmethylene group. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —[Y$^{21}$—C(=O)—O]$_{m''}$—Y$^{22}$—, m" represents an integer in a range of 0 to 3, preferably an integer in a range of 0 to 2, more preferably 0 or 1, and particularly preferably 1. In other words, it is particularly preferable that the group represented by Formula —[Y$^{21}$—C(=O)—O]$_{m''}$—Y$^{22}$— represents a group represented by Formula —Y$^{21}$—C(=O)—O—Y$^{22}$—. Among these, a group represented by Formula —(CH$_2$)$_{a'}$—C(=O)—O—(CH$_2$)$_{b'}$— is preferable. In the formula, a' represents an integer in a range of 1 to 10, preferably an integer in a range of 1 to 8, more preferably an integer in a range of 1 to 5, still more preferably 1 or 2, and most preferably 1. b' represents an integer in a range of 1 to 10, preferably an integer in a range of 1 to 8, more preferably an integer in a range of 1 to 5, still more preferably 1 or 2, and most preferably 1.

Among the above, Ya$^{21}$ is preferably a single bond, an ester bond [—C(=O)—O—], an ether bond (—O—), a linear or branched alkylene group, or a combination thereof.

In General Formula (a2-1), Ra$^{21}$ represents a lactone-containing cyclic group, a —SO$_2$—-containing cyclic group, or a carbonate-containing cyclic group.

Suitable examples of the lactone-containing cyclic group, the —SO$_2$—-containing cyclic group, and the carbonate-containing cyclic group as Ra$^{21}$ include groups each represented by General Formulae (a2-r-1) to (a2-r-7), groups each represented by General Formulae (a5-r-1) to (a5-r-4), and groups each represented by General Formulae (ax3-r-1) to (ax3-r-3) described above.

Among them, a lactone-containing cyclic group or a —SO$_2$—-containing cyclic group is preferable, groups each represented by General Formula (a2-r-1), (a2-r-2), (a2-r-6), or (a5-r-1) are more preferable, and groups each represented by General Formula (a2-r-2) or (a5-r-1) are still more preferable. Specifically, any one of groups each represented by Chemical Formulae (r-lc-1-1) to (r-lc-1-7), (r-lc-2-1) to (r-lc-2-18), (r-lc-6-1), (r-sl-1-1), or (r-sl-1-18), is preferable, any one of groups each represented by Chemical Formulae (r-lc-2-1) to (r-lc-2-18), or (r-sl-1-1) is more preferable, and any one of groups each represented by Chemical Formula (r-lc-2-1), (r-lc-2-12), or (r-sl-1-1) s still more preferable.

The constitutional unit (a2) contained in the component (A1) may be one kind or may be two or more kinds.

In a case where the component (A1) has the constitutional unit (a2), the proportion of the constitutional unit (a2) is preferably in a range of 5% to 60% by mole, more preferably in a range of 10% to 60% by mole, still more preferably in a range of 20% to 60% by mole, and particularly preferably in a range of 30% to 60% by mole with respect to the total (100% by mole) of all constitutional units constituting the component (A1).

In a case where the proportion of the constitutional unit (a2) is equal to or larger than the lower limit value of the above-described preferred range, the effect obtained by being allowed to contain the constitutional unit (a2) can be sufficiently achieved by the effect described above. In a case where the proportion of the constitutional unit (a2) is equal to or smaller than the upper limit value of the above-described preferred range, balance with other constitutional units can be obtained, and various lithography characteristics are improved.

In Regard to Constitutional Unit (a3):

The component (A1) may further have, as necessary, a constitutional unit (a3) (provided that a constitutional unit corresponding to the constitutional unit (a1) or the constitutional unit (a2) is excluded) containing a polar group-containing aliphatic hydrocarbon group, in addition to the constitutional unit (a1). In a case where the component (A1) has the constitutional unit (a3), the hydrophilicity of the component (A) is increased, which contributes to an improvement in resolution. Further, acid diffusion length can be appropriately adjusted.

Examples of the polar group include a hydroxyl group, a cyano group, a carboxy group, or a hydroxyalkyl group in which a part of hydrogen atoms of the alkyl group have been substituted with a fluorine atom, and the polar group is particularly preferably a hydroxyl group.

Examples of the aliphatic hydrocarbon group include a linear or branched hydrocarbon group (preferably an alkylene group) having 1 to 10 carbon atoms, and a cyclic aliphatic hydrocarbon group (a cyclic group). The cyclic group may be a monocyclic group or a polycyclic group. For example, these cyclic groups can be appropriately selected from a large number of groups that have been proposed in resins for a resist composition for an ArF excimer laser.

In a case where the cyclic group is a monocyclic group, the monocyclic group preferably has 3 to 10 carbon atoms. Among them, a constitutional unit derived from an acrylic acid ester that includes an aliphatic monocyclic group containing a hydroxyl group, cyano group, carboxy group, or a hydroxyalkyl group in which a part of hydrogen atoms of the alkyl group have been substituted with a fluorine atom are particularly preferable. Examples of the monocyclic group include a group obtained by removing two or more hydrogen atoms from a monocycloalkane. Specific examples of the monocyclic group include a group obtained by removing two or more hydrogen atoms from a monocycloalkane such as cyclopentane, cyclohexane, or cyclooctane. Among these monocyclic groups, a group obtained by removing two or more hydrogen atoms from cyclopentane or a group obtained by removing two or more hydrogen atoms from cyclohexane are industrially preferable.

In a case where the cyclic group is a polycyclic group, the polycyclic group preferably has 7 to 30 carbon atoms. Among them, a constitutional unit derived from an acrylic acid ester that includes an aliphatic polycyclic group containing a hydroxyl group, cyano group, carboxy group, or a hydroxyalkyl group in which a part of hydrogen atoms of the alkyl group have been substituted with a fluorine atom is particularly preferable. Examples of the polycyclic group include groups obtained by removing two or more hydrogen atoms from a bicycloalkane, tricycloalkane, tetracycloalkane, or the like. Specific examples thereof include a group obtained by removing two or more hydrogen atoms from a polycycloalkane such as adamantane, norbornane, isobornane, tricyclodecane, or tetracyclododecane. Among these polycyclic groups, a group obtained by removing two or more hydrogen atoms from adamantane, a group obtained by removing two or more hydrogen atoms from norbornane, or a group obtained by removing two or more hydrogen atoms from tetracyclododecane are industrially preferable.

The constitutional unit (a3) is not particularly limited, and any constitutional unit may be used as long as the constitutional unit contains a polar group-containing aliphatic hydrocarbon group.

The constitutional unit (a3) is a constitutional unit derived from acrylic acid ester in which the hydrogen atom bonded to the carbon atom at the α-position may be substituted with a substituent, and a constitutional unit containing a polar group-containing aliphatic hydrocarbon group is preferable.

In a case where the hydrocarbon group in the polar group-containing aliphatic hydrocarbon group is a linear or branched hydrocarbon group having 1 to 10 carbon atoms, the constitutional unit (a3) is preferably a constitutional unit derived from a hydroxyethyl ester of acrylic acid.

Further, as the constitutional unit (a3), in a case where the hydrocarbon group in the polar group-containing aliphatic hydrocarbon group is a polycyclic group, a constitutional unit represented by General Formula (a3-1), a constitutional unit represented by General Formula (a3-2), and a constitutional unit represented by General Formula (a3-3) are preferable, and in a case where the hydrocarbon group is a monocyclic group, a constitutional unit represented by General Formula (a3-4) is preferable.

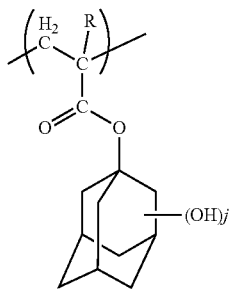

(a3-1)

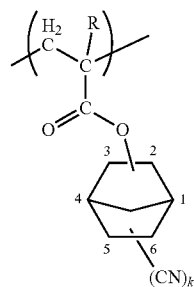

(a3-2)

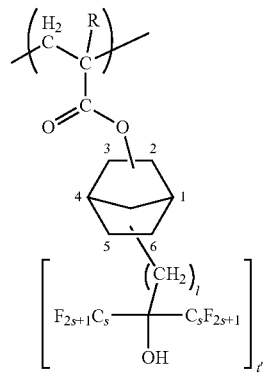

(a3-3)

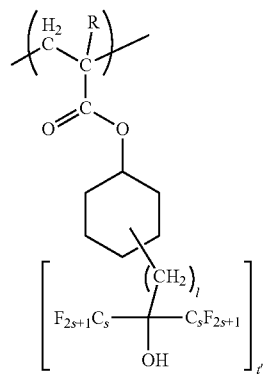

(a3-4)

[In the formulae, R has the same definition as described above, j represents an integer in a range of 1 to 3, k represents an integer in a range of 1 to 3, t' represents an integer in a range of 1 to 3, l represents an integer in a range of 0 to 5, and s represents an integer in a range of 1 to 3.]

In General Formula (a3-1), j preferably represents 1 or 2 and more preferably 1. In a case where j represents 2, it is preferable that the hydroxyl groups are bonded to the 3- and 5-positions of the adamantyl group. In a case where j represents 1, it is preferable that the hydroxyl group is bonded to the 3-position of the adamantyl group.

It is preferable that j represents 1, and it is particularly preferable that the hydroxyl group is bonded to the 3-position of the adamantyl group.

In General Formula (a3-2), k preferably represents 1. The cyano group is preferably bonded to the 5- or 6-position of the norbornyl group.

In General Formula (a3-3), it is preferable that t' represents 1. It is preferable that l represents 1. It is preferable that s represents 1. Further, it is preferable that a 2-norbornyl group or 3-norbornyl group is bonded to the terminal of the carboxy group of the acrylic acid. It is preferable that the fluorinated alkyl alcohol is bonded to the 5- or 6-position of the norbornyl group.

In General Formula (a3-4), it is preferable that t' represents 1 or 2. It is preferable that l represents 0 or 1. It is preferable that s represents 1. It is preferable that the fluorinated alkyl alcohol is bonded to the 3- or 5-position of the cyclohexyl group.

The constitutional unit (a3) contained in the component (A1) may be one kind or may be two or more kinds.

In a case where the component (A1) has the constitutional unit (a3), the proportion of the constitutional unit (a3) is preferably in a range of 1% to 30% by mole, more preferably in a range of 2% to 25% by mole, and still more preferably in a range of 5% to 20% by mole, with respect to the total (100% by mole) of all constitutional units constituting the component (A1).

In a case where the proportion of the constitutional unit (a3) is equal to or larger than the lower limit value of the above-described preferred range, the effect obtained by being allowed to contain the constitutional unit (a3) can be sufficiently achieved by the effect described above. In a case where the proportion of the constitutional unit (a3) is equal to or smaller than the upper limit value of the above-described preferred range, balance with other constitutional units can be obtained, and various lithography characteristics are improved.

In Regard to Constitutional Unit (a4):

The component (A1) may further have, in addition to the constitutional unit (a1), a constitutional unit (a4) containing an acid non-dissociable aliphatic cyclic group.

In a case where the component (A1) has the constitutional unit (a4), the dry etching resistance of the formed resist pattern is improved. Further, the hydrophobicity of the component (A) increases. The improvement in hydrophobicity contributes to the improvement in resolution, a resist pattern shape, and the like, particularly in the case of a solvent developing process.

The "acid non-dissociable cyclic group" in the constitutional unit (a4) is a cyclic group that remains in the constitutional unit without being dissociated even when an acid acts in a case where the acid is generated in the resist composition by exposure (for example, in a case where acid is generated from the constitutional unit that generates acid upon exposure, or the component (B)).

Examples of the constitutional unit (a4) preferably include a constitutional unit derived from an acrylic acid ester including an acid non-dissociable aliphatic cyclic group. As the cyclic group, a large number of cyclic groups known in the related art as cyclic groups used as a resin component of a resist composition for ArF excimer laser, KrF excimer laser (preferably ArF excimer laser), or the like can be used.

The cyclic group is particularly preferably at least one selected from a tricyclodecyl group, an adamantyl group, a tetracyclododecyl group, an isobornyl group, and a norbornyl group, from the viewpoint of industrial availability. These polycyclic groups may have, as a substituent, a linear or branched alkyl group having 1 to 5 carbon atoms.

Specific examples of the constitutional unit (a4) include constitutional units each represented by General Formulae (a4-1) to (a4-7).

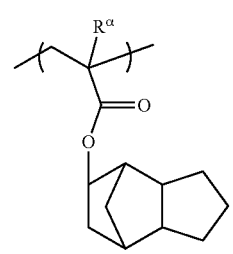
(a4-1)

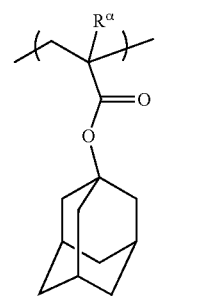
(a4-2)

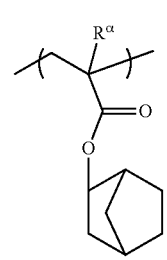
(a4-3)

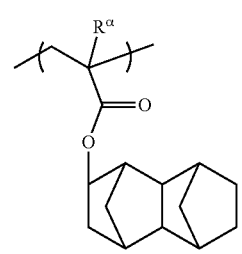
(a4-4)

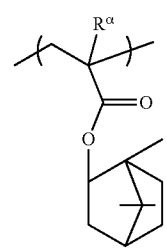
(a4-5)

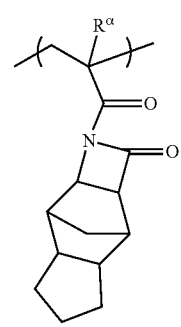
(a4-6)

-continued

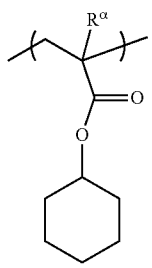
(a4-7)

[In the formula, Ra is the same as above.]

The constitutional unit (a4) contained in the component (A1) may be one kind or may be two or more kinds.

In a case where the component (A1) has the constitutional unit (a4), the proportion of the constitutional unit (a4) is preferably in a range of 1% to 40% by mole and more preferably in a range of 5% to 20% by mole, with respect to the total (100% by mole) of all constitutional units constituting the component (A1).

In a case where the proportion of the constitutional unit (a4) is equal to or larger than the lower limit value of the preferred range, the effect obtained by being allowed to contain the constitutional unit (a4) can be sufficiently achieved. In a case where the proportion of the constitutional unit (a4) is equal to or smaller than the upper limit value of the preferred range, the balance with other constitutional units is obtained easily.

In Regard to Constitutional Unit (St):

The constitutional unit (st) is a constitutional unit derived from styrene or a styrene derivative. The "constitutional unit derived from styrene" means a constitutional unit that is formed by the cleavage of an ethylenic double bond of styrene. The "constitutional unit derived from a styrene derivative" means a constitutional unit formed by the cleavage of an ethylenic double bond of a styrene derivative.

The "styrene derivative" means a compound in which at least a part of hydrogen atoms of styrene are substituted with a substituent. Examples of the styrene derivative include a derivative in which the hydrogen atom at the α-position of styrene is substituted with a substituent, a derivative in which one or more hydrogen atoms of the benzene ring of styrene are substituted with a substituent, and a derivative in which the hydrogen atom at the α-position of styrene and one or more hydrogen atoms of the benzene ring are substituted with a substituent.

Examples of the substituent that is substituted for the hydrogen atom at the α-position of styrene include an alkyl group having 1 to 5 carbon atoms or a halogenated alkyl group having 1 to 5 carbon atoms.

The alkyl group having 1 to 5 carbon atoms is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group.

The halogenated alkyl group having 1 to 5 carbon atoms is a group obtained by substituting part or all of hydrogen atoms in the alkyl group having 1 to 5 carbon atoms with a halogen atom. The halogen atom is particularly preferably a fluorine atom.

The substituent that is substituted for the hydrogen atom at the α-position of styrene is preferably an alkyl group having 1 to 5 carbon atoms or a fluorinated alkyl group having 1 to 5 carbon atoms, more preferably an alkyl group having 1 to 3 carbon atoms or a fluorinated alkyl group having 1 to 3 carbon atoms, and still more preferably a methyl group from the viewpoint of industrial availability.

Examples of the substituent that is substituted for the hydrogen atom of the benzene ring of styrene include an alkyl group, an alkoxy group, a halogen atom, and a halogenated alkyl group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and still more preferably a methoxy group or an ethoxy group.

The halogen atom as the substituent is preferably a fluorine atom.

Examples of the halogenated alkyl group as the substituent include groups in which part or all of hydrogen atoms in the above-described alkyl groups have been substituted with the above-described halogen atoms.

The substituent that is substituted for the hydrogen atom of the benzene ring of styrene is preferably an alkyl group having 1 to 5 carbon atoms, more preferably a methyl group or an ethyl group, and still more preferably a methyl group.

The constitutional unit (st) is preferably a constitutional unit derived from styrene or a constitutional unit derived from a styrene derivative in which the hydrogen atom at the α-position of styrene is substituted with an alkyl group having 1 to 5 carbon atoms or a halogenated alkyl group having 1 to 5 carbon atoms, more preferably a constitutional unit derived from styrene, or a constitutional unit derived from a styrene derivative in which the hydrogen atom at the α-position of styrene is substituted with a methyl group, and still more preferably a constitutional unit derived from styrene.

The constitutional unit (st) contained in the component (A1) may be one kind or may be two or more kinds.

In a case where the component (A1) has the constitutional unit (st), the proportion of the constitutional unit (st) is preferably in a range of 1% to 30% by mole and more preferably in a range of 3% to 20% by mole with respect to the total (100% by mole) of all constitutional units constituting the component (A1).

The component (A1) contained in the resist composition may be used alone, or two or more kinds thereof may be used in combination.

In the resist composition according to the present embodiment, examples of the component (A1) include a polymeric compound having a repeating structure of the constitutional unit (a1), and preferred examples thereof include a polymeric compound having a repeating structure of the constitutional unit (a1) and the constitutional unit (a10).

Among them, suitable examples of the component (A1) include a polymeric compound consisting of a repeating structure of the constitutional unit (a1) and the constitutional unit (a10).

In the polymeric compound having a repeating structure of the constitutional unit (a1) and the constitutional unit (a10), the proportion of the constitutional unit (a1) is preferably in a range of 10% to 90% by mole, more preferably in a range of 20% to 80% by mole, still more preferably in a range of 30% to 70% by mole, and particularly preferably in a range of 40% to 60% by mole with respect to the total (100% by mole) of all constitutional units constituting the polymeric compound.

In addition, the proportion of the constitutional unit (a10) in each of the polymeric compounds described above is preferably in a range of 10% to 90% by mole, more preferably in a range of 20% to 80% by mole, still more preferably in a range of 30% to 70% by mole, and particularly preferably in a range of 40% to 60% by mole, with respect to the total (100% by mole) of all constitutional units constituting the polymeric compound.

The molar ratio of the constitutional unit (a1) to the constitutional unit (a10) in the polymeric compound (the constitutional unit (a1):the constitutional unit (a2)) is preferably in a range of 2:8 to 8:2, more preferably in a range of 3:7 to 7:3, and still more preferably in a range of 4:6 to 6:4.

The component (A1) can be produced by dissolving, in a polymerization solvent, each monomer from which the constitutional unit is derived, adding thereto a radical polymerization initiator such as azobisisobutyronitrile (AIBN) or dimethyl azobisisobutyrate (for example, V-601) to carry out polymerization.

Alternatively, the component (A1) can be produced by dissolving, in a polymerization solvent, a monomer from which the constitutional unit (a1) is derived and, as necessary, a monomer from which a constitutional unit (for example, the constitutional unit (a10) other than the constitutional unit (a1) is derived, adding thereto a radical polymerization initiator as described above to carry out polymerization, and then carrying out a deprotection reaction.

Further, a —C(CF$_3$)$_2$—OH group may be introduced into the terminal of the component (A1) during the polymerization using a chain transfer agent such as HS—CH$_2$—CH$_2$—CH$_2$—C(CF$_3$)$_2$—OH in combination. As described above, a copolymer into which a hydroxyalkyl group, formed by substitution of a part of hydrogen atoms in the alkyl group with fluorine atoms, has been introduced is effective for reducing development defects and reducing line edge roughness (LER: uneven irregularities of a line side wall).

The weight average molecular weight (Mw) (based on the polystyrene-equivalent value determined by gel permeation chromatography (GPC)) of the component (A1), which is not particularly limited, is preferably in a range of 1,000 to 50,000, more preferably in a range of 2,000 to 30,000, and still more preferably in a range of 3,000 to 20,000.

In a case where Mw of the component (A1) is equal to or smaller than the upper limit value of this preferred range, the resist composition exhibits sufficient solubility in a resist solvent such that the resist composition can be used as a resist. On the other hand, in a case where Mw of the component (A1) is equal to or larger than the lower limit value of this preferred range, dry etching resistance and the cross-sectional shape of the resist pattern become excellent.

Further, the dispersity (Mw/Mn) of the component (A1) is not particularly limited; however, it is preferably in a range of 1.0 to 4.0, more preferably in a range of 1.0 to 3.0, and particularly preferably in a range of 1.0 to 2.0. Mn represents the number average molecular weight.

In Regard to Component (A2)

In the resist composition according to the present embodiment, a base material component (hereinafter, referred to as a "component (A2)") that exhibits changed solubility in a developing solution under action of acid, which does not correspond to the component (A1), may be used in combination as the component (A).

The component (A2) is not particularly limited and may be freely selected and used from a large number of base material components for the chemical amplification-type resist composition known in the related art.

As the component (A2), a polymeric compound or a low molecular weight compound may be used alone or in a combination of two or more kinds thereof.

The proportion of the component (A1) in the component (A) is preferably 25% by mass or greater, more preferably 50% by mass or greater, still more preferably 75% by mass or greater, and may be 100% by mass with respect to the total mass of the component (A). In a case where the proportion is 25% by mass or more, a resist pattern having various excellent lithography characteristics such as high sensitivity, resolution, and roughness amelioration can be easily formed.

The content of the component (A) in the resist composition according to the present embodiment may be adjusted depending on the resist film thickness to be formed.

<Acid Generator Component (B)>

The resist composition according to the present embodiment further contains an acid generator component (B) that generates acid upon exposure in addition to the component (A).

The component (B) is not particularly limited, and those which have been proposed so far as an acid generator for a chemical amplification-type resist composition can be used.

Examples of these acid generators are numerous and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl) diazomethanes; nitrobenzyl sulfonate-based acid generators; iminosulfonate-based acid generators; and disulfonate-based acid generators.

Examples of the onium salt-based acid generator include a compound represented by General Formula (b-1) (hereinafter, also referred to as a "component (b-1)"), a compound represented by General Formula (b-2) (hereinafter, also referred to as a "component (b-2)"), and a compound represented by General Formula (b-3) (hereinafter, also referred to as a "component (b-3)").

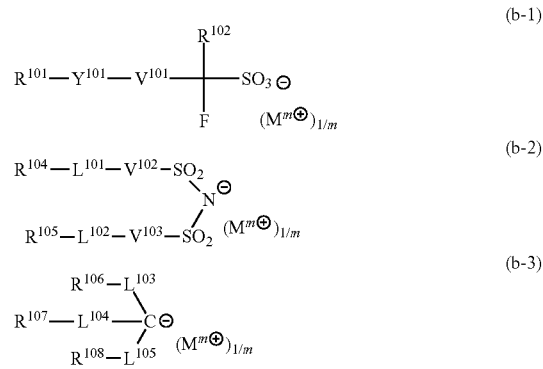

[In the formulae, $R^{101}$ and $R^{104}$ to $R^{108}$ each independently represent a cyclic group which may have a substituent, a chain-like alkyl group which may have a substituent, or a chain-like alkenyl group which may have a substituent. $R^{104}$ and $R^{105}$ may be bonded to each other to form a ring structure. $R^{102}$ represents a fluorinated alkyl group having 1 to 5 carbon atoms or a fluorine atom. $Y^{101}$ represents a divalent linking group containing an oxygen atom or a single bond. $V^{101}$ to $V^{103}$ each independently represent a single bond, an alkylene group, or a fluorinated alkylene group. $L^{101}$ and $L^{102}$ each independently represent a single bond or an oxygen atom. $L^{103}$ to $L^{105}$ each independently represent a single bond, —CO—, or —SO$_2$—. m represents an integer of 1 or more, and $M^{m+}$ represents an m-valent onium cation.]

{Anion Moiety}

Anion in Component (b-1)

In General Formula (b-1), $R^{101}$ represents a cyclic group which may have a substituent, a chain-like alkyl group which may have a substituent, or a chain-like alkenyl group which may have a substituent.

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. The aliphatic hydrocarbon group may be saturated or unsaturated. In general, it is preferable that the aliphatic hydrocarbon group is saturated.

The aromatic hydrocarbon group as $R^{101}$ is a hydrocarbon group having an aromatic ring. The aromatic hydrocarbon group preferably has 3 to 30 carbon atoms, more preferably 5 to 30, still more preferably 5 to 20, particularly preferably 6 to 15, and most preferably 6 to 10. However, the number of carbon atoms in a substituent is not included in the number of carbon atoms.

Specific examples of the aromatic ring contained in the aromatic hydrocarbon group as $R^{101}$ include benzene, fluorene, naphthalene, anthracene, phenanthrene, biphenyl, or an aromatic heterocyclic ring obtained by substituting a part of carbon atoms constituting these aromatic rings with a hetero atom. Examples of the hetero atom in the aromatic heterocyclic rings include an oxygen atom, a sulfur atom, and a nitrogen atom.

Specific examples of the aromatic hydrocarbon group as $R^{101}$ include a group obtained by removing one hydrogen atom from the above-described aromatic ring (an aryl group; for example, a phenyl group or a naphthyl group) and a group in which one hydrogen atom in the aromatic ring has been substituted with an alkylene group (an arylalkyl group such as a benzyl group, a phenethyl group, a 1-naphthylmethyl group, a 2-naphthylmethyl group, 1-naphthylethyl group, or a 2-naphthylethyl group). The alkylene group (an alkyl chain in the arylalkyl group) preferably has 1 to 4 carbon atoms, more preferably 1 or 2 carbon atoms, and particularly preferably 1 carbon atom.

Examples of the cyclic aliphatic hydrocarbon group as $R^{101}$ include aliphatic hydrocarbon groups containing a ring in the structure thereof.

Examples of the aliphatic hydrocarbon group containing a ring in the structure thereof include an alicyclic hydrocarbon group (a group obtained by removing one hydrogen atom from an aliphatic hydrocarbon ring), a group in which the alicyclic hydrocarbon group is bonded to the terminal of a linear or branched aliphatic hydrocarbon group, and a group in which the alicyclic hydrocarbon group is interposed in a linear or branched aliphatic hydrocarbon group.

The alicyclic hydrocarbon group preferably has 3 to 20 carbon atoms and more preferably 3 to 12 carbon atoms.

The alicyclic hydrocarbon group may be a polycyclic group or a monocyclic group. The monocyclic alicyclic hydrocarbon group is preferably a group obtained by removing one or more hydrogen atoms from a monocycloalkane. The monocycloalkane preferably has 3 to 6 carbon atoms, and specific examples thereof include cyclopentane and cyclohexane. The polycyclic alicyclic hydrocarbon group is preferably a group obtained by removing one or more hydrogen atoms from a polycycloalkane, and the polycycloalkane preferably has 7 to 30 carbon atoms. Among the above, the polycycloalkane is more preferably a polycycloalkane having a bridged ring-based polycyclic skeleton, such as adamantane, norbornane, isobornane, tricyclodecane, or tetracyclododecane; or a polycycloalkane having a condensed ring-based polycyclic skeleton, such as a cyclic group having a steroid skeleton.

Among them, the cyclic aliphatic hydrocarbon group as $R^{101}$ is preferably a group obtained by removing one or more hydrogen atoms from a monocycloalkane or a polycycloalkane, more preferably a group obtained by removing one hydrogen atom from a polycycloalkane, still more preferably an adamantyl group or a norbornyl group, and particularly preferably an adamantyl group.

The linear aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and most preferably 1 to 3 carbon atoms. The linear aliphatic hydrocarbon group is preferably a linear alkylene group, and specific examples thereof include a methylene group [—CH$_2$—], an ethylene group [—(CH$_2$)$_2$—], a trimethylene group [—(CH$_2$)$_3$—], a tetramethylene group [—(CH$_2$)$_4$—], and a pentamethylene group [—(CH$_2$)$_5$—].

The branched aliphatic hydrocarbon group which may be bonded to the alicyclic hydrocarbon group preferably has 2 to 10 carbon atoms, more preferably 3 to 6 carbon atoms, still more preferably 3 or 4 carbon atoms, and most preferably 3 carbon atoms. The branched aliphatic hydrocarbon group is preferably a branched alkylene group, and specific examples thereof include alkylalkylene groups, for example, alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. The alkyl group in the alkylalkylene group is preferably a linear alkyl group having 1 to 5 carbon atoms.

The cyclic hydrocarbon group as $R^{101}$ may contain a hetero atom such as a heterocyclic ring. Specific examples thereof include lactone-containing cyclic groups each represented by General Formulae (a2-r-1) to (a2-r-7), —SO$_2$—-containing cyclic groups each represented by General Formulae (a5-r-1) to (a5-r-4), and other heterocyclic groups each represented by Chemical Formulae (r-hr-1) to (r-hr-16). In the formulae, * represents a bonding site that is bonded to $Y^{101}$ in General Formula (b-1).

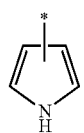

(r-hr-1)

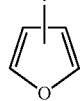

(r-hr-2)

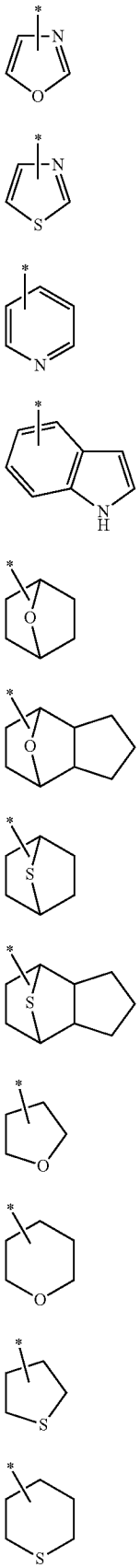

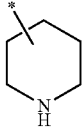

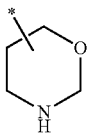

Examples of the substituent of the cyclic group as $R^{101}$ include an alkyl group, an alkoxy group, a halogen atom, a halogenated alkyl group, a hydroxyl group, a carbonyl group, and a nitro group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom for the substituent include a fluorine atom, a chlorine atom, a bromine atom, and an iodine atom, and a fluorine atom is preferable.

Examples of the halogenated alkyl group as the substituent include a group obtained by substituting part or all of hydrogen atoms in an alkyl group having 1 to 5 carbon atoms such as a methyl group, an ethyl group, a propyl group, an n-butyl group, or a tert-butyl group, with the above-described halogen atom.

The carbonyl group as the substituent is a group that substitutes a methylene group (—$CH_2$—) constituting the cyclic hydrocarbon group.

The cyclic hydrocarbon group as $R^{101}$ may be a condensed ring-type group containing a condensed ring in which an aliphatic hydrocarbon ring is condensed with an aromatic ring. Examples of the condensed ring include a condensed ring in which one or more aromatic rings are condensed with a polycycloalkane having a bridged ring-based polycyclic skeleton. Specific examples of the bridged ring-based polycycloalkane include bicycloalkanes such as bicyclo[2.2.1]heptane (norbornane) and bicyclo[2.2.2]octane. The condensed ring-type group is preferably a group containing a condensed ring in which two or three aromatic rings are condensed with a bicycloalkane and is more preferably a group containing a condensed ring in which two or three aromatic rings are condensed with bicyclo[2.2.2]octane. Specific examples of the condensed ring-type group as $R^{100}$ include groups represented by General Formulae (r-br-1) to (r-br-2). In the formulae, * represents a bonding site that is bonded to $Y^{101}$ in General Formula (b-1).

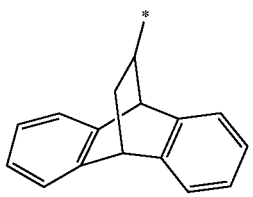

(r-br-1)

-continued

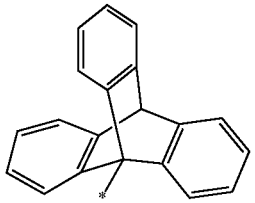
(r-br-2)

Examples of the substituent which may be contained in the condensed ring-type group as $R^{101}$ include an alkyl group, an alkoxy group, a halogen atom, a halogenated alkyl group, a hydroxyl group, a carbonyl group, a nitro group, an aromatic hydrocarbon group, and an alicyclic hydrocarbon group.

Examples of the alkyl group, the alkoxy group, the halogen atom, and the halogenated alkyl group, as the substituent of the condensed ring-type group, include the same ones as those described as the substituent of the cyclic group as $R^{101}$.

Examples of the aromatic hydrocarbon group as the substituent of the condensed ring-type group include a group obtained by removing one hydrogen atom from the above-described aromatic ring (an aryl group; for example, a phenyl group or a naphthyl group), a group in which one hydrogen atom in the aromatic ring has been substituted with an alkylene group (for example, an arylalkyl group such as a benzyl group, a phenethyl group, a 1-naphthylmethyl group, a 2-naphthylmethyl group, 1-naphthylethyl group, or a 2-naphthylethyl group), and heterocyclic groups each represented by General Formulae (r-hr-1) to (r-hr-6).

Examples of the alicyclic hydrocarbon group as the substituent of the condensed ring-type group include a group obtained by removing one hydrogen atom from a monocycloalkane such as cyclopentane or cyclohexane; a group obtained by removing one hydrogen atom from a polycycloalkane such as adamantane, norbornane, isobornane, tricyclodecane, or tetracyclododecane; lactone-containing cyclic groups each represented by General Formulae (a2-r-1) to (a2-r-7); —SO$_2$—-containing cyclic groups each represented by General Formulae (a5-r-1) to (a5-r-4); and heterocyclic groups each represented by General Formulae (r-hr-7) to (r-hr-16).

Chain-Like Alkyl Group which May have Substituent:

The chain-like alkyl group as $R^{101}$ may be linear or branched.

The linear alkyl group preferably has 1 to 20 carbon atoms, more preferably 1 to 15 carbon atoms, and most preferably 1 to 10 carbon atoms.

The branched alkyl group preferably has 3 to 20 carbon atoms, more preferably 3 to 15 carbon atoms, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-Like Alkenyl Group which May have Substituent:

The chain-like alkenyl group as $R^{101}$ may be linear or branched, and it preferably has 2 to 10 carbon atoms, more preferably 2 to 5 carbon atoms, still more preferably 2 to 4 carbon atoms, and particularly preferably 3 carbon atoms. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group.

Among the above, the chain-like alkenyl group is preferably a linear alkenyl group, more preferably a vinyl group or a propenyl group, and particularly preferably a vinyl group.

Examples of the substituent in the chain-like alkyl group or alkenyl group as $R^{101}$, include an alkoxy group, a halogen atom, a halogenated alkyl group, a hydroxyl group, a carbonyl group, a nitro group, an amino group, and a cyclic group as $R^{101}$.

Among the above, $R^{101}$ is preferably a cyclic group which may have a substituent and more preferably a cyclic hydrocarbon group which may have a substituent.

More specifically, the cyclic hydrocarbon group is preferably a group obtained by removing one or more hydrogen atoms from a polycycloalkane or a condensed ring-type group containing a condensed ring in which an aliphatic hydrocarbon ring is condensed with an aromatic ring, more preferably an adamantyl group, a group represented by General Formula (r-br-1), or a group represented by General Formula (r-br-2), and still more preferably an adamantyl group or a group represented by General Formula (r-br-1).

In General Formula (b-1), $Y^{101}$ represents a single bond or a divalent linking group containing an oxygen atom.

In a case where $Y^{101}$ represents a divalent linking group containing an oxygen atom, $Y^{101}$ may contain an atom other than the oxygen atom. Examples of the atom other than the oxygen atom include a carbon atom, a hydrogen atom, a sulfur atom, and a nitrogen atom.

Examples of divalent linking groups containing an oxygen atom include non-hydrocarbon-based oxygen atom-containing linking groups such as an oxygen atom (an ether bond; —O—), an ester bond (—C(=O)—O—), an oxycarbonyl group (—O—C(=O)—), an amide bond (—C(=O)—NH—), a carbonyl group (—C(=O)—), or a carbonate bond (—O—C(=O)—O—); and combinations of the above-described non-hydrocarbon-based oxygen atom-containing linking groups with an alkylene group. Furthermore, a sulfonyl group (—SO$_2$—) may be linked to the combination. Examples of such a divalent linking group containing an oxygen atom include linking groups each represented by General Formulae (y-al-1) to (y-al-7) shown below. In General Formulae (y-al-1) to (y-al-7), the one that is bonded to $R^{101}$ in General Formula (b-1) is $V'^{101}$ in General Formulae (y-al-1) to (y-al-7).

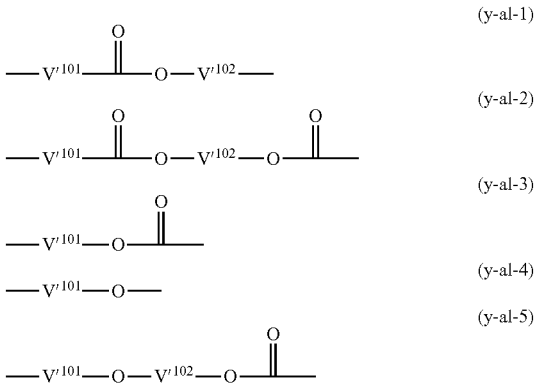

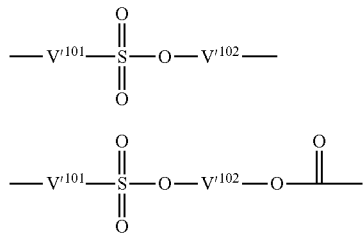

[In the formulae, $V'^{101}$ represents a single bond or an alkylene group having 1 to 5 carbon atoms, and $V'^{102}$ represents a divalent saturated hydrocarbon group having 1 to 30 carbon atoms.]

The divalent saturated hydrocarbon group as $V'^{102}$ is preferably an alkylene group having 1 to 30 carbon atoms, more preferably an alkylene group having 1 to 10 carbon atoms, and still more preferably an alkylene group having 1 to 5 carbon atoms.

The alkylene group as $V'^{101}$ and $V'^{102}$ may be a linear alkylene group or a branched alkylene group, and a linear alkylene group is preferable.

Specific examples of the alkylene group as $V'^{101}$ and $V'^{102}$ include a methylene group [—CH$_2$—]; an alkylmethylene group such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, or —C(CH$_2$CH$_3$)$_2$—; an ethylene group [—CH$_2$CH$_2$—]; an alkylethylene group such as —CH(CH$_3$)CH$_2$—, —CH(CH$_3$)CH(CH$_3$)—, —C(CH$_3$)$_2$CH$_2$—, or —CH(CH$_2$CH$_3$)CH$_2$—; a trimethylene group (n-propylene group) [—CH$_2$CH$_2$CH$_2$—]; an alkyltrimethylene group such as —CH(CH$_3$)CH$_2$CH$_2$— or —CH$_2$CH(CH$_3$)CH$_2$—; a tetramethylene group [—CH$_2$CH$_2$CH$_2$CH$_2$—]; an alkyltetramethylene group such as —CH(CH$_3$)CH$_2$CH$_2$CH$_2$—, or —CH$_2$CH(CH$_3$)CH$_2$CH$_2$—; and a pentamethylene group [—CH$_2$CH$_2$CH$_2$CH$_2$CH$_2$—].

Further, part of methylene groups in the alkylene group as $V'^{10}$ and $V'^{102}$ may be substituted with a divalent aliphatic cyclic group having 5 to 10 carbon atoms. The aliphatic cyclic group is preferably a divalent group obtained by removing one hydrogen atom from the cyclic aliphatic hydrocarbon group (a monocyclic aliphatic hydrocarbon group or a polycyclic aliphatic hydrocarbon group) as $Ra'^3$ in General Formula (a1-r-1), and a cyclohexylene group, a 1,5-adamantylene group, or a 2,6-adamantylene group is more preferable.

$Y^{101}$ preferably represents a divalent linking group containing an ester bond or a divalent linking group containing an ether bond and more preferably linking groups each represented by General Formulae (y-al-1) to (y-al-5).

In General Formula (b-1), $V^{101}$ represents a single bond, an alkylene group, or a fluorinated alkylene group. The alkylene group and the fluorinated alkylene group as $V^{101}$ preferably have 1 to 4 carbon atoms. Examples of the fluorinated alkylene group as $V^{101}$ include a group obtained substituting part or all of hydrogen atoms in the alkylene group as $V^{101}$ with a fluorine atom. Among these examples, as $V^{101}$, a single bond or a fluorinated alkylene group having 1 to 4 carbon atoms is preferable.

In General Formula (b-1), $R^{102}$ represents a fluorine atom or a fluorinated alkyl group having 1 to 5 carbon atoms. $R^{102}$ preferably represents a fluorine atom or a perfluoroalkyl group having 1 to 5 carbon atoms and more preferably a fluorine atom.

In a case where $Y^{101}$ represents a single bond, specific examples of the anion moiety represented by General Formula (b-1) include a fluorinated alkyl sulfonate anion such as a trifluoromethanesulfonate anion or a perfluorobutanesulfonate anion; and in a case where $Y^{101}$ represents a divalent linking group containing an oxygen atom, specific examples thereof include an anion represented by any one of General Formulae (an-1) to (an-3) shown below.

$$R'''^{101}-(CH_2)_{v''}-\overset{O}{\overset{\|}{C}}-O-(CH_2)_{q''}-\left[O-\overset{O}{\overset{\|}{C}}\right]_{n''}-V'''^{101}-\overset{R^{102}}{\underset{F}{\overset{|}{C}}}-SO_3^- \quad \text{(an-1)}$$

$$R'''^{102}-(CH_2)_{v''}-O-\overset{O}{\overset{\|}{C}}-V'''^{101}-\overset{R^{102}}{\underset{F}{\overset{|}{C}}}-SO_3^- \quad \text{(an-2)}$$

$$R'''^{103}-(CH_2)_{v''}-O-\left[(CH_2)_{q''}-O-\overset{O}{\overset{\|}{C}}\right]_{n''}-V'''^{101}-\overset{R^{102}}{\underset{F}{\overset{|}{C}}}-SO_3^- \quad \text{(an-3)}$$

[In the formula, $R'''^{101}$ represents an aliphatic cyclic group which may have a substituent, monovalent heterocyclic groups each represented by Chemical Formulae (r-hr-1) to (r-hr-6), a condensed ring-type group represented by General Formula (r-br-1) or (r-br-2), and a chain-like alkyl group which may have a substituent. $R'''^{102}$ is an aliphatic cyclic group which may have a substituent, a condensed ring-type group represented by General Formula (r-br-1) or (r-br-2), lactone-containing cyclic groups each represented by General Formulae (a2-r-1), (a2-r-3) to (a2-r-7), or —SO$_2$—-containing cyclic groups each represented by General Formulae (a5-r-1) to (a5-r-4). $R'''^{103}$ represents an aromatic cyclic group which may have a substituent, an aliphatic cyclic group which may have a substituent, or a chain-like alkenyl group which may have a substituent. $V'''^{101}$ represents a single bond, an alkylene group having 1 to 4 carbon atoms, or a fluorinated alkylene group having 1 to 4 carbon atoms. $R^{102}$ represents a fluorine atom or a fluorinated alkyl group having 1 to 5 carbon atoms. Each v'' independently represents an integer in a range of 0 to 3, each q'' independently represents an integer in a range of 0 to 20, and n'' represents 0 or 1.]

The aliphatic cyclic group as $R'''^{101}$, $R'''^{102}$, and $R'''^{103}$ which may have a substituent is preferably the group exemplified as the cyclic aliphatic hydrocarbon group as $R^{101}$ in General Formula (b-1). Examples of the substituent include the same one as the substituent that may be substituted for the cyclic aliphatic hydrocarbon group as $R^{101}$ in General Formula (b-1).

The aromatic cyclic group which may have a substituent, as $R'''^{103}$, is preferably the group exemplified as the aromatic hydrocarbon group for the cyclic hydrocarbon group as $R^{101}$ in General Formula (b-1). Examples of the substituent include the same one as the substituent that may be substituted for the aromatic hydrocarbon group as $R^{101}$ in General Formula (b-1).

The chain-like alkyl group as $R'''^{101}$, which may have a substituent, is preferably the group exemplified as the chain-like alkyl group as $R^{101}$ in General Formula (b-1).

The chain-like alkenyl group as $R''^{103}$, which may have a substituent, is preferably the group exemplified as the chain-like alkenyl group as $R^{101}$ in General Formula (b-1).

Anion in Component (b-2)

In General Formula (b-2), $R^{104}$ and $R^{105}$ each independently represent a cyclic group which may have a substituent, a chain-like alkyl group which may have a substituent, or a chain-like alkenyl group which may have a substituent, and examples thereof each include the same one as $R^{101}$ in General Formula (b-1). However, $R^{104}$ and $R^{105}$ may be bonded to each other to form a ring.

$R^{104}$ and $R^{105}$ are preferably a chain-like alkyl group which may have a substituent and more preferably a linear or branched alkyl group or a linear or branched fluorinated alkyl group.

The chain-like alkyl group preferably has 1 to 10 carbon atoms, more preferably 1 to 7 carbon atoms, and still more preferably 1 to 3 carbon atoms. It is preferable that the number of carbon atoms in the chain-like alkyl group as $R^{104}$ and $R^{105}$ is small since the solubility in a resist solvent is also excellent in this range of the number of carbon atoms. Further, in the chain-like alkyl group as $R^{104}$ and $R^{105}$, it is preferable that the number of hydrogen atoms substituted with a fluorine atom is large since the acid strength increases and the transparency to high energy radiation of 250 nm or less or electron beams is improved. The proportion of fluorine atoms in the chain-like alkyl group, that is, the fluorination rate is preferably in a range of 70% to 100% and more preferably in a range of 90% to 100%, and it is most preferable that the chain-like alkyl group be a perfluoroalkyl group in which all hydrogen atoms be substituted with a fluorine atom.

In General Formula (b-2), $V^{102}$ and $V^{103}$ each independently represent a single bond, an alkylene group, or a fluorinated alkylene group, and examples thereof each include the same ones as $V^{101}$ in General Formula (b-1).

in General Formula (b-2), $L^{101}$ and $L^{102}$ each independently represent a single bond or an oxygen atom.

Anion in Component (b-3)

In General Formula (b-3), $R^{106}$ to $R^{108}$ each independently represent a cyclic group which may have a substituent, chain-like alkyl group which may have a substituent, or a chain-like alkenyl group which may have a substituent, and examples thereof include the same one as $R^{101}$ in General Formula (b-1).

In General Formula (b-3), $L^{103}$ to $L^{105}$ each independently represent a single bond, —CO—, or —SO$_2$—.

Among the above, the anion moiety of the component (B) is preferably an anion of the component (b-1). Among these, an anion represented by any one of General Formulae (an-1) to (an-3) is more preferable, an anion represented by any one of General Formula (an-1) or (an-2) is still more preferable, and an anion represented by General Formula (an-2) is particularly preferable.

{Cation Moiety}

In Formulae (b-1), (b-2), and (b-3) described above, $M^{m+}$ represents an m-valent onium cation. Among them, a sulfonium cation and an iodonium cation are preferable. m represents an integer of 1 or more.

Preferred examples of the cation moiety $((M^{m+})_{1/m})$ include organic cations each represented by General Formulae (ca-1) to (ca-5).

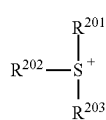
(ca-1)

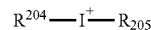
(ca-2)

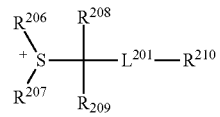
(ca-3)

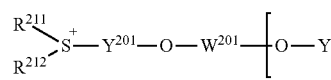
(ca-4)

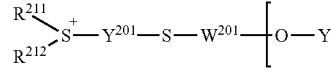
(ca-5)

[In the formula, $R^{201}$ to $R^{207}$, $R^{211}$, and $R^{212}$ each independently represent an aryl group, an alkyl group, or an alkenyl group, each of which may have a substituent. $R^{201}$ to $R^{203}$, $R^{206}$ and $R^{207}$, or $R^{211}$ and $R^{212}$ may be bonded to each other to form a ring together with the sulfur atoms in the formulae. $R^{208}$ and $R^{209}$ each independently represent a hydrogen atom or an alkyl group having 1 to 5 carbon atoms. $R^{210}$ represents an aryl group which may have a substituent, an alkyl group which may have a substituent, an alkenyl group which may have a substituent, or a —SO$_2$—-containing cyclic group which may have a substituent. $L^{201}$ represents —C(=O)— or —C(=O)—O—. Each $Y^{201}$ independently represents an arylene group, an alkylene group, or an alkenylene group. x represents 1 or 2. $W^{201}$ represents an (x+1)-valent linking group.]

In General Formulae (ca-1) to (ca-5), examples of the aryl group as $R^{201}$ to $R^{207}$, $R^{211}$, and $R^{212}$ include an unsubstituted aryl group having 6 to 20 carbon atoms, and a phenyl group or a naphthyl group is preferable.

The alkyl group as $R^{201}$ to $R^{207}$, $R^{211}$, and $R^{212}$ is a chain-like or cyclic alkyl group and preferably has 1 to 30 carbon atoms.

The alkenyl group as $R^{201}$ to $R^{207}$, $R^{211}$, and $R^{212}$ preferably has 2 to 10 carbon atoms.

Examples of the substituent which may be contained in $R^{201}$ to $R^{207}$ and $R^{210}$ to $R^{212}$ include an alkyl group, a halogen atom, a halogenated alkyl group, a carbonyl group, a cyano group, an amino group, an aryl group, and groups each represented by General Formulae (ca-r-1) to (ca-r-7) shown below.

(ca-r-1)

(ca-r-2)

(ca-r-3)

(ca-r-4)

(ca-r-5)

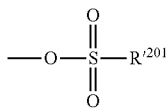

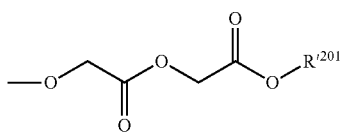

[In the formulae, each $R'^{201}$ independently represents a hydrogen atom, a cyclic group which may have a substituent, a chain-like alkyl group which may have a substituent, or a chain-like alkenyl group which may have a substituent.]

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. The aliphatic hydrocarbon group may be saturated or unsaturated. In general, it is preferable that the aliphatic hydrocarbon group is saturated.

The aromatic hydrocarbon group as $R'^{201}$ is a hydrocarbon group having an aromatic ring. The aromatic hydrocarbon group preferably has 3 to 30 carbon atoms, more preferably 5 to 30 carbon atoms, still more preferably 5 to 20 carbon atoms, particularly preferably 6 to 15 carbon atoms, and most preferably 6 to 10 carbon atoms. Here, the number of carbon atoms in a substituent is not included in the number of carbon atoms.

Specific examples of the aromatic ring contained in the aromatic hydrocarbon group as $R'^{201}$ include benzene, fluorene, naphthalene, anthracene, phenanthrene, biphenyl, or an aromatic heterocyclic ring obtained by substituting a part of carbon atoms constituting these aromatic rings with a hetero atom. Examples of the hetero atom in the aromatic heterocyclic rings include an oxygen atom, a sulfur atom, and a nitrogen atom.

Specific examples of the aromatic hydrocarbon group as $R'^{201}$ include a group obtained by removing one hydrogen atom from the above-described aromatic ring (an aryl group; for example, a phenyl group or a naphthyl group) and a group in which one hydrogen atom in the aromatic ring has been substituted with an alkylene group (for example, an arylalkyl group such as a benzyl group, a phenethyl group, a 1-naphthylmethyl group, a 2-naphthylmethyl group, 1-naphthylethyl group, or a 2-naphthylethyl group). The alkylene group (an alkyl chain in the arylalkyl group) preferably has 1 to 4 carbon atoms, more preferably 1 or 2 carbon atoms, and particularly preferably 1 carbon atom.

Examples of the cyclic aliphatic hydrocarbon group as $R'^{201}$ include aliphatic hydrocarbon groups containing a ring in the structure thereof.

Examples of the aliphatic hydrocarbon group containing a ring in the structure thereof include an alicyclic hydrocarbon group (a group obtained by removing one hydrogen atom from an aliphatic hydrocarbon ring), a group in which the alicyclic hydrocarbon group is bonded to the terminal of a linear or branched aliphatic hydrocarbon group, and a group in which the alicyclic hydrocarbon group is interposed in a linear or branched aliphatic hydrocarbon group.

The alicyclic hydrocarbon group preferably has 3 to 20 carbon atoms and more preferably 3 to 12 carbon atoms.

The alicyclic hydrocarbon group may be a polycyclic group or a monocyclic group. The monocyclic alicyclic hydrocarbon group is preferably a group obtained by removing one or more hydrogen atoms from a monocycloalkane. The monocycloalkane preferably has 3 to 6 carbon atoms, and specific examples thereof include cyclopentane and cyclohexane. The polycyclic alicyclic hydrocarbon group is preferably a group obtained by removing one or more hydrogen atoms from a polycycloalkane, and the polycycloalkane preferably has 7 to 30 carbon atoms. Among the above, the polycycloalkane is more preferably a polycycloalkane having a bridged ring-based polycyclic skeleton, such as adamantane, norbornane, isobornane, tricyclodecane, or tetracyclododecane; or a polycycloalkane having a condensed ring-based polycyclic skeleton, such as a cyclic group having a steroid skeleton.

Among them, the cyclic aliphatic hydrocarbon group as $R'^{201}$ is preferably a group obtained by removing one or more hydrogen atoms from a monocycloalkane or a polycycloalkane, more preferably a group obtained by removing one hydrogen atom from a polycycloalkane, particularly preferably an adamantyl group or a norbornyl group, and most preferably an adamantyl group.

The linear or branched aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and particularly preferably 1 to 3 carbon atoms.

The linear aliphatic hydrocarbon group is preferably a linear alkylene group, and specific examples thereof include a methylene group [—$CH_2$—], an ethylene group [—($CH_2$)$_2$—], a trimethylene group [—($CH_2$)$_3$—], a tetramethylene group [—($CH_2$)$_4$—], and a pentamethylene group [—($CH_2$)$_5$—].

The branched aliphatic hydrocarbon group is preferably a branched alkylene group, and specific examples thereof include alkylalkylene groups, for example, alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$)—, —C($CH_3$)$_2CH_2$—, —CH($CH_2CH_3$)$CH_2$—, and —C($CH_2CH_3$)$_2$—$CH_2$—; alkyltrimethylene groups such as —CH($CH_3$)$CH_2CH_2$—, and —$CH_2$CH($CH_3$)$CH_2$—; and alkyltetramethylene groups such as —CH($CH_3$)$CH_2CH_2CH_2$—, and —$CH_2$CH($CH_3$)$CH_2CH_2$—. The alkyl group in the alkylalkylene group is preferably a linear alkyl group having 1 to 5 carbon atoms.

The cyclic hydrocarbon group as $R'^{201}$ may contain a hetero atom such as a heterocyclic ring. Specific examples thereof include lactone-containing cyclic groups each represented by General Formulae (a2-r-1) to (a2-r-7), —$SO_2$—-containing cyclic groups each represented by General Formulae (a5-r-1) to (a5-r-4), and other heterocyclic groups each represented by Chemical Formulae (r-hr-1) to (r-hr-16).

Examples of the substituent of the cyclic group as $R'^{201}$ include an alkyl group, an alkoxy group, a halogen atom, a halogenated alkyl group, a hydroxyl group, a carbonyl group, and a nitro group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

The halogen atom as the substituent is preferably a fluorine atom.

Examples of the above-described halogenated alkyl group as the substituent include a group in which part or all of hydrogen atoms in an alkyl group having 1 to 5 carbon atoms such as a methyl group, an ethyl group, a propyl group, an n-butyl group, or a tert-butyl group have been substituted with the above-described halogen atom.

The carbonyl group as the substituent is a group that substitutes a methylene group (—$CH_2$—) constituting the cyclic hydrocarbon group.

Chain-Like Alkyl Group which May have Substituent:

The chain-like alkyl group as $R'^{201}$ may be linear or branched.

The linear alkyl group preferably has 1 to 20 carbon atoms, more preferably 1 to 15 carbon atoms, and most preferably 1 to 10 carbon atoms.

The branched alkyl group preferably has 3 to 20 carbon atoms, more preferably 3 to 15 carbon atoms, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-Like Alkenyl Group which May have Substituent:

Such a chain-like alkenyl group as $R'^{201}$ may be linear or branched, preferably has 2 to 10 carbon atoms, more preferably 2 to 5 carbon atoms, still more preferably 2 to 4 carbon atoms, and particularly preferably 3 carbon atoms. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group.

Among the above, the chain-like alkenyl group is preferably a linear alkenyl group, more preferably a vinyl group or a propenyl group, and particularly preferably a vinyl group.

Examples of the substituent in the chain-like alkyl group or alkenyl group as $R'^{201}$ include an alkoxy group, a halogen atom, a halogenated alkyl group, a hydroxyl group, a carbonyl group, a nitro group, an amino group, and a cyclic group as $R'^{201}$.

As the cyclic group which may have a substituent, the chain-like alkyl group which may have a substituent, or the chain-like alkenyl group which may have a substituent, as $R'^{201}$, a group that is the same as the acid dissociable group represented by above-described General Formula (a1-r-2) can be mentioned as the same one as the cyclic group which may have a substituent or the chain-like alkyl group which may have a substituent, in addition to the groups described above.

Among them, $R'^{201}$ is preferably a cyclic group which may have a substituent and more preferably a cyclic hydrocarbon group which may have a substituent. More specific examples thereof preferably include a phenyl group, a naphthyl group, a group obtained by removing one or more hydrogen atoms from a polycycloalkane, lactone-containing cyclic groups each represented by any one of General Formulae (a2-r-1) to (a2-r-7), and —$SO_2$—-containing cyclic groups each represented by any one of General Formulae (a5-r-1) to (a5-r-4).

In General Formulae (ca-1) to (ca-5), in a case where $R^{201}$ to $R^{203}$, $R^{206}$ and $R^{207}$, or $R^{211}$ and $R^{212}$ are bonded to each other to form a ring with a sulfur atom in the formula, these groups may be bonded to each other via a hetero atom such as a sulfur atom, an oxygen atom or a nitrogen atom, or a functional group such as a carbonyl group, —SO—, —$SO_2$—, —$SO_3$—, —COO—, —CONH—, or —N($R_N$)— (here, $R_N$ represents an alkyl group having 1 to 5 carbon atoms). Regarding the ring to be formed, it is preferable that a ring containing the sulfur atom in the formula in the ring skeleton thereof is a 3-membered to 10-membered ring and it is particularly preferable that it is a 5-membered to 7-membered ring, in a case where the sulfur atom is included. Specific examples of the ring to be formed include a thiophene ring, a thiazole ring, a benzothiophene ring, a dibenzothiophene ring, a 9H-thioxanthene ring, a thioxanthone ring, a thianthrene ring, a phenoxathiin ring, a tetrahydrothiophenium ring, and a tetrahydrothiopyranium ring.

$R^{208}$ and $R^{209}$ each independently represent a hydrogen atom or an alkyl group having 1 to 5 carbon atoms and are preferably a hydrogen atom or an alkyl group having 1 to 3 carbon atoms. In a case where $R^{208}$ and $R^{209}$ each independently represent an alkyl group, $R^{208}$ and $R^{209}$ may be bonded to each other to form a ring.

$R^{210}$ represents an aryl group which may have a substituent, an alkyl group which may have a substituent, an alkenyl group which may have a substituent, or a —$SO_2$—-containing cyclic group which may have a substituent.

Examples of the aryl group as $R^{210}$ include an unsubstituted aryl group having 6 to 20 carbon atoms, and a phenyl group or a naphthyl group is preferable.

The alkyl group as $R^{210}$, a chain-like or cyclic alkyl group having 1 to 30 carbon atoms is preferable.

The alkenyl group as $R^{210}$ preferably has 2 to 10 carbon atoms.

The —$SO_2$—-containing cyclic group which may have a substituent, as $R^{210}$, is preferably a "—$SO_2$—-containing polycyclic group", and more preferably a group represented by General Formula (a5-r-1).

Each $Y^{201}$ independently represents an arylene group, an alkylene group, or an alkenylene group.

Examples of the arylene group as $Y^{201}$ include groups obtained by removing one hydrogen atom from an aryl group mentioned as the aromatic hydrocarbon group represented by $R^{101}$ in General Formula (b-1) described above.

Examples of the alkylene group and alkenylene group as $Y^{201}$ include groups obtained by removing one hydrogen atom from the chain-like alkyl group or the chain-like alkenyl group as $R^{101}$ in General Formula (b-1) described above.

In General Formula (ca-4), x represents 1 or 2.

$W^{201}$ represents an (x+1)-valent linking group, that is, a divalent or trivalent linking group.

The divalent linking group as $W^{201}$ is preferably a divalent hydrocarbon group which may have a substituent, and as examples thereof include the same divalent hydrocarbon group, which may have a substituent, as $Ya^{21}$ in General Formula (a2-1) described above. The divalent linking group as $W^{201}$ may be linear, branched, or cyclic, and it is preferably cyclic. Among these, an arylene group having both terminals at which two carbonyl groups are combined is preferable. Examples of the arylene group include a phenylene group and a naphthylene group, and a phenylene group is particularly preferable.

Examples of the trivalent linking group as $W^{201}$ include a group obtained by removing one hydrogen atom from the above-described divalent linking group as $W^{201}$ and a group in which the divalent linking group has been bonded to another divalent linking group. The trivalent linking group as $W^{201}$ is preferably a group in which two carbonyl groups are bonded to an arylene group.
Specific examples of the suitable cation represented by General Formula (ca-1) include cations each represented by Chemical Formulae (ca-1-1) to (ca-1-72) shown below.
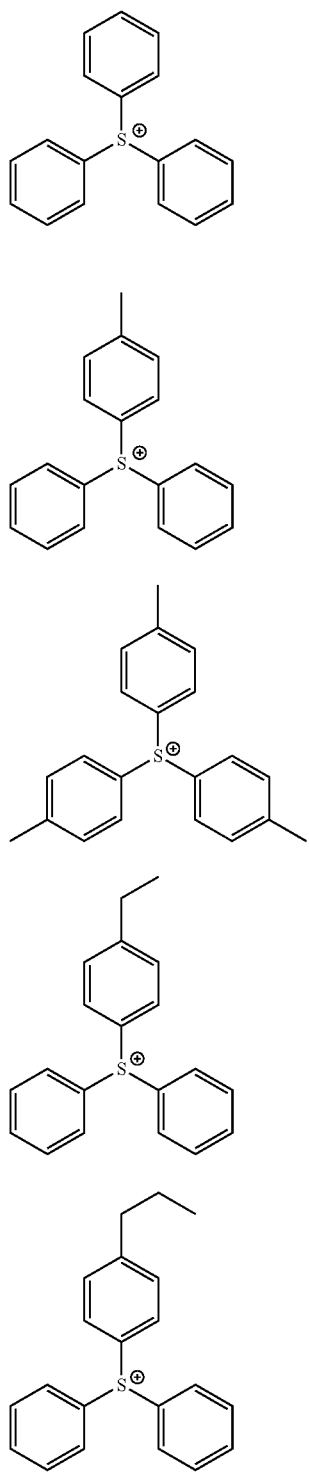
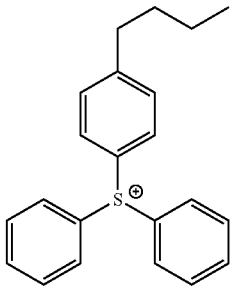
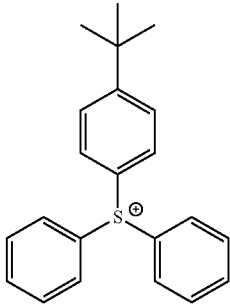
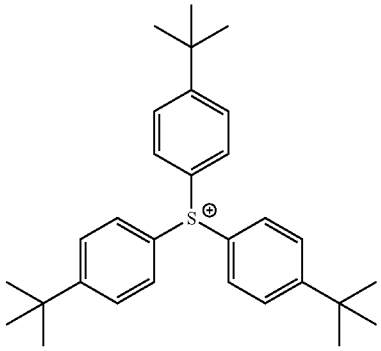
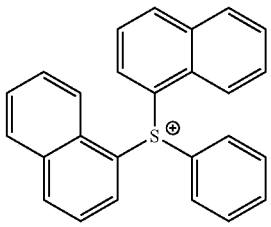
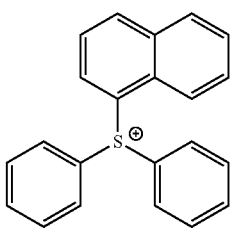

(ca-1-11)
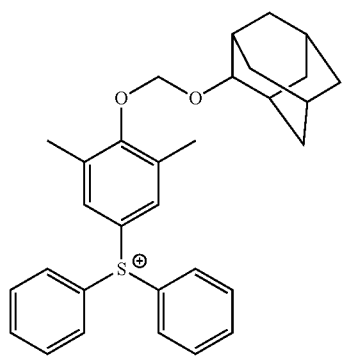
(ca-1-12)
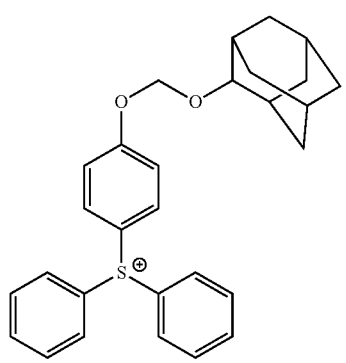
(ca-1-13)
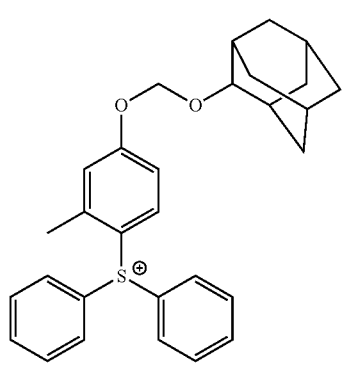
(ca-1-14)
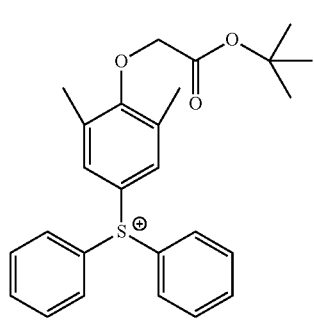
(ca-1-15)
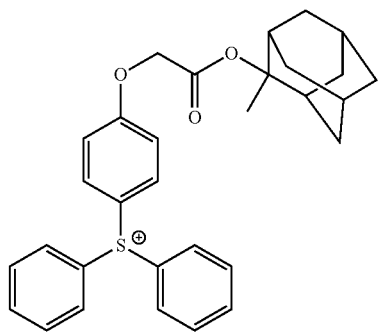
(ca-1-16)
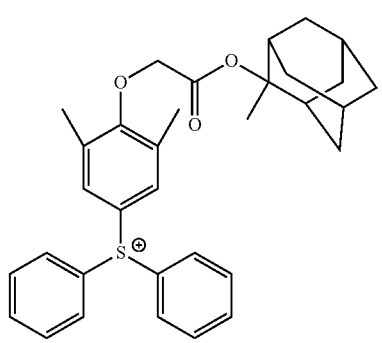
(ca-1-17)
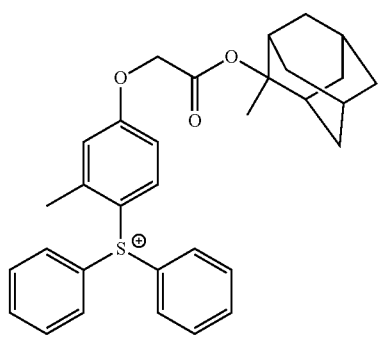
(ca-1-18)
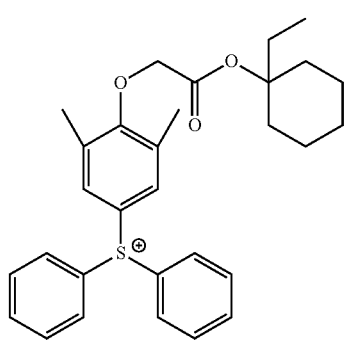

(ca-1-19)
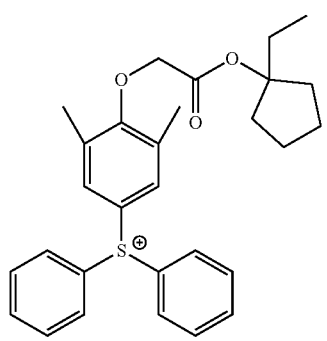
(ca-1-20)
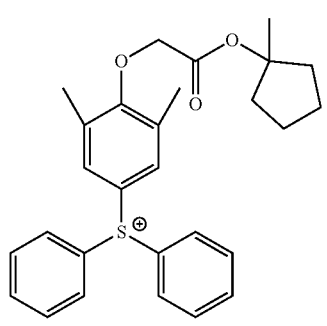
(ca-1-21)
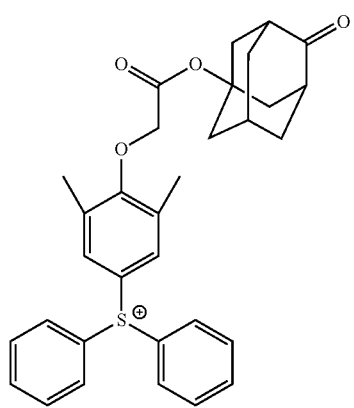
(ca-1-22)
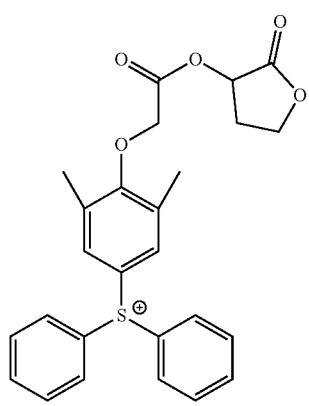
(ca-1-23)
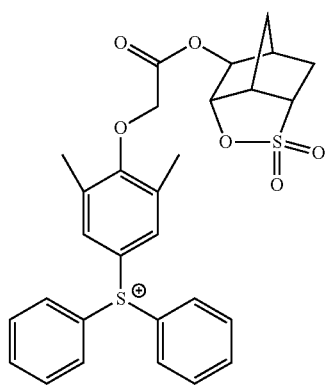
(ca-1-24)
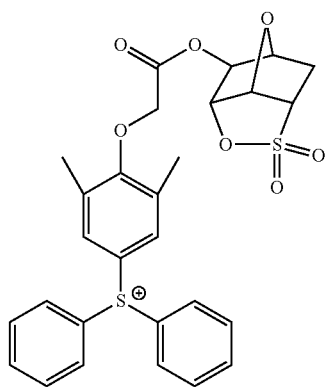
(ca-1-25)
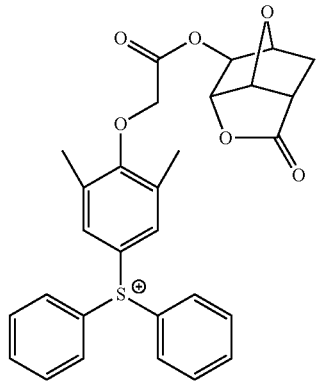
(ca-1-26)
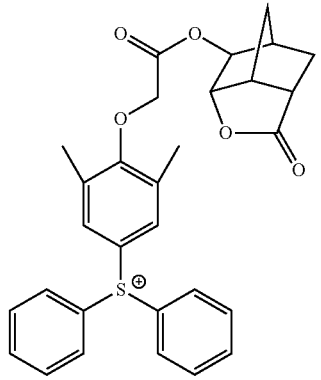

-continued
(ca-1-27)
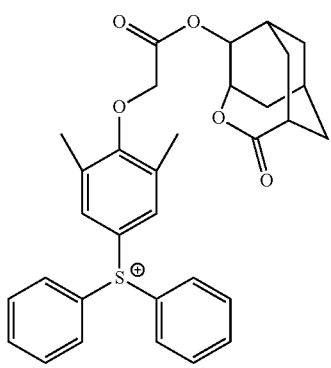
(ca-1-28)
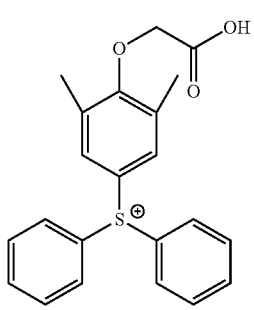
(ca-1-29)
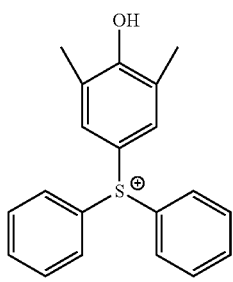
(ca-1-30)
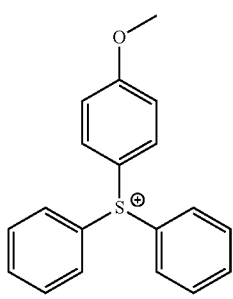
(ca-1-31)
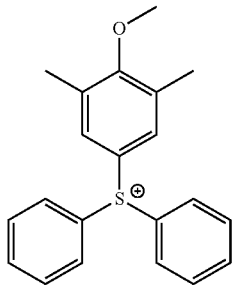
-continued
(ca-1-32)
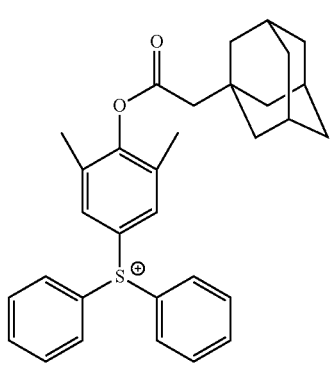
(ca-1-33)
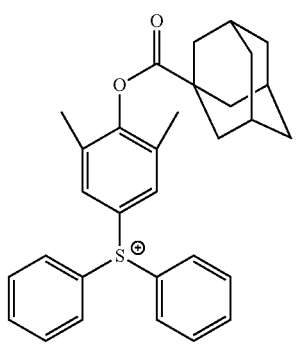
(ca-1-34)
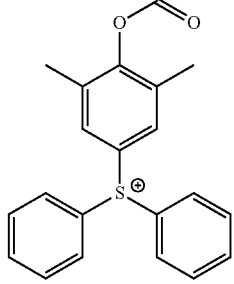
(ca-1-35)
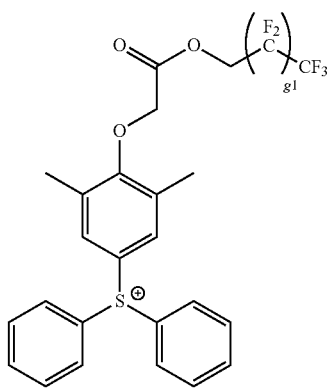

(ca-1-36)
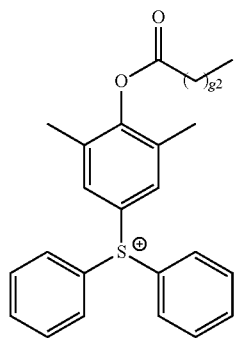
(ca-1-37)
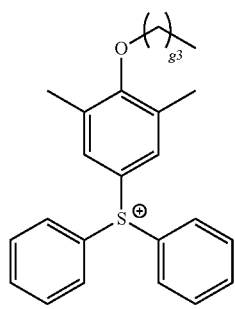
(ca-1-38)
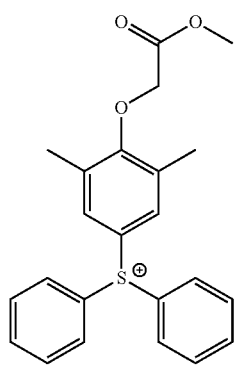
(ca-1-39)
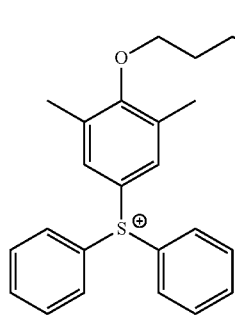
(ca-1-40)
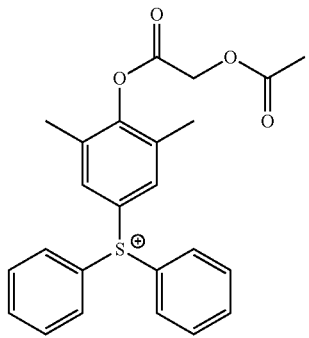
(ca-1-41)
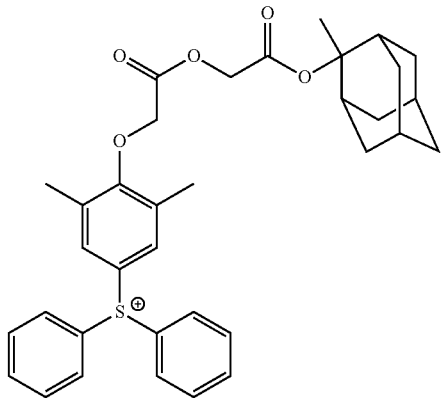
(ca-1-42)
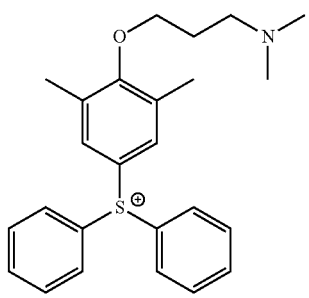
(ca-1-43)
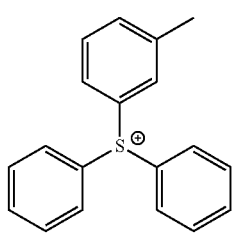
(ca-1-44)
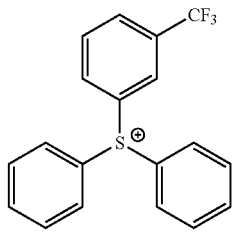

-continued
(ca-1-45)
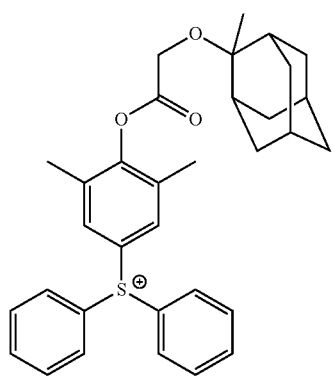
(ca-1-46)
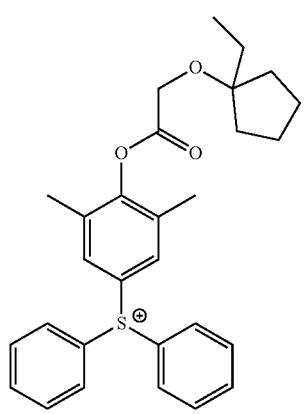
(ca-1-47)
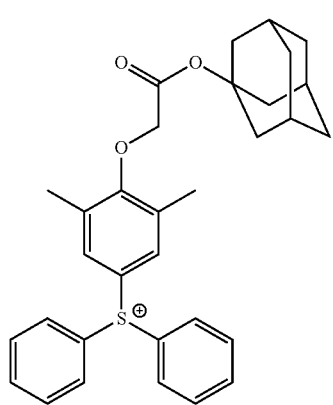
[In the formula, g1, g2, and g3 represent the numbers of repetitions, g1 is an integer in a range of 1 to 5, g2 is an integer in a range of 0 to 20, and g3 is an integer in a range of 0 to 20.]
(ca-1-48)
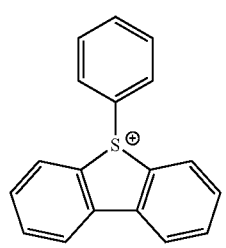
-continued
(ca-1-49)
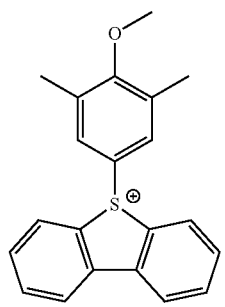
(ca-1-50)
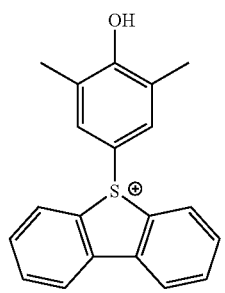
(ca-1-51)
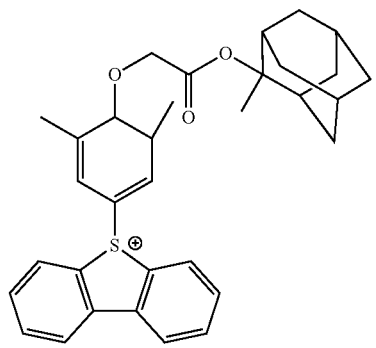
(ca-1-52)
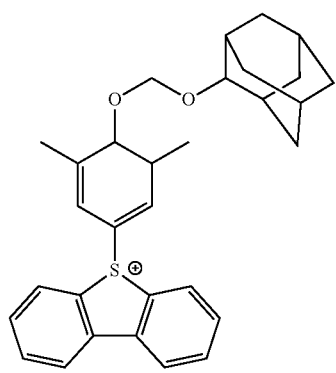
(ca-1-53)
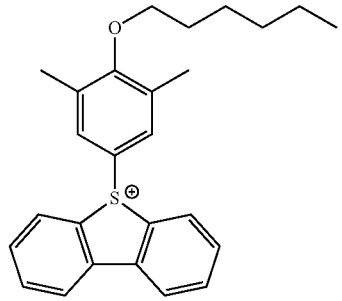

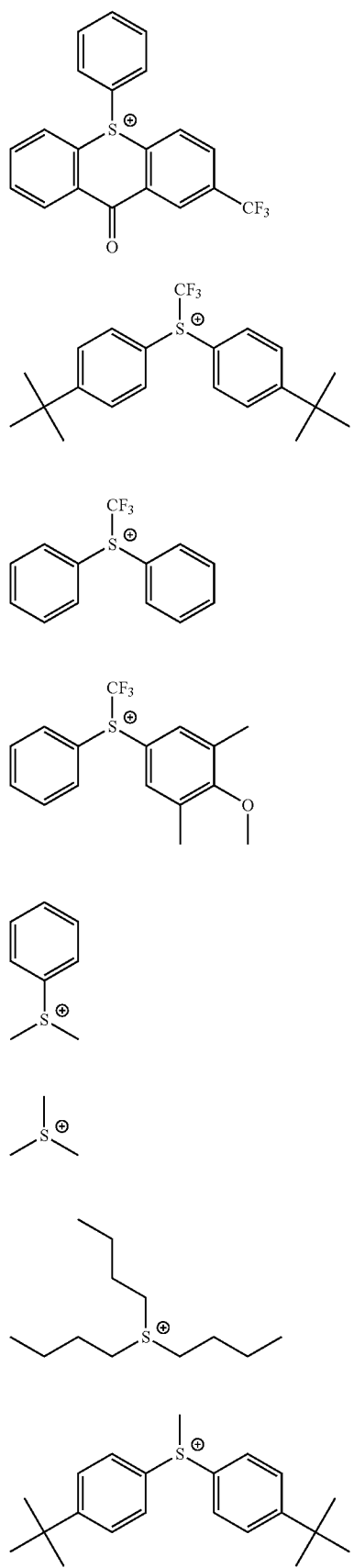
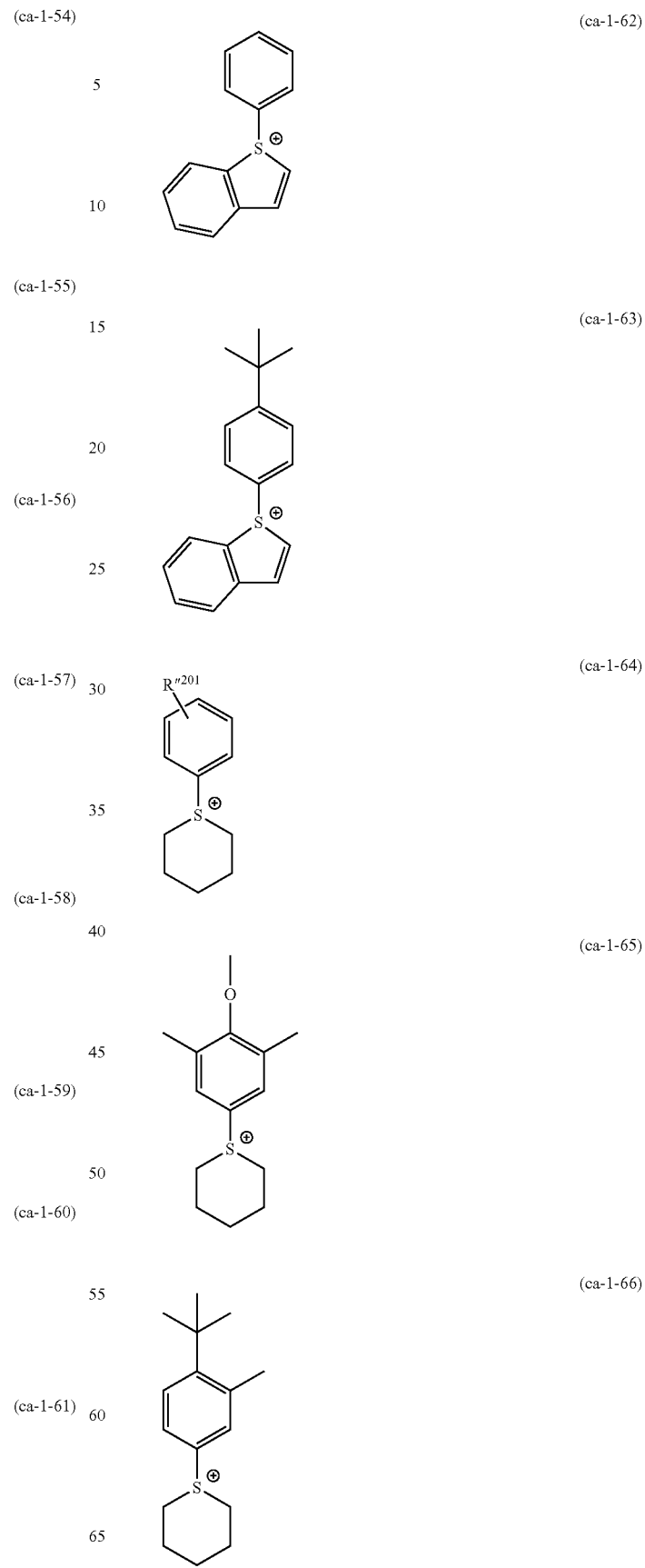

(ca-1-67)

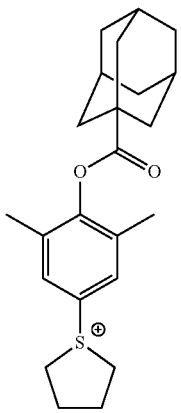

(ca-1-68)

(ca-1-69)

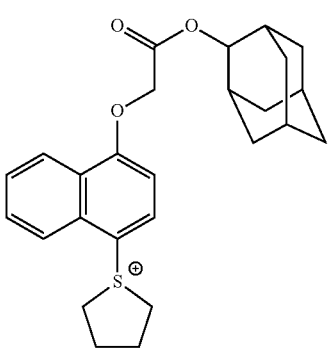

(ca-1-70)

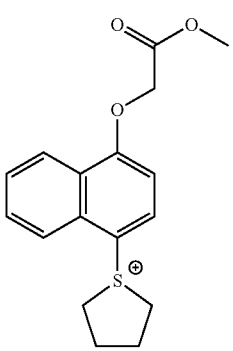

(ca-1-71)

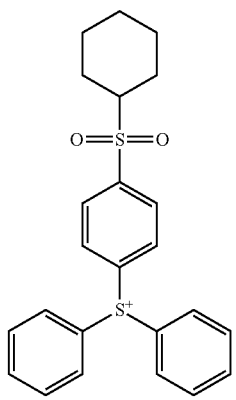

(ca-1-72)

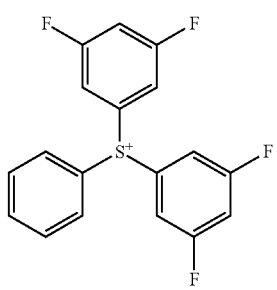

[In the formula, $R''^{201}$ represents a hydrogen atom or a substituent, and examples of the substituent include the same ones as those exemplified as the substituent which may be contained in $R^{201}$ to $R^{207}$ and $R^{210}$ to $R^1$.

Specific examples of suitable cations represented by General Formula (ca-2) include a diphenyliodonium cation and a bis(4-tert-butylphenyl)iodonium cation.

Specific examples of the suitable cations each represented by General Formula (ca-3) include cations each represented by General Formulae (ca-3-1) to (ca-3-6) shown below.

(ca-3-1)

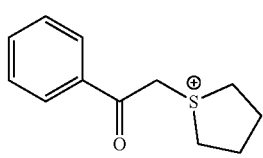

(ca-3-2)

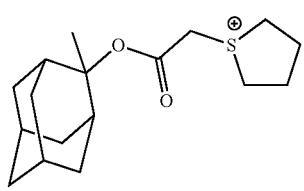

-continued
(ca-3-3)
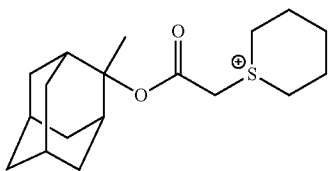
(ca-3-4)
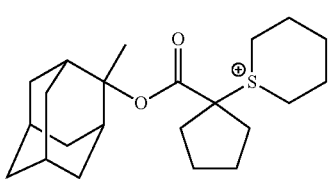
(ca-3-5)
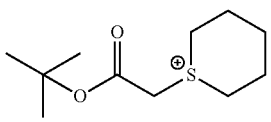
(ca-3-6)
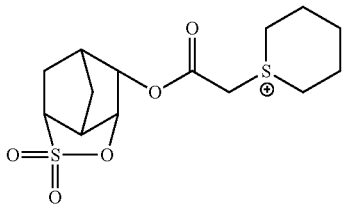
Specific examples of the suitable cations each represented by General Formula (ca-4) include cations each represented by General Formulae (ca-4-1) and (ca-4-2) shown below.
(ca-4-1)
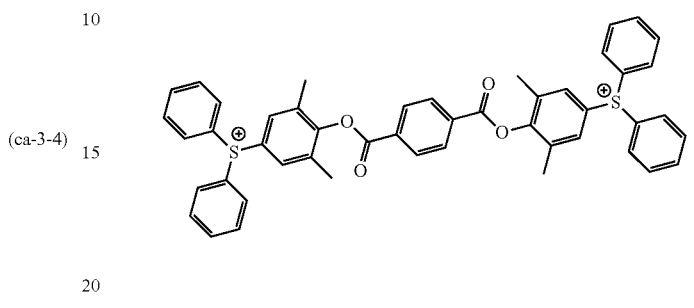
(ca-4-2)
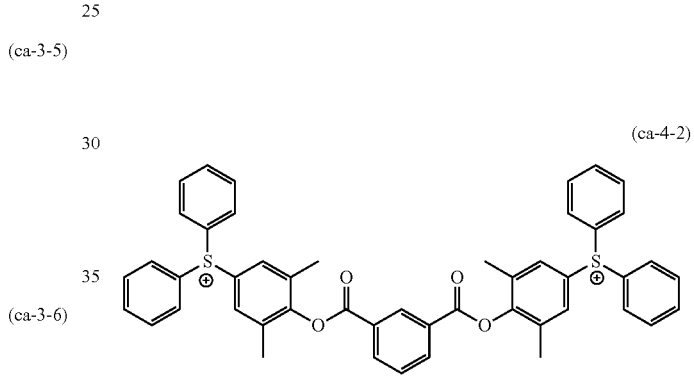
Specific examples of the suitable cations each represented by General Formula (ca-5) include cations each represented by General Formulae (ca-5-1) to (ca-5-3) shown below.
(ca-5-1)
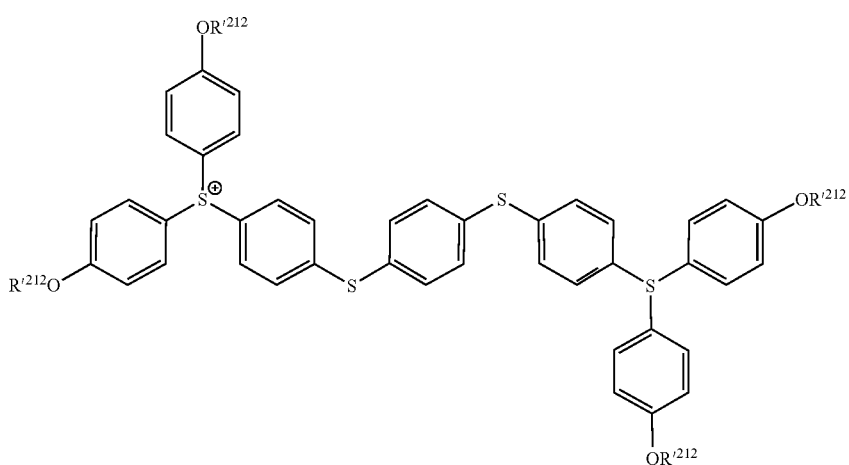

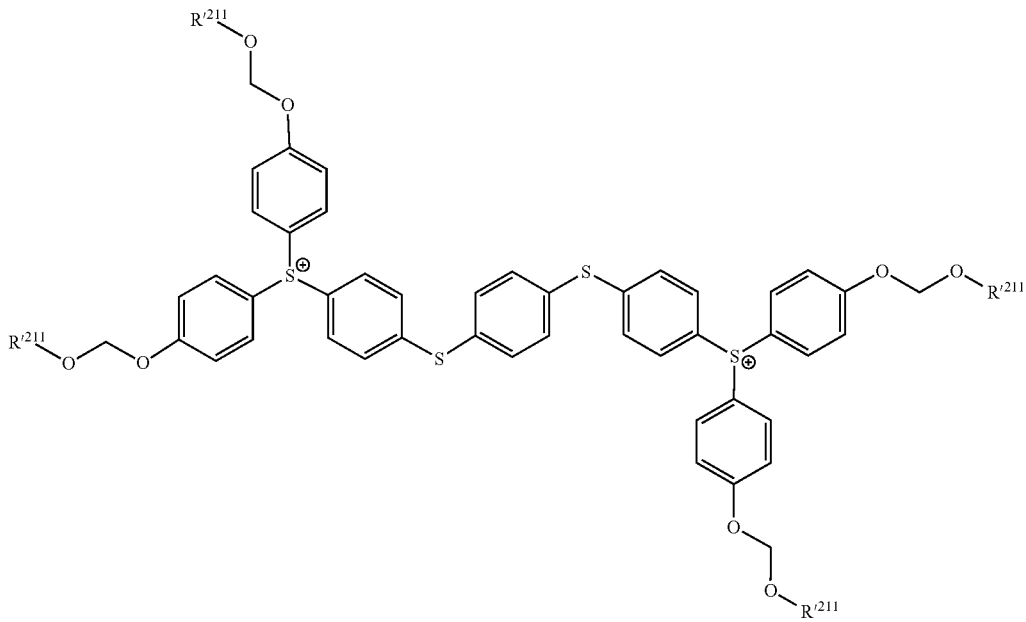

(ca-5-2)

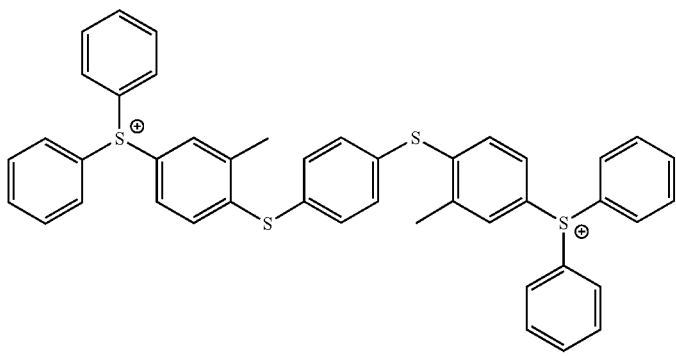

(ca-5-3)

Among the above cations, the cation moiety $((M^{m+})_{1/m})$ is preferably a cation represented by General Formula (ca-1).

In the resist composition according to the present embodiment, the component (B) may be used alone, or two or more kinds thereof may be used in combination.

The content of the component (B) in the resist composition according to the present embodiment is preferably less than 40 parts by mass, more preferably in a range of 1 to 30 parts by mass, and still more preferably in a range of 5 to 30 parts by mass, with respect to 100 parts by mass of the component (A).

In a case where the content of the component (B) is set to be in the preferred range described above, pattern formation can be satisfactorily carried out. Further, in a case where each component of the resist composition is dissolved in an organic solvent, the above range is preferable since a homogeneous solution is easily obtained and the storage stability of the resist composition is improved.

<Acid Diffusion Controlling Agent Component (D)>

The resist composition according to the present embodiment further contains an acid diffusion controlling agent component (D) in addition to the component (A) and the component (B).

The component (D) contains a compound (D0) (hereinafter, also referred to as a "component (D0)") represented by General Formula (d0).

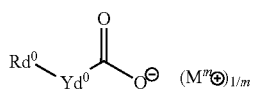

(d0)

[In the formula, $Rd^0$ represents a condensed ring-type group containing a condensed ring containing one or more aromatic rings. The condensed ring-type group has, as a substituent, an acid decomposable group that is decomposed under action of acid to form a polar group. $Yd^0$ represents a divalent linking group or a single bond, $M^{m+}$ represents an m-valent organic cation. m represents an integer of 1 or more.]

{Anion Moiety of Component (D0)}

In General Formula (d0), $Rd^0$ represents a condensed ring-type group that has a condensed ring containing one or more aromatic rings and has an acid decomposable group. Specific examples of the aromatic ring include aromatic hydrocarbon rings such as benzene, naphthalene, anthracene, and phenanthrene; and an aromatic heterocyclic ring obtained by substituting a part of carbon atoms constituting the above-described aromatic hydrocarbon ring with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

The condensed ring-type group as $Rd^0$ may be a polycyclic aromatic cyclic group in which a plurality of aromatic rings are condensed with each other or may be an aromatic ring-aliphatic hydrocarbon ring condensed ring-type group in which the above aromatic ring is condensed with aliphatic hydrocarbon ring.

Specific examples of the polycyclic aromatic cyclic group include naphthalene, anthracene, phenanthrene, biphenyl, and an aromatic heterocyclic ring obtained by substituting a part of carbon atoms constituting these aromatic rings with a hetero atom. Examples of the hetero atom in the aromatic heterocyclic rings include an oxygen atom, a sulfur atom, and a nitrogen atom.

Specific examples of the polycyclic aromatic cyclic group as $Rd^0$ include a group obtained by removing one hydrogen atom from the above-described aromatic ring (an aryl group; for example a naphthyl group) and a group in which one hydrogen atom in the aromatic ring has been substituted with an alkylene group (for example, an arylalkyl group such as a phenethyl group, a 1-naphthylmethyl group, a 2-naphthylmethyl group, 1-naphthylethyl group, or a 2-naphthylethyl group). The alkylene group (an alkyl chain in the arylalkyl group) preferably has 1 to 4 carbon atoms, more preferably 1 or 2 carbon atoms, and particularly preferably 1 carbon atom.

Examples of the aromatic ring-aliphatic hydrocarbon ring condensed ring-type group as $Rd^0$ include fluorene; and a group in which one or more aromatic rings are condensed with a polycycloalkane having a bridged ring-based polycyclic skeleton. Specific examples of the bridged ring-based polycycloalkane include bicycloalkanes such as bicyclo[2.2.1]heptane (norbornane) and bicyclo[2.2.2]octane.

The aromatic ring-aliphatic hydrocarbon ring condensed ring-type group is preferably a group containing a condensed ring, in which two or three aromatic rings are condensed with a bicycloalkane, and more preferably a group containing a condensed ring, in which two or three aromatic rings are condensed with bicyclo[2.2.2]octane. Specific examples of the condensed ring-type group as $Rd^0$ include groups represented by General Formulae (r-br-1) to (r-br-2) described above. In this case, * in General Formulae (r-br-1) to (r-br-2) described above represents a bonding site that is bonded to $Yd^0$ in General Formula (d0).

Among the above, the condensed ring-type group as $Rd^0$ in General Formula (d0) is preferably an aromatic ring-aliphatic hydrocarbon ring condensed ring-type group, more preferably a group containing a condensed ring, in which two or three aromatic rings are condensed with a bicycloalkane, still more preferably a group containing a condensed ring, in which two or three aromatic rings are condensed with a bicyclo[2.2.2]octane, and even still more preferably groups represented by General Formulae (r-br-1) and (r-br-2) described above.

In General Formula (d0), the condensed ring-type group as $Rd^0$ has, as a substituent, an acid decomposable group that is decomposed under action of acid to form a polar group. Specific examples of the acid dissociable group constituting the acid decomposable group include the "acetal-type acid dissociable group", the "tertiary alkyl ester-type acid dissociable group", and the "tertiary alkyloxycarbonyl acid dissociable group". Examples of the polar group include a carboxy group, a hydroxyl group, an amino group, and a sulfo group ($-SO_3H$).

Acetal-Type Acid Dissociable Group:

Examples of the acid dissociable group for protecting the hydroxyl group include the acid dissociable group represented by General Formula (a1-r-1) shown below.

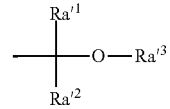

(a1-r-1)

[In the formula, $Ra'^1$ to $Ra'^2$ represent hydrogen atoms or alkyl groups. $Ra'^3$ represents a hydrocarbon group, and $Ra'^3$ may be bonded to any one of $Ra'^1$ or $Ra'^2$ to form a ring.]

Tertiary Alkyl Ester-Type Acid Dissociable Group:

Examples of the acid dissociable group for protecting the carboxy group include the acid dissociable group represented by General Formula (a1-r-2) shown below.

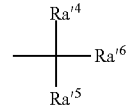

(a1-r-2)

[In the formula, $Ra'^4$ to $Ra'^6$ each represents a hydrocarbon group, and $Ra'^5$ and $Ra'^6$ may be bonded to each other to form a ring.]

Tertiary Alkyloxycarbonyl Acid Dissociable Group:

Examples of the acid dissociable group for protecting the hydroxyl group include the acid dissociable group represented by General Formula (a1-r-3) shown below.

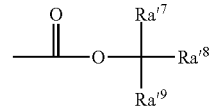

(a1-r-3)

[In the formula, $Ra'^7$ to $Ra'^9$ each represents an alkyl group.]

Examples of the "acetal-type acid dissociable group", the "tertiary alkyl ester-type acid dissociable group", and the "tertiary alkyloxycarbonyl acid dissociable group" include the same ones as the "acetal-type acid dissociable group", the "tertiary alkyl ester-type acid dissociable group", and the "tertiary alkyloxycarbonyl acid dissociable group", which are described in the expression of the constitutional unit (a1) of the component (A) described above.

The acid dissociable group constituting the acid decomposable group of the condensed ring-type group as $Rd^0$ is not particularly limited, and it may be an acid dissociable group other than the "acetal-type acid dissociable group", the "tertiary alkyl ester-type acid dissociable group", and the "tertiary alkyloxycarbonyl acid dissociable group".

Among the above, the acid decomposable group contained in the condensed ring-type group as $Rd^0$ is preferably an acid decomposable group represented by General Formula (pg-1).

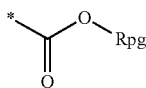

(pg-1)

[In General Formula (pg-1), Rpg represents an acid dissociable group represented by General Formula (pg-r-1), an acid dissociable group represented by General Formula (pg-r-2), an acid dissociable group represented by General Formula (pg-r-3), or an acid dissociable group represented by General Formula (pg-r-4). * represents a bonding site.]

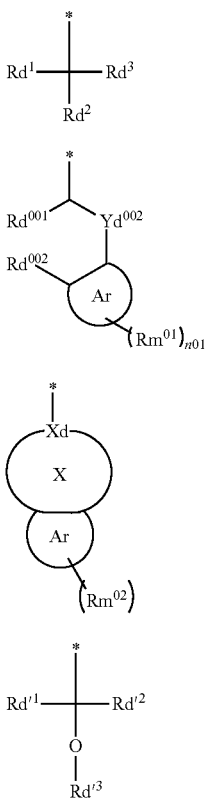

(pg-r-1)

(pg-r-2)

(pg-r-3)

(pg-r-4)

[In General Formula (pg-r-1), $Rd^1$ to $Rd^3$ each independently represent a hydrocarbon group, where $Rd^1$ and $Rd^2$ may be bonded to each other to form a ring.

In General Formula (pg-r-2), $Rd^{001}$ represents a linear or branched aliphatic hydrocarbon group. $Yd^{002}$ represents a single bond or a divalent linking group. $Rd^{002}$ represents a hydrogen atom or a substituent. Ar represents a benzene ring or a naphthalene ring. $Rm^{01}$ represents a substituent. n01 represents an integer in a range of 1 to 4.

In General Formula (pg-r-3), Xd represents a secondary carbon atom. X represents an alicyclic hydrocarbon ring which may have a substituent. Ar represents a benzene ring or a naphthalene ring. $Rm^{02}$ represents a substituent. n02 represents an integer in a range of 1 to 4.

In General Formula (pg-r-4), $Rd'^1$ and $Rd'^2$ represent a hydrogen atom or an alkyl group. $Rd'^3$ represents a hydrocarbon group, where $Rd'^3$ may be bonded to $Rd'^1$ or $Rd'^2$ to form a ring.

* represents a bonding site to an oxygen atom (—O—) in General Formula (pg-1).]

Examples of the acid dissociable group represented by General Formula (pg-r-1) include the same one as the acid dissociable group represented by General Formula (a1-r-2), in the constitutional unit (a1) of the component (A) described above.

That is, examples thereof include an acid dissociable group, where $Rd^{r1}$ in General Formula (pg-r-1) and $Ra'^4$ in General Formula (a1-r-2) are the same, $Rd^2$ in General Formula (pg-r-1) and $Ra'^5$ in General Formula (a1-r-2) are the same, and $Rd^3$ in General Formula (pg-r-1) and $Ra'^6$ in General Formula (a1-r-2) are the same.

In the acid dissociable group represented by General Formula (pg-r-1), suitable examples thereof include a group represented by General Formula (a1-r2-1), a group represented by General Formula (a1-r2-2), and a group represented by General Formula (a1-r2-3) in a case where $Rd^{r1}$ and $Rd^2$ are bonded to each other to form a ring.

On the other hand, suitable examples thereof include a group represented by General Formula (a1-r2-4) in a case where $Rd^{r1}$ to $Rd^3$ are not bonded to each other and are independent hydrocarbon groups.

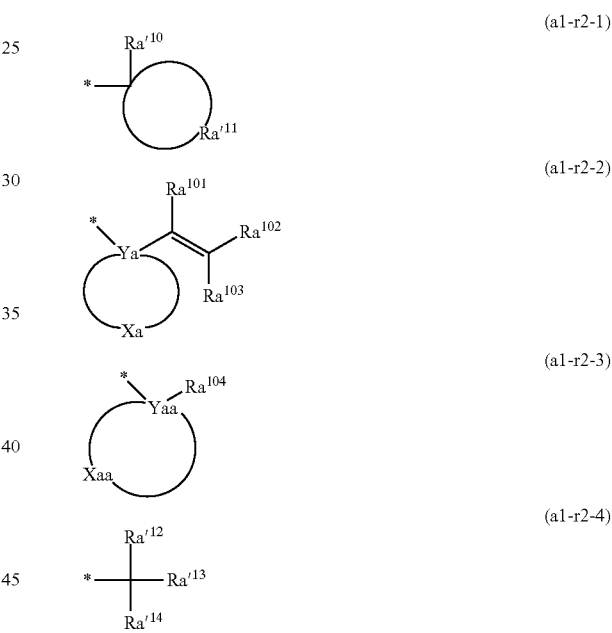

(a1-r2-1)

(a1-r2-2)

(a1-r2-3)

(a1-r2-4)

[In General Formula (a1-r2-1), $Ra'^{10}$ represents a linear or branched alkyl group having 1 to 12 carbon atoms, a part of which may be substituted with a halogen atom or a hetero atom-containing group. $Ra'^{11}$ represents a group that forms an aliphatic cyclic group together with a carbon atom to which $Ra'^{10}$ is bonded. In General Formula (a1-r2-2), Ya represents a carbon atom. Xa is a group that forms a cyclic hydrocarbon group together with Ya. Part or all of hydrogen atoms contained in the cyclic hydrocarbon group may be substituted. $Ra^{101}$ to $Ra^{103}$ each independently represent a hydrogen atom, a monovalent chain-like saturated hydrocarbon group having 1 to 10 carbon atoms, or a monovalent aliphatic cyclic saturated hydrocarbon group having 3 to 20 carbon atoms. Part or all of hydrogen atoms contained in the chain-like saturated hydrocarbon group and the aliphatic cyclic saturated hydrocarbon group may be substituted. Two or more of $Ra^{101}$ to $Ra^{103}$ may be bonded to each other to form a ring structure. In General Formula (a1-r2-3), Yaa represents a carbon atom. Xaa is a group that forms an aliphatic cyclic group together with Yaa. $Ra^{104}$ represents an aromatic hydrocarbon group which may have a substituent. In General Formula (a1-r2-4), $Ra'^{12}$ and $Ra'^{13}$ each independently represent a monovalent chain-like saturated hydrocarbon group having 1 to 10 carbon atoms or a hydrogen atom. Part or all of hydrogen atoms contained in the chain-like saturated hydrocarbon group may be substituted. $Ra'^{14}$ represents a hydrocarbon group which may have a substituent. * represents a bonding site].

Examples of the groups represented by General Formulae (a1-r2-1) to (a1-r2-4) include the same ones as the groups represented by General Formula Formulae (a1-r2-1) to (a1-r2-4), in the constitutional unit (a1) of the component (A) described above.

In General Formula (pg-r-2), $Rd^{001}$ represents a linear or branched aliphatic hydrocarbon group.

The linear or branched aliphatic hydrocarbon group as $Rd^{001}$ is preferably a linear alkyl group having 1 to 10 carbon atoms or a branched alkyl group having 3 to 20 carbon atoms, preferably a methyl group, an ethyl group, a propyl group, a 1-methylethyl group, a 1-methylpropyl group, or 2-methylpropyl group, and still more preferably a methyl group.

In General Formula (pg-r-2), $Yd^{002}$ represents a single bond or a divalent linking group. Examples of the divalent linking group as $Yd^{002}$ include the same one as the $Ya^{x1}$ in the constitutional unit (a10) of the component (A) described above. Specifically, suitable examples include a divalent hydrocarbon group which may have a substituent, and a divalent linking group containing a hetero atom.

Among the above, $Yd^{002}$ is preferably a single bond or a linear or branched aliphatic hydrocarbon group, more preferably a single bond or a linear aliphatic hydrocarbon group, still more preferably a single bond, or a methylene group [—$CH_2$—] or an ethylene group [—$(CH_2)_2$—], particularly preferably a single bond or a methylene group [—$CH_2$—], and most preferably a single bond.

In General Formula (pg-r-2), $Rd^{002}$ represents a hydrogen atom or a substituent. Examples of the substituent as $Rd^{002}$ include a carboxy group, a hydroxy group, an amino group, a sulfo group, a halogen atom, a halogenated alkyl group, an alkoxy group, an alkyloxycarbonyl group, and a nitro group, and among them, a hydroxy group is preferable.

Among them, $Rd^{002}$ is preferably a hydrogen atom or a hydroxy group, and more preferably a hydrogen atom.

In General Formula (pg-r-2), Ar represents a benzene ring or a naphthalene ring, and it is preferably a benzene ring.

In General Formula (pg-r-2), examples of the substituent as $Rm^{01}$ include a carboxy group, a hydroxy group, an amino group, a sulfo group, a halogen atom, a halogenated alkyl group, an alkoxy group, an alkyloxycarbonyl group, and a nitro group, and among them, a hydroxy group is preferable.

In General Formula (pg-r-2), $Rm^{01}$ is preferably a hydrogen atom.

In General Formula (pg-r-2), n01 is an integer in a range of 1 to 4, and it is preferably 1 or 2.

In General Formula (pg-r-3), X represents an alicyclic hydrocarbon ring which may have a substituent. The alicyclic hydrocarbon ring is preferably an alicyclic hydrocarbon ring having 4 to 20 carbon atoms, more preferably an alicyclic hydrocarbon ring having 5 to 15 carbon atoms, and still more preferably an alicyclic hydrocarbon ring having 5 to 10 carbon atoms. Specific examples thereof include aliphatic rings such as cyclopentane, cyclohexane, cycloheptane, cyclooctane, cyclononane, cyclodecane, cycloundecane, and cyclododecane; and spiroalkanes such as spiro[4.5]decane and spiro[5.5]undecane.

In General Formula (pg-r-3), Ar represents a benzene ring or a naphthalene ring, and it is preferably a benzene ring.

In General Formula (pg-r-3), examples of the substituent as $Rm^{02}$ include a carboxy group, a hydroxy group, an amino group, a sulfo group, a halogen atom, a halogenated alkyl group, an alkoxy group, an alkyloxycarbonyl group, and a nitro group, and among them, a hydroxy group is preferable.

In General Formula (pg-r-3), n02 is an integer in a range of 1 to 4, and it is preferably 1 or 2.

Examples of the acid dissociable group represented by General Formula (pg-r-4) include the same one as the acid dissociable group represented by General Formula (a1-r-1), in the constitutional unit (a1) of the component (A) described above.

That is, examples thereof include an acid dissociable group, where $Rd'^1$ in General Formula (pg-r-4) and $Ra'^1$ in General Formula (a1-r-1) are the same, $Rd'^2$ in General Formula (pg-r-4) and $Ra'^2$ in General Formula (a1-r-1) are the same, and $Rd'^3$ in General Formula (pg-r-4) and $Ra'^3$ in General Formula (a1-r-1) are the same.

Among them, Rpg as the acid decomposable group represented by General Formula (pg-1) is preferably a group having a cyclic acid dissociable group, more preferably an acid dissociable group represented by any one of General Formulae (pg-r-1) to (pg-r-3), and still more preferably an acid dissociable group represented by General Formula (pg-r-1), from the viewpoint of further improving the acid dissociation ability.

More specifically, Rpg is preferably an acid dissociable group represented by General Formula (a1-r2-1).

In a case where Rpg as the acid dissociable group represented by General Formula (pg-1) is an acid decomposable group represented by General Formula (a1-r2-1), $Ra'^{10}$ in General Formula (a1-r2-1) is preferably a linear or branched alkyl group having 1 to 5 carbon atoms, and more preferably a linear alkyl group having 1 to 5 carbon atoms.

Further, as $Ra'^{11}$ (a group that forms an aliphatic cyclic group together with a carbon atom to which $Ra'^{10}$ is bonded) in General Formula (a1-r2-1) is preferably a monocyclic alicyclic hydrocarbon group and more preferably a cyclopentyl group or a cyclohexyl group.

In General Formula (d0), the condensed ring-type group as $Rd^0$ may have a substituent other than the acid decomposable group described above. Examples of the above substituent include an alkyl group, an alkoxy group, a halogen atom, a halogenated alkyl group, a hydroxyl group, a nitro group, and a carbonyl group as a substituent.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

The halogen atom as the substituent is preferably a fluorine atom.

Examples of the above-described halogenated alkyl group as the substituent include a group in which part or all of hydrogen atoms in an alkyl group having 1 to 5 carbon atoms such as a methyl group, an ethyl group, a propyl group, an n-butyl group, or a tert-butyl group have been substituted with the above-described halogen atom.

The carbonyl group as the substituent is a group that substitutes a methylene group (—CH$_2$—) constituting the cyclic hydrocarbon group.

In General Formula (d0), Yd$^0$ represents a divalent linking group or a single bond.

Suitable examples of the divalent linking group as Yd$^0$ include a divalent linking group containing an oxygen atom.

In a case where Yd$^0$ represents a divalent linking group containing an oxygen atom, Yd$^0$ may contain an atom other than the oxygen atom. Examples of the atom other than the oxygen atom include a carbon atom, a hydrogen atom, a sulfur atom, and a nitrogen atom.

Examples of divalent linking groups containing an oxygen atom include non-hydrocarbon-based oxygen atom-containing linking groups such as an oxygen atom (an ether bond; —O—), an ester bond (—C(=O)—O—), an oxycarbonyl group (—O—C(=O)—), an amide bond (—C(=O)—NH—), a carbonyl group (—C(=O)—), or a carbonate bond (—O—C(=O)—O—); and combinations of the above-described non-hydrocarbon-based oxygen atom-containing linking groups with an alkylene group. Furthermore, a sulfonyl group (—SO$_2$—) may be linked to the combination.

Yd$^0$ is preferably a divalent linking group containing an ester bond or a divalent linking group containing an ether bond, and more preferably a linking group represented by General Formulae (y-d0-1) or (y-d0-2).

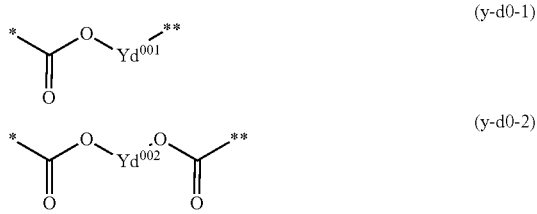

[In the formula, Yd$^{001}$ and Yd$^{002}$ each independently represent an aliphatic hydrocarbon group having 1 to 4 carbon atoms. * represents a bonding site to Rd$^0$ in General Formula (d0). ** represents a bonding site to a carbon atom of the carbonyl group in General Formula (d0).]

Yd$^{001}$ in General Formula (y-d0-1) and Yd$^{002}$ in General Formula (y-d0-2) each independently represent an aliphatic hydrocarbon group having 1 to 4 carbon atoms.

Examples of the aliphatic hydrocarbon group include an alkylene group, an alkenylene group, an alkadienylene group, an alkartrienylene group, an alkynylene group, or a group obtained by combining these groups.

Alkylene Group Having 1 to 4 Carbon Atoms

Examples of the linear alkylene group having 1 to 4 carbon atoms include a methylene group, an ethylene group [—(CH$_2$)$_2$—], a trimethylene group [—(CH$_2$)$_3$—], and a tetramethylene group [—(CH$_2$)$_4$—].

Examples of the branched alkylene group having 2 to 4 carbon atoms include alkylalkylene groups such as an alkylmethylene group such as —CH(CH$_3$)—, —CH(CH$_2$CH$_3$)—, —C(CH$_3$)$_2$—, or —C(CH$_3$)(CH$_2$CH$_3$)—; an alkylethylene group such as —CH(CH$_3$)CH$_2$—, —CH(CH$_3$)CH(CH$_3$)—, —C(CH$_3$)$_2$CH$_2$—, or —CH(CH$_2$CH$_3$)CH$_2$—; and an alkyltrimethylene group such as an —CH(CH$_3$)CH$_2$CH$_2$— or CH$_2$CH(CH$_3$)CH$_2$—.

Alkenylene Group Having 2 to 4 Carbon Atoms

The alkenylene group having 2 to 4 carbon atoms may be a linear alkenylene group or may be a branched alkenylene group.

Examples of the linear alkenyl group having 2 to 4 carbon atoms include an ethenylene group (a vinylene group), a 1-propenylene group, a 2-propenylene group, and a butynylene group.

Examples of the branched alkenyl group having 3 or 4 carbon atoms include a 1-methylvinylene group, a 1-methylpropenylene group, and a 2-methylpropenylene group.

Alkadienylene Group and Alkatrienylene Group

Examples of the alkadienylene group having 3 or 4 carbon atoms include a propadienylene group and a butadienylene group, and examples of the alkadienylene group having 4 carbon atoms include a butatrienylene group.

Alkynylene Group Having 2 to 4 Carbon Atoms

Examples of the alkynylene group having 2 to 4 carbon atoms include an ethynylene group (—C≡C—).

A combination of a group of an alkylene group, an alkenylene group, an alkadienylene group, an alkatrienylene group, and an alkynylene group is preferably, for example, a group of a combination of an alkylene group and an alkynylene group. Specifically, a —CH$_2$—C≡C— group is preferable.

Among the above, Yd$^{001}$ in General Formula (y-d0-1) and Yd$^{002}$ in General Formula (y-d0-2) are each independently preferably an alkylene group having 1 to 4 carbon atoms or a group of a combination of an alkylene group and an alkynylene group, the group having 1 to 4 carbon atoms in total, and it is more preferably an alkylene group having 1 or 2 carbon atoms or a —CH$_2$—C≡C— group.

In the present embodiment, the anion moiety of the component (D0) is preferably an anion represented by General Formula (d0-an0) from the viewpoint of CDU and resolution improvement.

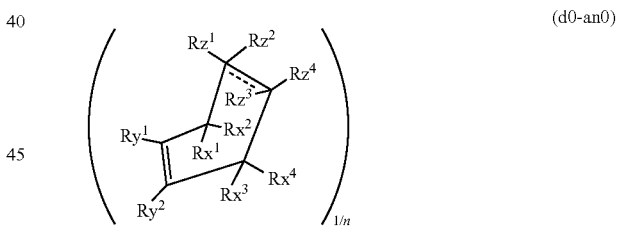

[In the formula, Rx$^1$ to Rx$^4$ each independently represent a hydrocarbon group which may have a substituent or a hydrogen atom, or two or more thereof may be bonded to each other to form a ring structure. Ry$^1$ and Ry$^2$ each independently represent a hydrocarbon group which may have a substituent or a hydrogen atom, or may be bonded to each other to form a ring structure.]

- - - - -

The above doublet line of dotted line and straight line represents a double bond or a single bond. In a case of being allowed in terms of valence, Rz$^1$ to Rz$^4$ each independently represent a hydrocarbon group which may have a substituent or a hydrogen atom, or two or more thereof may be bonded to each other to form a ring structure. However, two or more of Rx$^1$ to Rx$^4$, Ry$^1$ and Ry$^2$, or two or more of Rz$^1$ to Rz$^4$ are bonded to each other to form an aromatic ring. In addition, at least one of Rx$^1$ to Rx$^4$, Ry$^1$ and Ry$^2$, and Rz$^1$ to Rz$^4$ has an anion group represented by General Formula (d0-r-an1), where an entire anion moiety is an n-valent anion. Further, at least one of $Rx^1$ to $Rx^4$, $Ry^1$, $Ry^2$, and $Rz^1$ to $Rz^4$ has the acid decomposable group. n represents an integer of 1 or more.]

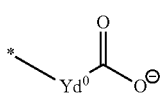
(d0-r-an1)

[In the formula, $Yd^0$ represents a divalent linking group or a single bond. * represents a bonding site].

In General Formula (d0-an0), $Rx^1$ to $Rx^4$ each independently represent a hydrocarbon group which may have a substituent or a hydrogen atom, or two or more thereof may be bonded to each other to form a ring structure.

$Ry^1$ and $Ry^2$ each independently represent a hydrocarbon group which may have a substituent or a hydrogen atom or may be bonded to each other to form a ring structure.

In a case of being allowed in terms of valence, $Rz^1$ to $Rz^4$ each independently represent a hydrocarbon group which may have a substituent or a hydrogen atom, or two or more thereof may be bonded to each other to form a ring structure.

The hydrocarbon group as $Rx^1$ to $Rx^4$, $Ry^1$, $Ry^2$, and $Rz^1$ to $Rz^4$ may be each an aliphatic hydrocarbon group or an aromatic hydrocarbon group and may be each a cyclic hydrocarbon group or a chain-like hydrocarbon group.

Examples of the hydrocarbon group which may have a substituent, as $Rx^1$ to $Rx^4$, $Ry^1$, $Ry^2$, and $Rz^1$ to $Rz^4$, include a cyclic group which may have a substituent, a chain-like alkyl group which may have a substituent, and a chain-like alkenyl group which may have a substituent.

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. The aliphatic hydrocarbon group may be saturated or unsaturated. In general, it is preferable that the aliphatic hydrocarbon group is saturated. In addition, the cyclic hydrocarbon group as $Rx^1$ to $Rx^4$, $Ry^1$, $Ry^2$, and $Rz^1$ to $Rz^4$ may contain a hetero atom such as a heterocyclic ring.

The aromatic hydrocarbon group as $Rx^1$ to $Rx^4$, $Ry^1$, $Ry^2$, and $Rz^1$ to $Rz^4$ is a hydrocarbon group having an aromatic ring. The aromatic hydrocarbon group preferably has 3 to 30 carbon atoms, more preferably has 5 to 30 carbon atoms, still more preferably 5 to 20 carbon atoms, particularly preferably 6 to 15 carbon atoms, and most preferably 6 to 12 carbon atoms. However, the number of carbon atoms in a substituent is not included in the number of carbon atoms.

Specific examples of the aromatic ring contained in the aromatic hydrocarbon group as $Rx^1$ to $Rx^4$, $Ry^1$ and $Ry^2$, and $Rz^1$ to $Rz^4$ include benzene, fluorene, naphthalene, anthracene, phenanthrene, biphenyl, and an aromatic heterocyclic ring obtained by substituting part of carbon atoms constituting any one of these aromatic rings with a hetero atom. Examples of the hetero atom in the aromatic heterocyclic rings include an oxygen atom, a sulfur atom, and a nitrogen atom. The aromatic ring contained in the aromatic hydrocarbon group as $Rx^1$ to $Rx^4$, $Ry^1$, $Ry^2$, and $Rz^1$ to $Rz^4$ preferably does not contain a hetero atom and is more preferably an aromatic ring such as benzene, fluorene, naphthalene, anthracene, phenanthrene, or biphenyl from the viewpoint of the compatibility with the component (A).

Specific examples of the aromatic hydrocarbon group as $Rx^1$ to $Rx^4$, $Ry^1$, $Ry^2$, and $Rz^1$ to $Rz^4$ include a group obtained by removing one hydrogen atom from the above-described aromatic ring (an aryl group such as a phenyl group or a naphthyl group) and a group in which one hydrogen atom in the aromatic ring has been substituted with an alkylene group (an arylalkyl group such as a benzyl group, a phenethyl group, a 1-naphthylmethyl group, a 2-naphthylmethyl group, 1-naphthylethyl group, or a 2-naphthylethyl group). The alkylene group (an alkyl chain in the arylalkyl group) preferably has 1 to 4 carbon atoms, more preferably 1 or 2 carbon atoms, and particularly preferably 1 carbon atom.

Examples of the cyclic aliphatic hydrocarbon group as $Rx^1$ to $Rx^4$, $Ry^1$, $Ry^2$, and $Rz^1$ to $Rz^4$ include an aliphatic hydrocarbon group containing a ring in the structure thereof.

Examples of the aliphatic hydrocarbon group containing a ring in the structure thereof include an alicyclic hydrocarbon group (a group obtained by removing one hydrogen atom from an aliphatic hydrocarbon ring), a group in which the alicyclic hydrocarbon group is bonded to the terminal of a linear or branched aliphatic hydrocarbon group, and a group in which the alicyclic hydrocarbon group is interposed in a linear or branched aliphatic hydrocarbon group.

The alicyclic hydrocarbon group preferably has 3 to 20 carbon atoms and more preferably 3 to 12 carbon atoms.

The alicyclic hydrocarbon group may be a polycyclic group or a monocyclic group. The monocyclic alicyclic hydrocarbon group is preferably a group obtained by removing one or more hydrogen atoms from a monocycloalkane. The monocycloalkane preferably has 3 to 6 carbon atoms, and specific examples thereof include cyclopentane and cyclohexane. The polycyclic alicyclic hydrocarbon group is preferably a group obtained by removing one or more hydrogen atoms from a polycycloalkane, and the polycycloalkane preferably has 7 to 30 carbon atoms.

The linear aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and most preferably 1 to 3 carbon atoms. The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group which may be bonded to the alicyclic hydrocarbon group preferably has 2 to 10 carbon atoms, more preferably 3 to 6 carbon atoms, still more preferably 3 or 4 carbon atoms, and most preferably 3 carbon atoms. The branched aliphatic hydrocarbon group is preferably a branched alkylene group, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. The alkyl group in the alkylalkylene group is preferably a linear alkyl group having 1 to 5 carbon atoms.

In addition, examples of the cyclic group as $Rx^1$ to $Rx^4$, $Ry^1$, $Ry^2$, and $Rz^1$ to $Rz^4$ include —$COOR^{XYZ}$ and —OC (=O)R$^{XYZ}$, where R$^{XYZ}$ is a lactone-containing cyclic group, a carbonate-containing cyclic group, or —SO$_2$—-containing cyclic group.

Examples of the substituent in the cyclic group as Rx$^1$ to Rx$^4$, Ry$^1$, Ry$^2$, and Rz$^1$ to Rz$^4$ include the same substituent as the substituent that the polycyclic aromatic cyclic group as Rd$^0$ may have.

Among the above, the substituent in the cyclic group as Rx$^1$ to Rx$^4$, Ry$^1$ and Ry$^2$, Rz$^1$ to Rz$^4$ is preferably an alkyl group, a halogen atom, or a halogenated alkyl group from the viewpoint of the compatibility with the component (A).

Chain-Like Alkyl Group which May have Substituent:

The chain-like alkyl group as Rx$^1$ to Rx$^4$, Ry$^1$, Ry$^2$, and Rz$^1$ to Rz$^4$ may be either linear or branched.

The linear alkyl group preferably has 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecil group, an icosyl group, a henicosyl group, and a docosyl group.

The branched alkyl group preferably has 3 to 20 carbon atoms, more preferably 3 to 15 carbon atoms, and most preferably 3 to 10 carbon atoms. Specific examples thereof include a 1-methylethyl group, a 1,1-dimethylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-Like Alkenyl Group which May have Substituent:

The chain-like alkenyl group as Rx$^1$ to Rx$^4$, Ry$^1$, Ry$^2$, and Rz$^1$ to Rz$^4$ may be linear or branched, preferably has 2 to 10 carbon atoms, more preferably 2 to 5 carbon atoms, still more preferably 2 to 4 carbon atoms, and particularly preferably 3 carbon atoms. Examples of the linear alkenyl group include a vinyl group, a propenyl group (an allyl group), and a butynyl group. Examples of the branched alkenyl group include a 1-propenyl group, a 2-propenyl group (an allyl group), a 1-methylpropenyl group, and a 2-methylpropenyl group.

Examples of the substituent in the chain-like alkyl group or alkenyl group as Rx$^1$ to Rx$^4$, Ry$^1$, Ry$^2$, and Rz$^1$ to Rz$^4$ include an alkoxy group, a halogen atom, a halogenated alkyl group, a hydroxyl group, a carbonyl group, a nitro group, an amino group, and the above-described cyclic group as Rx$^1$ to Rx$^4$, Ry$^1$, Ry$^2$, and Rz$^1$ to Rz$^4$. Among them, the substituent in the chain-like alkyl group or alkenyl group as Rx$^1$ to Rx$^4$, Ry$^1$, Ry$^2$, and Rz$^1$ to Rz$^4$ is preferably a halogen atom, a halogenated alkyl group, or the group mentioned as the above-described cyclic group as Rx$^1$ to Rx$^4$, Ry$^1$, Ry$^2$, and Rz$^1$ to Rz$^4$ from the viewpoint of the compatibility with the component (A).

In General Formula (d0-an0), Ry$^1$ and Ry$^2$ may be bonded to each other to form a ring structure.

The ring structure formed by Ry$^1$ and Ry$^2$ shares one side (the bond between carbon atoms to which Ry$^1$ and Ry$^2$ are each bonded) of the 6-membered ring in General Formula (d0-an0), and this ring structure may be an alicyclic hydrocarbon or may be an aromatic hydrocarbon. Further, this ring structure may be a polycyclic structure consisting of other ring structures.

The alicyclic hydrocarbons formed by Ry$^1$ and Ry$^2$ may be polycyclic or monocyclic. The monocyclic alicyclic hydrocarbon is preferably a monocycloalkane. The monocycloalkane preferably has 3 to 6 carbon atoms, and specific examples thereof include cyclopentane and cyclohexane. The polycyclic alicyclic hydrocarbon is preferably a polycycloalkane. The polycycloalkane preferably has 7 to 30 carbon atoms.

Specific examples of the aromatic hydrocarbon ring that are formed by Ry$^1$ and Ry$^2$ include benzene, fluorene, naphthalene, anthracene, phenanthrene, biphenyl, or an aromatic heterocyclic ring obtained by substituting a part of carbon atoms constituting these aromatic rings with a hetero atom. The aromatic hydrocarbon ring formed by Ry$^1$ and Ry$^2$ preferably does not contain a hetero atom and is more preferably an aromatic ring such as benzene, fluorene, naphthalene, anthracene, phenanthrene, or biphenyl from the viewpoint of the compatibility with the component (A).

The ring structure (the alicyclic hydrocarbon or the aromatic hydrocarbon) formed by Ry$^1$ and Ry$^2$ may have a substituent. Examples of the substituent here include the same ones as the substituents (for example, an alkyl group, an alkoxy group, a halogen atom, a halogenated alkyl group, a hydroxyl group, a nitro group, and a carbonyl group) in the above-described cyclic group as Rx$^1$ to Rx$^4$, Ry$^1$ and Ry$^2$, and Rz$^1$ to Rz$^4$. Among them, the substituent in the ring structure formed by Ry$^1$ and Ry$^2$ is preferably an alkyl group, a halogen atom, or a halogenated alkyl group from the viewpoint of the compatibility with the component (A).

Among the above, the ring structure formed by Ry$^1$ and Ry$^2$ is more preferably an aromatic hydrocarbon which may have a substituent.

In General Formula (d0-an0), two or more Rz$^1$ to Rz$^4$ may be bonded to each other to form a ring structure. For example, Rz$^1$ may form a ring structure together with any one of Rz$^2$ to Rz$^4$. Specific examples thereof include a ring structure that shares one side (the bond between a carbon atom to which Rz$^1$ and Rz$^2$ are bonded and a carbon atom to which Rz$^3$ and Rz$^4$ are bonded) of the 6-membered ring in General Formula (d0-an0), a ring structure formed by bonding Rz$^1$ and Rz$^2$, and a ring structure formed by bonding Rz$^3$ and Rz$^4$.

The ring structure formed by two or more of Rz$^1$ to Rz$^4$ may be an alicyclic hydrocarbon or an aromatic hydrocarbon and is preferably an aromatic hydrocarbon. Further, this ring structure may be a polycyclic structure consisting of other ring structures.

The alicyclic hydrocarbon formed by two or more of Rz$^1$ to Rz$^4$ may be polycyclic or monocyclic. The monocyclic alicyclic hydrocarbon is preferably a monocycloalkane. The monocycloalkane preferably has 3 to 6 carbon atoms, and specific examples thereof include cyclopentane and cyclohexane. The polycyclic alicyclic hydrocarbon is preferably a polycycloalkane. The polycycloalkane is preferably a polycycloalkane having 7 to 30 carbon atoms and specifically, the polycycloalkane is more preferably a polycycloalkane having a bridged ring-based polycyclic skeleton, such as adamantane, norbornane, isobornane, tricyclodecane, or tetracyclododecane; or a polycycloalkane having a condensed ring-based polycyclic skeleton, such as a cyclic group having a steroid skeleton.

The polycyclic structure may be a heterocyclic structure obtained by substituting a part of carbon atoms with a hetero atom and particularly preferably a nitrogen-containing heterocyclic ring, and specific examples thereof include a cyclic imide.

Specific examples of the aromatic hydrocarbon ring that are formed by two or more of $Rz^1$ to $Rz^4$ include benzene, fluorene, naphthalene, anthracene, phenanthrene, biphenyl, or an aromatic heterocyclic ring obtained by substituting a part of carbon atoms constituting these aromatic rings with a hetero atom. The aromatic hydrocarbon rings formed by two or more of $Rz^1$ to $Rz^4$ preferably do not contain a hetero atom, and it is more preferably an aromatic ring such as benzene, fluorene, naphthalene, anthracene, phenanthrene, or biphenyl from the viewpoint of the compatibility with the component (A).

The ring structure (the alicyclic hydrocarbon or the aromatic hydrocarbon) formed by $Rz^1$ to $Rz^4$ may have a substituent. Examples of the substituent here include the same ones as the substituents (for example, an alkyl group, an alkoxy group, a halogen atom, a halogenated alkyl group, a hydroxyl group, a nitro group, and a carbonyl group) in the above-described cyclic group as $Rx^1$ to $Rx^4$, $Ry^1$ and $Ry^2$, and $Rz^1$ to $Rz^4$. Among them, the substituent in the ring structure formed by $Rz^1$ to $Rz^4$ is preferably an alkyl group, a halogen atom, or a halogenated alkyl group from the viewpoint of the compatibility with the component (A).

Among the above, the ring structure formed by two or more of $Rz^1$ to $Rz^4$ is preferably a ring structure that shares one side (the bond between a carbon atom to which $Rz^1$ and $Rz^2$ are bonded and a carbon atom to which $Rz^3$ and $Rz^4$ are bonded) of the 6-membered ring in General Formula (d0-an0) and more preferably an aromatic ring structure.

In General Formula (d0-an0), "in a case of being allowed in terms of valence" is as follows.

That is, in a case where the bond between the carbon atom to which $Rz^1$ and $Rz^2$ are bonded and the carbon atom to which $Rz^3$ and $Rz^4$ are bonded is a single bond, all of $Rz^1$, $Rz^2$, $Rz^3$, and $Rz^4$ are present. In a case where the bond between the carbon atom to which $Rz^1$ and $Rz^2$ are bonded and the carbon atom to which $Rz^3$ and $Rz^4$ are bonded is a double bond, only one of $Rz^1$ and $Rz^2$ is present, and only one of $Rz^3$ and $Rz^4$ is present. Further, for example, in a case where $Rz^1$ and $Rz^3$ are bonded to form an aromatic ring structure, $Rz^2$ and $Rz^4$ are not present.

In General Formula (d0-an0), two or more $Rx^1$ to $Rx^4$ may be bonded to each other to form a ring structure. For example, $Rx^1$ may form a ring structure together with any one of $Rx^2$ to $Rx^4$.

The ring structure formed by two or more of $Rx^1$ to $Rx^4$ may be an alicyclic hydrocarbon or an aromatic hydrocarbon. Further, this ring structure may be a polycyclic structure consisting of other ring structures.

The alicyclic hydrocarbon formed by two or more of $Rx^1$ to $Rx^4$ may be polycyclic or monocyclic. The monocyclic alicyclic hydrocarbon is preferably a monocycloalkane. The monocycloalkane preferably has 3 to 6 carbon atoms, and specific examples thereof include cyclopentane and cyclohexane. The polycyclic alicyclic hydrocarbon is preferably a polycycloalkane. The polycycloalkane is preferably a polycycloalkane having 7 to 30 carbon atoms and specifically, the polycycloalkane is more preferably a polycycloalkane having a bridged ring-based polycyclic skeleton, such as adamantane, norbornane, isobornane, tricyclodecane, or tetracyclododecane; or a polycycloalkane having a condensed ring-based polycyclic skeleton, such as a cyclic group having a steroid skeleton.

Specific examples of the aromatic hydrocarbon ring that are formed by two or more of Rx1 to Rx4 include benzene, fluorene, naphthalene, anthracene, phenanthrene, biphenyl, or an aromatic heterocyclic ring obtained by substituting a part of carbon atoms constituting these aromatic rings with a hetero atom. The aromatic hydrocarbon rings formed by two of Rx1 to Rx4 preferably do not contain a hetero atom, and it is more preferably an aromatic ring such as benzene, fluorene, naphthalene, anthracene, phenanthrene, or biphenyl from the viewpoint of the compatibility with the component (A).

The ring structure (the alicyclic hydrocarbon or the aromatic hydrocarbon) formed by $Rx^1$ to $Rx^4$ may have a substituent. Examples of the substituent here include the same ones as the substituents (for example, an alkyl group, an alkoxy group, a halogen atom, a halogenated alkyl group, a hydroxyl group, a nitro group, and a carbonyl group) in the above-described cyclic group as $Rx^1$ to $Rx^4$, $Ry^1$ and $Ry^2$, and $Rz^1$ to $Rz^4$. Among them, the substituent in the ring structure formed by $Rx^1$ to $Rx^4$ is preferably an alkyl group, a halogen atom, or a halogenated alkyl group from the viewpoint of the compatibility with the component (A).

The ring structure formed by two or more of $Rx^1$ to $Rx^4$ is preferably an alicyclic hydrocarbon.

Further, among the above, it is preferable that the ring structure formed by two or more of $Rx^1$ to $Rx^4$ be a ring structure in which at least one of $Rx^1$ and $Rx^2$ and at least one of $Rx^3$ to $Rx^4$ are bonded to each other to form a bridged ring structure, and it is more preferable that this ring structure be an alicyclic hydrocarbon.

In a case where at least one of $Rx^1$ and $Rx^2$ and at least one of $Rx^3$ and $Rx^4$ are bonded to each other to form a ring structure, the number of carbon atoms constituting the bicyclic structure (the ring structure which also contains carbon atoms each bonded to $Ry^1$, $Ry^2$, $Rz^1$ and $Rz^2$, and $Rz^3$ and $Rz^4$) is preferably 7 to 16.

In General Formula (d0-an0), two or more of $Rx^1$ to $Rx^4$, $Ry^1$ and $Ry^2$, or two or more of $Rz^1$ to $Rz^4$ are bonded to each other to form an aromatic ring. The aromatic ring is the same as the aromatic ring described in the explanation of General Formula (d0).

In General Formula (d0-an0), at least one of $Rx^1$ to $Rx^4$, $Ry^1$, $Ry^2$, and $Rz^1$ to $Rz^4$ has an anion group represented by General Formula (d0-r-an1), and an entire anion moiety is an n-valent anion. n represents an integer of 1 or more. $Rx^1$ to $Rx^4$, $Ry^1$, $Ry^2$, and $Rz^1$ to $Rz^4$ may be each the above anion group. In a case where two or more of $Rx^1$ to $Rx^4$ are bonded to each other to form a ring structure, a carbon atom that forms the ring structure or a hydrogen atom bonded to the carbon atom may be substituted with the above anion group. In a case where two or more of $Ry^1$ and $Ry^2$ are bonded to each other to form a ring structure, a carbon atom that forms the ring structure or a hydrogen atom bonded to the carbon atom may be substituted with the above anion group. In a case where two or more of $Rz^1$ to $Rz^4$ are bonded to each other to form a ring structure, a carbon atom that forms the ring structure or a hydrogen atom bonded to the carbon atom may be substituted with the above anion group.

In General Formula (d0-r-an1), the divalent linking group as $Yd^0$ is the same as the divalent linking group as $Yd^0$ in General Formula (d0).

The number of anion groups in the component (D0) may be one or two or more.

In the component (D0), the entire anion moiety is an n-valent anion. n represents an integer of 1 or more, preferably represents 1 or 2, and more preferably 1.

In General Formula (d0-an0), at least one of $Rx^1$ to $Rx^4$, $Ry^1$ to $Ry^2$, and $Rz^1$ to $Rz^4$ has the above-described acid decomposable group. The preferred aspect of the acid decomposable group is the same as the acid decomposable group described in the explanation of General Formula (d0).

The anion moiety in the component (D0) is more preferably an anion represented by General Formula (d0-an1) from the viewpoint of acid diffusion suppressibility.

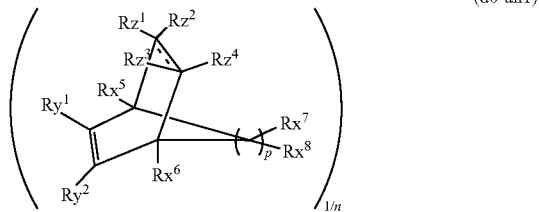

(d0-an1)

[In the formula, $Rx^5$ and $Rx^6$ each independently represent a hydrocarbon group which may have a substituent or a hydrogen atom. $Rx^7$ and $Rx^8$ each independently represent a hydrocarbon group which may have a substituent or a hydrogen atom, or they may be bonded to each other to form a ring structure. p is 1 or 2, and in a case where p=2, a plurality of $Rx^7$'s and $Rx^8$'s may be each different from each other. $Ry^1$ and $Ry^2$ each independently represent a hydrocarbon group which may have a substituent or a hydrogen atom or may be bonded to each other to form a ring structure.

----- is a double bond or a single bond, Rz1 to Rz4 each independently represent. In a case of being allowed in terms of valence, $Rz^1$ to $Rz^4$ each independently represent a hydrocarbon group which may have a substituent or a hydrogen atom, or two or more thereof may be bonded to each other to form a ring structure. However, $Rx^5$ and $Rx^6$, $Rx^7$ and $Rx^8$, $Ry^1$ and $Ry^2$, or two or more of $Rz^1$ to $Rz^4$ are bonded to each other to form an aromatic ring. Further, at least one of $Rx^5$ to $Rx^8$, $Ry^1$, $Ry^2$, and $Rz^1$ to $Rz^4$ has an anion group represented by General Formula (d0-r-an1), and an entire anion moiety is an n-valent anion. Furthermore, at least one of $Rx^5$ to $Rx^8$, $Ry^1$, $Ry^2$, and $Rz^1$ to $Rz^4$ has the acid decomposable group. n represents an integer of 1 or more.]

(d0-r-an1)

[In the formula, $Yd^0$ represents a divalent linking group or a single bond. * represents a bonding site].

In General Formula (d0-an1), $Rx^5$ and $Rx^6$ each independently represent a hydrocarbon group which may have a substituent or a hydrogen atom. The hydrocarbon group which may have a substituent, as $Rx^5$ and $Rx^6$, is the same as those described in the explanation of the hydrocarbon group which may have a substituent, as $Rx^1$ to $Rx^4$ in General Formula (d0-an0).

In General Formula (d0-an1), $Rx^7$ and $Rx^8$ each independently represent a hydrocarbon group which may have a substituent or a hydrogen atom or may be bonded to each other to form a ring structure. $Rx^7$ and $Rx^8$ are the same as those described in the explanation of $Rx^1$ to $Rx^4$ in General Formula (d0-an0).

In General Formula (d0-an1), p is 1 or 2, and in a case where p=2, a plurality of $Rx^7$'s and $Rx^8$'s may be each different from each other. In a case of p=1, the anion represented by General Formula (d0-an1) has a bicycloheptane ring structure, and in a case of p=2, the anion has a bicyclooctane ring structure.

In General Formula (d0-an1), $Ry^1$ and $Ry^2$ each independently represent a hydrocarbon group which may have a substituent or a hydrogen atom or may be bonded to each other to form a ring structure. $Ry^1$ and $Ry^2$ are the same as $Ry^1$ and $Ry^2$ in General Formula (d0-an0).

In a case of being allowed in terms of valence, $Rz^1$ to $Rz^4$ each independently represent a hydrocarbon group which may have a substituent or a hydrogen atom, or two or more thereof may be bonded to each other to form a ring structure. $Rz^1$ to $Rz^4$ are the same as $Rz^1$ to $Rz^4$ in General Formula (d0-an0) described above.

In General Formula (d0-an1), $Rx^5$ and $Rx^6$, $Rx^7$ and $Rx^8$, $Ry^1$ and $Ry^2$, or two or more of $Rz^1$ to $Rz^4$ are bonded to each other to form an aromatic ring. The details of the aromatic ring are as described in the explanation in General Formula (d0).

In General Formula (d0-an1), at least one of $Rx^5$ to $Rx^8$, $Ry^1$, $Ry^2$, and $Rz^1$ to $Rz^4$ has an anion group represented by General Formula (d0-r-an1), and an entire anion moiety is an n-valent anion. n represents an integer of 1 or more, preferably represents 1 or 2, and more preferably 1.

In General Formula (d0-an1), at least one of $Rx^5$ to $Rx^8$, $Ry^1$ to $Ry^2$, and $Rz^1$ to $Rz^4$ has the acid decomposable group. The preferred aspect of the acid decomposable group is the same as the acid decomposable group described in the explanation of General Formula (d0).

Among the above, the anion moiety in the component (D0) is still more preferably an anion represented by General Formula (d0-an1) in a case of p=2, that is, an anion represented by General Formula (d0-an2).

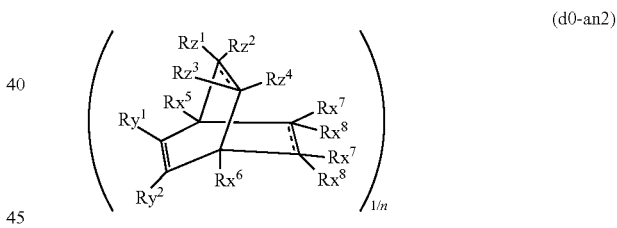

(d0-an2)

[In the formula, $Rx^5$ and $Rx^6$ each independently represent a hydrocarbon group which may have a substituent or a hydrogen atom. The plurality of $Rx^7$'s and $Rx^8$'s each independently represent a hydrocarbon group which may have a substituent or a hydrogen atom, or two or more thereof may be bonded to each other to form a ring structure. $Ry^1$ and $Ry^2$ each independently represent a hydrocarbon group which may have a substituent or a hydrogen atom or may be bonded to each other to form a ring structure.

----- is a double bond or a single bond, Rz1 to Rz4 each independently represent. In a case of being allowed in terms of valence, $Rz^1$ to $Rz^4$ each independently represent a hydrocarbon group which may have a substituent or a hydrogen atom, or two or more thereof may be bonded to each other to form a ring structure. However, $Rx^5$ and $Rx^6$, two or more of $Rx^7$'s and $Rx^8$'s, $Ry^1$ and $Ry^2$, or two or more of $Rz^1$ to $Rz^4$ are bonded to each other to form an aromatic ring. Further, at least one of $Rx^5$ to $Rx^8$, $Ry^1$, $Ry^2$, and $Rz^1$ to $Rz^4$ has an anion group represented by General Formula (d0-r-an1), and an entire anion moiety is an n-valent anion.

Furthermore, at least one of $Rx^5$ to $Rx^8$, $Ry^1$, $Ry^2$, and $Rz^1$ to $Rz^4$ has the acid decomposable group. n represents an integer of 1 or more.]

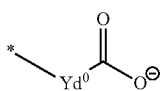
(d0-r-an1)

[In the formula, $Yd^0$ represents a divalent linking group or a single bond. * represents a bonding site].

In General Formula (d0-an2), $Rx^5$ and $Rx^6$, $Rx^7$ and $Rx^8$, $Ry^1$ and $Ry^2$, and $Rz^1$ to $Rz^4$ are each the same as $Rx^5$ and $Rx^6$, $Rx^7$ and $Rx^8$, $Ry^1$ and $Ry^2$, and $Rz^1$ to $Rz^4$ in General Formula (d0-an1).

In General Formula (d0-an2), $Rx^5$ and $Rx^6$, two or more of $Rx^7$'s and $Rx^8$'s, $Ry^1$ and $Ry^2$, or two or more of $Rz^1$ to $Rz^4$ are bonded to each other to form an aromatic ring. The details of the aromatic ring are as described in the explanation in General Formula (d0).

In General Formula (d0-an2), at least one of $Rx^5$ to $Rx^8$, $Ry^1$, $Ry^2$, and $Rz^1$ to $Rz^4$ has an anion group represented by General Formula (d0-r-an1), and an entire anion moiety is an n-valent anion. n represents an integer of 1 or more, preferably represents 1 or 2, and more preferably 1.

In General Formula (d0-an2), at least one of $Rx^5$ to $Rx^8$, $Ry^1$ to $Ry^2$, and $Rz^1$ to $Rz^4$ has the above-described acid decomposable group. The preferred aspect of the acid decomposable group is the same as the acid decomposable group described in the explanation of General Formula (d0).

In General Formula (d0-an0), General Formula (d0-an1), and General Formula (d0-an2) described above, it is preferable that $Ry^1$ and $Ry^2$ are bonded to each other to form a ring structure, and it is more preferable that the ring structure to be formed is an aromatic hydrocarbon (an aromatic ring or an aromatic heterocyclic ring) which may have a substituent.

In General Formula (d0-an0), General Formula (d0-an1), and General Formula (d0-an2) described above, it is preferable that $Rz^1$ to $Rz^4$ are bonded to each other to form a ring structure, where the ring structure to be formed is preferably a ring structure that shares one side (the bond between a carbon atom to which $Rz^1$ and $Rz^2$ are bonded and a carbon atom to which $Rz^3$ and $Rz^4$ are bonded) of the 6-membered ring in the formula and more preferably an aromatic hydrocarbon (an aromatic ring or an aromatic heterocyclic ring) which may have a substituent.

In General Formulae (d0-an1) and (d0-an2) described above, it is preferable that $Rx^7$ and $Rx^8$ are bonded to each other to form a ring structure, and it is more preferable that the ring structure to be formed is an aromatic hydrocarbon (an aromatic ring or an aromatic heterocyclic ring) which may have a substituent.

In General Formula (d0-an2), the ring structure formed in $Rx^7$ and $Rx^8$ is preferably a ring structure that shares one side (the bond between the same carbon atoms to which $Rx^7$ and $Rx^8$ are bonded) of the 6-membered ring in the formula and more preferably an aromatic hydrocarbon (an aromatic ring or an aromatic heterocyclic ring) which may have a substituent.

In the entire anion represented by General Formula (d0-an2) described above, the number of ring structures each formed by bonding $Rx^7$ and $Rx^8$, $Ry^1$ and $Ry^2$, and $Rz^1$ to $Rz^4$ to each other may be one or two or more and is preferably two or three.

In the present embodiment, the anion moiety of the component (D0) is particularly preferably an anion represented by General Formula (d0-an3) from the viewpoint of CDU and resolution improvement.

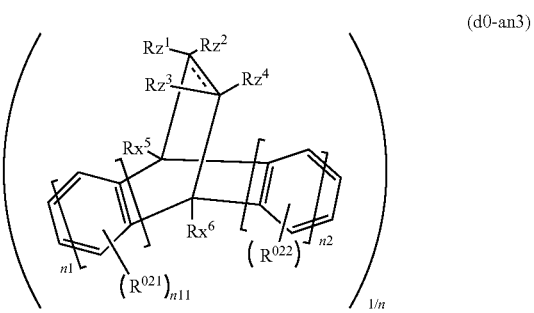
(d0-an3)

[In the formula, $Rx^5$ and $Rx^6$ each independently represent a hydrocarbon group which may have a substituent or a hydrogen atom.

----- is a double bond or a single bond, Rz1 to Rz4 each independently represent. In a case of being allowed in terms of valence, $Rz^1$ to $Rz^4$ each independently represent a hydrocarbon group which may have a substituent or a hydrogen atom, or two or more thereof may be bonded to each other to form a ring structure. However, at least one of $Rx^5$ and $Rx^6$ and $Rz^1$ to $Rz^4$ has an anion group represented by General Formula (d0-r-an1), and an entire anion moiety is an n-valent anion. n represents an integer of 1 or more. Further, at least one of $Rx^5$ and $Rx^6$ and $Rz^1$ to $Rz^4$ has the acid decomposable group. $R^{021}$ represents an alkyl group, an alkoxy group, a halogen atom, a halogenated alkyl group, a hydroxyl group, a carbonyl group, or a nitro group. n1 represents an integer in a range of 1 to 3. n11 represents an integer in a range of 0 to 8. $R^{022}$ represents an alkyl group, an alkoxy group, a halogen atom, a halogenated alkyl group, a hydroxyl group, a carbonyl group, or a nitro group. n2 represents an integer in a range of 1 to 3. n21 represents an integer in a range of 0 to 8.]

(d0-r-an1)

[In the formula, $Yd^0$ represents a divalent linking group or a single bond. * represents a bonding site].

In General Formula (d0-an3), $Rx^5$ and $Rx^6$ and $Rz^1$ to $Rz^4$ are each the same as $Rx^5$ and $Rx^6$ and $Rz^1$ to $Rz^4$ in General Formula (d0-an1).

In General Formula (d0-an3), $R^{021}$ represents an alkyl group, an alkoxy group, a halogen atom, a halogenated alkyl group, a hydroxy group, a carbonyl group, or a nitro group.

The alkyl group as $R^{021}$ is preferably an alkyl group having 1 to 5 carbon atoms, and a methyl group, an ethyl group, a propyl group, an n-butyl group, or a tert-butyl group is more preferable.

The alkoxy group as $R^{021}$ is preferably an alkoxy group having 1 to 5 carbon atoms, more preferably a methoxy group, an ethoxy group, an n-propoxy group, an iso-propoxy group, an n-butoxy group, or a tert-butoxy group, and still more preferably a methoxy group or an ethoxy group.

The halogen atom as $R^{o21}$ is preferably a fluorine atom.

Examples of the halogenated alkyl group as $R^{o21}$ include a group in which part or all of hydrogen atoms in an alkyl group having 1 to 5 carbon atoms such as a methyl group, an ethyl group, a propyl group, an n-butyl group, or a tert-butyl group have been substituted with the above-described halogen atom.

Among them, $R^{o21}$ is preferably an alkyl group, a halogen atom, or a halogenated alkyl group from the viewpoint of the compatibility with the component (A).

In General Formula (d0-an3), n1 represents an integer in a range of 1 to 3, preferably 1 or 2, and more preferably 1.

In General Formula (d0-an3), n11 represents an integer in a range of 0 to 8, preferably an integer in a range of 0 to 4, more preferably 0, 1, or 2, and still more preferably 0 or 1.

In General Formula (d0-an3), $R^{o22}$ represents an alkyl group, an alkoxy group, a halogen atom, a halogenated alkyl group, a hydroxy group, a carbonyl group, or a nitro group, and examples thereof include the same one as $R^{o21}$ described above. Among them, $R^{o22}$ is preferably an alkyl group, a halogen atom, or a halogenated alkyl group from the viewpoint of the compatibility with the component (A).

In General Formula (d0-an3), n2 represents an integer in a range of 1 to 3, preferably 1 or 2, and particularly preferably 1.

In General Formula (d0-an3), n21 represents an integer in a range of 0 to 8, preferably an integer in a range of 0 to 4, more preferably 0, 1, or 2, and particularly preferably 0 or 1.

However, in General Formula (d0-an3), at least one of $Rx^5$ and $Rx^6$ and $Rz^1$ to $Rz^4$ has an anion group represented by General Formula (d0-r-an1), and an entire anion moiety is an n-valent anion. n represents an integer of 1 or more, preferably represents 1 or 2, and more preferably 1.

In General Formula (d0-an3), at least one of $Rx^5$ and $Rx^6$ and $Rz^1$ to $Rz^4$ has the above-described acid decomposable group. The preferred aspect of the acid decomposable group is the same as the acid decomposable group described in the explanation of General Formula (d0).

In General Formula (d0-an0), General Formula (d0-an1), General Formula (d0-an2), and General Formula (d0-an3) described above, at least one of $Rz^1$ to $Rz^4$ preferably has an anion group from the viewpoint of the excellent effect of the present invention. In a case where two or more of $Rz^1$ to $Rz^4$ are bonded to each other to form a ring structure, a carbon atom that forms the ring structure or a hydrogen atom bonded to the carbon atom may be substituted with the above anion group.

In General Formula (d0-an0), General Formula (d0-an1), General Formula (d0-an2), and General Formula (d0-an3) described above, at least one of $Rz^1$ to $Rz^4$ preferably has an acid decomposable group from the viewpoint of the excellent effect of the present invention. In a case where two or more of $Rz^1$ to $Rz^4$ are bonded to each other to form a ring structure, a hydrogen atom bonded to the carbon atom that forms the ring structure may be substituted with the above acid decomposable group.

Specific examples of the anion moiety of the component (D0) are shown below.

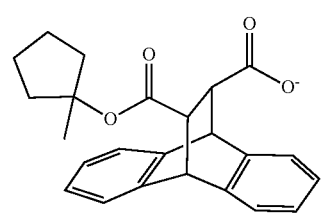
(d0-an-1)

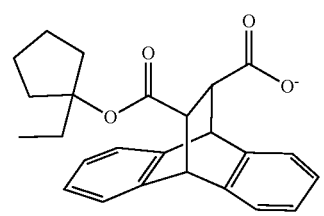
(d0-an-2)

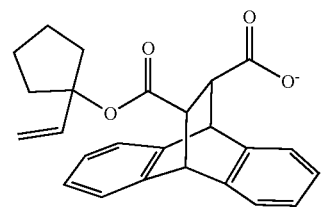
(d0-an-3)

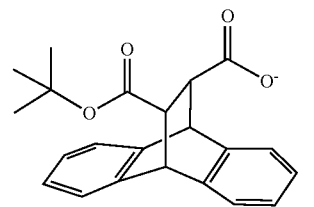
(d0-an-4)

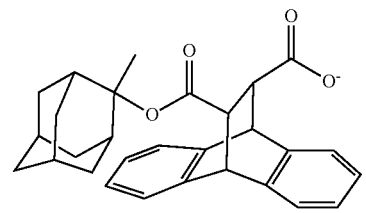
(d0-an-5)

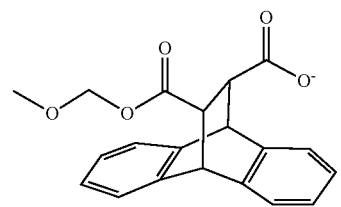
(d0-an-6)

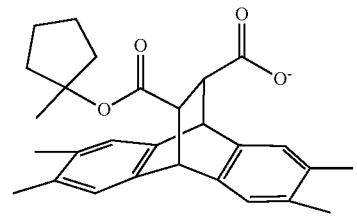
(d0-an-7)

(d0-an-8)
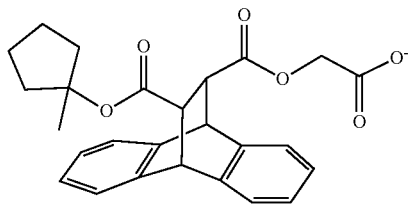
(d0-an-9)
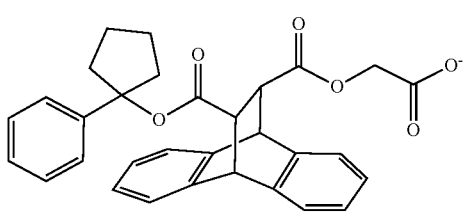
(d0-an-10)
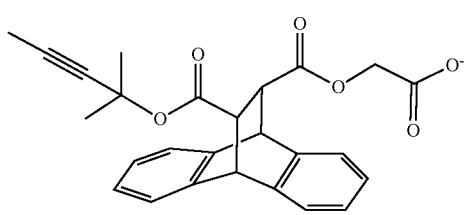
(d0-an-10)
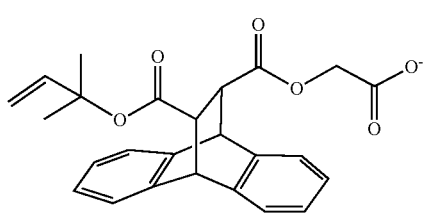
(d0-an-12)
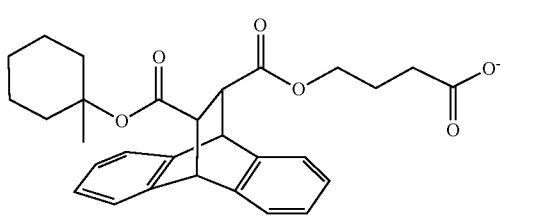
(d0-an-13)
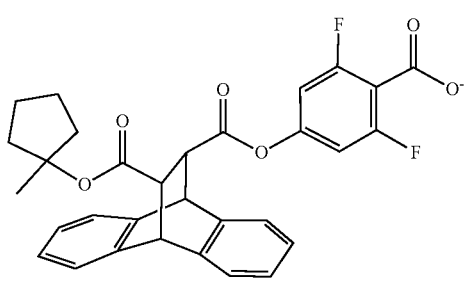
(d0-an-14)
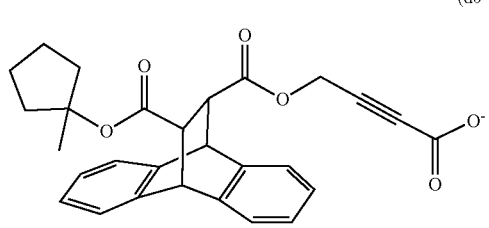
(d0-an-15)
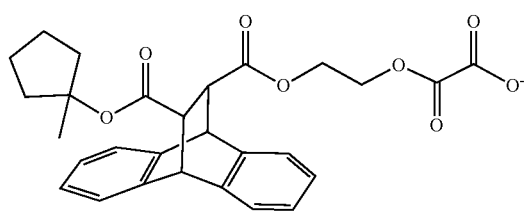
(d0-an-16)
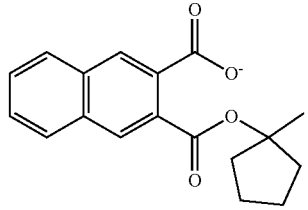
(d0-an-17)
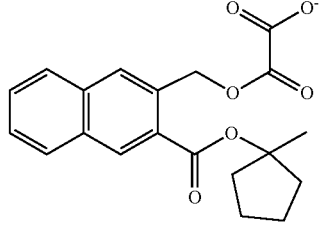
(d0-an-18)
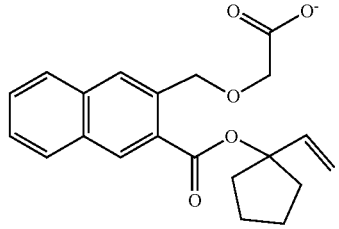
(d0-an-19)
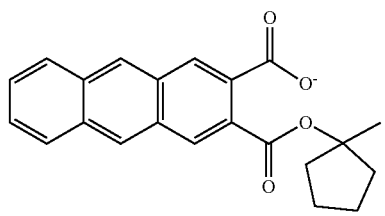
(d0-an-20)
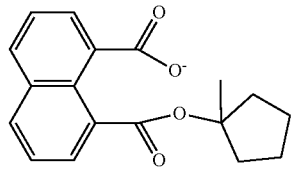

-continued (d0-an-21)

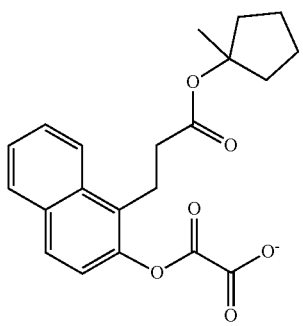

Among the above, the anion moiety of the component (D0) is preferably an anion represented by any one of Chemical Formulae (d0-an-1) to (d0-an-21), more preferably an anion represented by any one of Chemical Formulae (d0-an-1) to (d0-an-15), and still more preferably an anion represented by any one of Chemical Formulae (d0-an-1) to (d0-an-3), (d0-an-8), (d0-an-9) (d0-an-12), (d0-an-14), and (d0-an-15).

{Cation Moiety of Component (D0)}

In General Formula (d0), $M^{m+}$ represents an m-valent organic cation. Among them, a sulfonium cation and an iodonium cation are preferable. m represents an integer of 1 or more.

The suitable examples of the organic cation as $M^{m+}$ include the same ones as the cations each represented by General Formulae (ca-1) to (ca-5), and the cation represented by General Formula (ca-1) is more preferable.

In the resist composition according to the present embodiment, among the above, the component (D0) is preferably a compound represented by General Formula (d0-1).

(d0-1)

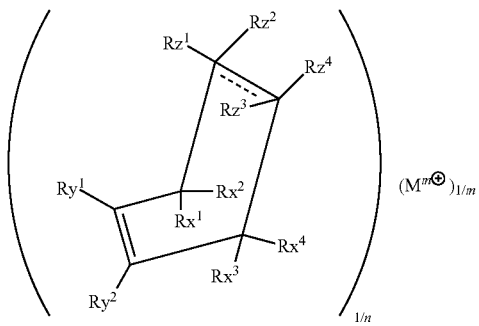

[In the formula, $Rx^1$ to $Rx^4$ each independently represent a hydrocarbon group which may have a substituent or a hydrogen atom, or two or more thereof may be bonded to each other to form a ring structure. $Ry^1$ and $Ry^2$ each independently represent a hydrocarbon group which may have a substituent or a hydrogen atom or may be bonded to each other to form a ring structure.

----- is a double bond or a single bond, Rz1 to Rz4 each independently represent. In a case of being allowed in terms of valence, $Rz^1$ to $Rz^4$ each independently represent a hydrocarbon group which may have a substituent or a hydrogen atom, or two or more thereof may be bonded to each other to form a ring structure. However, at least two or more of $Rx^1$ to $Rx^4$, at least $Ry^1$ and $Ry^2$, or at least two or more of $Rz^1$ to $Rz^4$ are bonded to each other to form an aromatic ring. In addition, at least one of $Rx^1$ to $Rx^4$, $Ry^1$ and $Ry^2$, and $Rz^1$ to $Rz^4$ has an anion group represented by General Formula (d0-r-an1), where an entire anion moiety is an n-valent anion. Further, at least one of $Rx^1$ to $Rx^4$, $Ry^1$ and $Ry^2$, and $Rz^1$ to $Rz^4$ has the acid decomposable group. n represents an integer of 1 or more. $M^{m+}$ represents an m-valent organic cation, where m represents an integer of 1 or more.]

(d0-r-an1)

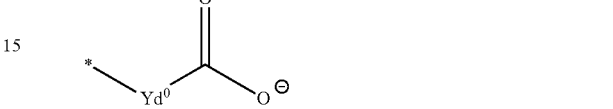

[In the formula, $Yd^0$ represents a divalent linking group or a single bond. * represents a bonding site].

The anion moiety of the compound represented by General Formula (d0-1) is the same as the anion represented by General Formula (d0-an0).

The acid decomposable group contained in the anion moiety of the compound represented by General Formula (d0-1) is preferably an acid decomposable group represented by General Formula (pg-1). Rpg as the acid decomposable group represented by General Formula (pg-1) is preferably a group having a cyclic acid dissociable group, more preferably an acid dissociable group represented by any one of General Formulae (pg-r-1) to (pg-r-3), and still more preferably an acid dissociable group represented by General Formula (pg-r-1).

More specifically, Rpg is preferably an acid dissociable group represented by General Formula (a1-r2-1).

$Yd^0$ in General Formula (d0-r-an1) is preferably a divalent linking group containing an ester bond or a divalent linking group containing an ether bond, and more preferably a linking group represented by General Formulae (y-d0-1) or (y-d0-2).

The cation moiety of the compound represented by General Formula (d0-1) is the same as the cation moiety of the compound represented by General Formula (d0).

Specific examples of the component (D0) are shown below but are not limited thereto.

(D0-01)

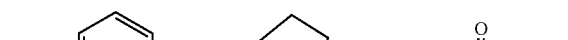

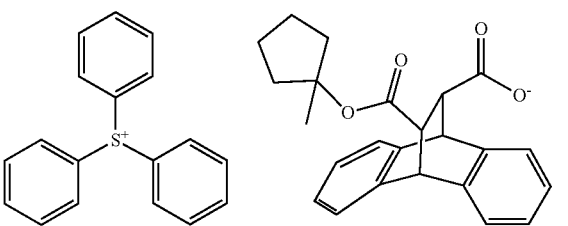

(D0-02)

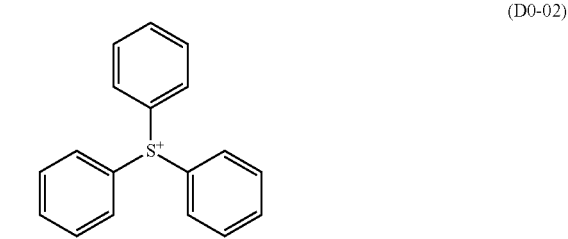

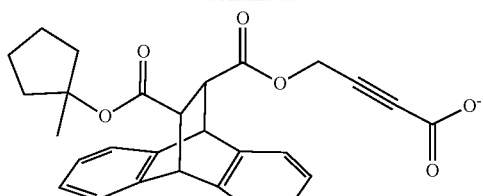
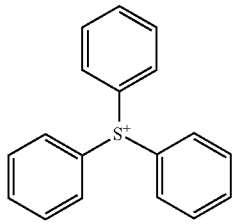
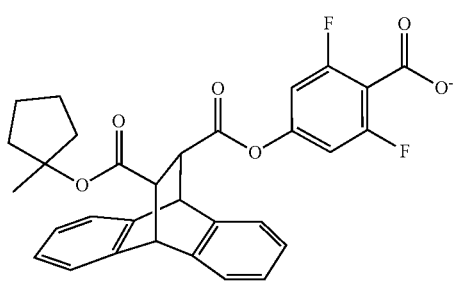
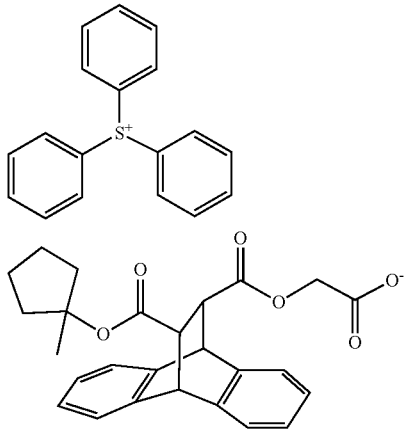
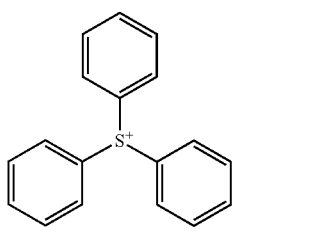
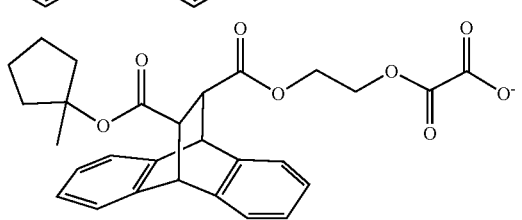
(D0-03)
(D0-04)
(D0-05)
(D0-06)
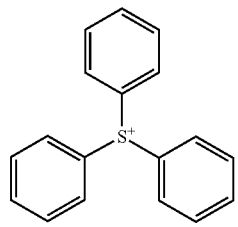
(D0-07)
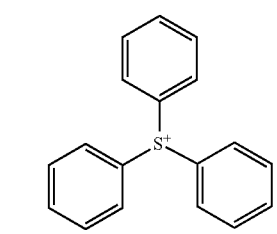
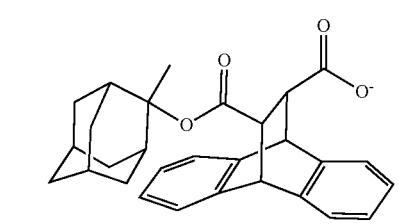
(D0-08)
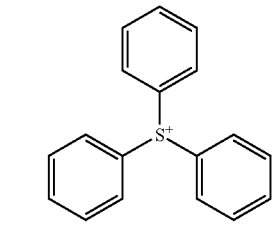
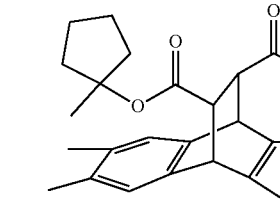
(D0-09)
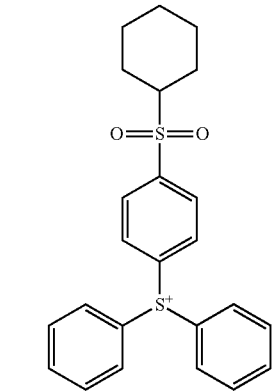

-continued

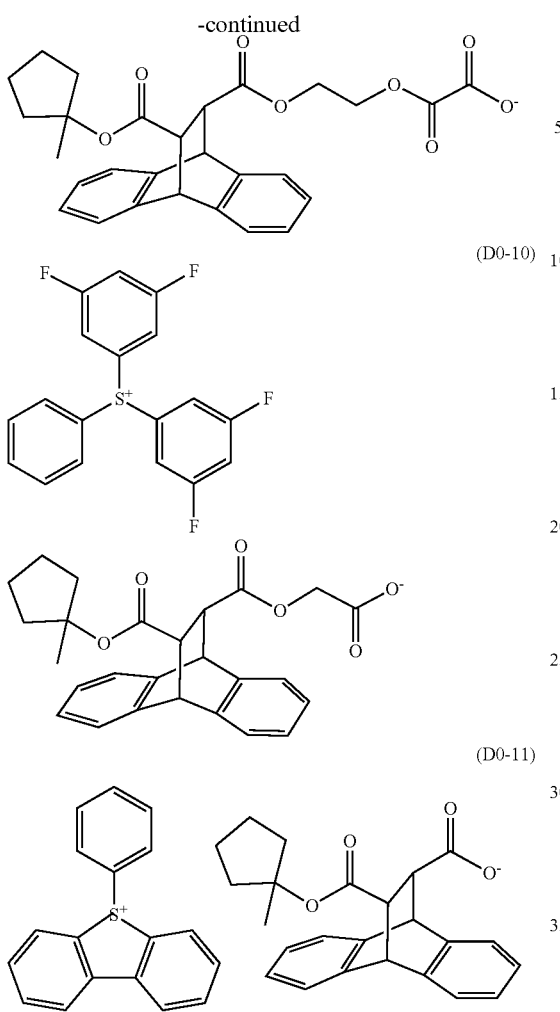

(D0-10)

(D0-11)

In the resist composition according to the present embodiment, the component (D0) may be used alone or may be used in a combination of two or more kinds thereof.

In the resist composition according to the present embodiment, the content of the component (D0) is preferably in a range of 0.5 to 20 parts by mass, more preferably in a range of 1 to 15 parts by mass, and still more preferably in a range of 3 to 10 parts by mass with respect to 100 parts by mass of the component (A).

In a case where the content of the component (D0) is equal to or larger than the lower limit value of the above-described preferred range, CDU and resolution is further improved in the resist pattern formation. On the other hand, in a case where it is equal to or smaller than the upper limit value of the preferred range, the sensitivity can be maintained satisfactorily.

The component (D) in the resist composition according to the present embodiment may contain a base component other than the above-described component (D0).

Examples of the base component other than component (D0) include a photodecomposable base (D1) having an acid diffusion controllability (hereinafter, referred to as a "component (D1)") which is lost by being decomposed upon exposure and a nitrogen-containing organic compound (D2) (hereinafter, referred to as a "component (D2)") which does not correspond to the component (D1).

In Regard to Component (D1)

The component (D1) is not particularly limited as long as it is decomposed upon exposure and loses the acid diffusion controllability. The component (D1) is preferably one or more compounds selected from the group consisting of a compound represented by General Formula (d1-1) (hereinafter, referred to as a "component (d1-1)"), a compound represented by General Formula (d1-2) (hereinafter, referred to as a "component (d1-2)"), and a compound represented by General Formula (d1-3) (hereinafter, referred to as a "component (d1-3)").

At exposed portions of the resist film, the components (d1-1) to (d1-3) are decomposed and then lose the acid diffusion controllability (basicity), and thus they cannot act as a quencher, whereas they act as a quencher at unexposed portions of the resist film.

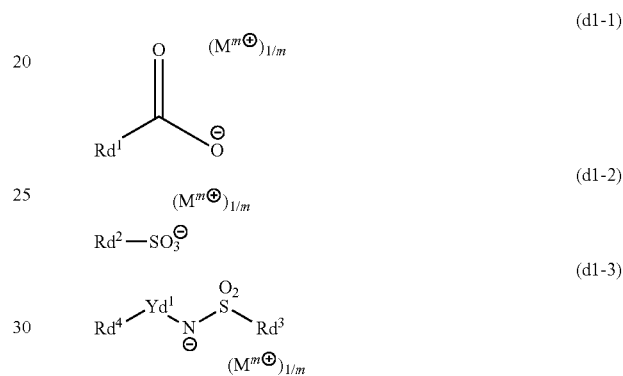

(d1-1)

(d1-2)

(d1-3)

[In the formulae, $Rd^{1}$ to $Rd^{4}$ represents cyclic groups which may have a substituent, chain-like alkyl groups which may have a substituent, or chain-like alkenyl groups which may have a substituent. Here, the carbon atom adjacent to the S atom in $Rd^{2}$ in General Formula (d1-2) has no fluorine atom bonded thereto. $Yd^{1}$ represents a single bond or a divalent linking group. m represents an integer of 1 or more, and each $M^{m+}$ independently represents an m-valent organic cation.]

{Component (d1-1)}
Anion Moiety

In General Formula (d1-1), $Rd'^{1}$ represents a cyclic group which may have a substituent, a chain-like alkyl group which may have a substituent, or a chain-like alkenyl group which may have a substituent, and examples thereof include the same one as $R'^{201}$.

Among these, $Rd^{1}$ is preferably an aromatic hydrocarbon group which may have a substituent, an aliphatic cyclic group which may have a substituent, or a chain-like alkyl group which may have a substituent. Examples of the substituent which may be contained in these groups include a hydroxyl group, an oxo group, an alkyl group, an aryl group, a fluorine atom, a fluorinated alkyl group, lactone-containing cyclic groups each represented by any of General Formulae (a2-r-1) to (a2-r-7), an ether bond, an ester bond, and a combination thereof. In a case where an ether bond or an ester bond is included as the substituent, the substituent may be bonded via an alkylene group, and linking groups each represented by General Formulae (y-al-1) to (y-al-5) are preferable as the substituent. It is noted that in a case where the aromatic hydrocarbon group, the aliphatic cyclic group, or the chain-like alkyl group, as Rd', has a linking group each represented by General Formulae (y-al-1) to (y-al-7) as a substituent, in General Formulae (y-al-1) to (y-al-7), the group that is bonded to a carbon atom constituting the aromatic hydrocarbon group, the aliphatic cyclic group, or the chain-like alkyl group, as Rd', in General Formula (d3-1) is $V'^{101}$ in General Formulae (y-al-1) to (y-al-7).

Suitable examples of the aromatic hydrocarbon group include a phenyl group, a naphthyl group, and a polycyclic structure (a polycyclic structure consisting of a bicyclooctane skeleton and a ring structure other than the bicyclooctane skeleton) including a bicyclooctane skeleton.

The aliphatic cyclic group is preferably a group obtained by removing one or more hydrogen atoms from a polycycloalkane such as adamantane, norbornane, isobornane, tricyclodecane, or tetracyclododecane.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl group, or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group.

In a case where the chain-like alkyl group is a fluorinated alkyl group having a fluorine atom or a fluorinated alkyl group as a substituent, the fluorinated alkyl group preferably has 1 to 11 carbon atoms, more preferably 1 to 8 carbon atoms, and still more preferably 1 to 4 carbon atoms. The fluorinated alkyl group may contain an atom other than a fluorine atom. Examples of the atom other than a fluorine atom include an oxygen atom, a sulfur atom, and a nitrogen atom.

Specific examples of the preferred anion moiety for the component (d1-1) are shown below.

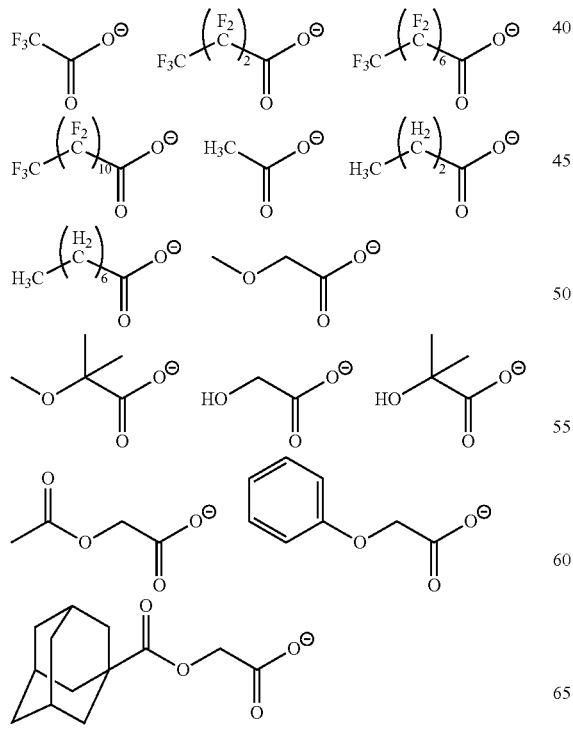

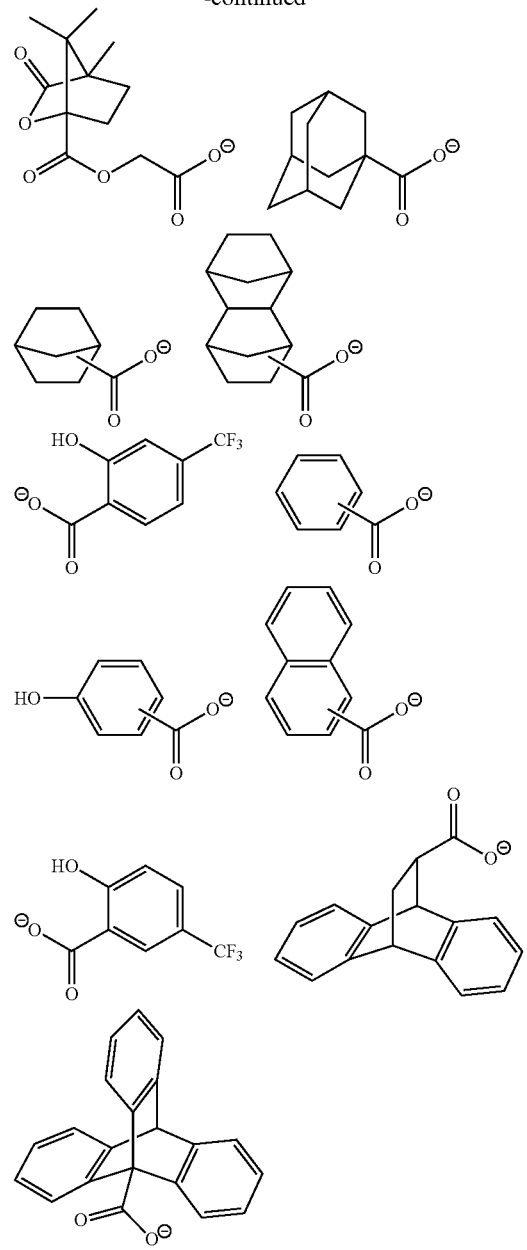

-continued

Cation Moiety

In General Formula (d1-1), $M^{m+}$ represents an m-valent organic cation.

Suitable examples of the organic cation as $M^{m+}$ include the same ones as the cations each represented by General Formulae (ca-1) to (ca-5), a cation represented by General Formula (ca-1) is preferable, and cations each represented by General Formulae (ca-1-1) to (ca-1-72) are more preferable.

The component (d1-1) may be used alone or in a combination of two or more kinds thereof.

{Component (d1-2)}

Anion Moiety

In General Formula (d1-2), $Rd^2$ represents a cyclic group which may have a substituent, a chain-like alkyl group which may have a substituent, or a chain-like alkenyl group which may have a substituent, and examples thereof include the same one as $R'^{201}$.

Here, the carbon atom adjacent to the S atom in $Rd^2$ has no fluorine atom bonded thereto (the carbon atom adjacent to the S atom in $Rd^2$ is not substituted with a fluorine atom). As a result, the anion of the component (d1-2) becomes an appropriately weak acid anion, thereby improving the quenching ability of the component (D).

$Rd^2$ is preferably a chain-like alkyl group which may have a substituent or an aliphatic cyclic group which may have a substituent, and more preferably an aliphatic cyclic group which may have a substituent.

The chain-like alkyl group preferably has 1 to 10 carbon atoms and more preferably 3 to 10 carbon atoms.

The aliphatic cyclic group is more preferably a group (which may have a substituent) obtained by removing one or more hydrogen atoms from adamantane, norbornane, isobornane, tricyclodecane, tetracyclododecane, or the like; and a group obtained by removing one or more hydrogen atoms from camphor.

The hydrocarbon group as $Rd^2$ may have a substituent. Examples of the substituent include the same ones as the substituents which may be contained in the hydrocarbon group (the aromatic hydrocarbon group, the aliphatic cyclic group, or the chain-like alkyl group) as $Rd^1$ in General Formula (d1-1).

Among the above, the anion moiety of the component (d1-2) is preferably a camphorsulfonic acid anion.

Preferred specific examples of the anion moiety of the component (d1-2) are shown below.

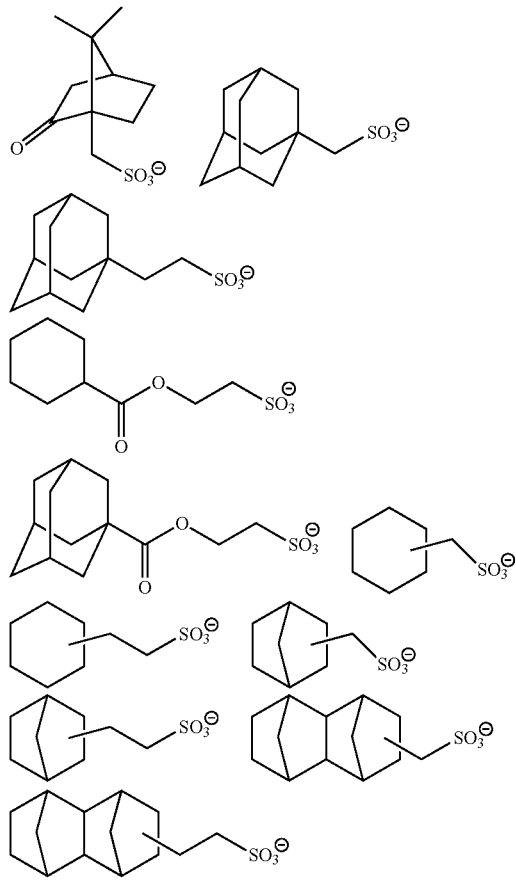

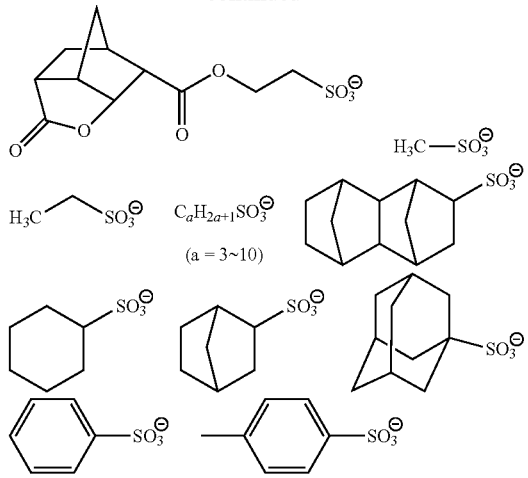

Cation Moiety

In General Formula (d1-2), $M^{m+}$ represents an m-valent organic cation and is the same as $M^{m+}$ in General Formula (d1-1).

One kind of the component (d1-2) may be used alone, or a combination of two or more kinds thereof may be used.

{Component (d1-3)}

Anion Moiety

In General Formula (d1-3), $Rd^3$ represents a cyclic group which may have a substituent, a chain-like alkyl group which may have a substituent, or a chain-like alkenyl group which may have a substituent, examples thereof include the same one as $R'^{201}$, and a cyclic group containing a fluorine atom, a chain-like alkyl group, or a chain-like alkenyl group is preferable. Among them, a fluorinated alkyl group is preferable, and the same one as the fluorinated alkyl group described above as $Rd'^1$ is more preferable.

In General Formula (d1-3), $Rd^4$ represents a cyclic group which may have a substituent, a chain-like alkyl group which may have a substituent, or a chain-like alkenyl group which may have a substituent, and examples thereof include the same one as $R'^{201}$.

Among them, an alkyl group which may have a substituent, an alkoxy group which may have a substituent, an alkenyl group which may have a substituent, or a cyclic group which may have a substituent is preferable.

The alkyl group as $Rd^4$ is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. A part of hydrogen atoms in the alkyl group as $Rd^4$ may be substituted with a hydroxyl group, a cyano group, or the like.

The alkoxy group as $Rd^4$ is preferably an alkoxy group having 1 to 5 carbon atoms, and specific examples of the alkoxy group having 1 to 5 carbon atoms include a methoxy group, an ethoxy group, an n-propoxy group, an iso-propoxy group, an n-butoxy group, and a tert-butoxy group. Among these, a methoxy group and an ethoxy group are preferable.

Examples of the alkenyl group as $Rd^4$ include the same one as $R'^{201}$, and a vinyl group, a propenyl group (an allyl group), a 1-methylpropenyl group, or a 2-methylpropenyl group is preferable. These groups may have an alkyl group having 1 to 5 carbon atoms or a halogenated alkyl group having 1 to 5 carbon atoms as a substituent.

Examples of the cyclic group as $Rd^4$ include the same one as the cyclic group described above as $R'^{201}$, and the cyclic group is preferably an alicyclic group obtained by removing one or more hydrogen atoms from a cycloalkane such as cyclopentane, cyclohexane, adamantane, norbornane, isobornane, tricyclodecane, or tetracyclododecane, or an aromatic group such as a phenyl group or a naphthyl group. In a case where $Rd^4$ represents an alicyclic group, the resist composition can be satisfactorily dissolved in an organic solvent, thereby improving the lithography characteristics. In a case where $Rd^4$ is an aromatic group, the resist composition is excellent in light absorption efficiency and thus has good sensitivity and lithography characteristics in the lithography using EUV or the like as a light source for exposure.

In General Formula (d1-3), $Yd^1$ represents a single bond or a divalent linking group.

The divalent linking group as $Yd^1$ is not particularly limited, and examples thereof include a divalent hydrocarbon group (an aliphatic hydrocarbon group or an aromatic hydrocarbon group) which may have a substituent and a divalent linking group containing a hetero atom. The divalent linking groups include the same ones as those described above as the divalent hydrocarbon group which may have a substituent and the divalent linking group containing a hetero atom described above as the divalent linking group as $Ya^{21}$ in General Formula (a2-1).

$Yd^1$ is preferably a carbonyl group, an ester bond, an amide bond, an alkylene group, or a combination thereof. The alkylene group is more preferably a linear or branched alkylene group and still more preferably a methylene group or an ethylene group.

Preferred specific examples of the anion moiety for the component (d1-3) are shown below.

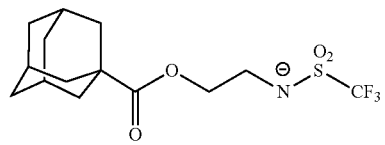

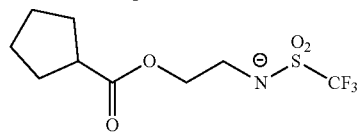

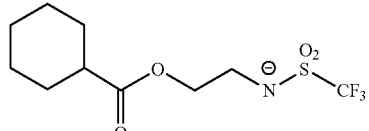

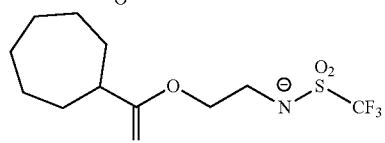

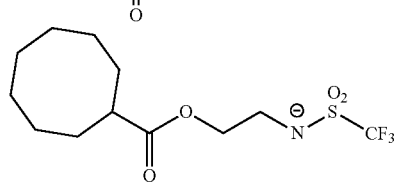

-continued

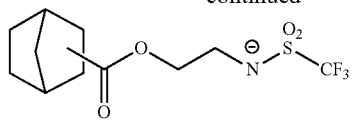

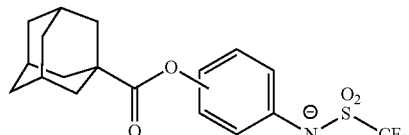

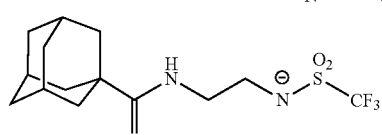

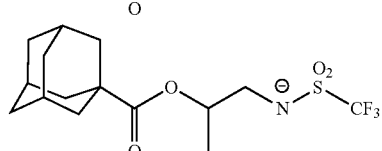

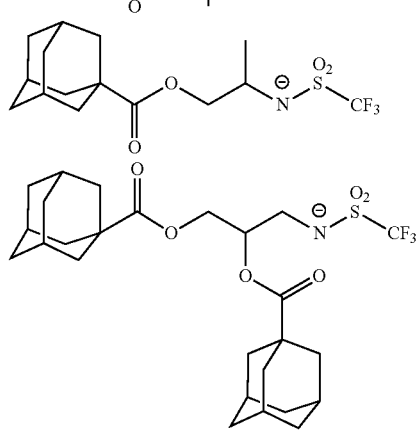

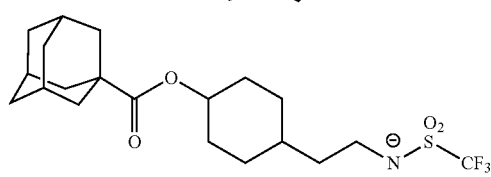

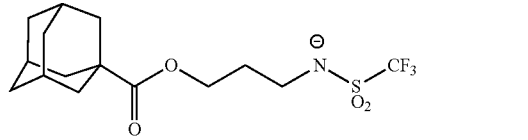

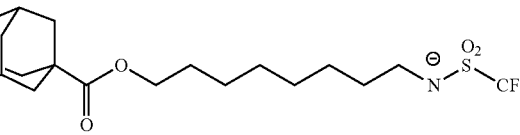

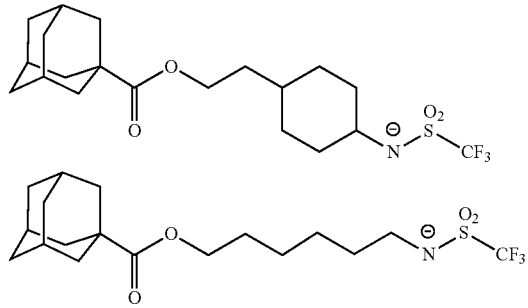

Cation Moiety

In General Formula (d1-3), $M^{m+}$ represents an m-valent organic cation and is the same as $M^{m+}$ in General Formula (d1-1).

One kind of the component (d1-3) may be used alone, or a combination of two or more kinds thereof may be used.

As the component (D1), only one of the above-described components (d1-1) to (d1-3) or a combination of two or more kinds thereof may be used.

In a case where the resist composition contains the component (D1), the content of the component (D1) in the resist composition is preferably in a range of 0.5 to 10 parts by mass and more preferably in a range of 0.5 to 5 parts by mass with respect to 100 parts by mass of the component (A1).

In a case where the content of the component (D1) is equal to or larger than the preferred lower limit value, excellent lithography characteristics and an excellent resist pattern shape are easily obtained. On the other hand, in a case where the content thereof is equal to or smaller than the upper limit value, the sensitivity can be maintained satisfactorily and the throughput is also excellent.

Method of Producing Component (D1):

The methods of producing the components (d1-1) and (d1-2) described above are not particularly limited, and the components (d1-1) and (d1-2) can be produced by conventionally known methods.

Further, the method of producing the component (d1-3) is not particularly limited, and the component (d1-3) can be produced in the same manner as disclosed in United States patent Application, Publication No. 2012-0149916.

In Regard to Component (D2)

The component (D) may contain a nitrogen-containing organic compound component (hereinafter, referred to as a "component (D2)") which does not correspond to the above-described component (D1).

The component (D2) is not particularly limited as long as it acts as an acid diffusion controlling agent and does not correspond to the component (D1), and any known compound may be used. Among the above, aliphatic amines are preferable, and among the aliphatic amines, a secondary aliphatic amine or a tertiary aliphatic amine is more preferable.

An aliphatic amine is an amine having one or more aliphatic groups, and the aliphatic groups preferably have 1 to 12 carbon atoms.

Examples of these aliphatic amines include an amine in which at least one hydrogen atom of ammonia ($NH_3$) has been substituted with an alkyl group or hydroxyalkyl group having 12 or fewer carbon atoms (alkyl amines or alkyl alcohol amines) and a cyclic amine.

Specific examples of the alkyl amine and the alkyl alcohol amine include monoalkyl amines such as n-hexyl amine, n-heptyl amine, n-octyl amine, n-nonyl amine, and n-decyl amine; dialkyl amines such as diethyl amine, di-n-propyl amine, di-n-heptyl amine, di-n-octyl amine, and dicyclohexyl amine; trialkyl amines such as trimethyl amine, triethyl amine, tri-n-propyl amine, tri-n-butyl amine, tri-n-hexyl amine, tri-n-pentyl amine, tri-n-heptyl amine, tri-n-octyl amine, tri-n-nonyl amine, tri-n-decyl amine, and tri-n-dodecyl amine; and alkyl alcohol amines such as diethanol amine, triethanol amine, diisopropanol amine, triisopropanol amine, di-n-octanol amine, and tri-n-octanol amine. Among these, trialkyl amines of 5 to 10 carbon atoms are preferable, and tri-n-pentyl amine and tri-n-octyl amine are particularly preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine and triethanol amine triacetate, and triethanol amine triacetate is preferable.

In addition, as the component (D2), an aromatic amine may be used.

Examples of the aromatic amine include 4-dimethylaminopyridine, pyrrole, indole, pyrazole, imidazole, and derivatives thereof, tribenzyl amine, 2,6-diisopropylaniline, and N-tert-butoxycarbonylpyrrolidine.

Among the above, the component (D2) is preferably an alkyl amine and more preferably a trialkyl amine having 5 to 10 carbon atoms.

The component (D2) may be used alone or in a combination of two or more kinds thereof.

In a case where the resist composition contains the component (D2), the content of the component (D2) in the resist composition is preferably in a range of 0.01 to 5 parts by mass, more preferably in a range of 0.1 to 5 parts by mass, and still more preferably in a range of 0.5 to 5 parts by mass with respect to 100 parts by mass of the component (A1).

In a case where the content of the component (D2) is equal to or larger than the preferred lower limit value, excellent lithography characteristics and an excellent resist pattern shape are easily obtained. On the other hand, in a case where the content thereof is equal to or smaller than the upper limit value, the sensitivity can be maintained satisfactorily and the throughput is also excellent.

The content of the component (D0) in the total component (D) contained in the resist composition according to the present embodiment is preferably 50% by mass or more, more preferably 70% by mass or more, and still more preferably 90% by mass or more, and the component (D) may consist of only the component (D0).

<Other Components>

The resist composition according to the present embodiment may further contain other components in addition to the component (A), the component (B), and the component (D), described above. Examples of the other components include a component (E), a component (F), and a component (S), described below.

<<At Least One Compound (E) Selected from the Group Consisting of Organic Carboxylic Acid, Phosphorus Oxo Acid, and Derivatives Thereof>>

For the purpose of preventing any deterioration in sensitivity and improving the resist pattern shape and the post-exposure temporal stability, the resist composition according to the present embodiment may contain, as an optional component, at least one compound (E) (hereinafter referred to as a component (E)) selected from the group consisting of an organic carboxylic acid, and a phosphorus oxo acid and a derivative thereof.

Specific examples of the organic carboxylic acid include acetic acid, malonic acid, citric acid, malic acid, succinic acid, benzoic acid, and salicylic acid, and among them, salicylic acid is preferable.

Examples of the phosphorus oxo acid include phosphoric acid, phosphonic acid, and phosphinic acid. Among these, phosphonic acid is particularly preferable.

Examples of the phosphorus oxo acid derivative include an ester obtained by substituting a hydrogen atom in the above-described oxo acid with a hydrocarbon group. Examples of the hydrocarbon group include an alkyl group having 1 to 5 carbon atoms and an aryl group having 6 to 15 carbon atoms.

Examples of the phosphoric acid derivative include phosphoric acid esters such as di-n-butyl phosphate and diphenyl phosphate.

Examples of the phosphonic acid derivative include phosphonic acid esters such as dimethyl phosphonate, di-n-butyl phosphonate, phenylphosphonic acid, diphenyl phosphonate, and dibenzyl phosphonate.

Examples of the phosphinic acid derivative include phosphinic acid esters and phenylphosphinic acid.

In the resist composition according to the present embodiment, the component (E) may be used alone, or two or more kinds thereof may be used in combination.

In a case where the resist composition contains the component (E), the content of the component (E) is preferably in a range of 0.01 to 5 parts by mass and more preferably in a range of 0.05 to 3 parts by mass with respect to 100 parts by mass of the component (A). Within the above range, the lithography characteristics are further improved.

<<Fluorine Additive Component (F)>>

The resist composition according to the present embodiment may further include a fluorine additive component (hereinafter, referred to as a "component (F)") in order to impart water repellency to the resist film or to improve lithography characteristics.

As the component (F), a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be mentioned.

Specific examples of the component (F) include polymers having a constitutional unit (f1) represented by General Formula (f1-1) shown below. This polymer is preferably a polymer (a homopolymer) consisting only of a constitutional unit (f1) represented by General Formula (f1-1); a copolymer of the constitutional unit (f1) and the constitutional unit (a1); a copolymer of the constitutional unit (f1), a constitutional unit derived from acrylic acid or methacrylic acid, and the constitutional unit (a1), and more preferably a copolymer of the constitutional unit (f1) and the constitutional unit (a1). The constitutional unit (a1) to be copolymerized with the constitutional unit (f1) is preferably a constitutional unit derived from 1-ethyl-1-cyclooctyl (meth)acrylate or a constitutional unit derived from 1-methyl-1-adamantyl (meth)acrylate, and more preferably a constitutional unit derived from 1-ethyl-1-cyclooctyl (meth)acrylate.

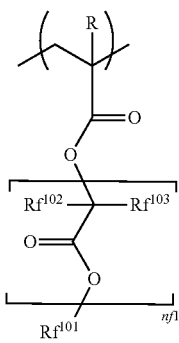

(f1-1)

[In the formula, R has the same definition as described above. $Rf^{102}$ and $Rf^{103}$ each independently represent a hydrogen atom, a halogen atom, an alkyl group having 1 to 5 carbon atoms, or a halogenated alkyl group having 1 to 5 carbon atoms, and $Rf^{102}$ and $Rf^{103}$ may be the same as or different from each other. $nf^1$ represents an integer in a range of 0 to 5 and $Rf^{101}$ represents an organic group containing a fluorine atom.]

In General Formula (f1-1), R bonded to the carbon atom at the α-position has the same definition as described above. R is preferably a hydrogen atom or a methyl group.

In General Formula (f1-1), the halogen atom of $Rf^{102}$ and $Rf^{103}$ is preferably a fluorine atom. Examples of the alkyl group having 1 to 5 carbon atoms as $Rf^{102}$ and $Rf^{103}$ include the same one as the alkyl group having 1 to 5 carbon atoms as R, and a methyl group or an ethyl group is preferable. Specific examples of the halogenated alkyl group having 1 to 5 carbon atoms as $Rf^{102}$ and $Rf^{103}$ include groups in which part or all of hydrogen atoms of the above-described alkyl groups of 1 to 5 carbon atoms have been substituted with a halogen atom. The halogen atom is preferably a fluorine atom. Among the above, $Rf^{102}$ and $Rf^{103}$ are preferably a hydrogen atom, a fluorine atom, or an alkyl group having 1 to 5 carbon atoms, more preferably a hydrogen atom, a fluorine atom, a methyl group, or an ethyl group, and still more preferably a hydrogen atom.

In General Formula (f1-1), $nf^1$ represents an integer in a range of 0 to 5, preferably an integer in a range of 0 to 3, and more preferably an integer of 1 or 2.

In General Formula (f1-1), $Rf^{101}$ represents an organic group containing a fluorine atom and is preferably a hydrocarbon group containing a fluorine atom.

The hydrocarbon group containing a fluorine atom may be linear, branched, or cyclic, and preferably has 1 to 20 carbon atoms, more preferably 1 to 15 carbon atoms, and particularly preferably 1 to 10 carbon atoms.

In addition, in the hydrocarbon group containing a fluorine atom, 25% or more of the hydrogen atoms in the hydrocarbon group are preferably fluorinated, more preferably 50% or more are fluorinated, and particularly preferably 60% or more are fluorinated since the hydrophobicity of the resist film during immersion exposure increases.

Among them, $Rf^{101}$ is more preferably a fluorinated hydrocarbon group having 1 to 6 carbon atoms and particularly preferably a trifluoromethyl group, —$CH_2$—$CF_3$, —$CH_2$—$CF_2$—$CF_3$, or —$CH(CF_3)_2$, —$CH_2$—$CH_2$—$CF_3$, or —$CH_2$—$CH_2$—$CF_2$—$CF_2$—$CF_2$—$CF_3$.

The weight average molecular weight (Mw) (based on the polystyrene-equivalent value determined by gel permeation chromatography) of the component (F) is preferably in a range of 1,000 to 50,000, more preferably in a range of 5,000 to 40,000, and most preferably in a range of 10,000 to 30,000. In a case where the weight average molecular weight is equal to or smaller than the upper limit value of this range, the resist composition exhibits sufficiently satisfactory solubility in a resist solvent to be used as a resist. On the other hand, in a case where the weight average molecular weight is equal to or larger than the lower limit value of this range, the water repellency of the resist film is excellent.

Further, the dispersity (Mw/Mn) of the component (F) is preferably in a range of 1.0 to 5.0, more preferably in a range of 1.0 to 3.0, and most preferably in a range of 1.0 to 2.5.

In the resist composition according to the present embodiment, the component (F) may be used alone, or two or more kinds thereof may be used in combination.

In a case where the resist composition contains the component (F), the content of the component (F) in the resist composition is preferably in a range of 0.5 to 10 parts by mass and more preferably in a range of 1 to 10 parts by mass with respect to 100 parts by mass of the component (A).

<<Organic Solvent Component (S)>>

The resist composition according to the present embodiment may be produced by dissolving the resist materials in an organic solvent component (hereinafter, referred to as a "component (S)").

The component (S) may be any organic solvent which can dissolve each of the components to be used to obtain a homogeneous solution, and optional organic solvent can be appropriately selected from those which are conventionally known in the related art as solvents for a chemical amplification-type resist composition and then used.

Examples of the component (S) include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkyl ether (such as monomethyl ether, monoethyl ether, monopropyl ether or monobutyl ether) or monophenyl ether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzyl ether, cresylmethyl ether, diphenyl ether, dibenzyl ether, phenetole, butylphenyl ether, ethyl benzene, diethyl benzene, pentyl benzene, isopropyl benzene, toluene, xylene, cymene and mesitylene; and dimethylsulfoxide (DMSO).

In the resist composition according to the present embodiment, the component (S) may be used alone or as a mixed solvent of two or more kinds thereof. Among these, PGMEA, PGME, γ-butyrolactone, EL, and cyclohexanone are preferable.

Further, a mixed solvent obtained by mixing PGMEA with a polar solvent is also preferable as the component (S). The blending ratio (mass ratio) of the mixed solvent can be appropriately determined, taking into consideration the compatibility of the PGMEA with the polar solvent, but is preferably in a range of 1:9 to 9:1 and more preferably in a range of 2:8 to 8:2.

More specifically, in a case where EL or cyclohexanone is blended as the polar solvent, the PGMEA:EL or cyclohexanone mass ratio is preferably in a range of 1:9 to 9:1 and more preferably in a range of 2:8 to 8:2. Alternatively, in a case where PGME is blended as the polar solvent, the PGMEA:PGME mass ratio is preferably in a range of 1:9 to 9:1, more preferably in a range of 2:8 to 8:2, and still more preferably in a range of 3:7 to 7:3. Furthermore, a mixed solvent of PGMEA, PGME, and cyclohexanone is also preferable.

Further, the component (S) is also preferably a mixed solvent of at least one selected from PGMEA and EL and γ-butyrolactone. In this case, as the mixing ratio, the mass ratio of the former to the latter is preferably in a range of 70:30 to 95:5.

The amount of the component (S) to be used is not particularly limited and is appropriately set, depending on a thickness of a film to be coated, to a concentration at which the component (S) can be applied onto a substrate or the like. Generally, the component (S) is used such that the solid content concentration of the resist composition is in a range of 0.1% to 20% by mass and preferably in a range of 0.2% to 15% by mass.

As desired, other miscible additives can also be added to the resist composition according to the present embodiment. For example, for improving the performance of the resist film, an additive resin, a dissolution inhibitor, a plasticizer, a stabilizer, a colorant, a halation prevention agent, and a dye can be appropriately contained therein.

After dissolving the resist material in the component (S), the resist composition according to the present embodiment may be subjected to removal of impurities and the like by using a porous polyimide membrane, a porous polyamide-imide membrane, or the like. For example, the resist composition may be filtered using a filter consisting of a porous polyimide membrane, a filter consisting of a porous polyamide-imide membrane, or a filter consisting of a porous polyimide membrane and a porous polyamide-imide membrane. Examples of the porous polyimide membrane and the porous polyamide-imide membrane include those described in Japanese Unexamined Patent Application, First Publication No. 2016-155121.

The resist composition according to the present embodiment described above contains the compound (D0) (the component (D0)) represented by General Formula (d0).

The anion moiety of the component (D0) has a specific bulky structure (a condensed ring-type group containing a condensed ring containing one or more aromatic rings). As a result, the uniformity of the component (D0) in the resist film is increased, and the acid generated from the component (B) is evenly trapped by the component (D0) at the boundary between exposed portions and unexposed portions of the resist film.

In addition, in the acid decomposable group contained in the anion moiety of the component (D0), the acid dissociable group constituting the acid decomposable group is eliminated in exposed portions of the resist film, and a polar group is generated. As a result, the hydrophobicity of the component (D0) is reduced, and the compatibility between the component (D0) and the developing solution (the alkali developing solution) is improved.

As a result, it is presumed that with the resist composition containing the component (D0) according to the present embodiment, a resist pattern having good CDU and good resolution can be formed.

(Method of Forming Resist Pattern)

A method of forming a resist pattern according to the second aspect of the present invention is a method including a step of forming a resist film on a support using the resist composition according to the first aspect of the present embodiment described above, a step of exposing the resist film, and a step of developing the exposed resist film to form a resist pattern.

Examples of one embodiment of such a method of forming a resist pattern include a method of forming a resist pattern carried out as described below.

First, the resist composition of the above-described embodiment is applied onto a support with a spinner or the like, and a baking (post-apply baking (PAB)) treatment is carried out, for example, at a temperature condition in a range of 80° C. to 150° C. for 40 to 120 seconds, preferably for 60 to 90 seconds to form a resist film.

Following the selective exposure carried out on the resist film by, for example, exposure through a mask (a mask pattern) having a predetermined pattern formed on the mask by using an exposure apparatus such as an electron beam lithography apparatus or an ArF exposure apparatus, or direct irradiation of the resist film for drawing with an electron beam without using a mask pattern, baking treatment (post-exposure baking (PEB)) is carried out, for example, under a temperature condition in a range of 80° C. to 150° C. for 40 to 120 seconds and preferably 60 to 90 seconds.

Next, the resist film is subjected to a developing treatment. The developing treatment is carried out using an alkali developing solution in a case of an alkali developing process, and a developing solution containing an organic solvent (organic developing solution) in a case of a solvent developing process.

After the developing treatment, it is preferable to conduct a rinse treatment. The rinse treatment is preferably water rinsing using pure water in a case of an alkali developing process, and rinsing using a rinse liquid containing an organic solvent is preferable in a case of a solvent developing process.

In a case of a solvent developing process, after the developing treatment or the rinse treatment, the developing solution or the rinse liquid remaining on the pattern can be removed by a treatment using a supercritical fluid.

After the developing treatment or the rinse treatment, drying is conducted. As desired, baking treatment (post-baking) can be carried out following the developing treatment.

In this manner, a resist pattern can be formed.

The support is not specifically limited, and a support known in the related art can be used. For example, substrates for electronic components, and such substrates having a predetermined wiring pattern formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the support, any support having the above-described substrate on which an inorganic and/or organic film is provided may be used. Examples of the inorganic film include an inorganic antireflection film (an inorganic BARC). Examples of the organic film include an organic antireflection film (organic BARC) and an organic film such as a lower-layer organic film used in a multilayer resist method.

Here, the multilayer resist method is a method in which at least one layer of an organic film (lower-layer organic film) and at least one layer of a resist film (upper-layer resist film)

are provided on a substrate, and a resist pattern formed on the upper-layer resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be carried out using radiation such as an ArF excimer laser, a KrF excimer laser, an $F_2$ excimer laser, extreme ultraviolet (EUV) rays, vacuum ultraviolet (VUV) rays, electron beams (EB), X-rays, or soft X-rays. The resist composition is highly useful for a KrF excimer laser, an ArF excimer laser, EB, or EUV, more useful for an ArF excimer laser, EB or EUV, and particularly useful for EB or EUV. That is, the method of forming a resist pattern according to the present embodiment is a method particularly useful in a case where the step of exposing the resist film includes an operation of exposing the resist film to extreme ultraviolet (EUV) rays or electron beams (EB).

The exposure method of the resist film can be a general exposure (dry exposure) carried out in air or an inert gas such as nitrogen, or liquid immersion exposure (liquid immersion lithography); however, liquid immersion exposure is more preferable.

In liquid immersion exposure is an exposure method in which the region between the resist film and the lens at the lowermost position of the exposure apparatus is pre-filled with a solvent (liquid immersion medium) that has a larger refractive index than the refractive index of air, and the exposure (dipping exposure) is carried out in this state.

The liquid immersion medium is preferably a solvent that exhibits a refractive index larger than the refractive index of air but smaller than the refractive index of the resist film to be exposed. The refractive index of the solvent is not particularly limited as long as it satisfies the above-described requirements.

Examples of the solvent which exhibits a refractive index that is larger than the refractive index of air but smaller than the refractive index of the resist film include water, fluorine-based inert liquids, silicone-based solvents, and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$, or $C_5H_3F_7$ as the main component, and the boiling point is preferably in a range of 700 to 180° C. and more preferably in a range of 80° to 160° C. A fluorine-based inert liquid having a boiling point in the above-described range is preferable since the removal of the medium used in the liquid immersion can be carried out after the exposure by a simple method.

The fluorine-based inert liquid is particularly preferably a perfluoroalkyl compound in which all of the hydrogen atoms of the alkyl group are substituted with a fluorine atom. Examples of these perfluoroalkyl compounds include perfluoroalkyl ether compounds and perfluoroalkyl amine compounds.

Specifically, an example of a suitable perfluoroalkyl ether compound is perfluoro(2-butyl-tetrahydrofuran) (boiling point of 102° C.), and an example of a suitable perfluoroalkyl amine compound is perfluorotributyl amine (boiling point of 174° C.).

As the liquid immersion medium, water is preferable in terms of cost, safety, environment, and versatility.

Examples of the alkali developing solution used for a developing treatment in an alkali developing process include a 0.1% to 10% by mass aqueous solution of tetramethylammonium hydroxide (TMAH).

As the organic solvent contained in the organic developing solution, which is used for a developing treatment in a solvent developing process, any one of the conventionally known organic solvents capable of dissolving the component (A) (component (A) prior to exposure) can be appropriately selected from the conventionally known organic solvents. Specific examples of the organic solvent include polar solvents such as a ketone-based solvent, an ester-based solvent, an alcohol-based solvent, a nitrile-based solvent, an amide-based solvent, an ether-based solvent, and a hydrocarbon-based solvent.

A ketone-based solvent is an organic solvent containing C—C(=O)—C in the structure thereof. An ester-based solvent is an organic solvent containing C—C(=O)—O—C in the structure thereof. An alcohol-based solvent is an organic solvent containing an alcoholic hydroxyl group in the structure thereof. The "alcoholic hydroxyl group" indicates a hydroxyl group bonded to a carbon atom of an aliphatic hydrocarbon group. A nitrile-based solvent is an organic solvent containing a nitrile group in the structure thereof. An amide-based solvent is an organic solvent containing an amide group in the structure thereof. An ether-based solvent is an organic solvent containing C—O—C in the structure thereof.

Some organic solvents have a plurality of the functional groups which characterize the above-described solvents in the structure thereof. In such a case, the organic solvent can be classified as any type of solvent having a characteristic functional group. For example, diethylene glycol monomethyl ether can be classified as an alcohol-based solvent or an ether-based solvent.

A hydrocarbon-based solvent consists of a hydrocarbon which may be halogenated and does not have any substituent other than a halogen atom. The halogen atom is preferably a fluorine atom.

Among the above, the organic solvent contained in the organic developing solution is preferably a polar solvent and more preferably a ketone-based solvent, an ester-based solvent, or a nitrile-based solvent.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methyl cyclohexanone, phenyl acetone, methyl ethyl ketone, methyl isobutyl ketone, acetyl acetone, acetonyl acetone, ionone, diacetonyl alcohol, acetylcarbinol, acetophenone, methyl naphthyl ketone, isophorone, propylene carbonate, γ-butyrolactone and methylamyl ketone (2-heptanone). Among these examples, the ketone-based solvent is preferably methylamyl ketone (2-heptanone).

Examples of the ester-based solvent include methyl acetate, butyl acetate, ethyl acetate, isopropyl acetate, amyl acetate, isoamyl acetate, ethyl methoxyacetate, ethyl ethoxyacetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these, the ester-based solvent is preferably butyl acetate.

Examples of the nitrile-based solvent include acetonitrile, propionitrile, valeronitrile, and butyronitrile.

As desired, the organic developing solution may have a conventionally known additive blended. Examples of the additive include surfactants. The surfactant is not particularly limited, and for example, an ionic or non-ionic fluorine-based and/or a silicone-based surfactant can be used. The surfactant is preferably a non-ionic surfactant, and it is more preferably a non-ionic fluorine-based surfactant or a non-ionic silicone-based surfactant.

In a case where a surfactant is blended, the amount of the surfactant to be blended is typically in a range of 0.001% to 5% by mass, preferably in a range of 0.005% to 2% by mass, and more preferably in a range of 0.01% to 0.5% by mass with respect to the total amount of the organic developing solution.

The developing treatment can be carried out by a conventionally known developing method. Examples thereof include a method in which the support is immersed in the developing solution for a predetermined time (a dip method), a method in which the developing solution is cast upon the surface of the support by surface tension and maintained for a predetermined period (a puddle method), a method in which the developing solution is sprayed onto the surface of the support (spray method), and a method in which a developing solution is continuously ejected from a developing solution ejecting nozzle and applied onto a support which is scanned at a constant rate while being rotated at a constant rate (dynamic dispense method).

As the organic solvent contained in the rinse liquid used in the rinse treatment after the developing treatment in a case of a solvent developing process, an organic solvent hardly dissolving the resist pattern can be appropriately selected and used, among the organic solvents mentioned as organic solvents that are used for the organic developing solution. In general, at least one kind of solvent selected from the group consisting of a hydrocarbon-based solvent, a ketone-based solvent, an ester-based solvent, an alcohol-based solvent, an amide-based solvent, and an ether-based solvent is used. Among these, at least one kind of solvent selected from the group consisting of a hydrocarbon-based solvent, a ketone-based solvent, an ester-based solvent, an alcohol-based solvent, and an amide-based solvent is preferable, at least one kind of solvent selected from the group consisting of an alcohol-based solvent and an ester-based solvent is more preferable, and an alcohol-based solvent is particularly preferable.

The alcohol-based solvent used for the rinse liquid is preferably a monohydric alcohol of 6 to 8 carbon atoms, and the monohydric alcohol may be linear, branched, or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Among these, 1-hexanol, 2-heptanol, and 2-hexanol are preferable, and 1-hexanol and 2-hexanol are more preferable.

Any one of these organic solvents may be used alone, or two or more kinds thereof may be used in combination. Further, an organic solvent other than the above-described examples or water may be mixed thereto. However, in consideration of the development characteristics, the amount of water to be blended in the rinse liquid is preferably 30% by mass or less, more preferably 10% by mass or less, still more preferably 5% by mass or less, and particularly preferably 3% by mass or less with respect to the total amount of the rinse liquid.

A conventionally known additive can be blended with the rinse liquid as necessary. Examples of the additive include surfactants. Examples of the surfactant include the same ones as those described above, the surfactant is preferably a non-ionic surfactant and more preferably a non-ionic fluorine-based surfactant or a non-ionic silicone-based surfactant.

In a case where a surfactant is blended, the amount of the surfactant to be blended is typically in a range of 0.001% to 5% by mass, preferably in a range of 0.005% to 2% by mass, and more preferably in a range of 0.01% to 0.5% by mass with respect to the total amount of the rinse liquid.

The rinse treatment using a rinse liquid (washing treatment) can be carried out by a conventionally known rinse method. Examples of the rinse treatment method include a method in which the rinse liquid is continuously ejected and applied onto the support while rotating it at a constant rate (rotational coating method), a method in which the support is immersed in the rinse liquid for a predetermined period (dip method), and a method in which the rinse liquid is sprayed onto the surface of the support (spray method).

According to the method of forming a resist pattern according to the present embodiment described above, since the resist composition described above is used, it is possible to form a resist pattern having good CDU and good resolution.

(Compound)

The compound according to the third aspect of the present invention is a compound represented by General Formula (d0).

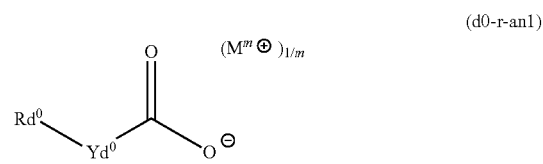

(d0-r-an1)

[In the formula, $Rd^0$ represents a condensed ring-type group containing a condensed ring containing one or more aromatic rings. The condensed ring-type group has, as a substituent, an acid decomposable group that is decomposed under action of acid to form a polar group. $Yd^0$ represents a divalent linking group or a single bond, $M^{m+}$ represents an m-valent organic cation. m represents an integer of 1 or more.]

The compound represented by General Formula (d0) is the same as the component (D0) in the resist composition according to the first aspect of the present invention described above.

[Method of Producing Compound Represented by General Formula (d0)]

The component (D0) can be produced by using a known method.

As a specific method of producing the component (D0), a method of producing a compound represented by General Formula (d'0), which is an example of the component (D0), is described below.

First, a compound X1 represented by General Formula (X-1) is reacted with a compound (Alc-1) represented by General Formula (Alc-1) having a desired acid dissociable group (Rpg) to obtain a compound D0pre represented by General Formula (D0pre) is obtained (a first step).

Next, the compound (D0pre) and a compound (S-1) represented by General Formula (S-1) are subjected to a salt exchange reaction in the presence of a base, which makes it possible to obtain a compound represented by General Formula (d'0), which is an example of the component (D0) (a second step).

It is noted that in the following reaction formula, "RpgO—C=O—$Rd^{00}$" is an example of "$Rd^0$" in General Formula (d0) although it is denoted as "RpgO—C=O—$Rd^{00}$" for convenience.

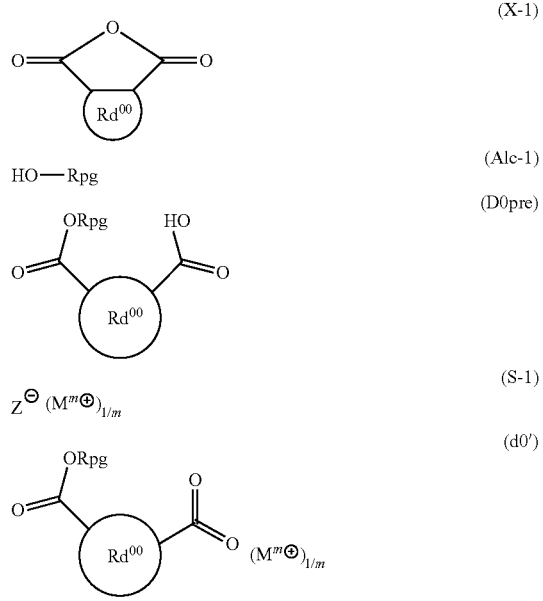

[In the formula, $Rd^{00}$ represents a condensed ring-type group containing a condensed ring containing one or more aromatic rings. Rpg is an acid dissociable group represented by General Formula (pg-r-1), an acid dissociable group represented by General Formula (pg-r-2), an acid dissociable group represented by General Formula (pg-r-3), or an acid dissociable group represented by General Formula (pg-r-4). Z-represents a halogen ion. $(M^{m+})_{1/m}$ represents an m-valent organic cation. m represents an integer of 1 or more.]

First Step:

The first step is a step of dissolving, for example, the compound (X-1) and the compound (Alc-1) in an organic solvent (THF or the like) and reacting them in the presence of a base to obtain the compound (D0pre).

Specific examples of the base include sodium hydride, $K_2CO_3$, $Cs_2CO_3$, lithium diisopropylamide (LDA), triethyl amine, and 4-dimethylaminopyridine.

The reaction temperature is, for example, in a range of 0° C. to 50° C., and the reaction time is, for example, 10 minutes or more and 24 hours or less.

In the above formula, $Rd^{00}$ represents a condensed ring-type group containing a condensed ring containing one or more aromatic rings, and it is the same as the condensed ring-type group containing a condensed ring containing one or more aromatic rings, as $Rd^0$ in General Formula (d0).

Second Step:

The second step is a step of reacting, for example, the compound (D0pre) with the compound (S-1) for salt exchange in the presence of a solvent such as water, dichloromethane, acetonitrile, or chloroform, and a base to obtain a compound represented by General Formula (d'0), which is an example of the component (D0).

Specific examples of the base include sodium hydride, $K_2CO_3$, $Cs_2CO_3$, lithium diisopropylamide (LDA), triethyl amine, and 4-dimethylaminopyridine.

Specific examples of $Z^-$ in the above formula include a bromine ion and a chloride ion.

The reaction temperature is, for example, in a range of 0° C. to 100° C., and the reaction time is, for example, 10 minutes or more and 24 hours or less.

In the above formula, $(M^{m+})_{1/m}$ is the same as $(M^{m+})_{1/m}$ in General Formula (d0).

After the salt exchange reaction is completed, the compound in the reaction solution may be isolated and purified. A known method in the related art can be used for isolation and purification, and for example, concentration, solvent extraction, distillation, crystallization, recrystallization, or chromatography can be appropriately combined and used.

The structure of the compound obtained as described above can be identified by general organic analysis methods such as $^1$H-nuclear magnetic resonance (NMR) spectroscopy, $^{13}$C-NMR spectroscopy, $^{19}$F-NMR spectroscopy, infrared (IR) absorption spectroscopy, mass spectrometry (MS), elemental analysis, and X-ray crystal diffraction.

In the method of producing the component (D0), a step of reacting the compound (D0pre) with a hydroxy acid to obtain a compound represented by General Formula (D0pre), which is different from the compound (D0pre), may be provided between the first step and the second step.

Specific examples of the hydroxy acid include a compound represented by Chemical Formula (K-1) a compound represented by Chemical Formula (K-2).

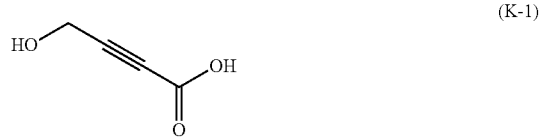

-continued

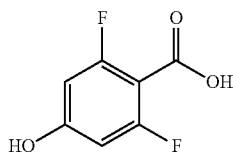

(K-2)

Further, the method of producing the component (D0) may include a step of reacting the compound (D0pre) obtained in the first step with a diol such as ethylene glycol to obtain an intermediate and reacting the obtained intermediate with a dicarboxylic acid such as oxalic acid to obtain a compound represented by General Formula (D0pre) which is different from the compound (D0pre).

As the raw material that is used in each step, a commercially available raw material may be used, or a synthetic material may be used.

For example, in a case of synthesizing the compound (X-1), the compound (X-1) can be obtained by carrying out a Diels-Alder reaction between an aromatic compound (for example, anthracene) and an alkene (for example, maleic acid anhydride).

The compound according to the third aspect of the present invention described above is a compound useful as an acid diffusion controlling agent in the resist composition according to the first aspect of the present invention described above.

(Acid Diffusion Controlling Agent)

An acid diffusion controlling agent according to a fourth aspect of the present invention contains the compound according to the third aspect described above.

Such an acid diffusion controlling agent is useful as an acid diffusion controlling agent for a chemical amplification-type resist composition.

Since the compound according to the third aspect described above has a carboxylate anion in the anion moiety, it generates upon exposure a relatively weak acid as compared with a fluorinated alkyl sulfonate anion or the like contained in the anion moiety of the acid generator that is generally used in the chemical amplification-type resist composition.

In a case where such an acid diffusion controlling agent is used in a chemical amplification-type resist composition, CDU and resolution performance are further improved in the resist pattern formation. In a case where such an acid generator component is used, CDU and resolution performance are further improved, particularly in the resist pattern formation using an EB or EUV light source.

EXAMPLES

Hereinafter, the present invention will be described in more detail based on Examples, but the present invention is not limited to these Examples.

In present Examples, a compound represented by Chemical Formula (X-1-1) is denoted by a "compound (X-1-1)", and compounds represented by other chemical formulae are also denoted in the same manner.

<Production of Compound (X-1)>

Production Example 1-1

Anthracene (20.0 g, 112.2 mmol), maleic acid anhydride (16.6 g, 168.3 mmol), aluminum chloride (1.50 g, 11.2 mmol), and toluene (200 g) were placed in a 300 mL three-necked flask and reacted at 80° C. for 4 hours with stirring. After cooling, ultrapure water (155 g) was added thereto, and after carrying out stirring for 30 minutes, the precipitated solid was filtered. The filtrate was dissolved again in a mixed solvent of THF (93 g) and methylene chloride (680 g), washed 3 times with ultrapure water (155 g), and the organic layer was concentrated using a rotary evaporator. The concentrate was recrystallized with ethyl acetate to obtain a compound (X-1-1).

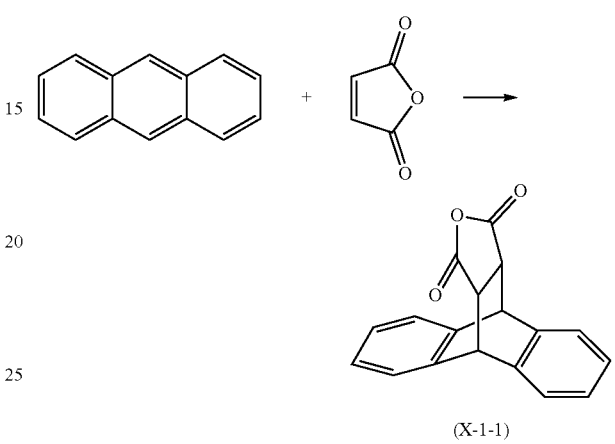

(X-1-1)

Production Example 1-2

A compound (X-1-2) was obtained in the same manner as in the production example of the compound (X-1-2), except that anthracene (20.0 g, 112.2 mmol) was changed to 2,3,6,7-tetramethylanthracene (26.3 g, 108.6 mmol).

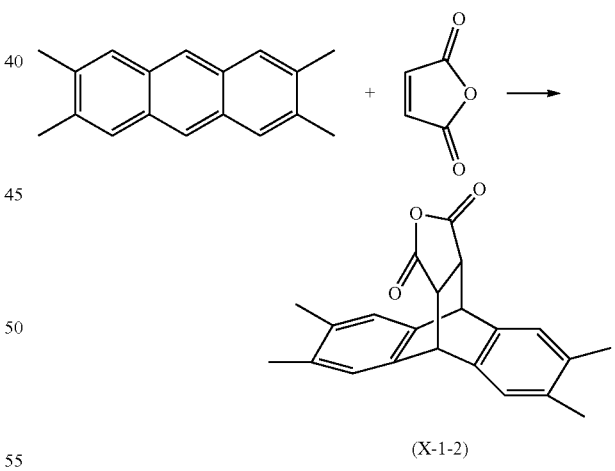

(X-1-2)

<Production of Compound (D0pre)>

Production Example 2-1

A THF/hexane solution (87 mL, 92.3 mmol) of 1.06 M lithium diisopropylamide (LDA) was placed in a 500 mL three-necked flask and cooled to 5° C., and then a solution obtained by dissolving 1-methylcyclopentanol (10.9 g, 108.6 mmol) in THF (30 g) was placed therein and reacted at 5° C. or lower for 2 hours. Then, a solution obtained by dissolving the compound (X1-1) (15.0 g, 54.3 mmol) in THF (225 g) was placed therein and reacted at 5° C. or lower for 2 hours. The reaction solution was added to ultrapure water (205 g) over 30 minutes, diheptane (205 g) was added thereto, the resultant mixture was stirred for 30 minutes, and then the organic layer was removed. After washing the aqueous layer with heptane (100 g) three times, tert-butyl-methyl ether (MTBE) (150 g) and a 10% aqueous citric acid solution (205 g, 106.1 mmol) were added, the resultant mixture was stirred for 30 minutes, and then the aqueous layer was removed. The recovered organic layer was washed with ultrapure water (150 g) three times, and the organic layer was concentrated using a rotary evaporator. The concentrate was recrystallized with ethyl acetate to obtain a compound (D0pre-01).

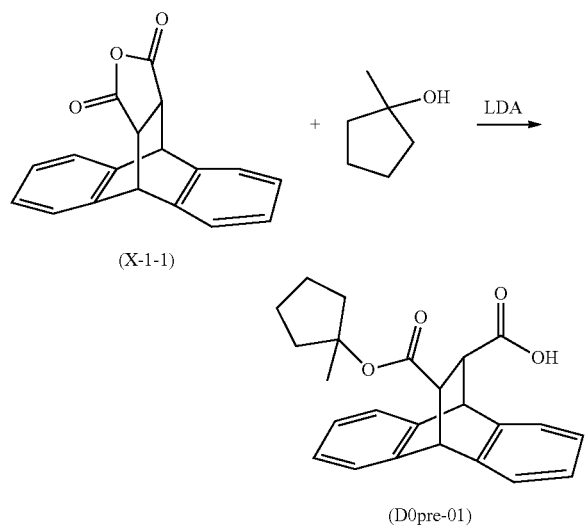

Production Example 2-2

A compound (D0pre-08) was obtained in the same manner as in the production example of the compound (D0pre-01), except that compound (X-1-1) (15.0 g, 54.3 mmol) was changed to the compound (X-1-2) (18.1 g, 54.3 mmol).

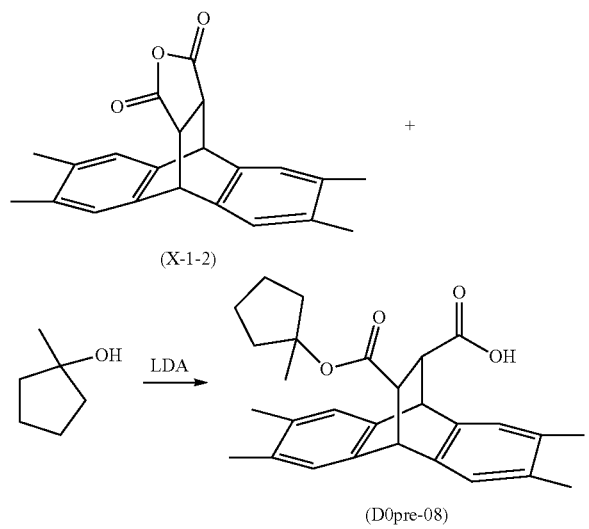

Production Example 2-3

A Compound (D0pre-06) was obtained in the same manner as in the production example of the compound (D0pre-01), except that 1-methylcyclopentanol (10.9 g, 108.6 mmol) was changed to t-butyl alcohol (8.0 g, 108.6 mmol).

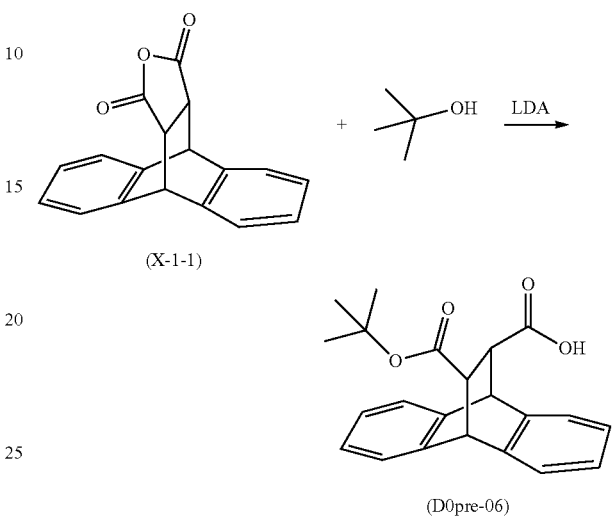

Production Example 2-4

A Compound (D0pre-07) was obtained in the same manner as in the production example of the compound (D0pre-01), except that 1-methylcyclopentanol (10.9 g, 108.6 mmol) was changed to 2-methyl-2-adamantanol (18.1 g, 108.6 mmol).

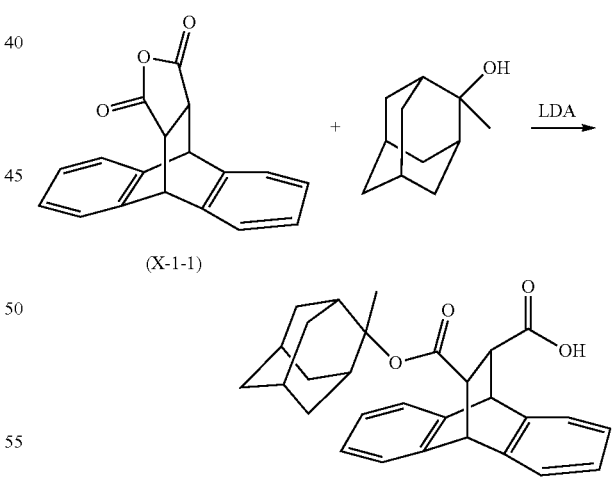

Production Example 2-5

The compound (D0pre-01) (11.0 g, 29.2 mmol), the compound (K-1) (3.2 g, 32.1 mmol), and dichloromethane (170 g) were placed in a 300 mL three-necked flask and stirred and dissolved at room temperature. Next, diisopropylcarbodiimide (4.1 g, 32.1 mmol) and dimethylaminopyridine (0.045 g, 0.4 mmol) were added thereto and reacted at room temperature for 5 hours. The reaction solution was filtered, and the filtrate was concentrated using a rotary evaporator. The concentrate was dissolved in acetonitrile (30 g) and subsequently added dropwise into MTBE (180 g), and the precipitated solid was filtered. The filtrate was dissolved in acetonitrile (30 g) and added dropwise into MTBE (180 g), and the precipitated solid was filtered. After repeating this operation twice, the filtrate was dried under reduced pressure to obtain a compound (D0pre-02).

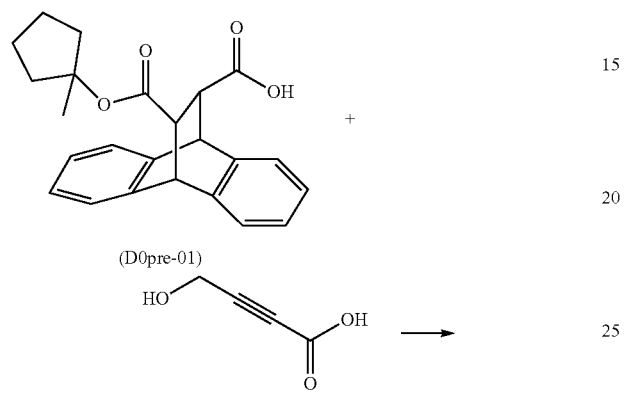

Production Example 2-6

A compound (D0pre-03) was obtained in the same manner as in the production example of the compound (D0pre-02), except that the compound (K-1) (3.2 g, 32.1 mmol) was changed to the compound (K-2) (5.6 g, 32.1 mmol).

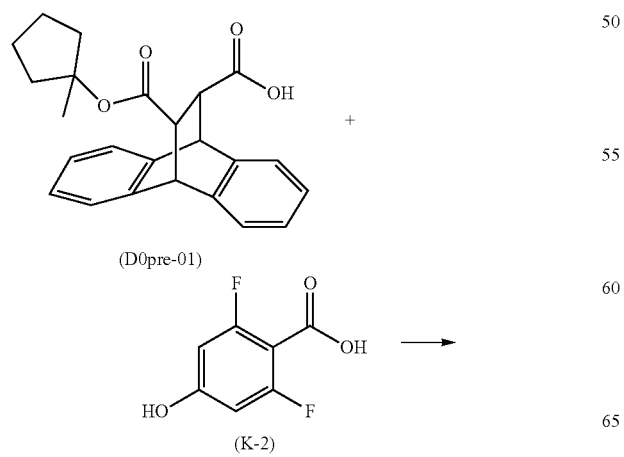

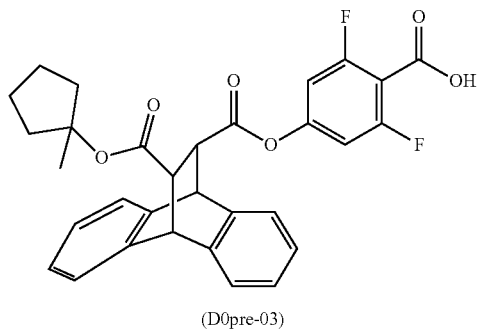

Production Example 2-7

A compound (D0pre-04) was obtained in the same manner as in the production example of the compound (D0pre-02), except that the compound (K-1) (3.2 g, 32.1 mmol) was changed to the compound (K-3) (2.4 g, 32.1 mmol).

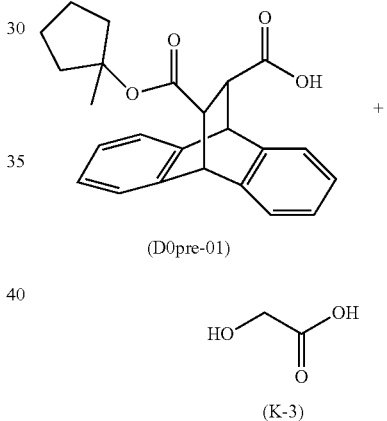

Production Example 2-8

A compound (D0pre-05pre) was obtained in the same manner as in the production example of the compound (D0pre-02), except that the compound (K-1) (3.2 g, 32.1 mmol) was changed to ethylene glycol (2.0 g, 32.1 mmol).

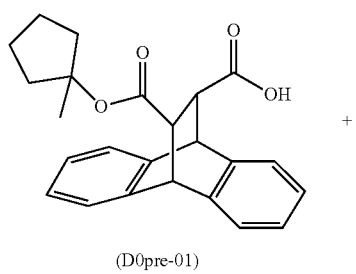

(D0pre-01)

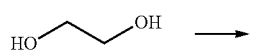

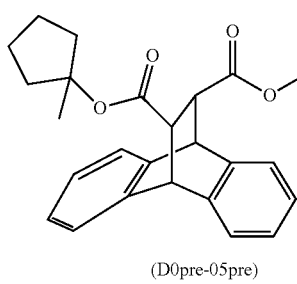

(D0pre-05pre)

Next, the compound (D0pre-05pre) (9.0 g, 21.4 mmol), oxalic acid (2.1 g, 23.5 mmol), and dichloromethane (95 g) were placed in a 300 mL three-necked flask and stirred and dissolved at room temperature. Next, diisopropylcarbodiimide (3.0 g, 23.5 mmol) and dimethylaminopyridine (0.033 g, 0.3 mmol) were added thereto and reacted at room temperature for 5 hours. The reaction solution was filtered, and the filtrate was concentrated using a rotary evaporator. The concentrate was dissolved in acetonitrile (15 g) and subsequently added dropwise into MTBE (80 g), and the precipitated solid was filtered. The filtrate was dissolved in acetonitrile (15 g) and added dropwise into MTBE (80 g), and the precipitated solid was filtered. After repeating this operation twice, the filtrate was dried under reduced pressure to obtain a compound (D0pre-05).

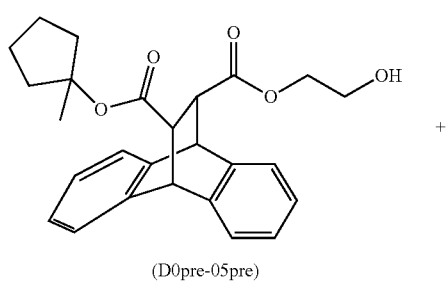

(D0pre-05pre)

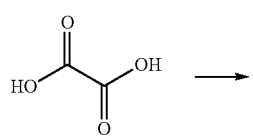

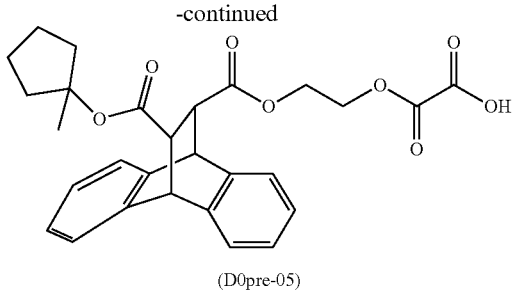

(D0pre-05)

<Production of Compound (D0)>

Production Example 3-1

The compound (D0pre-01) (3.0 g, 8.0 mmol) and a compound (S-1-1) (2.86 g, 8.4 mmol) were dissolved in dichloromethane (50 g), and an aqueous solution (14.5 g) of 5% tetramethylammonium hydroxide (TMAH) was added thereto and reacted at room temperature for 30 minutes. After completion of the reaction, the aqueous phase was removed, and the organic phase was washed 5 times with ultrapure water (15.0 g). The organic phase was concentrated and dried using a rotary evaporator to obtain a compound (D0-01).

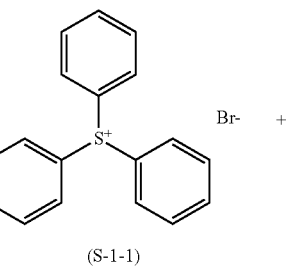

(S-1-1)

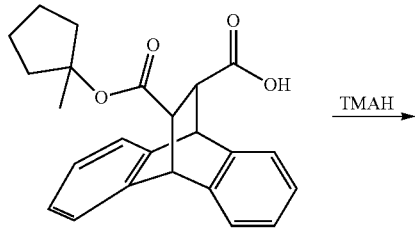

(D0pre-01)

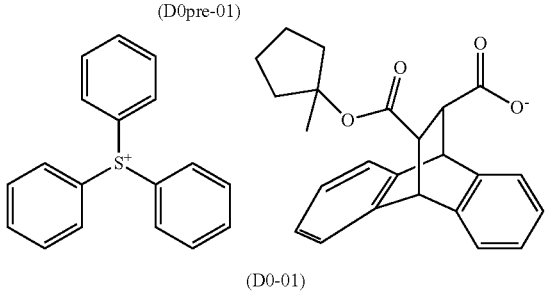

(D0-01)

Production Examples 3-2 to 3-11

A compound (D0-02) to a compound (D0-11) shown below were obtained in the same manner as in the "production example of the compound (D0-01)" described above, except that the combination of the compound (D0pre-01) with the salt exchange compound (S-1-1) in the "production example of the compound (D0-01)" described above was changed to each of the compounds (D0pre-01) to (D0pre-08) described below and each of the salt exchange compounds (S-1-1) to (S-1-4) described below.
The structures of the compound (D0-01) to the compound (D0-11) are shown below.
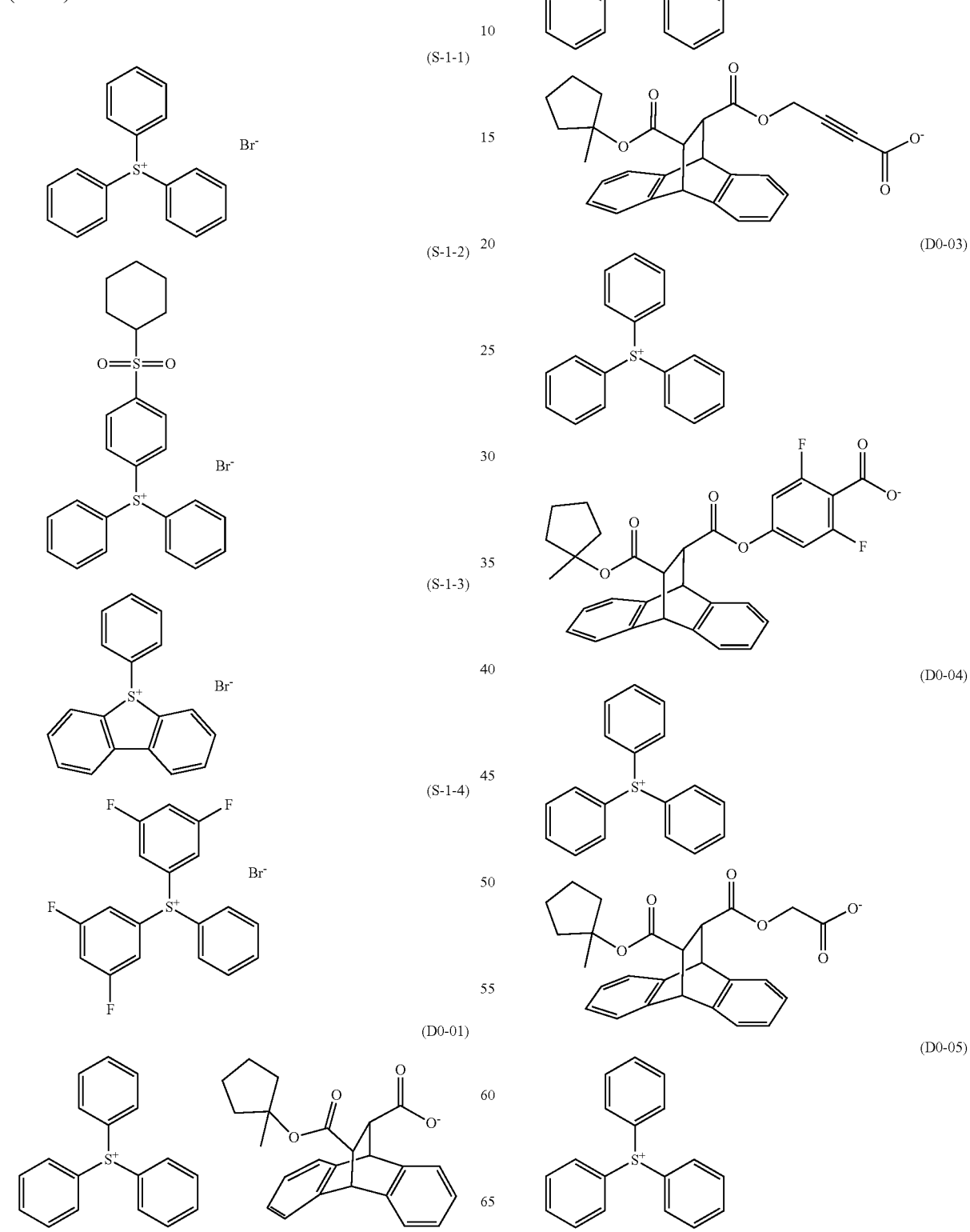

-continued

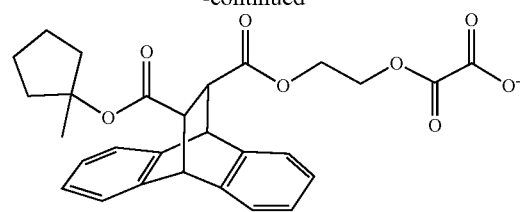

(D0-06)

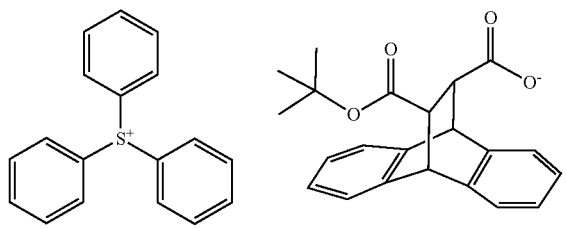

(D0-07)

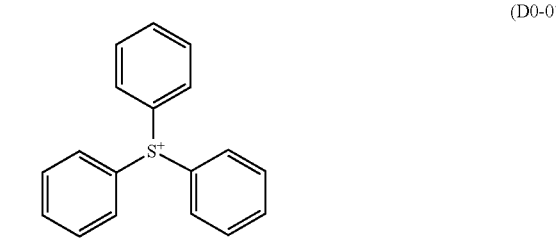

(D0-08)

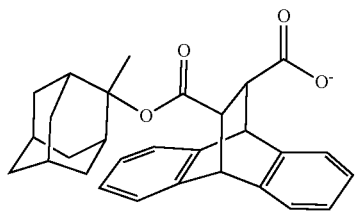

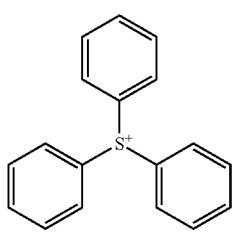

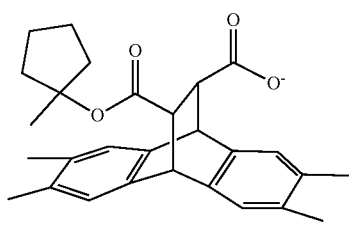

-continued (D0-09)

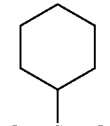

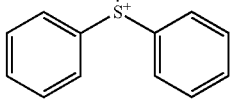

(D0-10)

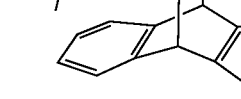

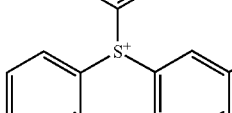

(D0-11)

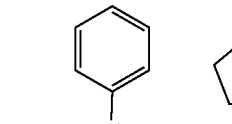

It is noted that the structures of the above-described compounds (D0-01) to (D0-11) were identified from the analysis results of the $^1$H-NMR measurement shown below.

Compound (D0-01): A Combination of the Compound (D0Pre-01) and the Salt Exchange Compound (S-1-1)

$^1$H-NMR (DMSO, 400 MHz): δ (ppm)=7.74-7.90 (m, ArH, 15H), 7.01-7.47 (m, ArH, 8H), 4.70-4.85 (m, CH, 2H), 3.15-3.40 (m, —OCO—CH—CH—COO—, 2H), 1.50-2.05 (m, cyclopenthyl, 8H), 1.40 (s, CH$_3$, 3H)

Compound (D0-02): A combination of the compound (D0pre-02) and the salt exchange compound (S-1-1)

$^1$H-NMR (DMSO, 400 MHz): δ (ppm)=7.74-7.90 (m, ArH, 15H), 7.01-7.47 (m, ArH, 8H), 4.70-4.85 (m, CH, 2H), 3.15-3.40 (m, —OCO—CH—CH—COO—, 2H), 2.15 (s, —COO—CH$_2$—, 2H), 1.50-2.05 (m, cyclopenthyl, 8H), 1.40 (s, CH$_3$, 3H)

Compound (D0-03): A combination of the compound (D0pre-03) and the salt exchange compound (S-1-1)

$^1$H-NMR (DMSO, 400 MHz): δ (ppm)=7.74-7.90 (m, ArH, 15H), 7.01-7.47 (m, ArH, 8H), 6.73 (s, ArH, 2H), 4.70-4.85 (m, CH, 2H), 3.15-3.40 (m, —OCO—CH—CH—COO—, 2H), 1.50-2.05 (m, cyclopenthyl, 8H), 1.40 (s, CH$_3$, 3H)

Compound (D0-04): A combination of the compound (D0pre-04) and the salt exchange compound (S-1-1)

$^1$H-NMR (DMSO, 400 MHz): δ (ppm)=7.74-7.90 (m, ArH, 15H), 7.01-7.47 (m, ArH, 8H), 4.70-4.85 (m, CH, 2H), 4.49 (s, —COOCH$_2$—, 2H), 3.15-3.40 (m, —OCO—CH—CH—COO—, 2H), 1.50-2.05 (m, cyclopenthyl, 8H), 1.40 (s, CH$_3$, 3H)

Compound (D0-05): A combination of the compound (D0pre-05) and the salt exchange compound (S-1-1)

$^1$H-NMR (DMSO, 400 MHz): δ (ppm)=7.74-7.90 (m, ArH, 15H), 7.01-7.47 (m, ArH, 8H), 4.70-4.85 (m, CH, 2H), 3.79-3.95 (m, —COO—CH$_2$CH$_2$—COO—, 4H), 3.15-3.40 (m, —OCO—CH—CH—COO—, 2H), 1.50-2.05 (m, cyclopenthyl, 8H), 1.40 (s, CH$_3$, 3H)

Compound (D0-06): A combination of the compound (D0pre-06) and the salt exchange compound (S-1-1)

$^1$H-NMR (DMSO, 400 MHz): δ (ppm)=7.74-7.90 (m, ArH, 15H), 7.01-7.47 (m, ArH, 8H), 4.70-4.85 (m, CH, 2H), 3.15-3.40 (m, —OCO—CH—CH—COO—, 2H), 1.40 (s, CH$_3$, 9H)

Compound (D0-07): A combination of the compound (D0pre-07) and the salt 5 exchange compound (S-1-1)

$^1$H-NMR (DMSO, 400 MHz): δ (ppm)=7.74-7.90 (m, ArH, 15H), 7.01-7.47 (m, ArH, 8H), 4.70-4.85 (m, CH, 2H), 3.15-3.40 (m, —OCO—CH—CH—COO—, 2H), 1.50-2.00 (m, methyl adamanthyl, 17H)

Compound (D0-08): A combination of the compound (D0pre-08) and the salt exchange compound (S-1-1)

$^1$H-NMR (DMSO, 400 MHz): δ (ppm)=7.74-7.90 (m, ArH, 15H), 7.19 (s, ArH, 4H), 4.70-4.85 (m, CH, 2H), 3.15-3.40 (m, —OCO—CH—CH—COO—, 2H), 2.27 (s, CH$_3$, 12H), 1.50-2.05 (m, cyclopenthyl, 8H), 1.40 (s, CH$_3$, 3H)

Compound (D0-09): A combination of the compound (D0pre-05) and the salt exchange compound (S-1-2)

$^1$H-NMR (DMSO, 400 MHz): δ (ppm)=7.70-8.22 (m, ArH, 14H), 7.01-7.47 (m, ArH, 8H), 4.70-4.85 (m, CH, 2H), 3.79-3.95 (m, —COO—CH$_2$CH$_2$—COO—, 4H), 3.15-3.45 (m, —OCO—CH—CH—COO—+SO$_2$CH, 3H), 1.09-2.05 (m, methyl cyclopenthyl+cyclohexyl, 21H)

Compound (D0-10): A combination of the compound (D0pre-04) and the salt exchange compound (S-1-4)

$^1$H-NMR (DMSO, 400 MHz): δ (ppm)=7.77-7.98 (m, ArH, 11H), 7.01-7.47 (m, ArH, 8H), 4.70-4.85 (m, CH, 2H), 4.49 (s, —COOCH$_2$—, 2H), 3.15-3.40 (m, —OCO—CH—CH—COO—, 2H), 1.50-2.05 (m, cyclopenthyl, 8H), 1.40 (s, CH$_3$, 3H)

Compound (D0-11): A combination of the compound (D0pre-01) and the salt exchange compound (S-1-3)

$^1$H-NMR (DMSO, 400 MHz): δ (ppm)=8.50 (d, ArH, 2H), 8.37 (d, ArH, 2H), 7.93 (t, ArH, 2H), 7.55-7.75 (m, ArH, 7H), 7.01-7.47 (m, ArH, 8H), 4.70-4.85 (m, CH, 2H), 3.15-3.40 (m, —OCO—CH—CH—COO—, 2H), 1.50-2.05 (m, cyclopenthyl, 8H), 1.40 (s, CH$_3$, 3H)

<Preparation of Resist Composition>

Examples 1 to 13 and Comparative Examples 1 to 4

Each of the components shown in Tables 1 and 2 was mixed and dissolved to prepare a resist composition of each Example.

TABLE 1

|  | Component (A) | Component (B) | Component (D) | Component (S) |
|---|---|---|---|---|
| Example 1 | (A)-1 [100] | (B)-1 [20.0] | (D0)-1 [6.2] | (S)-1 [8000] |
| Example 2 | (A)-1 [100] | (B)-1 [20.0] | (D0)-2 [7.0] | (S)-1 [8000] |
| Example 3 | (A)-1 [100] | (B)-1 [20.0] | (D0)-3 [7.8] | (S)-1 [8000] |
| Example 4 | (A)-1 [100] | (B)-1 [20.0] | (D0)-4 [6.8] | (S)-1 [8000] |
| Example 5 | (A)-1 [100] | (B)-1 [20.0] | (D0)-5 [7.4] | (S)-1 [8000] |
| Example 6 | (A)-1 [100] | (B)-1 [20.0] | (D0)-6 [6.0] | (S)-1 [8000] |
| Example 7 | (A)-1 [100] | (B)-1 [20.0] | (D0)-7 [6.9] | (S)-1 [8000] |
| Example 8 | (A)-1 [100] | (B)-1 [20.0] | (D0)-8 [6.8] | (S)-1 [8000] |
| Example 9 | (A)-1 [100] | (B)-1 [20.0] | (D0)-9 [8.8] | (S)-1 [8000] |
| Example 10 | (A)-1 [100] | (B)-1 [20.0] | (D0)-10 [7.5] | (S)-1 [8000] |
| Example 11 | (A)-1 [100] | (B)-1 [20.0] | (D0)-11 [6.2] | (S)-1 [8000] |
| Example 12 | (A)-1 [100] | (B)-2 [19.9] | (D0)-1 [6.2] | (S)-1 [8000] |
| Example 13 | (A)-2 [100] | (B)-1 [20.0] | (D0)-10 [7.5] | (S)-1 [8000] |

TABLE 2

|  | Component (A) | Component (B) | Component (D) | Component (S) |
|---|---|---|---|---|
| Comparative Example 1 | (A)-1 [100] | (B)-1 [20.0] | (D1)-1 [5.0] | (S)-1 [8000] |
| Comparative Example 2 | (A)-1 [100] | (B)-1 [20.0] | (D1)-2 [5.4] | (S)-1 [8000] |
| Comparative Example 3 | (A)-1 [100] | (B)-1 [20.0] | (Dl)-3 [5.1] | (S)-1 [8000] |
| Comparative Example 4 | (A)-1 [100] | (B)-1 [20.0] | (D0)-4 [5.3] | (S)-1 [8000] |

In Tables 1 and 2, each abbreviation has the following meaning. The numerical values in the brackets are blending amounts (parts by mass).

(A)-1: A polymeric compound represented by Chemical Formula (A1)-1. As a result of a GPC measurement to determine the weight average molecular weight (Mw) in terms of standard polystyrene value, this polymeric compound (A1)-1 had a weight average molecular weight of 7,100 and a polydispersity (Mw/Mn) of 1.69. The copolymerization compositional ratio (the ratio (molar ratio) among constitutional units in the structural formula) determined by $^{13}$C-NMR is 1/m=50/50.

(A)-2: A polymeric compound represented by Chemical Formula (A1)-2. As a result of a GPC measurement to determine the weight average molecular weight (Mw) in terms of standard polystyrene value, this polymeric compound (A1)-2 had a weight average molecular weight of 7,000 and a polydispersity (Mw/Mn) of 1.72. The copolymerization compositional ratio (the ratio (molar ratio) among constitutional units in the structural formula) determined by $^{13}$C-NMR is 1/m=50/50.

(D0)-1 to (D0)-11: Acid diffusion controlling agents each consisting of the compounds (D0-01) to (D0-11) described above.

(D1)-1 to (D1)-4: Acid diffusion controlling agents each consisting of the compounds (D1-1) to (D1-4) described later.

(S)-1: A mixed solvent of propylene glycol monomethyl ether acetate/propylene glycol monomethyl ether=60/40 (in terms of mass ratio)

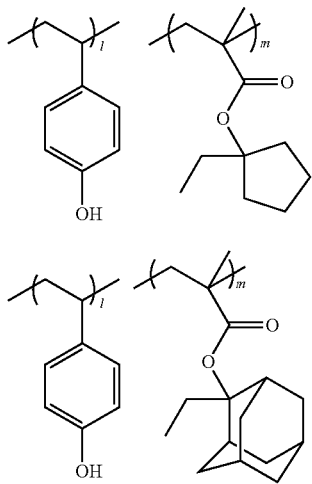

(A1)-1

(A1)-2

(B)-1: An acid generator consisting of the compound (B1-1).

(B)-2: An acid generator consisting of the compound (B1-2).

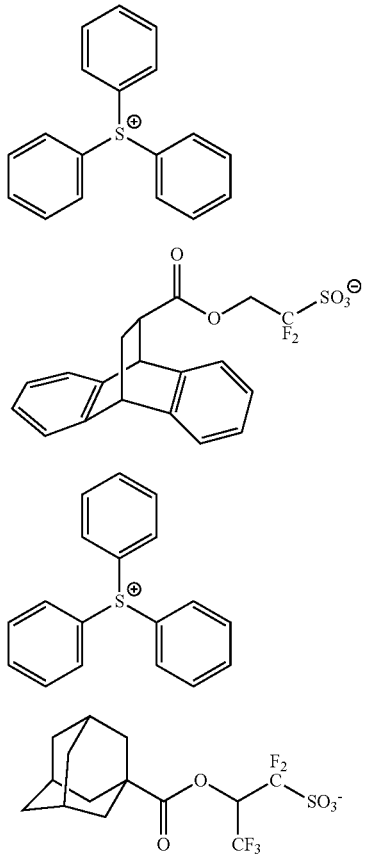

(B1-1)

(B1-2)

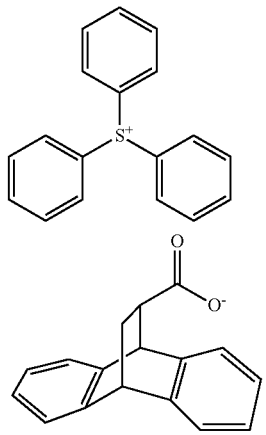

(D1-1)

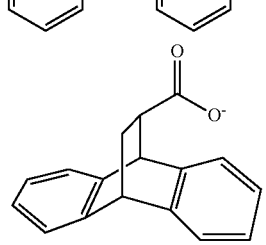

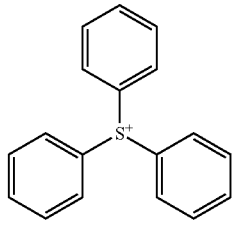

(D1-2)

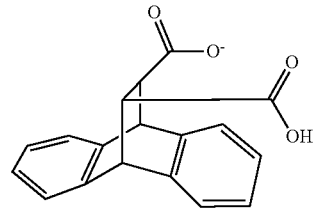

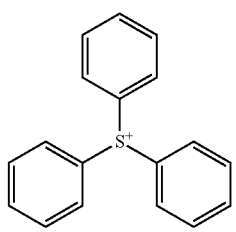

(D1-3)

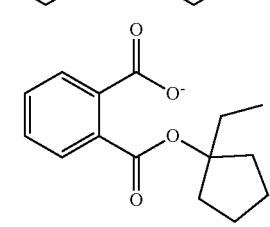

-continued (D1-4)

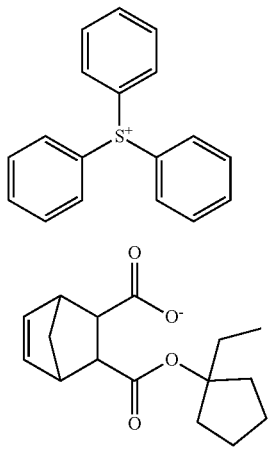

<Resist Pattern Formation>

The resist composition of each Example was applied onto an 8-inch silicon substrate which had been subjected to a hexamethyldisilazane (HMDS) treatment using a spinner, the coated wafer was subjected to a post-apply baking (PAB) treatment on a hot plate at a temperature of 110° C. for 60 seconds so that the coated wafer was dried to form a resist film having a film thickness of 50 nm.

Next, the resist film was subjected to drawing (exposure) to obtain a contact hole pattern (hereinafter, referred to as a "CH pattern") in which holes having a diameter of 32 nm were arranged at equal intervals (pitch: 64 nm) by using an electron beam lithography apparatus JEOL-JBX-9300FS (manufactured by JEOL Ltd.) at an acceleration voltage of 100 kV. Thereafter, a post-exposure baking (PEB) treatment was carried out on the resist film at 110° C. for 60 seconds.

Subsequently, alkali development was carried out at 23° C. for 60 seconds using a 2.38% by mass tetramethylammonium hydroxide (TMAH) aqueous solution "NMD-3" (product name, manufactured by TOKYO OHKA KOGYO CO., LTD.).

Thereafter, water rinsing was carried out with pure water for 15 seconds.

As a result of the above, a CH pattern in which holes having a diameter of 32 nm were arranged at equal intervals (pitch: 64 nm) was formed.

[Evaluation of Critical Dimension Uniformity (CDU) of Pattern Size]

The CH pattern formed according to "Resist pattern formation" described above was observed from the upper side of the CH pattern, and the hole diameter (nm) of each of the holes was measured with a length-measuring scanning electron microscope (SEM, acceleration voltage: 500 V, product name: CG5000, manufactured by Hitachi High-Tech Corporation). Then, the triple value (3σ) of the standard deviation (σ) calculated from the measurement result was determined. The obtained results are shown in Table 3 as "CDU (nm)".

The lower the value of 3σ determined as described above is, the higher the critical dimension (CD) uniformity of the plurality of holes formed in the resist film is.

[Evaluation of Limiting Resolution]

The limiting resolution at the optimum exposure amount (Eop) with which the above-described CH pattern was formed, specifically, the hole diameter (nm) of the pattern that was resolved when gradually reducing the exposure amount from the optimum exposure amount (Eop) to form the CH pattern, was determined using a scanning electron microscope S-9380 (manufactured by Hitachi High-Tech Corporation). The obtained results are shown in Table 3 as "Limiting resolution (nm)".

TABLE 3

| | PAB (° C.) | PEB (° C.) | CDU [nm] | Limiting resolution [nm] |
|---|---|---|---|---|
| Example 1 | 110 | 110 | 4.3 | 24 |
| Example 2 | 110 | 110 | 4.2 | 24 |
| Example 3 | 110 | 110 | 4.4 | 24 |
| Example 4 | 110 | 110 | 4.2 | 24 |
| Example 5 | 110 | 110 | 4.1 | 24 |
| Example 6 | 110 | 110 | 4.5 | 24 |
| Example 7 | 110 | 110 | 4.5 | 28 |
| Example 8 | 110 | 110 | 4.6 | 28 |
| Example 9 | 110 | 110 | 4.1 | 24 |
| Example 10 | 110 | 110 | 4.2 | 24 |
| Example 11 | 110 | 110 | 4.2 | 24 |
| Example 12 | 110 | 110 | 4.4 | 24 |
| Example 13 | 110 | 110 | 4.1 | 24 |
| Comparative Example 1 | 110 | 110 | 5.0 | 32 |
| Comparative Example 2 | 110 | 110 | 5.2 | 32 |
| Comparative Example 3 | 110 | 110 | 5.5 | 28 |
| Comparative Example 4 | 110 | 110 | 5.4 | 28 |

As shown in Table 3, it has been confirmed that it is possible to form a resist pattern having both good CDU and good limiting resolution with the resist compositions of Examples as compared with the resist compositions of Comparative Examples.

As a result of checking the effect due to the difference in the anion moiety of the component (D0) by comparing Examples 1 to 8, it has been seen that particularly the resist compositions Examples 2, 4, and 5, containing the component (D0), are excellent in CDU and limiting resolution.

It is presumed that the component (D0) of Example 1 can further improve the compatibility with the developing solution since in the comparison between the components (D0) contained in the resist compositions of Examples 1 and 6, where only the acid dissociable group contained in the component (D0) is different, the acid dissociable group which is a monocyclic alicyclic group contained in the anion moiety of the component (D0) of Example 1 has a high dissociation ability of the acid dissociable group as compared with the chain-like acid dissociable group contained in the anion moiety of the component (D0) of Example 6.

It is presumed that the component (D0) of Example 1 can further improve the compatibility with the developing solution while maintaining the uniformity in the resist film since in the comparison between the components (D0) contained in the resist compositions of Examples 1 and 7, where only the acid dissociable group contained in the component (D0) is different, the acid dissociable group which is a monocyclic alicyclic group contained in the anion moiety of the component (D0) of Example 1 has a suitably low hydrophobicity as compared with the acid dissociable group of the polycyclic alicyclic group contained in the anion moiety of the component (D0) of Example 7.

It is presumed that the component (D0) of Example 1 can further improve the compatibility with the developing solution while maintaining the uniformity in the resist film since in the comparison between the components (D0) contained in the resist compositions of Examples 1 and 8, where only the acid dissociable group contained in the component (D0) is different, the bicyclooctane skeleton contained in the anion moiety of the component (D0) of Examples 1 has a suitably low hydrophobicity as compared with the bicyclooctane skeleton having four methyl groups in the anion moiety of the component (D0) of Example 8.

While preferred embodiments of the invention have been described and illustrated above, it should be understood that these are exemplary of the invention and are not to be considered as limiting. Additions, omissions, substitutions, and other modifications can be made without departing from the scope of the invention. Accordingly, the invention is not to be considered as being limited by the foregoing description and is only limited by the scope of the appended claims.

What is claimed is:

1. A resist composition which generates acid upon exposure and exhibits changed solubility in a developing solution under action of acid, the resist composition comprising:
    a base material component (A) which exhibits changed solubility in a developing solution under action of acid;
    an acid generator component (B) which generates acid upon exposure; and
    an acid diffusion controlling agent (D) which controls a diffusion of the acid generated from the acid generator component (B) upon exposure,
    wherein the acid diffusion controlling agent component (D) contains a compound (D0) represented by General Formula (d0):

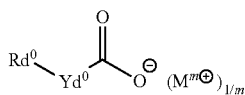
(d0)

wherein $Rd^0$ represents a polycyclic aromatic cyclic group in which a plurality of aromatic rings are condensed with each other or an aromatic ring-aliphatic hydrocarbon ring condensed ring-type group in which an aromatic ring is condensed with an aliphatic hydrocarbon ring, wherein the polycyclic aromatic cyclic group in which a plurality of aromatic rings are condensed with each other or an aromatic ring-aliphatic hydrocarbon ring condensed ring-type group in which an aromatic ring is condensed with aliphatic hydrocarbon ring has, as a substituent, an acid decomposable group represented by General Formula (pg-1); wherein the polycyclic aromatic cyclic group in which a plurality of aromatic rings are condensed with each other or an aromatic ring-aliphatic hydrocarbon ring condensed ring-type group in which an aromatic ring is condensed with aliphatic hydrocarbon ring may have an alkyl group, an alkoxy group, a halogen atom, a halogenated alkyl group, a hydroxyl group, a nitro group or a carbonyl group; $Yd^0$ represents a divalent linking group or a single bond; $M^{m+}$ represents an m-valent organic cation, and m represents an integer of 1 or more:

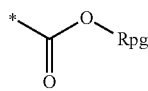
(pg-1)

wherein Rpg represents an acid dissociable group represented by General Formula (pg-r-1), an acid dissociable group represented by General Formula (pg-r-2), an acid dissociable group represented by General Formula (pg-r-3), or an acid dissociable group represented by General Formula (pg-r-4), and * represents a bonding site:

(pg-r-1)

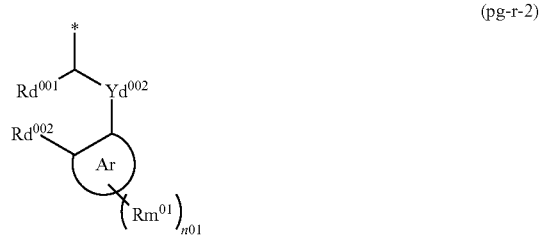
(pg-r-2)

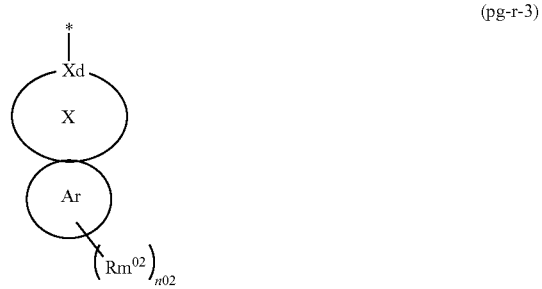
(pg-r-3)

(pg-r-4)

wherein in General Formula (pg-r-1), $Rd^1$ to $Rd^3$ each independently represent a hydrocarbon group, and $Rd^1$ and $Rd^2$ may be bonded to each other to form a ring, in General Formula (pg-r-2), $Rd^{001}$ represents a linear or branched aliphatic hydrocarbon group, $Yd^{002}$ represents a single bond or a divalent linking group, $Rd^{002}$ represents a hydrogen atom or a substituent, Ar represents a benzene ring or a naphthalene ring, $Rm^{01}$ represents a substituent, n01 represents an integer of 1 to 4, in General Formula (pg-r-3), Xd represents a secondary carbon atom, X represents an alicyclic hydrocarbon ring which may have a substituent, Ar represents a benzene ring or a naphthalene ring, $Rm^{02}$ represents a substituent, n02 represents an integer of 1 to 4, in General Formula (pg-r-4), $Rd'^1$ and $Rd'^2$ each independently represents a hydrogen atom or an alkyl group, $Rd'^3$ represents a hydrocarbon group, and $Rd'^3$ may be bonded to $Rd'^1$ or $Rd'^2$ to form a ring, and * represents a bonding site to the oxygen atom (—O—) in General Formula (pg-1).

2. The resist composition according to claim 1, wherein the acid diffusion controlling agent component (D) contains a compound represented by General Formula (d0-1):

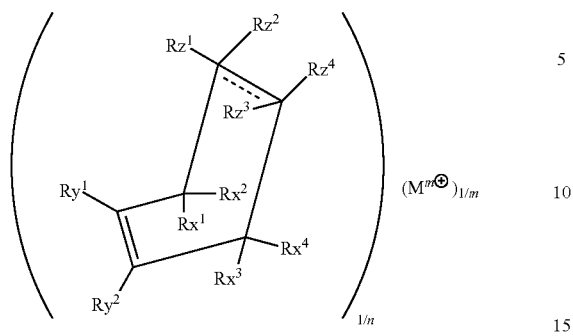
(d0-1)

wherein $Rx^1$ to $Rx^4$ each independently represents a hydrocarbon group which may have an alkyl group, an alkoxy group, a halogen atom, a halogenated alkyl group, a hydroxyl group, a nitro group or a carbonyl group, or a hydrogen atom, or two or more of $Rx^1$ to $Rx^4$ may be bonded to each other to form a ring structure, and $Ry^1$ and $Ry^2$ each independently represents a hydrocarbon group which may have an alkyl group, an alkoxy group, a halogen atom, a halogenated alkyl group, a hydroxyl group, a nitro group or a carbonyl group, or a hydrogen atom, or $Ry^1$ and $Ry^2$ may be bonded to each other to form a ring structure: ----- ................ is a double bond or a single bond, $Rz^1$ to $Rz^4$ each independently represents, where valence allows, a hydrocarbon group which may have a substituent or a hydrogen atom, or two or more of $Rz^1$ to $Rz^4$ may be bonded to each other to form a ring structure, provided which at least two or more of $Rx^1$ to $Rx^4$, at least $Ry^1$ and $Ry^2$, or at least two or more of $Rz^1$ to $Rz^4$ are bonded to each other to form an aromatic ring, at least one of $Rx^1$ to $Rx^4$, $Ry^1$ and $Ry^2$, and $Rz^1$ to $Rz^4$ includes an anion group represented by General Formula (d0-r-an1), and an entire anion moiety is an n-valent anion, and at least one of $Rx^1$ to $Rx^4$, $Ry^1$ and $Ry^2$, and $Rz^1$ to $Rz^4$ includes the acid decomposable group represented by General Formula (pg-1), n represents an integer of 1 or greater, and $M^{m+}$ represents an m-valent organic cation, and m represents an integer of 1 or more:

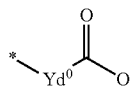
(d0-r-an1)

wherein $Yd^0$ represents a divalent linking group or a single bond, and * represents a bonding site.

3. A method of forming a resist pattern, comprising:
forming a resist film on a substrate using the resist composition according to claim 1;
exposing the resist film; and
developing the exposed resist film to form a resist pattern.

4. A compound represented by General Formula (d0):

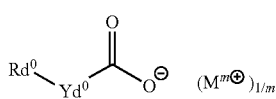
(d0)

wherein $Rd^0$ represents a polycyclic aromatic cyclic group in which a plurality of aromatic rings are condensed with each other or an aromatic ring-aliphatic hydrocarbon ring condensed ring-type group in which an aromatic ring is condensed with an aliphatic hydrocarbon ring, the polycyclic aromatic cyclic group in which a plurality of aromatic rings are condensed with each other or an aromatic ring-aliphatic hydrocarbon ring condensed ring-type group in which an aromatic ring is condensed with an aliphatic hydrocarbon ring having, as a substituent, an acid decomposable group represented by General Formula (pg-1); wherein the polycyclic aromatic cyclic group in which a plurality of aromatic rings are condensed with each other or an aromatic ring-aliphatic hydrocarbon ring condensed ring-type group in which an aromatic ring is condensed with aliphatic hydrocarbon ring may have an alkyl group, an alkoxy group, a halogen atom, a halogenated alkyl group, a hydroxyl group, a nitro group or a carbonyl group; $Yd^0$ represents a divalent linking group or a single bond; $M^{m+}$ represents an m-valent organic cation, and m represents an integer of 1 or more:

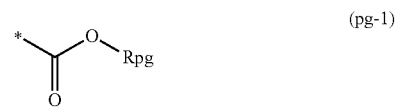
(pg-1)

wherein Rpg represents an acid dissociable group represented by General Formula (pg-r-1), an acid dissociable group represented by General Formula (pg-r-2), an acid dissociable group represented by General Formula (pg-r-3), or an acid dissociable group represented by General Formula (pg-r-4), and * represents a bonding site:

(pg-r-1)

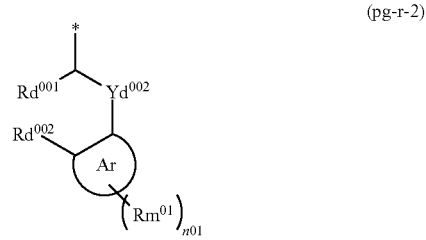
(pg-r-2)

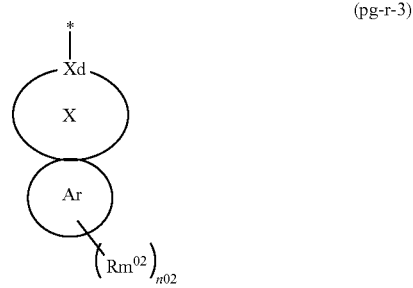
(pg-r-3)

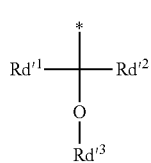

(pg-r-4)

wherein in General Formula (pg-r-1), $Rd^1$ to $Rd^3$ each independently represent a hydrocarbon group, and $Rd^1$ and $Rd^2$ may be bonded to each other to form a ring, in General Formula (pg-r-2), $Rd^{001}$ represents a linear or branched aliphatic hydrocarbon group, $Yd^{002}$ represents a single bond or a divalent linking group, $Rd^{002}$ represents a hydrogen atom or a substituent, Ar represents a benzene ring or a naphthalene ring, Rm01 represents a substituent, n01 represents an integer of 1 to 4, in General Formula (pg-r-3), Xd represents a secondary carbon atom, X represents an alicyclic hydrocarbon ring which may have a substituent, Ar represents a benzene ring or a naphthalene ring, $Rm^{02}$ represents a substituent, n02 represents an integer of 1 to 4, in General Formula (pg-r-4), $Rd'^1$ and $Rd'^2$ each independently represents represent a hydrogen atom or an alkyl group, $Rd'^3$ represents a hydrocarbon group, and $Rd'^3$ may be bonded to $Rd'^1$ or $Rd'^2$ to form a ring, and * represents a bonding site to the oxygen atom (—O—) in General Formula (pg-1).

5. An acid diffusion controlling agent comprising the compound according to claim 4.

* * * * *